United States Patent
Inoue et al.

(10) Patent No.: US 9,470,980 B2
(45) Date of Patent: Oct. 18, 2016

(54) PATTERN-FORMING METHOD, ELECTRON BEAM-SENSITIVE OR EXTREME ULTRAVIOLET RADIATION-SENSITIVE RESIN COMPOSITION, RESIST FILM, MANUFACTURING METHOD OF ELECTRONIC DEVICE USING THEM AND ELECTRONIC DEVICE

(71) Applicant: FUJIFILM Corporation, Tokyo (JP)

(72) Inventors: Naoki Inoue, Shizuoka (JP); Hiroo Takizawa, Shizuoka (JP); Shuji Hirano, Shizuoka (JP); Hideaki Tsubaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/228,894

(22) Filed: Mar. 28, 2014

(65) Prior Publication Data

US 2014/0212811 A1 Jul. 31, 2014

Related U.S. Application Data

(63) Continuation of application No. PCT/JP2012/072288, filed on Aug. 28, 2012.

(30) Foreign Application Priority Data

Sep. 30, 2011 (JP) ................. 2011-218550

(51) Int. Cl.
| | |
|---|---|
| G03F 7/20 | (2006.01) |
| C08F 212/14 | (2006.01) |
| G03C 1/73 | (2006.01) |
| G03F 7/004 | (2006.01) |
| G03F 7/039 | (2006.01) |
| G03F 7/075 | (2006.01) |
| G03F 7/32 | (2006.01) |
| C08F 12/24 | (2006.01) |

(52) U.S. Cl.
CPC ........... *G03F 7/2002* (2013.01); *C08F 212/14* (2013.01); *G03C 1/733* (2013.01); *G03F 7/0046* (2013.01); *G03F 7/0397* (2013.01); *G03F 7/0758* (2013.01); *G03F 7/2039* (2013.01); *G03F 7/2041* (2013.01); *G03F 7/325* (2013.01); *C08F 12/24* (2013.01)

(58) Field of Classification Search
CPC .. G03F 7/0046; G03F 7/0397; G03F 7/0758; G03F 7/2002; G03F 7/2059; G03F 7/325; G03C 1/733
See application file for complete search history.

(56) References Cited

U.S. PATENT DOCUMENTS

| | | | |
|---|---|---|---|
| 2002/0061462 A1 | 5/2002 | Uenishi | |
| 2008/0241745 A1 | 10/2008 | Shirakawa et al. | |
| 2008/0261150 A1* | 10/2008 | Tsubaki et al. | ............ 430/270.1 |
| 2009/0075177 A1 | 3/2009 | Ando et al. | |
| 2011/0129777 A1 | 6/2011 | Hatakeyama et al. | |
| 2011/0177462 A1 | 7/2011 | Hatakeyama et al. | |
| 2011/0236826 A1 | 9/2011 | Hatakeyama et al. | |
| 2011/0236831 A1 | 9/2011 | Hasegawa et al. | |
| 2011/0262864 A1* | 10/2011 | Hirano et al. | ............. 430/285.1 |
| 2012/0183903 A1 | 7/2012 | Hatakeyama et al. | |
| 2012/0282550 A1* | 11/2012 | Yada | ..................... G03F 7/0392 430/285.1 |
| 2013/0017492 A1 | 1/2013 | Hatakeyama et al. | |
| 2013/0052587 A1 | 2/2013 | Hatakeyama et al. | |

FOREIGN PATENT DOCUMENTS

| | | |
|---|---|---|
| JP | 10505172 A | 5/1998 |
| JP | 2002148806 A | 5/2002 |
| JP | 2006171439 A | 6/2006 |
| JP | 2008170784 A | 7/2008 |
| JP | 2008268935 A | 11/2008 |
| JP | 2009025707 A | 2/2009 |
| JP | 2009-258585 A | 11/2009 |
| JP | 2010139996 A | 6/2010 |
| JP | 2010197619 A | 9/2010 |
| JP | 2010217884 A | 9/2010 |
| JP | 2011022595 A | 2/2011 |
| JP | 2011123469 A | 6/2011 |
| JP | 2011137888 A | 7/2011 |
| JP | 2011138111 A | 7/2011 |
| TW | 201035121 A1 | 10/2010 |
| TW | 201300954 A1 | 1/2013 |

(Continued)

OTHER PUBLICATIONS

Office Action dated Jul. 1, 2014 issued by the Japanese Patent Office in counterpart Japanese Patent Application No. 2011/218850.
ISR (PCT/ISA/210) issued Oct. 30, 2012, in corresponding International Application No. PCT/JP2012/072288.
Written Opinion (PCT/ISA/237) issued Oct. 30, 2012, in corresponding International Application No. PCT/JP2012/072288.
Office Action dated Feb. 3, 2015, issued by the Japanese Intellectual Property Office in counterpart Japanese Application No. 2011-218550.
Search Report dated May 13, 2015 issued by the European Patent Office in counterpart European Patent Application No. 12836848.7.
Taiwanese Office Action issued in corresponding Taiwanese Patent Application No. 101131565 issued Oct. 8, 2015.

(Continued)

*Primary Examiner* — Brittany Raymond
(74) *Attorney, Agent, or Firm* — Sughrue Mion, PLLC

(57) ABSTRACT

A pattern-forming method includes in this order: step (1) of forming a film with an electron beam-sensitive or extreme ultraviolet radiation-sensitive resin composition that contains (A) a resin having an acid-decomposable repeating unit and capable of decreasing a solubility of the resin (A) in a developer containing an organic solvent by an action of an acid, (B) a compound capable of generating an acid upon irradiation with an electron beam or extreme ultraviolet radiation, (C) a resin having one or more groups selected from the specific group as defined in the specification and (D) a solvent; step (2) of exposing the film with an electron beam or extreme ultraviolet radiation; and step (4) of developing the film with a developer containing an organic solvent after the exposing to form a negative pattern.

18 Claims, No Drawings

(56) References Cited

FOREIGN PATENT DOCUMENTS

| TW | 201312278 A1 | 3/2013 |
| TW | 201319742 A1 | 5/2013 |
| WO | 9608750 A1 | 3/1996 |
| WO | 2010095763 A1 | 8/2010 |
| WO | 2010098493 A1 | 9/2010 |
| WO | 2010140709 A1 | 12/2010 |
| WO | 2011043481 A1 | 4/2011 |
| WO | 2011/077993 A1 | 6/2011 |
| WO | WO 2011-077993 * | 6/2011 |
| WO | 2013039243 A1 | 3/2013 |

OTHER PUBLICATIONS

Decision of Dismissal of Amendment issued in corresponding Japanese Patent Application No. 2011/218550, dated Sep. 29, 2015.

Office Action dated Mar. 14, 2016, issued by the Taiwanese Intellectual Property Office in counterpart Taiwanese Application No. 101131565.

Report of Reconsideration by Examiner before Appeal issued on Mar. 1, 2016 by the Japanese Patent Office in counterpart Japanese Application No. 2011-218550.

* cited by examiner

PATTERN-FORMING METHOD, ELECTRON BEAM-SENSITIVE OR EXTREME ULTRAVIOLET RADIATION-SENSITIVE RESIN COMPOSITION, RESIST FILM, MANUFACTURING METHOD OF ELECTRONIC DEVICE USING THEM AND ELECTRONIC DEVICE

CROSS-REFERENCE TO RELATED APPLICATION(S)

This is a continuation of International Application No. PCT/JP2012/072288 filed on Aug. 28, 2012, claims priority from Japanese Patent Application No. 2011-218550 filed on Sep. 30, 2011, the entire disclosures of which are incorporated herein by reference.

TECHNICAL FIELD

The present invention relates to a pattern-forming method with a developer containing an organic solvent which is preferably used in super-micro-lithography process such as the manufacture of super LSI and high capacity microchips, and other photo-fabrication processes; an electron beam-sensitive or extreme ultraviolet radiation-sensitive resin composition; a resist film; a manufacturing method of an electronic device by using them; and an electronic device. More specifically, the invention relates to a pattern-forming method with a developer containing an organic solvent capable of being preferably used in fine process of semiconductor devices using an electron beam or an EUV ray (wavelength: around 13 nm); an electron beam-sensitive or extreme ultraviolet radiation-sensitive resin composition; a resist film; a manufacturing method of an electronic device by using them; and an electronic device.

BACKGROUND ART

In the manufacturing processes of semiconductor devices such as IC and LSI, fine process by lithography with a photoresist composition has been conventionally carried out. In recent years, ultrafine pattern formation of a sub-micron region and a quarter micron region has been required with higher integration of integrated circuits. In such a circumstance, exposure wavelength also shows a tendency to become shorter such as from g-rays to i-rays, and further to KrF excimer laser rays. Further, besides KrF excimer laser rays, development of lithography using electron beams, X-rays or EUV rays is also now progressing.

Lithography using electron beams, X-rays or EUV rays is positioned as a pattern-forming technique of the next generation or the next of the next generation, and resist compositions of high sensitivity and high resolution are desired.

In particular, for shortening the processing time of wafers, increase of sensitivity is a very important subject. However, pursuit of higher sensitization is accompanied by lowering of pattern form and resolution that is shown by limiting resolution line width, accordingly development of a resist composition satisfying these characteristics at the same time is strongly desired.

High sensitivity, high resolution and a good pattern form are in a relationship of trade-off, and it is very important how to meet these characteristics at the same time.

There are generally two types of actinic ray-sensitive or radiation-sensitive resin compositions, that is, one is a "positive" resin composition using a resin hardly soluble or insoluble in an alkali developer and capable of forming a pattern by making an exposed part soluble in an alkali developer by exposure with radiation, and another is a "negative" resin composition using a resin soluble in an alkali developer and capable of forming a pattern by making an exposed part hardly soluble or insoluble in an alkali developer by exposure with radiation.

As such actinic ray-sensitive or radiation-sensitive resin compositions suitable for lithographic process using electron beams, X-rays or EUV rays, chemical amplification type positive resist compositions primarily utilizing acid catalytic reaction are examined from the viewpoint of the increase in sensitivity, and chemical amplification type positive resist composition comprising phenolic resin having a property insoluble or hardly soluble in an alkali developer and capable of being soluble in an alkali developer by the action of an acid (hereinafter abbreviated to a phenolic acid-decomposable resin), and an acid generator as the main components are effectively used.

On the other hand, in manufacturing semiconductor devices and the like, there are requirements to form patterns having various forms such as lines, trenches, holes, etc. For meeting the requirements for forming patterns having various forms, not only positive resin compositions but also negative actinic ray-sensitive or radiation-sensitive resin compositions have been developed (for example, refer to JP-A-2002-148806 (The term "JP-A" as used herein refers to an "unexamined published Japanese patent application") and JP-A-2008-268935).

In forming super fine patterns, further improvements of the reductions of resolution and a pattern form are required.

For solving these problems, a method of developing an acid-decomposable resin with a developer other than an alkali developer is also proposed (for example, refer to JP-A-2010-217884 and JP-A-2011-123469).

However, it is demanded to satisfy excellent pattern form, high resolution, and high line width roughness (LWR) performance in a super fine processing region at the same time on a higher order.

SUMMARY OF INVENTION

A first object of the invention is to solve the problems in techniques for improving performances in ultrafine processing of semiconductor devices using electron beams or extreme ultraviolet radiation (EUV rays). A second object is to provide a pattern-forming method capable of satisfying an excellent pattern form, high resolution (high critical resolution, etc.), and high line width roughness (LWR) performance on an extremely higher order at the same time. A third object is to provide an electron beam-sensitive or extreme ultraviolet radiation-sensitive resin composition and a resist film. A fourth object is to provide a manufacturing method of an electronic device using the same. A fifth object is to provide an electronic device.

That is, the invention is as follows.

[1] A pattern-forming method, comprising in this order:

step (1) of forming a film with an electron beam-sensitive or extreme ultraviolet radiation-sensitive resin composition that contains (A) a resin having an acid-decomposable repeating unit and capable of decreasing a solubility of the resin (A) in a developer containing an organic solvent by an action of an acid, (B) a compound capable of generating an acid upon irradiation with an electron beam or extreme ultraviolet radiation, (C) a resin having one or more groups selected from the group consisting of a fluorine atom, a group having a fluorine atom, a group having a silicon atom, an alkyl group having 6 or more carbon atoms, a cycloalkyl group having 6 or more carbon atoms, an aryl group having 9 or more carbon atoms, an aralkyl group having 10 or more carbon atoms, an aromatic ring group substituted with at least one alkyl group having 3 or more carbon atoms and an aromatic ring group substituted with at least one cycloalkyl group having 5 or more carbon atoms and (D) a solvent;

step (2) of exposing the film with an electron beam or extreme ultraviolet radiation; and step (4) of developing the film with a developer containing an organic solvent after the exposing to form a negative pattern.

[2] The pattern-forming method as described in [1] above, wherein the resin (C) contains a repeating unit represented by any one of the following formulae (C-Ia) to (C-Id):

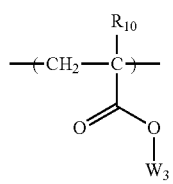

(C-Ia)

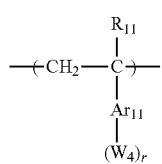

(C-Ib)

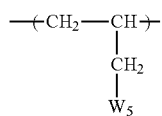

(C-Ic)

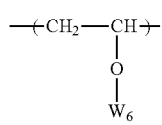

(C-Id)

wherein each of $R_{10}$ and $R_{11}$ independently represents a hydrogen atom, a fluorine atom or an alkyl group;

each of $W_3$, $W_5$ and $W_6$ independently represents an organic group having one or more groups selected from the group consisting of a group having a fluorine atom, a group having a silicon atom, an alkyl group having 6 or more carbon atoms, a cycloalkyl group having 6 or more carbon atoms, an aryl group having 9 or more carbon atoms and an aralkyl group having 10 or more carbon atoms;

$W_4$ represents an organic group having one or more groups selected from the group consisting of a group having a fluorine atom, a group having a silicon atom, an alkyl group having 3 or more carbon atoms and a cycloalkyl group having 5 or more carbon atoms;

$Ar_{11}$ represents an (r+1)-valent aromatic ring group; and r represents an integer of 1 to 10.

[3] The pattern-forming method as described in [1] above, wherein the resin (C) contains a repeating unit represented by the following formula (C-II):

(C-II)

wherein $R_{12}$ represents a hydrogen atom, a methyl group, a trifluoromethyl group or a fluorine atom;

$W_7$ represents an organic group having one or more groups selected from the group consisting of a group having a fluorine atom, a group having a silicon atom, an alkyl group having 3 or more carbon atoms and a cycloalkyl group having 5 or more carbon atoms;

$L_1$ represents a single bond or a —$COOL_2$- group;

$L_2$ represents a single bond or an alkylene group; and n represents an integer of 1 to 5.

[4] The pattern-forming method as described in [3] above, wherein in formula (C-II), $W_7$ represents a trialkylsilyl group, a trialkoxysilyl group, an alkyl group having a trialkylsilyl group, an alkyl group having a trialkoxysilyl group, an alkyl group having 3 or more carbon atoms or a cycloalkyl group having 5 or more carbon atoms.

[5] The pattern-forming method as described in [2] above, wherein the resin (C) further contains a repeating unit having an aromatic ring group other than the repeating unit represented by any one of the formulae (C-Ia) to (C-Id).

[6] The pattern-forming method as described in any one of [1] to [5] above, wherein a content of the acid-decomposable repeating unit in the resin (C) is 5 mol % or less to all repeating units in the resin (C).

[7] The pattern-forming method as described in any one of [1] to [6] above, wherein the resin (A) has one or more groups selected from the group consisting of a hydroxyl group, a cyano group, a lactone group, a carboxylic acid group, a sulfonic acid group, an amido group, a sulfonamido group, an ammonium group, a sulfonium group and a group obtained by combining two or more of these groups.

[8] The pattern-forming method as described in any one of [1] to [7] above, wherein a content of the compound (B) is 21% by mass to 70% by mass on the basis of all solids content of the composition.

[9] The pattern-forming method as described in any one of [1] to [8] above, which is a method for forming a semiconductor ultrafine circuit.

[10] An electron beam-sensitive or extreme ultraviolet radiation-sensitive resin composition, which is used for the pattern-forming method as described in any one of [1] to [9] above.

[11] A resist film, which is formed with the electron beam-sensitive or extreme ultraviolet radiation-sensitive resin composition as described in [10] above.

[12] A manufacturing method of an electronic device, comprising:

the pattern-forming method as described in any one of [1] to [9] above.

[13] An electronic device, which is manufactured by the manufacturing method of an electronic device as described in [12] above.

DESCRIPTION OF EMBODIMENTS

The embodiments of the invention will be described in detail below.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

In the specification of the invention, light includes not only extreme ultraviolet rays (EUV rays) but also electron beams.

Further, "exposure" in the specification includes not only exposure with extreme ultraviolet rays (EUV rays) but also imaging by electron beams unless otherwise indicated.

[Pattern-Forming Method]

A pattern-forming method in the invention is described in the first place.

A pattern-forming method in the invention comprises in order of step (1) of forming a film with an electron beam-sensitive or extreme ultraviolet radiation-sensitive resin composition containing (A) a resin having an acid-decomposable repeating unit and capable of decreasing the solubility in a developer containing an organic solvent by the action of an acid, (B) a compound capable of generating an acid upon irradiation with an electron beam or extreme ultraviolet radiation, (C) a resin having one or more groups selected from the group consisting of a fluorine atom, a group having a fluorine atom, a group having a silicon atom, an alkyl group having 6 or more carbon atoms, a cycloalkyl group having 6 or more carbon atoms, an aryl group having 9 or more carbon atoms, an aralkyl group having 10 or more carbon atoms, an aromatic ring group substituted with at least one alkyl group having 3 or more carbon atoms and an aromatic ring group substituted with at least one cycloalkyl group having 5 or more carbon atoms and (D) a solvent; step (2) of exposing the film with an electron beam or extreme ultraviolet radiation; and step (4) of developing the film with a developer containing an organic solvent after exposure to form a negative pattern.

According to the invention, a pattern-forming method capable of satisfying an excellent pattern form, high resolution and high line width roughness (LWR) performance on an extremely higher order at the same time; an electron beam-sensitive or extreme ultraviolet radiation-sensitive resin composition; a resist film; a manufacturing method of an electronic device using these; and an electronic device can be provided. The reason is not clear but it is presumed as follows.

In the first place, by exposing the resist film containing a resin having an acid-decomposable repeating unit, resin (A) and the acid generated from compound (B) are reacted at the exposed part, by which the degree of solubility of resin (A) in a developer containing an organic solvent (hereinafter also referred to as an organic developer) decreases.

In the next place, by development with the organic developer, the unexposed part is removed by the organic developer and the exposed part remains to thereby form a negative pattern.

Here, the pattern-forming method of performing exposure with an electron beam or extreme ultraviolet radiation is expected to be a method which is capable of well forming an extremely fine pattern (e.g., a pattern having a line width of 50 nm or less).

However, in the case where a line and space pattern having, for example, a line width of 50 nm or less and the ratio of the line width and the space width of 1/1 is formed, a stronger capillary force is liable to occur in the fine space formed at development time, and the capillary force is applied to the side wall of the pattern having a fine line width when the developer is discharged out of the space. And when a positive pattern is formed with an alkali developer, since the affinity of the pattern mainly comprising a resin with the alkali developer has a tendency to be low, the capillary force applied to the side wall of the pattern is great and collapse of the pattern is liable to occur.

On the other hand, when a negative pattern is formed with an organic developer as in the invention, the affinity of the pattern mainly comprising a resin with the organic developer has a tendency to be high, and so the capillary force applied to the side wall of the pattern is small and collapse of the pattern difficultly occurs. It is thought from these facts that high resolution can be achieved (excellent in limit resolution property) according to the invention. Further, the fact that the capillary force is small presumably contributes to the improvement of the line width roughness (LWR) performance.

Incidentally, in particular when extreme ultraviolet radiation (EUV ray) is used as the exposure light source, there arises a problem such that a vacuum ultraviolet ray called out of band light and an ultraviolet ray (wavelength: 130 to 400 nm) occur and even the unexposed part is also sensitized to light. Out of band light is a leaking light of EUV ray and the light strength is weak, and so out of band light is difficult to arrive as far as the deep part of the resist film. In other words, only the surface of the unexposed part of the resist film is liable to be sensitive to out of band light, and malfunctions easily occur such that the surface of the pattern is roughened, the sectional shape of the pattern obtained after development becomes a T-top shape or a reverse taper shape, and the surfaces of parts which should be separated do not separate from each other and a bridged part is generated.

And such malfunctions show conspicuous tendency in a case for obtaining an extremely fine pattern (for example, a pattern having a line width of 50 nm or less).

However, in the pattern-forming method of the invention, the electron beam-sensitive or extreme ultraviolet radiation-sensitive resin composition contains (C) a resin having one or more groups selected from the group consisting of a fluorine atom, a group having a fluorine atom, a group having a silicon atom, an alkyl group having 6 or more carbon atoms, a cycloalkyl group having 6 or more carbon atoms, an aryl group having 9 or more carbon atoms, an aralkyl group having 10 or more carbon atoms, an aromatic ring group substituted with at least one alkyl group having 3 or more carbon atoms and an aromatic ring group substituted with at least one cycloalkyl group having 5 or more carbon atoms.

Since the atoms or groups contained in resin (C) have high hydrophobicity, resin (C) can localize on the surface of the resist film. Highly hydrophobic resin (C) accelerates dissolution of the resist film in an organic developer regardless of exposed part or unexposed part of the resist film. As a result, even in the case of forming an extremely fine pattern as above, roughness on the pattern surface (especially in the case of EUV exposure) and the occurrence of a T-top shape, a reverse taper shape and a bridged part can be restrained, accordingly it is thought that very excellent LWR performance and a pattern form can be obtained.

Further, the fact that very excellent LWR performance and a pattern form can be obtained presumably contributes to the improvement of resolution.

These are the facts of the case, an excellent pattern form, high resolution and high LWR performance can be satisfied on an extremely higher order at the same time according to the invention.

(1) Film Forming

The resist film in the invention is a film formed from the electron beam-sensitive or extreme ultraviolet radiation-sensitive resin composition.

More specifically, the resist film is formed by dissolving each of the components of the later-described electron beam-sensitive or extreme ultraviolet radiation-sensitive resin composition in a solvent and, if necessary, filtering through a filter and applying the resulting solution on a support (a substrate). As the filter, a filter made of polytetrafluoroethylene, polyethylene or nylon each having a pore size of 0.1 μm or less, more preferably 0.05 μm or less, and still more preferably 0.03 μm or less is preferably used.

The composition is applied on a substrate such as the one used in the manufacture of an integrated circuit device (e.g., silicon, silicon dioxide coating) by a proper coating method, e.g., with a spin coater or the like. The coated substrate is then dried to form a photosensitive film. In the drying step, to perform heating (prebaking) is preferred.

The film thickness is not especially restricted, but it is preferably adjusted to the range of 10 nm to 500 nm, more preferably to the range of 10 nm to 200 nm, and still more preferably to the range of 10 nm to 80 nm. When the electron beam-sensitive or extreme ultraviolet radiation-sensitive resin composition is applied with a spinner, the revolution speed is generally 500 rpm to 3,000 rpm, preferably 800 rpm to 2,000 rpm, and more preferably 1,000 rpm to 1,500 rpm.

The temperature of heating (prebaking) is preferably 60° C. to 200° C., more preferably 80° C. to 150° C., and still more preferably 90° C. to 140° C.

The time of heating (prebaking) is not especially restricted, but the time is preferably 30 seconds to 300 seconds, more preferably 30 seconds to 180 seconds, and still more preferably 30 seconds to 90 seconds.

Heating can be performed with a unit attached to ordinary exposing and developing apparatus, and a hot plate and the like may also be used.

If necessary, a commercially available inorganic or organic antireflection film can be used. Further, an antireflection film may be applied on the under layer of an electron beam-sensitive or extreme ultraviolet radiation-sensitive resin composition. As the antireflection films, either an inorganic film, e.g., titanium, titanium dioxide, titanium nitride, chromium oxide, carbon, or amorphous silicon, or an organic film comprising a light absorber and a polymer material may be used. As organic antireflection films, commercially available organic antireflection films, such as DUV 30 series and DUV 40 series (manufactured by Brewer Science) and AR-2, AR-3 and AR-5 (manufactured by Shipley Company L.L.C.) may also be used.

(2) Exposure

Exposure is carried out with extreme ultraviolet radiation (EUV ray) or an electron beam (EB). When extreme ultraviolet radiation (EUV ray) is used as the exposure light source, it is preferred for the formed film to be irradiated with EUV ray (in the vicinity of 13 nm) through a prescribed mask. In irradiation with electron beams (EB), imaging (direct drawing) not via a mask is generally carried out. Exposure with extreme ultraviolet radiation is preferred.

(3) Baking

After exposure and before development, it is preferred to perform baking (heating).

Heating temperature is preferably 60° C. to 150° C., more preferably 80° C. to 150° C., and still more preferably 90° C. to 140° C.

Heating time is not especially restricted but is preferably 30 seconds to 300 seconds, more preferably 30 seconds to 180 seconds, and still more preferably 30 seconds to 90 seconds.

Heating can be performed with a unit attached to ordinary exposing and developing apparatus, and a hot plate and the like may also be used.

The reaction at the exposed part is expedited by baking and sensitivity and a pattern profile are improved. It is also preferred to have a heating step (post baking) after rinsing step. The heating temperature and heating time are as described above. The developer and rinsing solution remained between and within patterns are removed by baking.

(4) Development

In the invention, development is performed with a developer containing an organic solvent.

Developer

The vapor pressure of a developer (in the case of a mixed solvent, the vapor pressure as a whole) at 20° C. is preferably 5 kPa or less, more preferably 3 kPa or less, and especially preferably 2 kPa or less. By making the vapor pressure of an organic solvent 5 kPa or less, evaporation of the developer on a substrate or in a developing cup is inhibited and evenness of temperature in a wafer surface is improved, as a result dimensional evenness in the wafer surface is bettered.

As organic solvents for use as the developer, various organic solvents are widely used. For example, solvents such as ester solvents, ketone solvents, alcohol solvents, amide solvents, ether solvents and hydrocarbon solvents can be used.

In the invention, the ester solvents are solvents having an ester group in the molecule, the ketone solvents are solvents having a ketone group in the molecule, the alcohol solvents are solvents having an alcoholic hydroxyl group in the molecule, the amide solvents are solvents having an amido group in the molecule, and the ether solvents are solvents having an ether bond in the molecule. Of the above solvents, those having a plurality of functional groups in one molecule are also present. In such a case, these solvents are to come within the purview of all the kinds of solvents containing the functional groups that the solvents have. For example, diethylene glycol monomethyl ether is applicable to both of the alcohol solvents and the ether solvents of the above classification. Further, the hydrocarbon solvents are hydrocarbon solvents not having a substituent.

In particular, a developer containing at least one solvent selected from the ketone solvents, ester solvents, alcohol solvents and ether solvents is preferred as the developer in the invention.

As the examples of the ester solvents, e.g., methyl acetate, ethyl acetate, butyl acetate, pentyl acetate, isopropyl acetate, amyl acetate, isoamyl acetate, ethyl methoxyacetate, ethyl ethoxyacetate, propylene glycol monomethyl ether acetate (also known as PGMEA, 1-methoxy-2-acetoxypropane), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl-2-hydroxy propionate, ethyl-2-hydroxy propionate, methyl-3-methoxy propionate, ethyl-3-methoxy propionate, ethyl-3-ethoxy propionate, and propyl-3-methoxy propionate are exemplified.

As the examples of the ketone solvents, e.g., 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylene carbonate, and γ-butyrolactone are exemplified.

As the examples of the alcohol solvents, alcohols, e.g., methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol, 3-methoxy-1-butanol, etc., glycol solvents, e.g., ethylene glycol, diethylene glycol, triethylene glycol, etc., and glycol ether solvents having a hydroxyl group, e.g., ethylene glycol monomethyl ether, propylene glycol monomethyl ether (also known as PGME, 1-methoxy-2-propane), diethylene glycol monomethyl ether, triethylene glycol monoethyl ether, methoxymethylbutanol, ethylene glycol monoethyl ether, ethylene glycol monopropyl ether, ethylene glycol monobutyl ether, propylene glycol monoethyl ether, propylene glycol monopropyl ether, propylene glycol monobutyl ether, propylene glycol monophenyl ether, etc., are exemplified. Of these alcohol solvents, the glycol ether solvents are preferably used.

As the examples of the ether solvents, besides the glycol ether solvents having a hydroxyl group as described above, glycol ether solvents not having a hydroxyl group, e.g., propylene glycol dimethyl ether, propylene glycol diethyl ether, diethylene glycol dimethyl ether, diethylene glycol diethyl ether, etc., aromatic ether solvents, e.g., anisole, phenetole, etc., and dioxane, tetrahydropyran, tetrahydropyran, perfluoro-2-butyltetrahydrofuran, perfluorotetrahydrofuran, 1,4-dioxane, etc., are exemplified. Glycol ether solvents and aromatic ether solvents such as anisole are preferably used.

As the examples of the amide solvents, e.g., N-methyl-2-pyrrolidone, N,N-dimethylacetamide, N,N-dimethylformamide, hexamethyl phosphoric triamide, 1,3-dimethyl-2-imidazolidinone, etc., can be used.

As the examples of the hydrocarbon solvents, aliphatic hydrocarbon solvents, e.g., pentane, hexane, octane, decane, 2,2,4-trimethylpentane, 2,2,3-trimethylhexane, perfluorohexane, perfluoroheptane, etc., and aromatic hydrocarbon solvents e.g., toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene, dipropylbenzene, etc., are exemplified. Of these hydrocarbon solvents, aromatic hydrocarbon solvents are preferably used.

Two or more of these solvents may be blended, or these solvents may be used as mixture with solvents other than the above solvents and water. However, for sufficiently exhibiting the advantage of the invention, the water content as the developer at large is preferably less than 10% by mass, and it is more preferred not to substantially contain water. (In this specification, mass ratio is equal to weight ratio.)

The concentration of the organic solvent (when two or more solvents are blended, as total) in a developer is preferably 50% by mass or more, more preferably 70% by mass or more, and still more preferably 90% by mass or more. Especially preferred is the case consisting of organic solvents alone. Incidentally, the case consisting of organic solvents alone includes the case containing a trace amount of a surfactant, an antioxidant, a stabilizer, a defoaming agent, and the like.

Of the above solvents, it is more preferred to contain one or more solvents selected from the group consisting of butyl acetate, pentyl acetate, isopentyl acetate, propylene glycol monomethyl ether acetate, and anisole.

An organic solvent for use as the developer is preferably an ester solvent.

As the ester solvent, it is more preferred to use the later-described solvent represented by formula (S1) or the later-described solvent represented by formula (S2), it is still more preferred to use the solvent represented by formula (S1), it is especially preferred to use alkyl acetate, and it is most preferred to use butyl acetate, pentyl acetate or isopentyl acetate.

R—C(=O)—O—R'     (S1)

In formula (S1), each of R and R' independently represents a hydrogen atom, an alkyl group, a cycloalkyl group, an alkoxy group, an alkoxycarbonyl group, a carboxyl group, a hydroxyl group, a cyano group, or a halogen atom, and R and R' may be bonded to each other to form a ring.

The carbon atom number of the alkyl group, alkoxy group and alkoxycarbonyl group represented by R and R' is preferably in the range of 1 to 15, and the carbon atom number of the cycloalkyl group is preferably in the range of 3 to 15.

Each of R and R' preferably represents a hydrogen atom or an alkyl group, and the alkyl group, cycloalkyl group, alkoxy group, alkoxycarbonyl group, and the ring formed by bonding of R and R' to each other may be substituted with a hydroxyl group, a group containing a carbonyl group (e.g., an acyl group, an aldehyde group, an alkoxycarbonyl group or the like), or a cyano group.

As the examples of the solvents represented by formula (S1), e.g., methyl acetate, butyl acetate, ethyl acetate, isopropyl acetate, amyl acetate, isoamyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl-2-hydroxy propionate, ethyl-2-hydroxy propionate, and the like are exemplified.

Of the above, each of R and R' is preferably an unsubstituted alkyl group.

The solvent represented by formula (S1) is preferably alkyl acetate, and more preferably butyl acetate, pentyl acetate or isopentyl acetate.

The solvent represented by formula (S1) may be used in combination with one or more other organic solvents. The solvents for use in combination in this case are not especially restricted so long as they can be blended with the solvent represented by formula (S1) without separation. The solvents represented by formula (S1) may be blended with each other. The solvent represented by formula (S1) may be used as mixture with the solvent selected from other ester solvents, ketone solvents, alcohol solvents, amide solvents, ether solvents and hydrocarbon solvents. One or more solvents may be used in combination, but for obtaining stable performance, the solvent to be used in combination is preferably one kind. When one kind of a solvent is used in combination as mixture, the blending ratio of the solvent represented by formula (S1) and the solvent to be used in combination is generally 20/80 to 99/1 as mass ratio, preferably 50/50 to 97/3, more preferably 60/40 to 95/5, and most preferably 60/40 to 90/10.

$$R''-C(=O)-O-R'''-O-R''''  \quad (S2)$$

In formula (S2), each of R" and R"" independently represents a hydrogen atom, an alkyl group, a cycloalkyl group, an alkoxy group, an alkoxycarbonyl group, a carboxyl group, a hydroxyl group, a cyano group, or a halogen atom, and R" and R"" may be bonded to each other to form a ring.

Each of R" and R"" preferably represents a hydrogen atom or an alkyl group. The carbon atom number of the alkyl group, alkoxy group and alkoxycarbonyl group represented by R" and R"" is preferably in the range of 1 to 15, and the carbon atom number of the cycloalkyl group is preferably in the range of 3 to 15.

R'" represents an alkylene group or a cycloalkylene group. R'" preferably represents an alkylene group. The carbon atom number of the alkylene group represented by R'" is preferably in the range of 1 to 10. The carbon atom number of the cycloalkylene group represented by R'" is preferably in the range of 3 to 10.

The alkyl group, cycloalkyl group, alkoxy group, and alkoxycarbonyl group represented by each of R" and R"", the alkylene group and cycloalkylene group represented by R'", and the ring formed by bonding of R" and R"" and to each other may be substituted with a hydroxyl group, a group containing a carbonyl group (e.g., an acyl group, an aldehyde group, an alkoxycarbonyl group or the like), or a cyano group.

The alkylene group represented by R'" in formula (S2) may have an ether bond in the alkylene chain.

The examples of the solvents represented by formula (S2) include, for example, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monoethyl ether acetate, propylene glycol monopropyl ether acetate, methyl-3-methoxy propionate, ethyl-3-methoxy propionate, ethyl-3-ethoxy propionate, propyl-3-methoxy propionate, ethyl methoxyacetate, ethyl ethoxyacetate, 2-methoxybutyl acetate, 3-methoxybutyl acetate, 4-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, etc., and propylene glycol monomethyl ether acetate is preferred.

Of the above, each of R" and R"" preferably represents an unsubstituted alkyl group. R'" preferably represents an unsubstituted alkylene group. Each of R" and R"" more preferably represents either a methyl group or an ethyl group. Still more preferably, each of R" and R"" represents a methyl group.

The solvent represented by formula (S2) may be used in combination with one or more other organic solvents. The solvents for use in combination in this case are not especially restricted so long as they can be blended with the solvent represented by formula (S2) without separation. The solvents represented by formula (S2) may be blended with each other. The solvent represented by formula (S2) may be used as mixture with the solvent selected from other ester solvents, ketone solvents, alcohol solvents, amide solvents, ether solvents and hydrocarbon solvents. One or more solvents may be used in combination, but for obtaining stable performance, the solvent to be used in combination is preferably one kind. When one kind of a solvent is used in combination as mixture, the blending ratio of the solvent represented by formula (S2) and the solvent to be used in combination is generally 20/80 to 99/1 as mass ratio, preferably 50/50 to 97/3, more preferably 60/40 to 95/5, and most preferably 60/40 to 90/10.

As organic solvents for use as the developer, ether solvents can also be preferably exemplified.

As ether solvents that can be used, the above-described ether solvents are exemplified. Of the above ether solvents, ether solvents having one or more aromatic rings are preferred, more preferably a solvent represented by the following formula (S3), and most preferably anisole.

In formula (S3), Rs represents an alkyl group. The alkyl group preferably has 1 to 4 carbon atoms, and is more preferably a methyl group or an ethyl group, and most preferably a methyl group.

In the invention, the water content of the developer is generally 10% by mass or less, preferably 5% by mass or less, more preferably 1% by mass or less, and it is most preferred not to substantially contain water.

Surfactant

To the developer containing an organic solvent may be added an appropriate amount of a surfactant according to necessity.

As the surfactant, the same surfactants as those for use in the later-described electron beam-sensitive or extreme ultraviolet radiation-sensitive resin composition can be used.

The amount of the surfactant to be used is generally 0.001% by mass to 5% by mass of the entire amount of the developer, preferably 0.005% by mass to 2% by mass, and more preferably 0.01% by mass to 0.5% by mass.

Developing Method

As a developing method, for example, a method of dipping a substrate in a tank filled with a developer for a prescribed time (a dipping method), a developing method by swelling a developer by surface tension to slightly above the surface of a substrate and standing still for a prescribed time (a puddling method), a method of spraying a developer on the surface of a substrate (a spraying method), and a method of continuously ejecting a developer by scanning a developer ejection nozzle at a constant speed on a substrate revolving at a constant speed (a dynamic dispensing method) can be applied.

After a development step, a step of stopping development while replacing the developer with other solvent may be performed.

The developing time is not especially restricted so long as it is sufficient for the resin in an unexposed part to be dissolved thoroughly, and is generally 10 seconds to 300 seconds, and preferably 20 seconds to 120 seconds.

The temperature of the developer is preferably 0° C. to 50° C., and more preferably 15° C. to 35° C.

(5) Rinsing

In the pattern-forming method of the invention, rinsing step (5) of rinsing the substrate with a rinsing solution containing an organic solvent may be included after development step (4).

Rinsing Solution

The vapor pressure of a rinsing solution to be used after development (in the case of a mixed solvent, the vapor pressure as a whole) at 20° C. is preferably 0.05 kPa or more and 5 kPa or less, more preferably 0.1 kPa or more and 5 kPa or less, and most preferably 0.12 kPa or more and 3 kPa or less. By making the vapor pressure of a rinsing solution 0.05 kPa or more and 5 kPa or less, evenness of in-plane temperature of the wafer is improved, swelling attributable to the osmosis of a rinsing solution is restrained, and evenness of in-plane dimension of a wafer is bettered.

Various organic solvents are used as the rinsing solution, and it is preferred to use a rinsing solution containing at least one organic solvent selected from hydrocarbon solvents, ketone solvents, ester solvents, alcohol solvents, amide solvents and ether solvents, or water.

It is more preferred to perform a step of rinsing with a rinsing solution containing at least one organic solvent selected from ketone solvents, ester solvents, alcohol solvents, amide solvents and hydrocarbon solvents after development. Still more preferred is to perform a step of rinsing with a rinsing solution containing an alcohol solvent or a hydrocarbon solvent after development.

Especially preferred is to use a rinsing solution containing one or more solvents selected from monohydric alcohols and hydrocarbon solvents.

As the monohydric alcohols for use in the rinsing step after development, straight chain, branched, or cyclic monohydric alcohols are exemplified. Specifically, 1-butanol, 2-butanol, 3-methyl-1-butanol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 3-methyl-3-pentanol, 4-methyl-2-pentanol, 4-methyl-3-pentanol, cyclohexanol, 5-methyl-2-hexanol, 4-methyl-2-hexanol, 4,5-dimethyl-2-hexanol, 6-methyl-2-heptanol, 7-methyl-2-octanol, 8-methyl-2-nonal, 9-methyl-2-decanol, etc., can be used. Of these alcohols, 1-hexanol, 2-hexanol, 1-pentanol, 3-methyl-1-butanol, 3-methyl-2-pentanol, 3-methyl-3-pentanol, 4-methyl-2-pentanol, and 4-methyl-3-pentanol are preferred, and 1-hexanol and 4-methyl-2-pentanol are most preferred.

As the hydrocarbon solvents, aromatic hydrocarbon solvents such as toluene and xylene, and aliphatic hydrocarbon solvents such as octane and decane are exemplified.

The rinsing solution more preferably contains one or more selected from the group consisting of 1-hexanol, 4-methyl-2-pentanol and decane.

Two or more of the above components may be blended, or may be blended with organic solvents other than the above. The above solvents may be mixed with water but the water content in a rinsing solution is generally 60% by mass or less, preferably 30% by mass or less, more preferably 10% by mass or less, and most preferably 5% by mass or less. By making the water content 60% by mass or less, good rinsing characteristics can be obtained.

A proper amount of a surfactant may be added to a rinsing solution.

As the surfactant, the same surfactants as those for use in the later-described electron beam-sensitive or extreme ultraviolet radiation-sensitive resin composition can be used. The amount of the surfactant to be used is generally 0.001% by mass to 5% by mass of the entire amount of the rinsing solution, preferably 0.005% by mass to 2% by mass, and more preferably 0.01% by mass to 0.5% by mass.

Rinsing Method

In the rinsing step, a developed wafer is subjected to rinsing treatment with a rinsing solution containing the above organic solvent.

The method of rinsing treatment is not especially restricted, and, for example, a method of continuously ejecting a rinsing solution on a substrate rotating at a constant speed (a rotary ejecting method), a method of dipping a substrate in a tank filled with a rinsing solution for a prescribed time (a dipping method), and a method of spraying a rinsing solution on the surface of a substrate (a spraying method) can be applied. Of these methods, it is preferred to perform rinsing treatment by the rotary ejecting method and, after rinsing, remove the rinsing solution from the substrate by revolving the substrate by revolution of 2,000 rpm to 4,000 rpm.

The time of rinsing is not particularly limited, and it is generally 10 seconds to 300 seconds, preferably 10 seconds to 180 seconds, and most preferably 20 seconds to 120 seconds.

The temperature of the rinsing solution is preferably 0° C. to 50° C., and more preferably 15° C. to 35° C.

After developing treatment or rinsing treatment, the developer or the rinsing solution adhered on the pattern can be removed by supercritical fluid.

Further, after the developing treatment or rinsing treatment or the treatment by supercritical fluid, heating treatment can be carried out for taking clear away the solvent remaining in the pattern. The temperature of heating is not especially restricted so long as a good resist pattern can be obtained, and is generally 40° C. to 160° C., preferably 50° C. or more and 150° C. or less, and most preferably 50° C. or more and 110° C. or less. The heating time is not especially restricted so long as a good resist pattern can be obtained, and is generally 15 seconds to 300 seconds, and preferably 15 seconds to 180 seconds.

Alkali Development

The pattern-forming method in the invention can further include a step of development with an alkali aqueous solution to form a resist pattern (an alkali development step), by which a further finer pattern can be formed.

In the invention, a part where exposure strength is weak is removed by organic solvent development step (4), and a part where exposure strength is strong is also removed by further performing the alkali development step. By multiple development step of performing a plurality of development steps like this, a pattern can be formed without dissolving an area of intermediate exposure strength alone, so that a pattern that is finer than a usual pattern can be formed (the same mechanism as disclosed in JP-A-2008-292975 [0077]).

The alkali development may be performed either before or after development step (4) with a developer containing an organic solvent, but it is more preferred to be performed before organic solvent development step (4).

As the alkali aqueous solution for use in the alkali development, for example, alkaline aqueous solutions such as inorganic alkalis, e.g., sodium hydroxide, potassium hydroxide, sodium carbonate, sodium silicate, sodium metasilicate, aqueous ammonia, etc., primary amines, e.g., ethylamine, n-propylamine, etc., secondary amines, e.g., diethylamine, di-n-butylamine, etc., tertiary amines, e.g., triethylamine, methyldiethylamine, etc., alcohol amines, e.g., dimethylethanolamine, triethanolamine, etc., quaternary ammonium salts, e.g., tetramethylammonium hydroxide, tetraethylammonium hydroxide, etc., and cyclic amines, e.g., pyrrole, piperidine, etc., are exemplified.

Further, appropriate amounts of alcohols and surfactants can be added to the above alkaline aqueous solutions.

The alkali concentration of the alkali developer is generally 0.1% by mass to 20% by mass.

The pH of the alkali developer is generally 10.0 to 15.0.

An aqueous solution of 2.38% by mass of tetramethylammonium hydroxide is especially preferred.

The time of alkali development is not especially restricted and the time is generally 10 seconds to 300 seconds and preferably 20 seconds to 120 seconds.

The temperature of the alkali developer is preferably 0° C. to 50° C. and more preferably 15° C. to 35° C.

After development with an alkali aqueous solution, rinsing treatment can be carried out. Pure water is preferred as a rinsing solution in the rinsing treatment, and a proper amount of a surfactant can also be added.

Further, after the developing treatment or the rinsing treatment, heating treatment can be carried out for removing the water content remaining in the pattern.

Further, treatment for removing the residual developer or rinsing solution can be performed by heating. The heating temperature is not especially restricted so long as a good resist pattern can be obtained, and it is generally 40° C. to 160° C., preferably 50° C. or more and 150° C. or less, and most preferably 50° C. or more and 110° C. or less. The heating time is not especially restricted so long as a good resist pattern can be obtained, and it is generally 15 seconds to 300 seconds and preferably 15 seconds to 180 seconds.

The film formed from the resist composition according to the invention may be subjected to immersion exposure by filling a liquid having a refractive index higher than that of air (an immersion medium) between the film and lens at the time of irradiation with an actinic ray or radiation. Resolution can be further improved by this immersion exposure. As the immersion medium to be used, any liquid can be used so long as it has a refractive index higher than that of air, but purer water is preferred.

Immersion liquids for use at the time of immersion exposure are described below.

A liquid which is transparent to the exposure wavelength and having the temperature coefficient of refractive index as small as possible is preferred as the immersion liquid so as to confine distortion of the optical image projected on a resist film to the minimum level. Water is preferably used for this purpose from the points of easy availability and handling easiness, in addition to the above viewpoint.

Further, a medium having a refractive index of 1.5 or more can also be used from the point of capable of improvement of refractive index. The medium may be an aqueous solution or may be an organic solvent.

When water is used as the immersion liquid, a trace amount of additive (a liquid) which does not dissolve the resist film on the wafer and the influence of which on the optical coat of the lower surface of the lens is negligible may be added for the purpose of decreasing the surface tension of water and increasing surface activating property. As such additives, aliphatic alcohols having a refractive index almost equal to that of water are preferred, and specifically methyl alcohol, ethyl alcohol and isopropyl alcohol are exemplified. By the addition of an alcohol having a refractive index almost equal to that of water, an advantage such that the change of refractive index as the liquid at large can be made extremely small can be obtained even when the alcohol component in water evaporates and concentration of the content varies. On the other hand, when an impurity whose refractive index is greatly different from that of water is mixed, distortion of the optical image projected on the resist film is caused, and so the water to be used is preferably distilled water. Further, pure water having been filtered through an ion exchange filter may also be used.

Electrical resistance of water is preferably 18.3 MΩ cm or more, TOC (concentration of organic substance) is preferably 20 ppb or less, and water has been preferably subjected to deaeration treatment.

Further, it is also possible to improve lithographic performance by increasing the refractive index of an immersion liquid. From such a point of view, an additive capable of heightening refractive index may be added to water or deuterium oxide ($D_2O$) may be used in place of water.

A hardly soluble film in an immersion liquid (hereinafter also referred to as "topcoat") may be provided between the film formed out of the composition of the invention and an immersion liquid to prevent the film from coming into directly contact with the immersion liquid. Functions necessary to the topcoat are coating aptitude to the upper layer of the film of the composition and slight solubility in the immersion liquid. It is preferred that the topcoat is not mixed with the film of the composition and can be uniformly applied on the upper layer of the composition film.

As the topcoat, a hydrocarbon polymer, an acrylic ester polymer, polymethacrylic acid, polyacrylic acid, polyvinyl ether, a silicon-containing polymer, and a fluorine-containing polymer are specifically exemplified. From the viewpoint of prevention of elution of impurities from a topcoat into an immersion liquid to cause pollution of the optical lens, the residual monomer component of the polymer contained in the topcoat is the smaller the better.

When a topcoat is peeled off, a developer may be used, or a peeling agent may be separately used. As the peeling agent, a solvent little in osmosis into a film is preferred. From the point that a peeling step can be carried out at the same time with a developing treatment step of a film, peeling with a developer containing an organic solvent is preferred.

Resolution is improved when there is no difference in refractive index between the topcoat and the immersion liquid. When water is used as the immersion liquid, the refractive index of the topcoat is preferably near to the refractive index of the immersion liquid. From the viewpoint of making the refractive index of the topcoat near to that of the immersion liquid, it is preferred to contain a fluorine atom in the topcoat. Also from the aspect of transparency and refractive index, the topcoat is preferably a thin film.

It is preferred that the topcoat is not mixed with the film formed of the composition of the invention and also not mixed with the immersion liquid. From this point of view, when water is used as the immersion liquid, the solvent to be used in the topcoat is preferably hardly soluble in the solvent used in the composition of the invention, and is preferably a non-water-soluble medium. Further, when the immersion liquid is an organic solvent, the topcoat may be water-soluble or non-water-soluble.

[1] Electron Beam-Sensitive or Extreme Ultraviolet Radiation-Sensitive Resin Composition The electron beam-sensitive or extreme ultraviolet radiation-sensitive resin compositions usable in the invention are described below.

The electron beam-sensitive or extreme ultraviolet radiation-sensitive resin composition in the invention is used for negative type development (development of a type in which the solubility in a developer of a resin composition decreases by exposure and the exposed part remains as a pattern, and the unexposed part is removed). That is, the electron beam-sensitive or extreme ultraviolet radiation-sensitive resin composition according to the invention can be made an electron beam-sensitive or extreme ultraviolet radiation-sensitive resin composition for organic solvent development for use in development using a developer containing an organic solvent. Here, "for organic solvent development" means the use offered to a development step with a developer containing at least an organic solvent.

Thus, the invention also relates to an electron beam-sensitive or extreme ultraviolet radiation-sensitive resin composition for use in the pattern-forming method according to the invention.

The electron beam-sensitive or extreme ultraviolet radiation-sensitive resin composition according to the invention is typically a resist composition, and especially preferably a negative resist composition (that is, a resist composition for organic solvent development) for the reason of capable of obtaining high effect. The composition according to the invention is also typically a chemical amplification type resist composition.

The composition for use in the invention contains (A) a resin having an acid-decomposable repeating unit and capable of decreasing the solubility in a developer containing an organic solvent by the action of an acid, (B) a compound capable of generating an acid upon irradiation with an electron beam or extreme ultraviolet radiation, (C) a resin having one or more groups selected from the group consisting of a fluorine atom, a group having a fluorine atom, a group having a silicon atom, an alkyl group having 6 or more carbon atoms, a cycloalkyl group having 6 or more carbon atoms, an aryl group having 9 or more carbon atoms, an aralkyl group having 10 or more carbon atoms, an aromatic ring group substituted with at least one alkyl group having 3 or more carbon atoms and an aromatic ring group substituted with at least one cycloalkyl group having 5 or more carbon atoms, and (D) a solvent Resin (A) will be described below.

[1] Resin (A)

(a) Repeating Unit Having an Acid-Decomposable Group

Resin (A) is a resin capable of decreasing the solubility in a developer containing an organic solvent by the action of an acid and has an acid-decomposable repeating unit. The acid-decomposable repeating unit is a repeating unit having a group capable of decomposing by the action of an acid (hereinafter also referred to as "acid-decomposable group") on the main chain or side chain or both main chain and side chain of the resin. A group generated by decomposition is preferably a polar group for the reason that the affinity with the developer containing an organic solvent becomes low, which is preferred to progress insolubilization or slight solubilization (negativation). The polar group is more preferably an acid group. The definition of the polar group has the same meaning with the definition explained in the item of repeating unit (b) described later. The examples of the polar groups generated by decomposition of acid-decomposable groups include an alcoholic hydroxyl group, an amino group and an acid group.

The polar group generated by decomposition of an acid-decomposable group is preferably an acid group.

The acid group is not especially restricted so long as it is a group capable of being insolubilized in a developer containing an organic solvent. As preferred acid groups, a phenolic hydroxyl group, a carboxylic acid group, a sulfonic acid group, a fluorinated alcohol group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris-(alkylcarbonyl)methylene group and a tris(alkylsulfonyl)methylene group are exemplified, and more preferably a carboxylic acid group, a fluorinated alcohol group (preferably hexafluoroisopropanol), a phenolic hydroxyl group and a sulfonic acid group (a group dissociable in a 2.38% by mass tetramethylammonium hydroxide aqueous solution used as conventional resist developer) are exemplified.

Preferred groups as acid-decomposable groups are groups obtained by replacing the hydrogen atoms of these groups by a group capable of leaving by the action of an acid.

As groups capable of leaving by the action of an acid, e.g., —C($R_{36}$)($R_{37}$)($R_{38}$), —C($R_{36}$)($R_{37}$)(O$R_{39}$) and —C($R_{01}$)($R_{02}$)(O$R_{39}$) are exemplified.

In the above formulae, each of $R_{36}$ to $R_{39}$ independently represents an alkyl group, a cycloalkyl group, a monovalent aromatic ring group, a group obtained by combining an alkylene group and a monovalent aromatic ring group, or an alkenyl group. $R_{36}$ and $R_{37}$ may be bonded to each other to form a ring.

Each of $R_{01}$ and $R_{02}$ independently represents a hydrogen atom, an alkyl group, a cycloalkyl group, a monovalent aromatic ring group, a group obtained by combining an alkylene group and a monovalent aromatic ring group, or an alkenyl group.

As acid-decomposable groups, preferably a cumyl ester group, an enol ester group, an acetal ester group and a tertiary alkyl ester group are exemplified, and more preferably a tertiary alkyl ester group is exemplified.

As repeating unit (a), a repeating unit represented by the following formula (V) is more preferred.

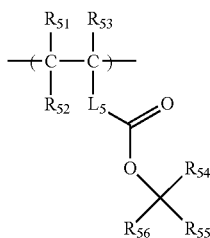

In formula (V), each of $R_{51}$, $R_{52}$ and $R_{53}$ independently represents a hydrogen atom, an alkyl group, a cycloalkyl group, a halogen atom, a cyano group or an alkoxycarbonyl group, and $R_{52}$ may be bonded to $L_5$ to form a ring, and $R_{52}$ represents an alkylene group in that case.

$L_5$ represents a single bond or a divalent linking group, and when $L_5$ forms a ring with $R_{52}$, $L_5$ represents a trivalent linking group.

$R_{54}$ represents an alkyl group; each of $R_{55}$ and $R_{56}$ independently represents a hydrogen atom, an alkyl group, a cycloalkyl group, a monovalent aromatic ring group or an aralkyl group, and $R_{55}$ and $R_{56}$ may be bonded to each other to form a ring, provided that $R_{55}$ and $R_{56}$ do not represent a hydrogen atom at the same time.

Formula (V) will be described in further detail below.

As the examples of the alkyl groups represented by each of $R_{51}$ to $R_{53}$ in formula (V), alkyl groups having 20 or less carbon atoms, e.g., a methyl group, an ethyl group, a propyl group, an isopropyl group, an n-butyl group, a sec-butyl group, a hexyl group, a 2-ethylhexyl group, an octyl group and a dodecyl group, each of which groups may have a substituent, are preferably exemplified, more preferably an alkyl group having 8 or less carbon atoms, and especially preferably an alkyl group having 3 or less carbon atoms.

As the alkyl group contained in the alkoxycarbonyl group, the same groups as in the above alkyl groups represented by each of $R_{51}$ to $R_{53}$ are preferred.

The cycloalkyl group may be monocyclic or polycyclic, and a monocyclic cycloalkyl group having 3 to 8 carbon atoms, e.g., a cyclopropyl group; a cyclopentyl group and a cyclohexyl group, each of which groups may have a substituent, are preferably exemplified.

As the halogen atom, a fluorine atom, a chlorine atom, a bromine atom and an iodine atom are exemplified, and a fluorine atom is especially preferred.

As preferred substituents in each of the above groups, e.g., an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group can be exemplified. The carbon atom number of each substituent is preferably 8 or less.

When $R_{52}$ represents an alkylene group and forms a ring with $L_5$, the alkylene group is preferably an alkylene group having 1 to 8 carbon atoms, and as the examples of preferred alkylene groups, for example, a methylene group, an ethylene group, a propylene group, a butylenes group, a hexylene group and an octylene group are exemplified. An alkylene group having 1 to 4 carbon atoms is more preferred, and an alkylene group having 1 or 2 carbon atoms is especially preferred. The ring formed by bonding of $R_{52}$ and $L_5$ is especially preferably a 5- or 6-membered ring.

As each of $R_{51}$ and $R_{53}$ in formula (V), a hydrogen atom, an alkyl group, or a halogen atom is more preferred, and a hydrogen atom, a methyl group, an ethyl group, a trifluoromethyl group (—$CF_3$), a hydroxymethyl group (—$CH_2$—OH), a chloromethyl group (—$CH_2$—Cl) or a fluorine atom (—F) is especially preferred. As $R_{52}$, a hydrogen atom, an alkyl group, a halogen atom or an alkylene group (forming a ring with $L_5$) is more preferred, and a hydrogen atom, a methyl group, an ethyl group, a trifluoromethyl group (—$CF_3$), a hydroxymethyl group (—$CH_2$—OH), a chloromethyl group (—$CH_2$—Cl), a fluorine atom (—F), a methylene group (forming a ring with $L_5$), or an ethylene group (forming a ring with $L_5$) is especially preferred.

As the divalent linking group represented by $L_5$, an alkylene group, a divalent aromatic ring group, —COO-$L_1$-, —O-$L_1$-, and a group formed by combining two or more of these groups are exemplified. Here, $L_1$ represents an alkylene group, a cycloalkylene group, a divalent aromatic ring group or a group obtained by combining an alkylene group and a divalent aromatic ring group.

$L_5$ preferably represents a single bond, a group represented by —COO-$L_1$-, or a divalent aromatic ring group. $L_1$ preferably represents an alkylene group having 1 to 5 carbon atoms, and more preferably a methylene group or a propylene group. As the divalent aromatic ring group, a 1,4-phenylene group, 1,3-phenylene group, 1,2-phenylene group, or a 1,4-naphthylene group is preferred, and a 1,4-phenylene group is more preferred.

As the trivalent linking group represented by $L_5$ in the case where $L_5$ is bonded to $R_{52}$ and forms a ring, a group obtained by removing one arbitrary hydrogen atom from any of the above-described specific examples of divalent linking groups represented by $L_5$ can be preferably exemplified.

As the alkyl group represented by each of $R_{54}$ to $R_{56}$, an alkyl group having 1 to 20 carbon atoms is preferred, more preferably an alkyl group having 1 to 10 carbon atoms, and especially preferably an alkyl group having 1 to 4 carbon atoms, such as a methyl group, an ethyl group, an n-propyl group, an isopropyl group, an n-butyl group, an isobutyl group, or a t-butyl group.

As the cycloalkyl group, represented by each of $R_{55}$ and $R_{56}$, a cycloalkyl group having 3 to 20 carbon atoms is preferred. The cycloalkyl group may be a monocyclic group such as a cyclopentyl group or a cyclohexyl group, or may be a polycyclic group such as a norbonyl group, an adamantyl group, a tetracyclodecanyl group, or a tetracyclododecanyl group.

As the ring formed by bonding of $R_{55}$ to $R_{56}$ to each other, a group having 3 to 20 carbon atoms is preferred, and the group may be a monocyclic group such as a cyclopentyl group or a cyclohexyl group, or may be a polycyclic group such as a norbonyl group, an adamantyl group, a tetracyclodecanyl group, or a tetracyclododecanyl group. When $R_{55}$ and $R_{56}$ are bonded to each other to form a ring, $R_{54}$ preferably represents an alkyl group having 1 to 3 carbon atoms, and a methyl group or an ethyl group is more preferred.

The monovalent aromatic ring group represented by each of $R_{55}$ and $R_{56}$ is preferably an aromatic ring group having 6 to 20 carbon atoms, which group may be monocyclic or polycyclic, and may have a substituent and, for example, a phenyl group, a 1-naphthyl group, a 2-naphthyl group, a 4-methylphenyl group and a 4-methoxyphenyl group are exemplified. When either one of $R_{55}$ and $R_{56}$ represents a hydrogen atom, the other preferably represents a monovalent aromatic ring group.

The aralkyl group represented by each of $R_{55}$ and $R_{56}$ may be monocyclic or polycyclic, and may have a substituent. Preferred is a group having 7 to 21 carbon atoms and, e.g., a benzyl group and a 1-naphthylmethyl group are exemplified.

A monomer corresponding to the repeating unit represented by formula (V) can be synthesized according to ordinary synthesizing methods of polymeric group-containing esters with no particular restriction.

The specific examples of the repeating units (a) represented by formula (V) are shown below, but the invention is not restricted thereto.

In the specific examples, each of Rx and $Xa_1$ represents a hydrogen atom, $CH_3$, $CF_3$ or $CH_2OH$. Each of Rxa and Rxb independently represents an alkyl group having 1 to 4 carbon atoms, an aryl group having 6 to 18 carbon atoms, or an aralkyl group having 7 to 19 carbon atoms. Z represents a substituent. p represents 0 or a positive integer, preferably 0 to 2, and more preferably 0 or 1. When two or more Z are present, they may be the same with or different from each other. As Z, from the point of increasing contrast of dissolution in a developer containing an organic solvent before and after acid-decomposition, groups consisting of hydrogen atoms or carbon atoms alone are preferably exemplified, for example, a straight chain or branched alkyl group and cycloalkyl group are preferred.

1
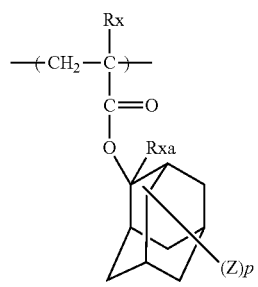

2
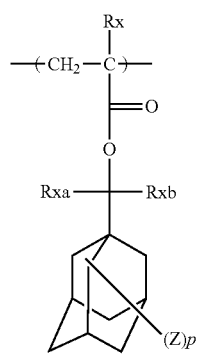

3
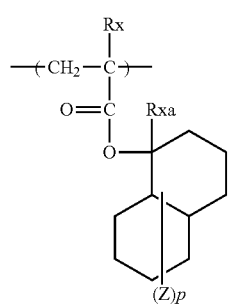

-continued

4
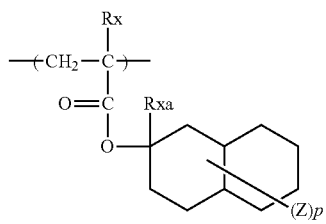

5
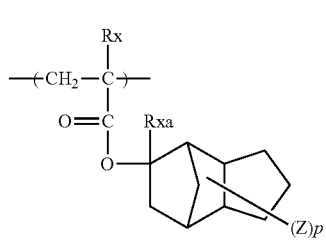

6
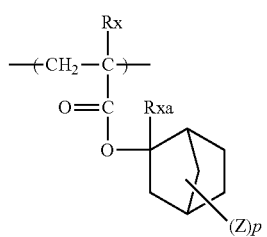

7
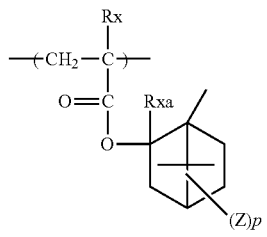

8
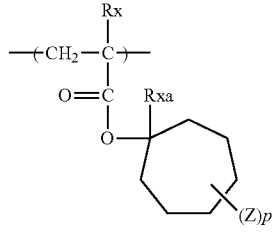

9
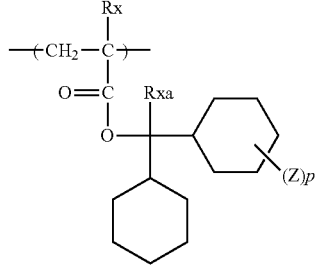

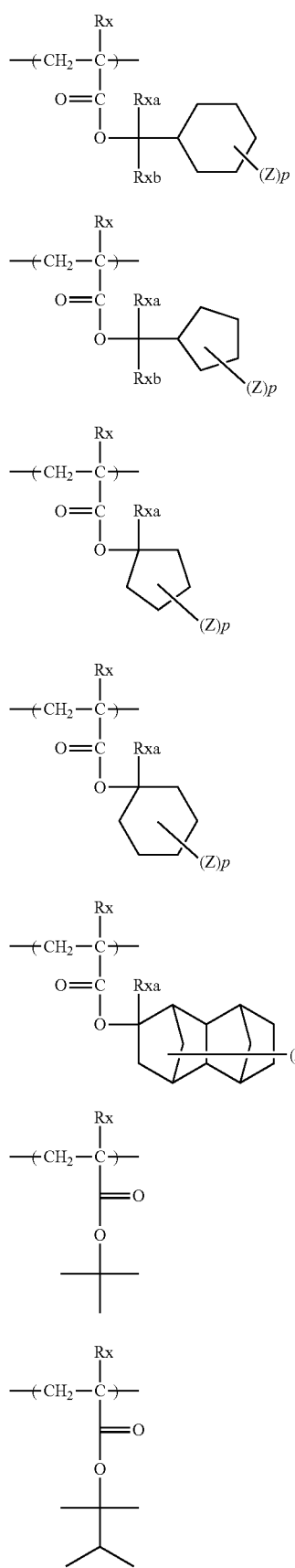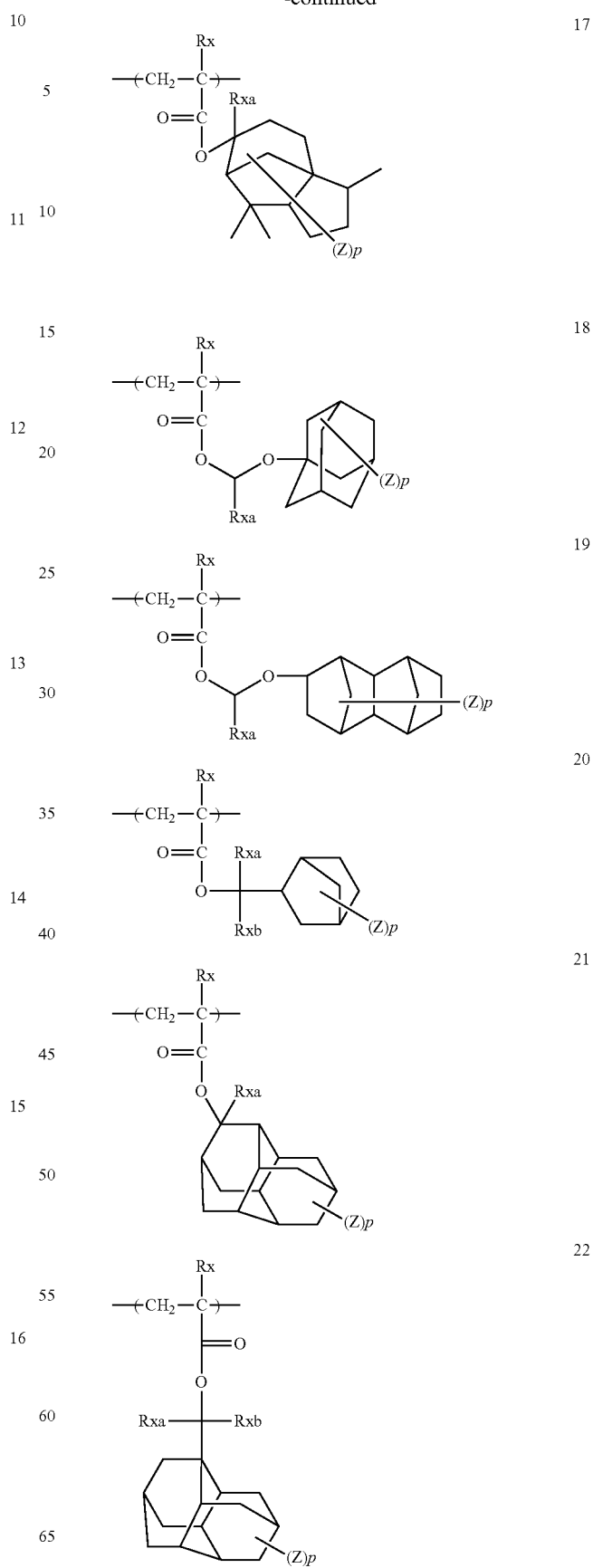

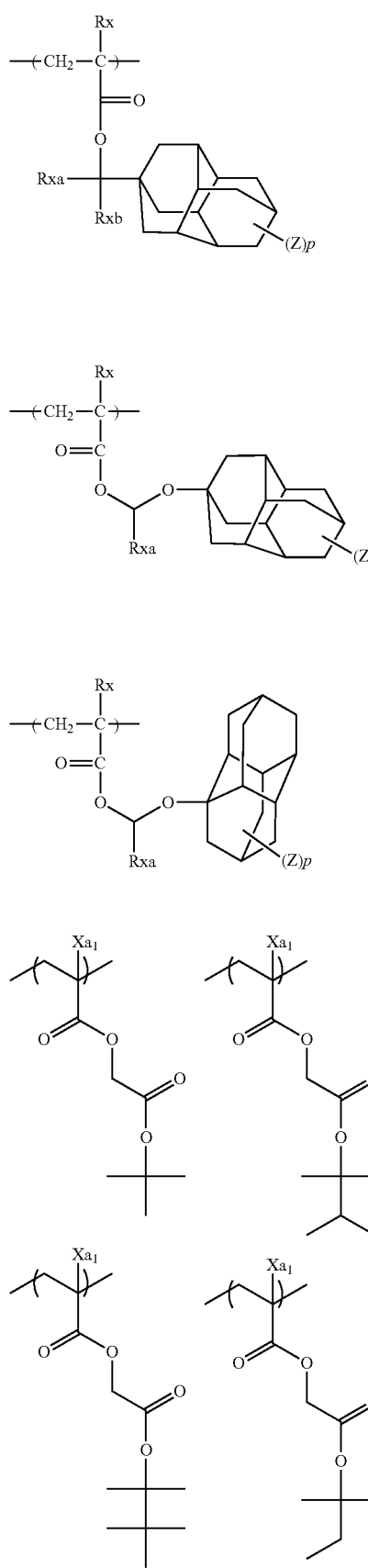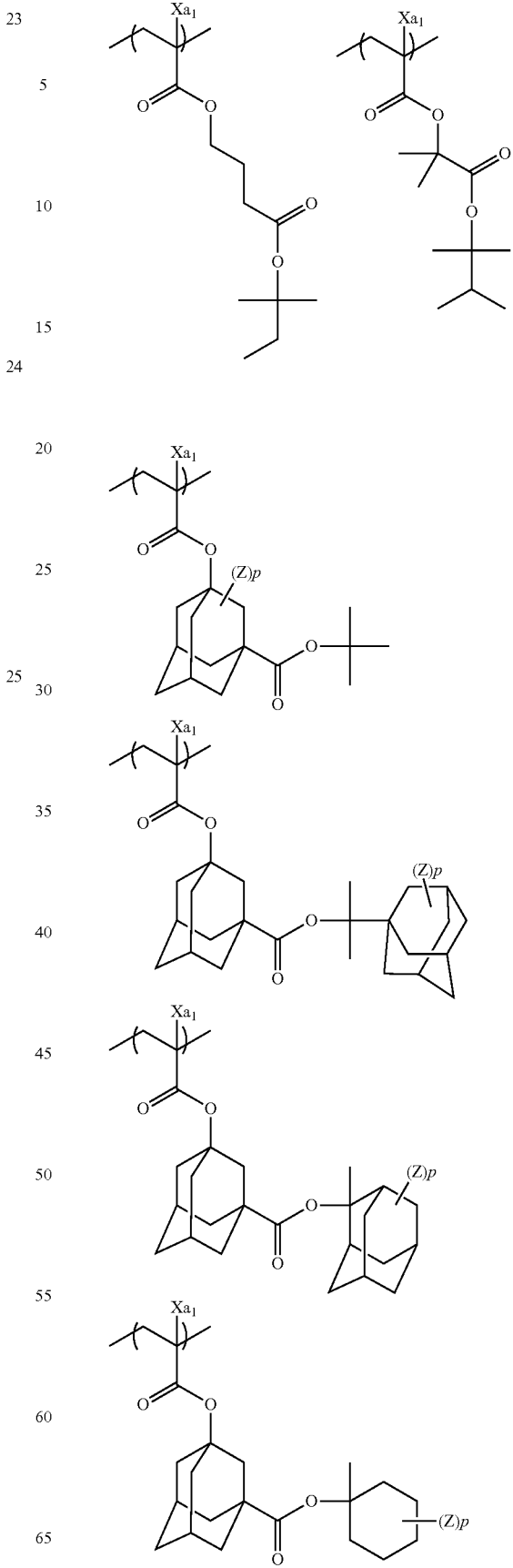

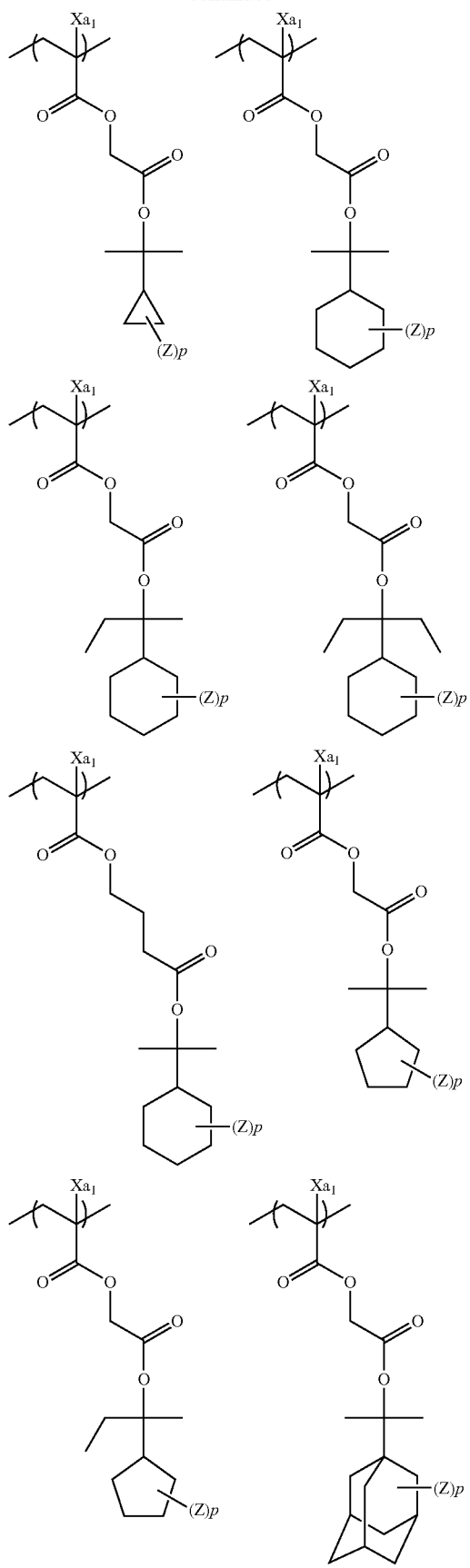
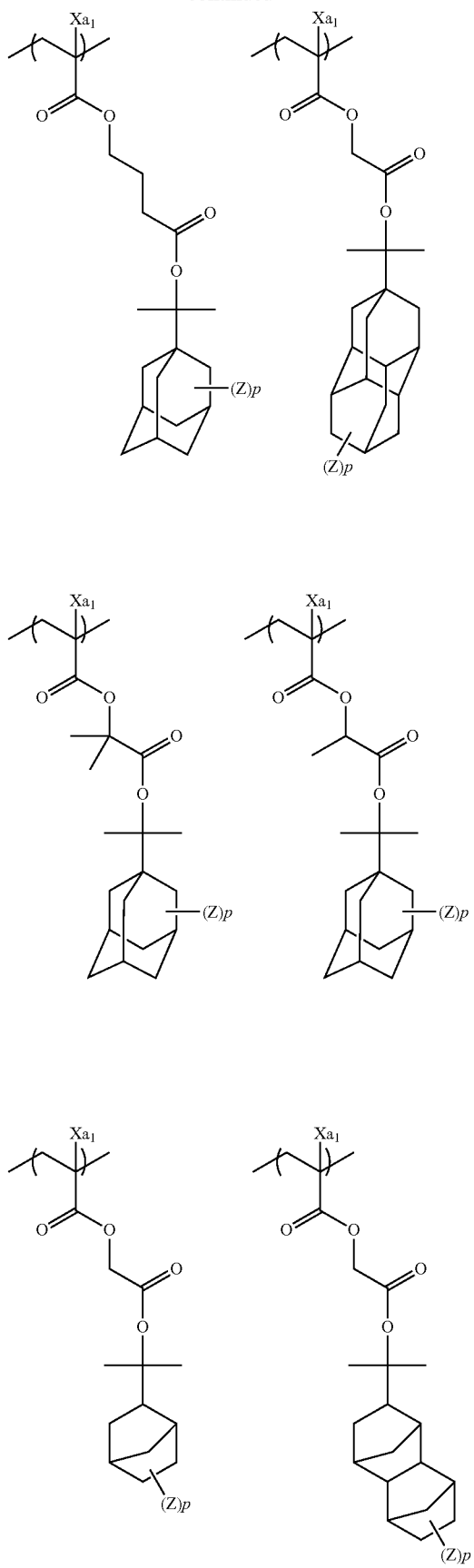

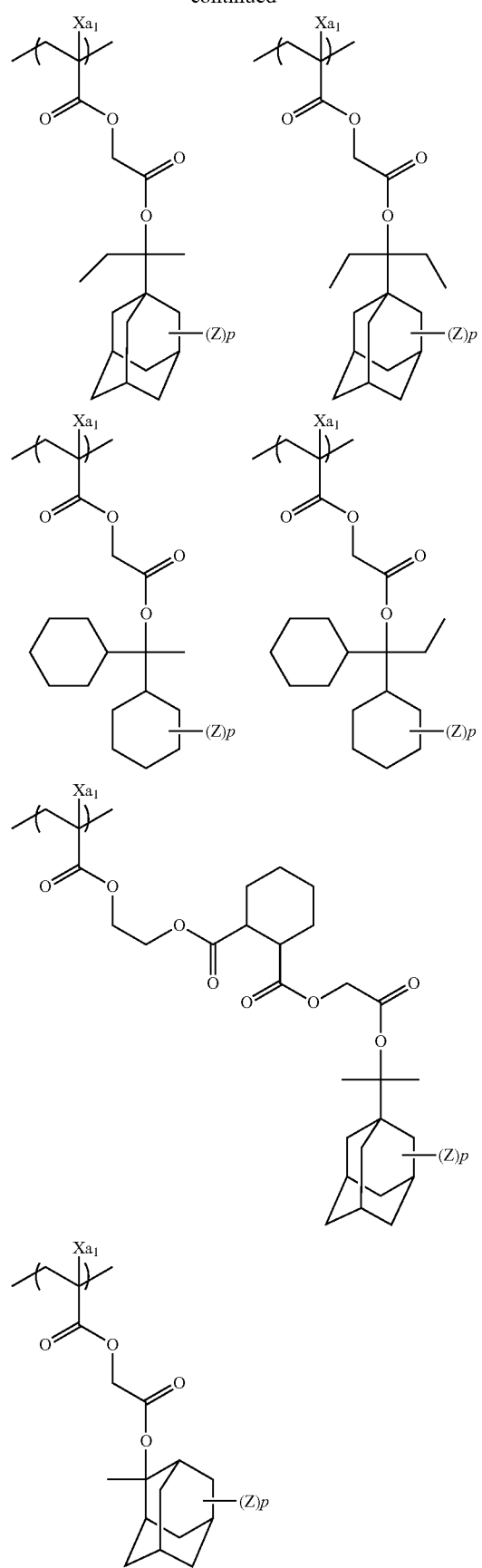
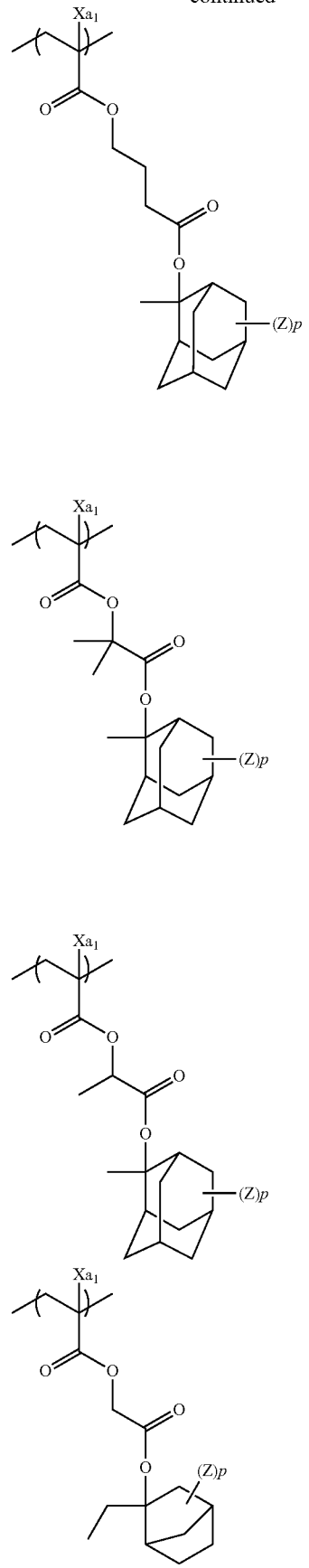

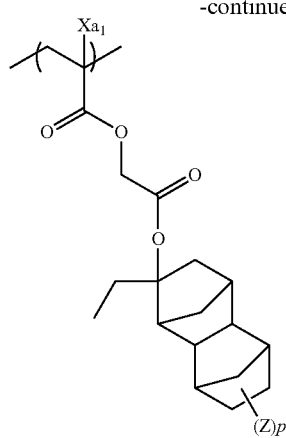
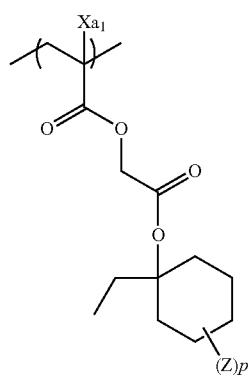
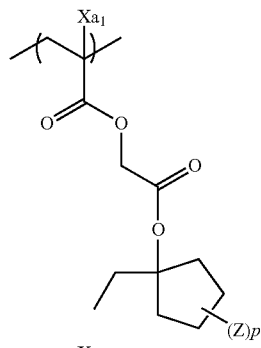
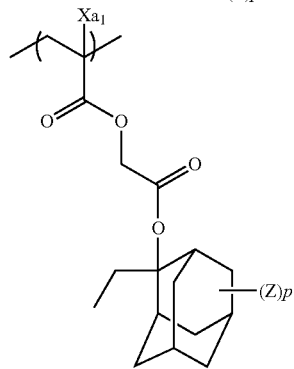
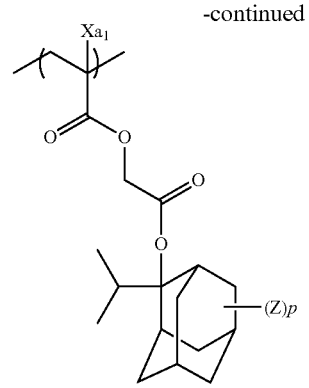
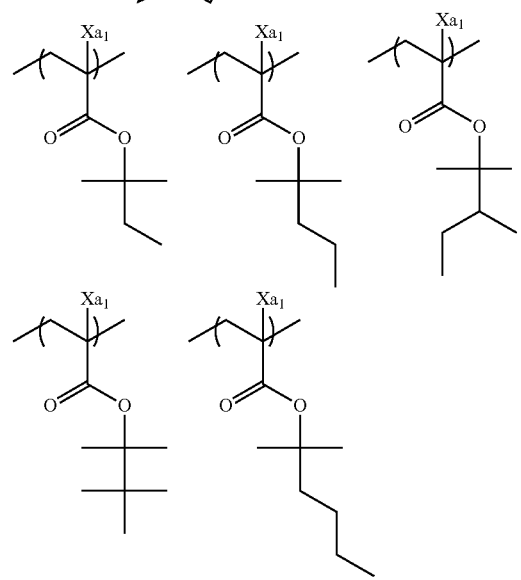
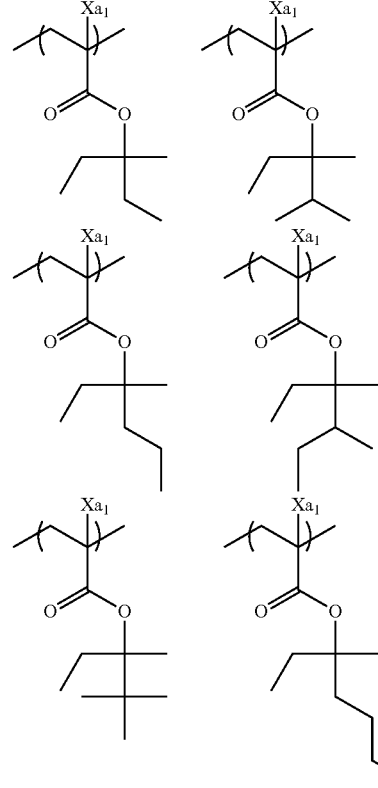

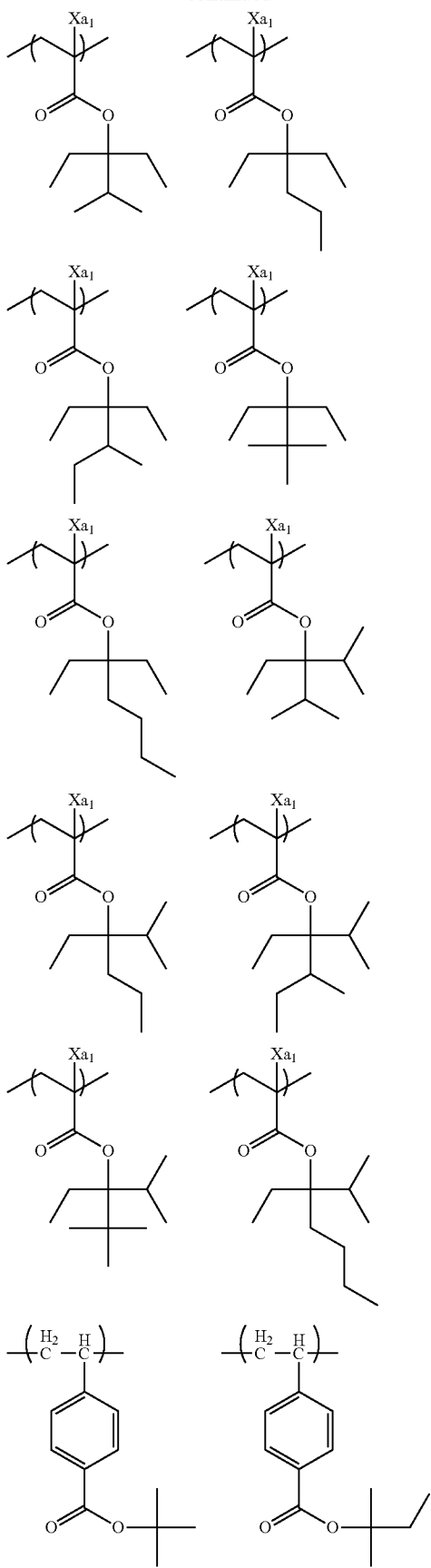
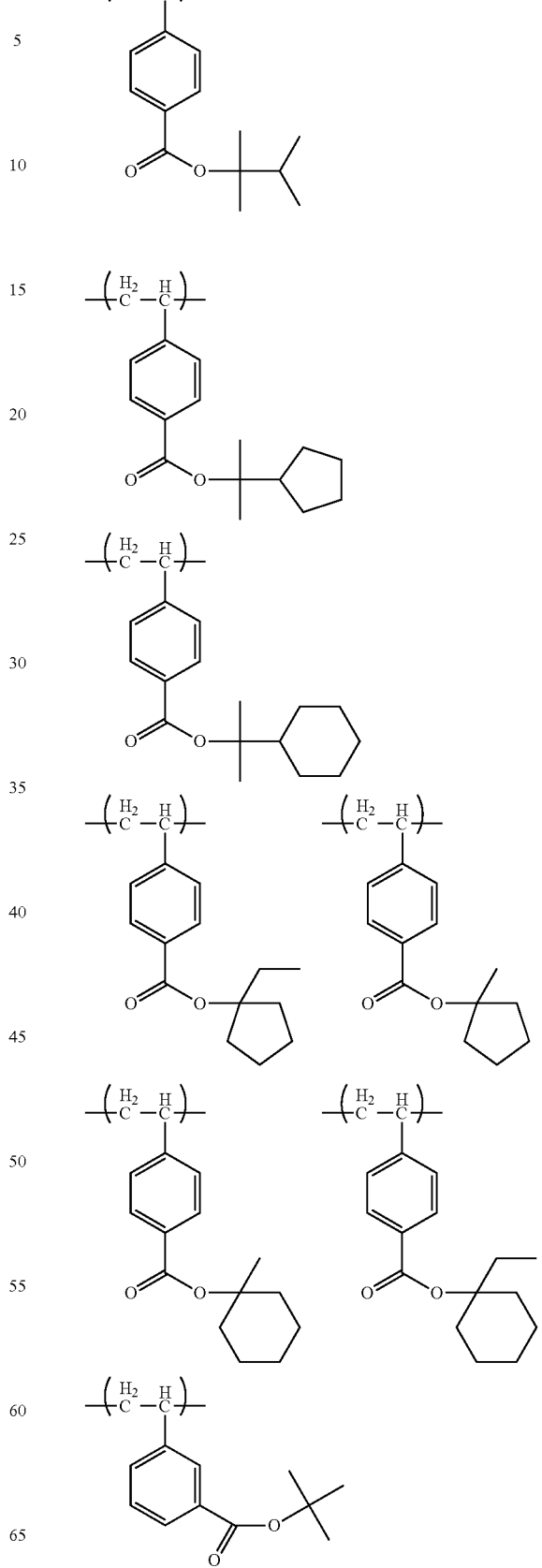

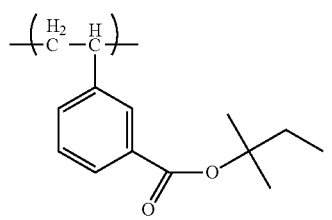
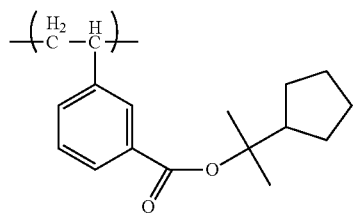
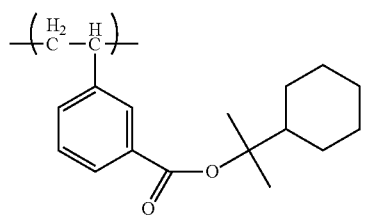
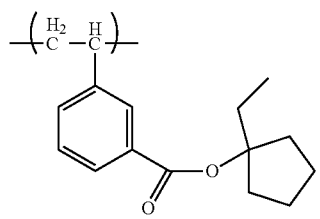
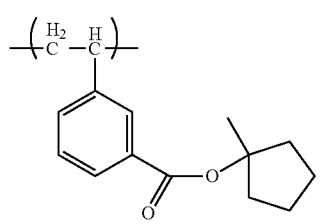
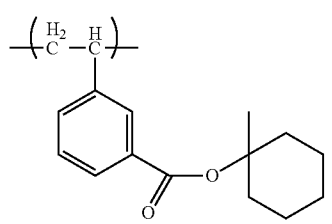
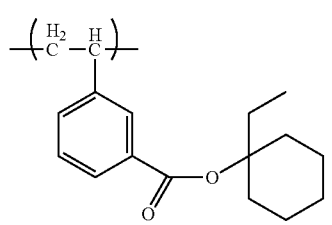
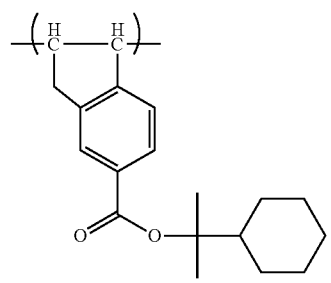
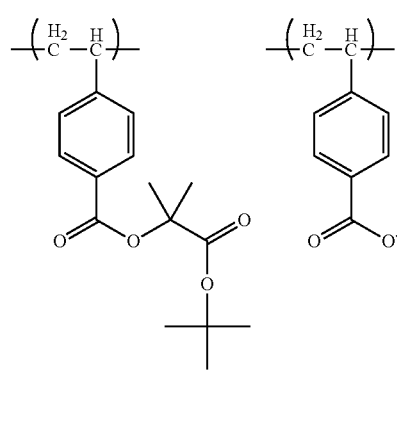
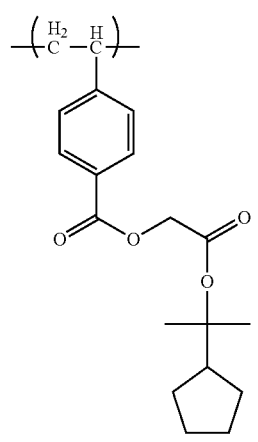
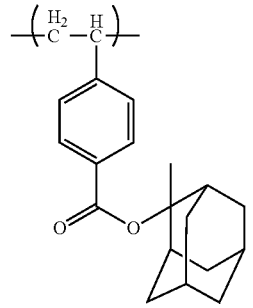

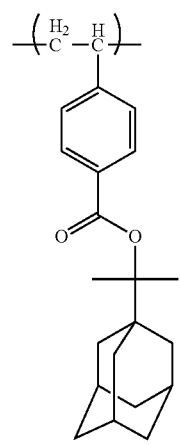
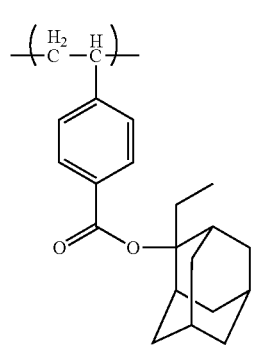
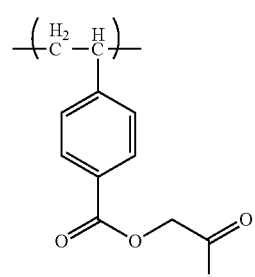
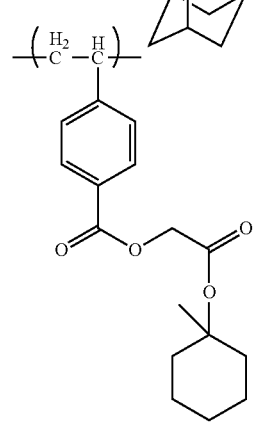
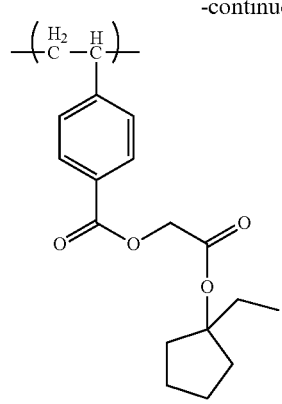
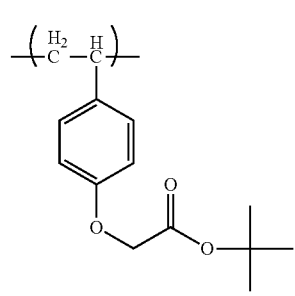
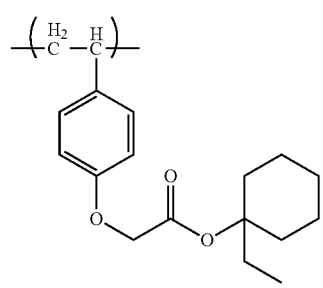
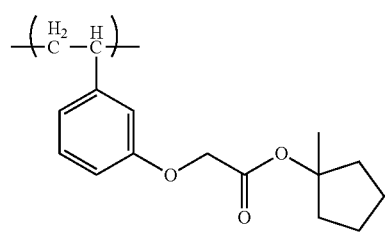
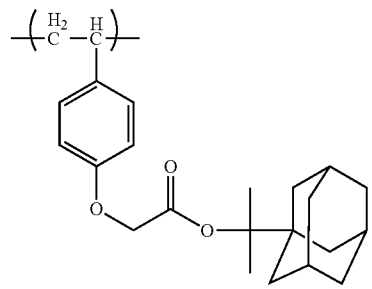

-continued

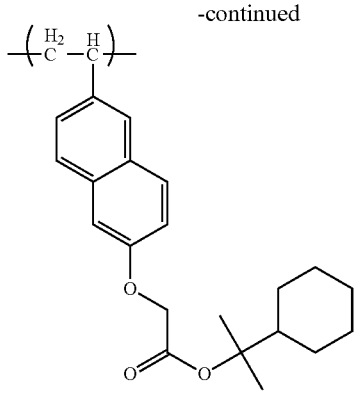

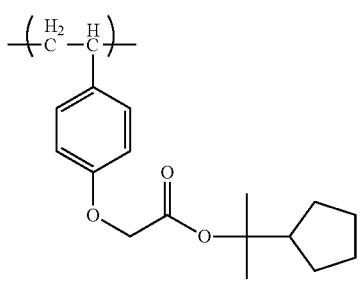

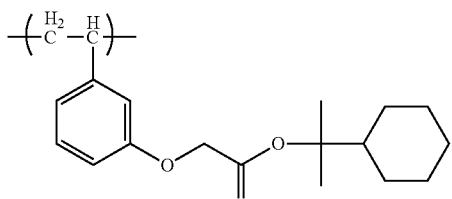

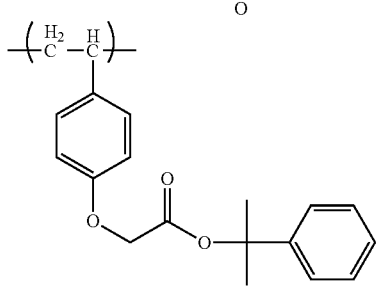

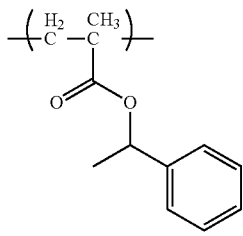

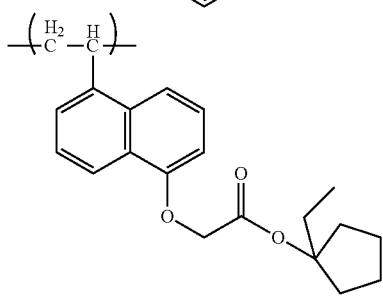

Resin (A) may have a repeating unit represented by the following formula (VI) as repeating unit (a).

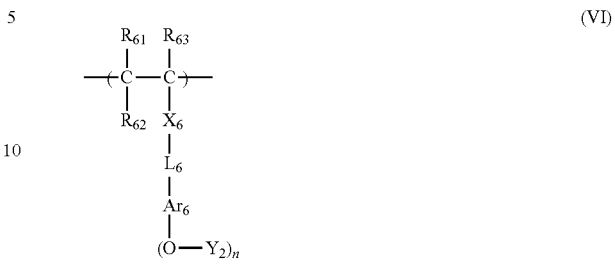

In formula (VI), each of $R_{61}$, $R_{62}$ and $R_{63}$ independently represents a hydrogen atom, an alkyl group, a cycloalkyl group, a halogen atom, a cyano group or an alkoxycarbonyl group. $R_{62}$ may be bonded to $Ar_6$ to form a ring, and $R_{62}$ in such a case represents a single bond or an alkylene group.

$X_6$ represents a single bond, —COO— or —CONR$_{64}$—. $R_{64}$ represents a hydrogen atom or an alkyl group.

$L_6$ represents a single bond or an alkylene group.

$Ar_6$ represents an (n+1)-valent aromatic ring group, and when $Ar_6$ is bonded to $R_{62}$ to form a ring, $Ar_6$ represents an (n+2)-valent aromatic ring group.

Each of $Y_2$ independently represents a hydrogen atom or a group capable of leaving by the action of an acid in the case where n is equal to or larger than 2, provided that at least one of $Y_2$ represents a group capable of leasing by the action of an acid.

n represents an integer of 1 to 4.

Formula (VI) will be described in further detail.

As the alkyl group represented by each of $R_{61}$ to $R_{63}$ in formula (VI), an alkyl group having 20 or less carbon atoms, e.g., a methyl group, an ethyl group, a propyl group, an isopropyl group, an n-butyl group, a sec-butyl group, a hexyl group, a 2-ethylhexyl group, an octyl group and a dodecyl group can be preferably exemplified, each of which may have a substituent, and more preferably an alkyl group having 8 or less carbon atoms can be exemplified.

As the alkyl group contained in the alkoxycarbonyl group, the same alkyl groups as in the above $R_{61}$ to $R_{63}$ are preferred.

The cycloalkyl group may be monocyclic or polycyclic, and a monocyclic cycloalkyl group having 3 to 8 carbon atoms, and a cyclopropyl group, a cyclopentyl group and a cyclohexyl group are preferably exemplified, each of which group may have a substituent.

As the halogen atom, a fluorine atom, a chlorine atom, a bromine atom and an iodine atom are exemplified, and more preferably a fluorine atom.

When $R_{62}$ represents an alkylene group, an alkylene group having 1 to 8 carbon atoms, e.g., a methylene group, an ethylene group, a propylene group, a butylenes group, a hexylene group and an octylene group are preferably exemplified, each of which may have a substituent.

As the alkyl group of $R_{64}$ in —CONR$_{64}$— (wherein $R_{64}$ represents a hydrogen atom or an alkyl group) represented by $X_6$, the same alkyl groups as in the alkyls group represented by each of $R_{61}$ to $R_{63}$ are exemplified.

$X_6$ preferably represents a single bond, —COO— or —CONH—, and more preferably a single bond or —COO—.

As the alkylene group represented by $L_6$, preferably an alkylene group having 1 to 8 carbon atoms, e.g., a methylene group, an ethylene group, a propylene group, a butylenes group, a hexylene group, and an octylene group are exemplified, each of which group may have a substituent. The ring formed by bonding of $R_{62}$ and $L_6$ is especially preferably a 5- or 6-membered ring.

$Ar_6$ represents an (n+1)-valent aromatic ring group. The divalent aromatic ring group in the case where n is 1 may have a substituent. For example, an arylene group having 6 to 18 carbon atoms, e.g., a phenylene group, a tolylene group and a naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole or thiazole are preferably exemplified.

As the specific example of the (n+1)-valent aromatic ring group in the case where n represents an integer of 2 or more, a group obtained by removing arbitrary (n−1)-number of hydrogen atom(s) from any of the above-described specific examples of the divalent aromatic ring groups can be preferably exemplified.

The (n+1)-valent aromatic ring group may further have a substituent.

As the substituents that the above alkyl group, cycloalkyl group, alkoxycarbonyl group, alkylene group, and (n+1)-valent aromatic ring group may have, the same examples with the substituents that each group represented by $R_{51}$, $R_{52}$ or $R_{53}$ in formula (V) above may have are exemplified as specific examples.

n is preferably 1 or 2, and more preferably 1.

Each of n-number of $Y_2$ independently represents a hydrogen atom or a group capable of leaving by the action of an acid, but at least one of n-number of $Y_2$ represents a group capable of leaving by the action of an acid.

As group $Y_2$ capable of leaving by the action of an acid, e.g., —C($R_{36}$)($R_{37}$)($R_{38}$), —C(=O)—O—C($R_{36}$)($R_{37}$)($R_{38}$), —C($R_{01}$)($R_{02}$)(O$R_{39}$), —C($R_{01}$)$R_{02}$)—C(=O)—O—C($R_{36}$)($R_{37}$)($R_{38}$), and —CH($R_{36}$)(Ar) are exemplified.

In the above formulae, each of $R_{36}$ to $R_{39}$ independently represents an alkyl group, a cycloalkyl group, a monovalent aromatic ring group, a group obtained by combining an alkylene group and a monovalent aromatic ring group, or an alkenyl group. $R_{36}$ and $R_{37}$ may be bonded to each other to form a ring.

Each of $R_{01}$ and $R_{02}$ independently represents a hydrogen atom, an alkyl group, a cycloalkyl group, a monovalent, aromatic ring group, a group obtained by combining an alkylene group and a monovalent aromatic ring group, or an alkenyl group.

Ar represents a monovalent aromatic ring group.

The alkyl group represented by each of $R_{36}$ to $R_{39}$, $R_{01}$ and $R_{02}$ is preferably an alkyl group having 1 to 8 carbon atoms, e.g., a methyl group, an ethyl group, a propyl group, an n-butyl group, a sec-butyl group, a hexyl group, and an octyl group are exemplified.

The cycloalkyl group represented by each of $R_{36}$ to $R_{39}$, $R_{01}$ and $R_{02}$ may be monocyclic or polycyclic. As the monocyclic cycloalkyl group, a cycloalkyl group having 3 to 8 carbon atoms is preferred and, e.g., a cyclopropyl group, a cyclobutyl group, a cyclopentyl group, a cyclohexyl group, and a cyclooctyl group can be exemplified. As the polycyclic cycloalkyl group, a cycloalkyl group having 6 to 20 carbon atoms is preferred and, e.g., an adamantyl group, a norbornyl group, an isoboronyl group, a camphanyl group, a dicyclopentyl group, an α-pinel group, a tricyclodecanyl group, a tetracyclododecyl group, and an androstanyl group can be exemplified. The carbon atoms in the cycloalkyl group may be partially replaced by a hetero atom such as an oxygen atom.

The monovalent aromatic ring group represented by each of $R_{36}$ to $R_{39}$, $R_{01}$, $R_{02}$ and Ar is preferably a monovalent aromatic ring group having 6 to 10 carbon atoms. For example, an aryl group, e.g., a phenyl group, a naphthyl group, and an anthryl group, and a divalent aromatic ring group containing a heterocyclic ring such as thiophene, furan, pyrrole, benzothiophene, benzofuran, benzopyrrole, triazine, imidazole, benzimidazole, triazole, thiadiazole, or thiazole can be exemplified.

As the group obtained by combining an alkylene group and a monovalent aromatic ring group represented by each of $R_{36}$ to $R_{39}$, $R_{01}$ and $R_{02}$ is preferably an aralkyl group having 7 to 12 carbon atoms and, for example, a benzyl group, a phenethyl group, and a naphthylmethyl group are exemplified.

The alkenyl group represented by each of $R_{36}$ to $R_{39}$, $R_{01}$ and $R_{02}$ is preferably an alkenyl group having 2 to 8 carbon atoms and, for example, a vinyl group, an allyl group, a butenyl group and a cyclohexenyl group can be exemplified.

The ring formed by bonding of $R_{36}$ and $R_{37}$ to each other may be monocyclic or polycyclic. As the monocyclic type, a cycloalkyl structure having 3 to 8 carbon atoms is preferred and, e.g., a cyclopropane structure, a cyclobutane structure, a cyclopentane structure, a cyclohexane structure, a cycloheptane structure, and a cyclooctane structure can be exemplified. As the polycyclic type, a cycloalkyl structure having 6 to 20 carbon atoms is preferred and, e.g., an adamantane structure, a norbornane structure, a dicyclopentane structure, a tricyclodecane structure, and a tetracyclododecane structure can be exemplified. The carbon atoms in the cycloalkyl structure may be partially substituted with a hetero atom such as an oxygen atom.

Each group represented by each of $R_{36}$ to $R_{39}$, $R_{01}$, $R_{02}$ and Ar may have a substituent. As the substituents, e.g., an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group can be exemplified. The carbon atom number of each substituent is preferably 8 or less.

It is more preferred for group $Y_2$ capable of leaving by the action of an acid to have a structure represented by the following formula (VI-A).

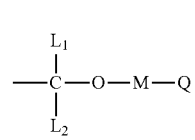

(VI-A)

In formula (VI-A), each of $L_1$ and $L_2$ independently represents a hydrogen atom, an alkyl group, a cycloalkyl group, a monovalent aromatic ring group, or a group obtained by combining an alkylene group and a monovalent aromatic ring group.

M represents a single bond or a divalent linking group.

Q represents an alkyl group, a cycloalkyl group which may contain a hetero atom, a monovalent aromatic ring group which may contain a hetero atom, an amino group, an ammonium group, a mercapto group, a cyano group or an aldehyde group.

At least two of Q, M and L$_1$ may be bonded to form a ring (preferably a 5- or 6-membered ring).

The alkyl group represented by each of L$_1$ and L$_2$ is, for example, an alkyl group having 1 to 8 carbon atoms, and specifically a methyl group, an ethyl group, a propyl group, an n-butyl group, a sec-butyl group, a hexyl group, and an octyl group can be preferably exemplified.

The cycloalkyl group represented by each of L$_1$ and L$_2$ is, for example, a cycloalkyl group having 3 to 15 carbon atoms, and specifically a cyclopentyl group, a cyclohexyl group, a norbornyl group and an adamantyl group can be preferably exemplified.

The monovalent aromatic ring group represented by each of L$_1$ and L$_2$ is, for example, an aryl group having 6 to 15 carbon atoms, and specifically a phenyl group, a tolyl group, a naphthyl group, and an anthryl group can be preferably exemplified.

The group obtained by combining an alkylene group and a monovalent aromatic ring group represented by each of L$_1$ and L$_2$ is, for example, a group having 6 to 20 carbon atoms, and an aralkyl group such as a benzyl group and a phenethyl group can be exemplified.

As the divalent linking group represented by M, for example, an alkylene group (e.g., a methylene group, an ethylene group, a propylene group, a butylene group, a hexylene group, and an octylene group), a cycloalkylene group (e.g., a cyclopentylene group, a cyclohexylene group, and an adamantylene group), an alkenylene group (e.g., an ethenylene group, a propenylene group, and a butenylene group), a divalent aromatic ring group (e.g., a phenylene group, a tolylene group, and a naphthylene group), —S—, —O—, —CO—, —SO$_2$—, —N(R$_0$)—, and divalent linking groups obtained by combining a plurality, of these groups are exemplified. R$_0$ represents a hydrogen atom or an alkyl group (e.g., an alkyl group having 1 to 8 carbon atoms, specifically a methyl group, an ethyl group, a propyl group, an n-butyl group, a sec-butyl group, a hexyl group, and an octyl group).

The alkyl group represented by Q is the same with each group represented by L$_1$ and L$_2$.

As the alicyclic hydrocarbon group not containing a hetero atom and the monovalent aromatic ring group not containing a hetero atom in the cycloalkyl group which may contain a hetero atom and the monovalent aromatic ring group which may contain a hetero atom represented by Q, the cycloalkyl group and the monovalent aromatic ring group represented by L$_1$ and L$_2$ are exemplified, and preferably the carbon atom number is 3 to 15.

As the cycloalkyl group containing a hetero arom and the monovalent aromatic ring group containing a hetero arom, groups having a heterocyclic structure, e.g., thiirane, cyclothioran, thiophene, furan, pyrrole, benzothiophene, benzofuran, benzopyrrole, triazine, imidazole, benzimidazole, triazole, thiadiazole, thiazole, and pyrrolidone are exemplified, but they are not restricted thereto so long as they have a structure generally called a heterocyclic structure (a ring formed by carbon atoms and hetero atoms, or a ring formed by hetero atoms).

As the ring which may be formed by bonding of at least two of Q, M and L$_1$, a case where at least two of Q, M and L$_1$ are bonded to form, e.g., a propylene group or a butylenes group to form a 5- or 6-membered ring containing oxygen atoms is exemplified.

Each group represented by L$_1$, L$_2$, M and Q in formula (VI-A) may have a substituent and, for example, the substituents exemplified above as the examples of the substituents that each of R$_{36}$ to R$_{39}$, R$_{01}$, R$_{02}$ and Ar may have are exemplified. The carbon atom number of the substituents is preferably 8 or less.

As the group represented by -M-Q, a group comprised of 1 to 30 carbon atoms is preferred, and a group comprised of 5 to 20 carbon atoms is more preferred.

As the preferred specific examples of repeating unit (a), the specific examples of the repeating unit represented by formula (VI) are shown below, but the invention is not restricted thereto.

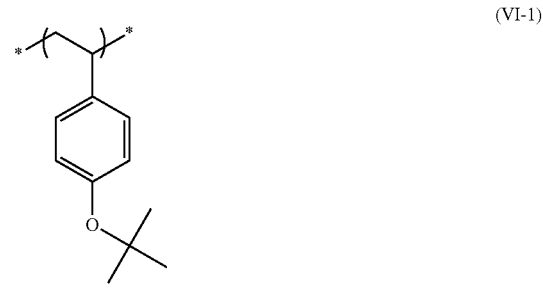

(VI-1)

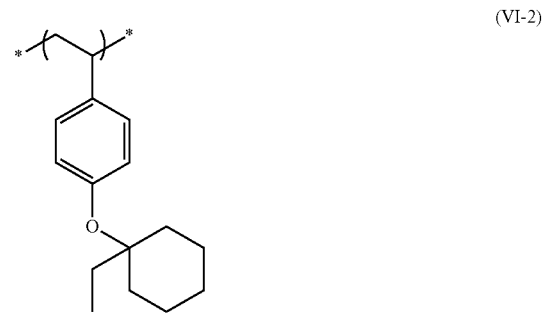

(VI-2)

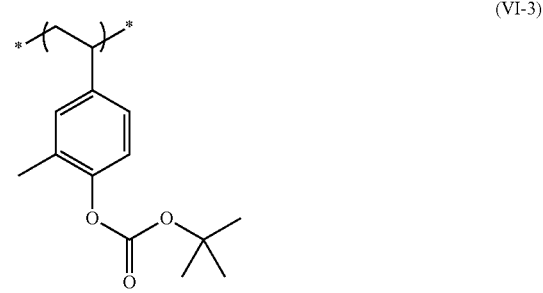

(VI-3)

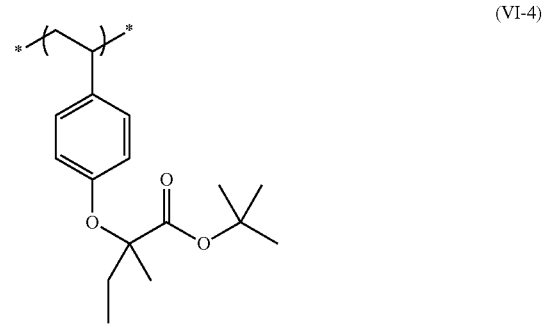

(VI-4)

(VI-5) 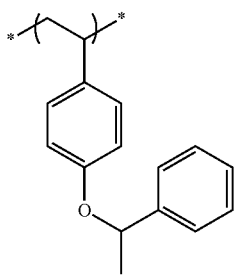
(VI-6) 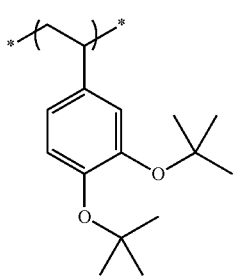
(VI-7) 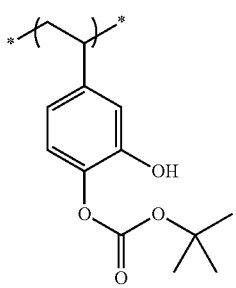
(VI-8) 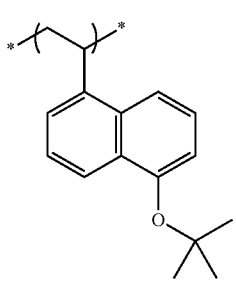
(VI-9) 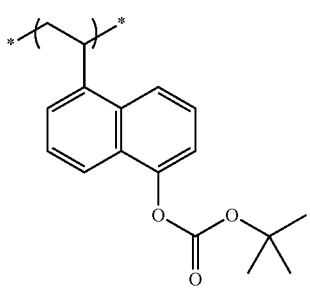
(VI-10) 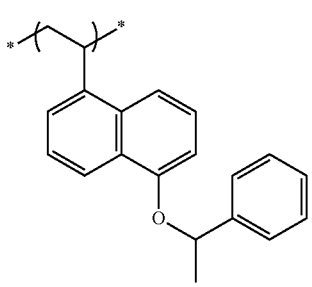
(VI-11) 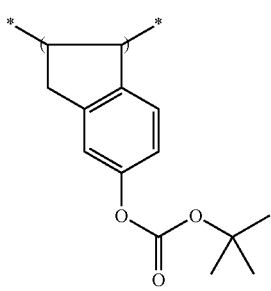
(VI-12) 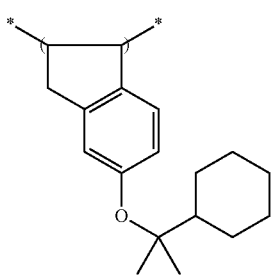
(VI-13) 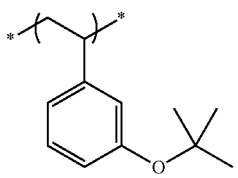
(VI-14) 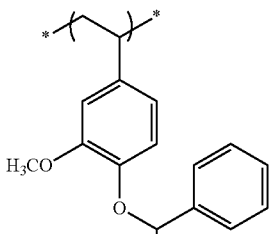
(VI-15) 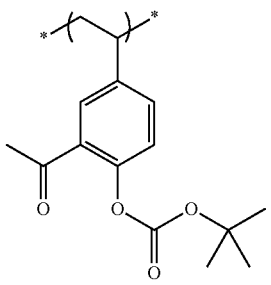

(VI-16) 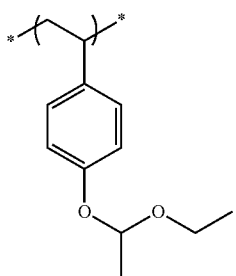
(VI-17) 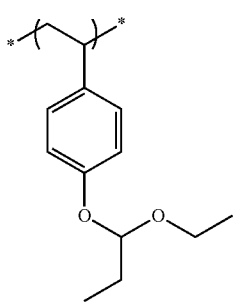
(VI-18) 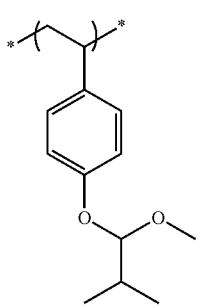
(VI-19) 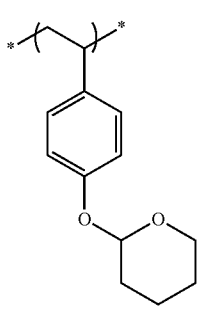
(VI-20) 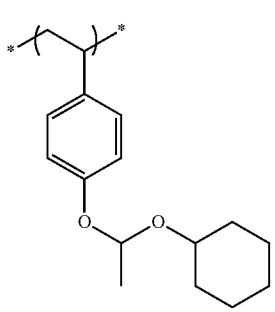
(VI-21) 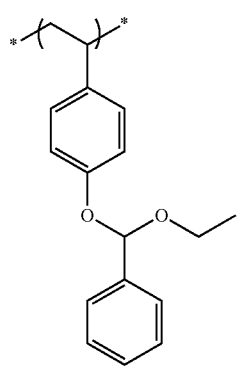
(VI-22) 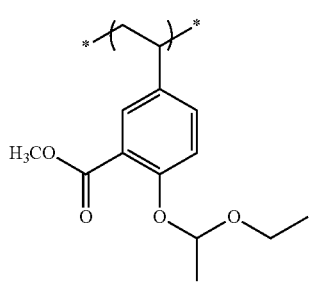
(VI-23) 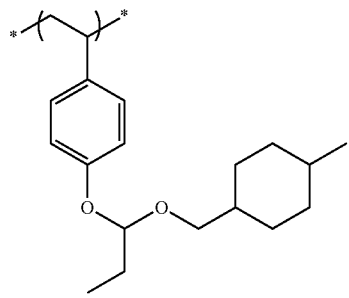
(VI-24) 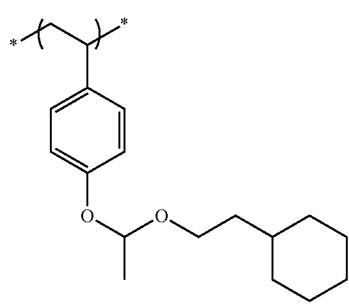
(VI-25) 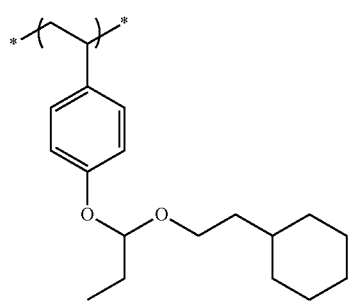

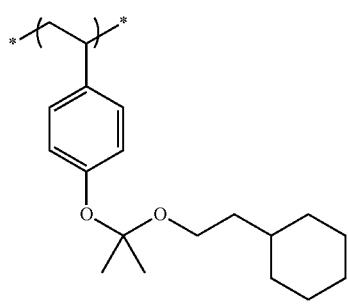
(VI-26)
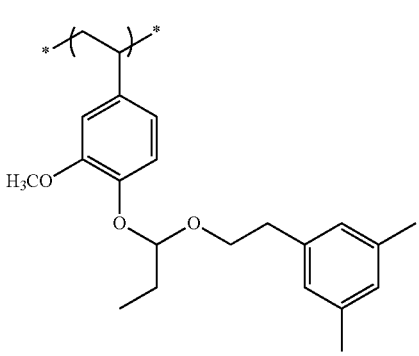
(VI-31)
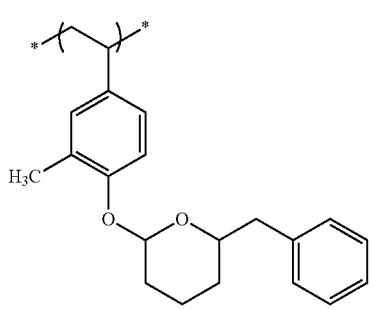
(VI-27)
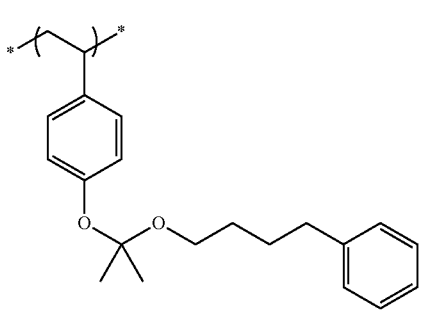
(VI-32)
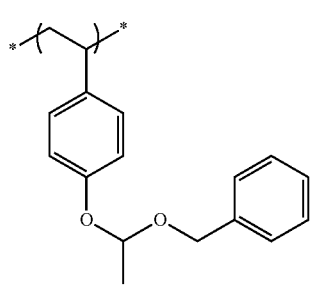
(VI-28)
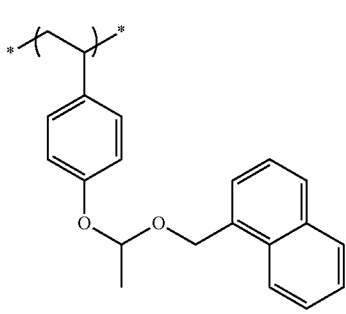
(VI-33)
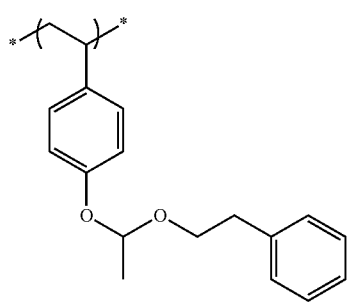
(VI-29)
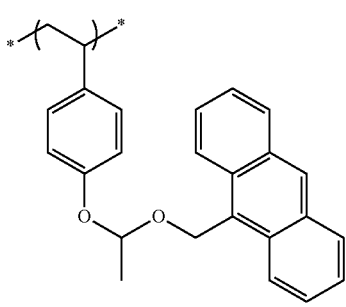
(VI-34)
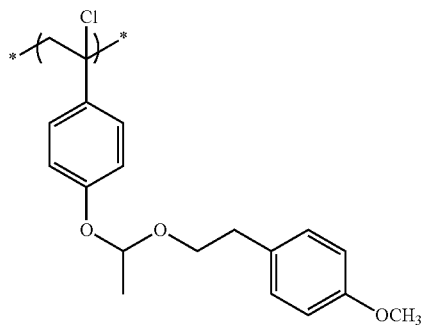
(VI-30)
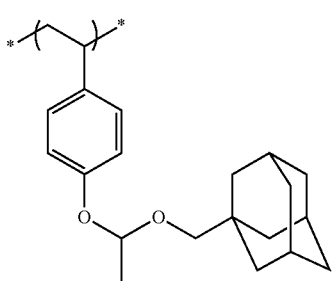
(VI-35)

(VI-36)
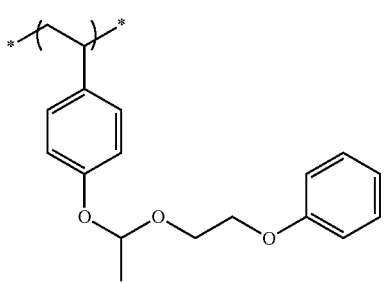
(VI-37)
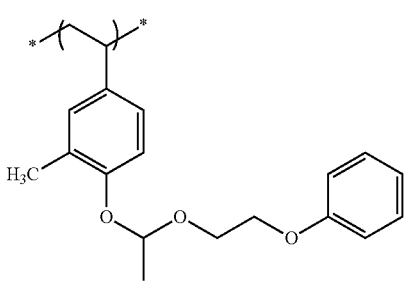
(VI-38)
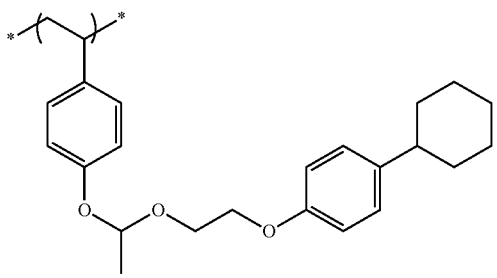
(VI-39)
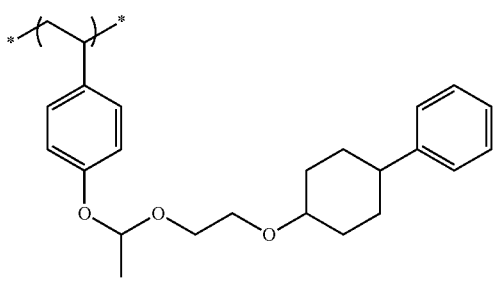
(VI-40)
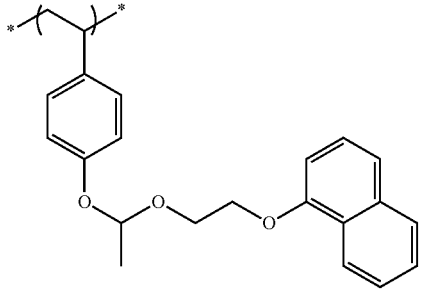
(VI-41)
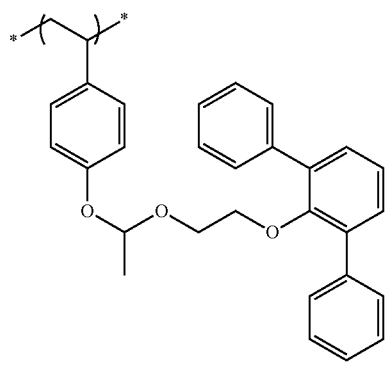
(VI-42)
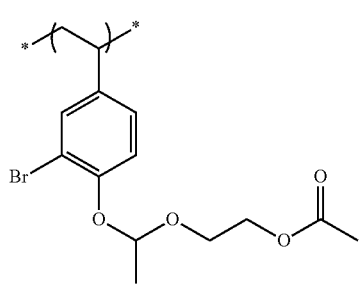
(VI-43)
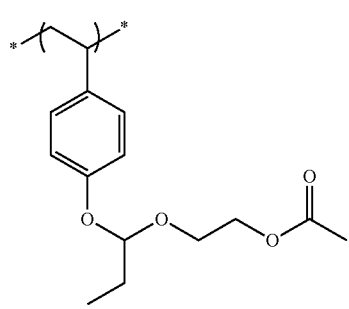
(VI-44)
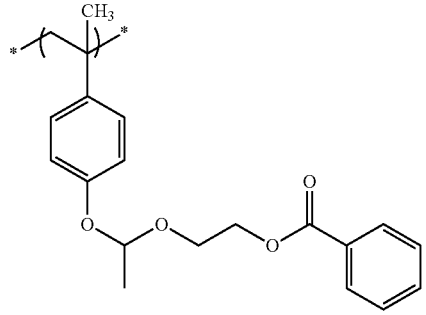
(VI-45)
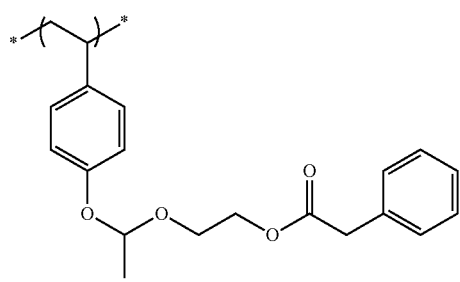

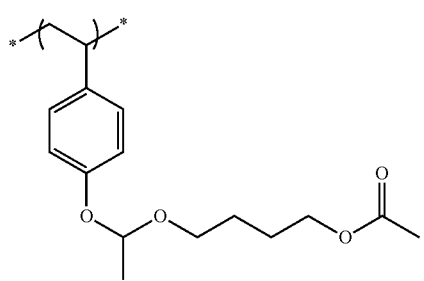 (VI-46)
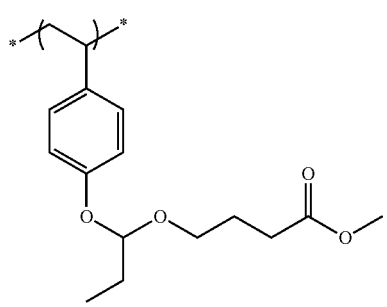 (VI-47)
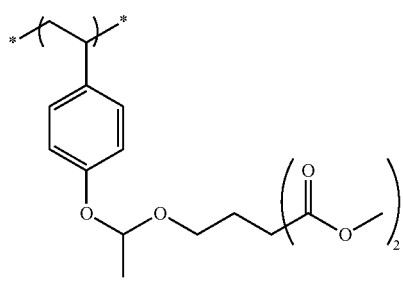 (VI-48)
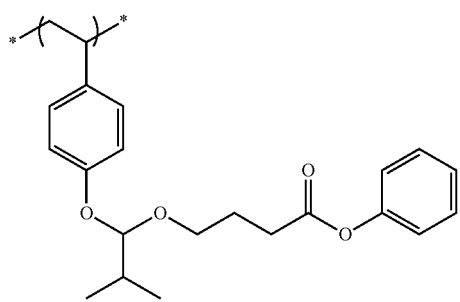 (VI-49)
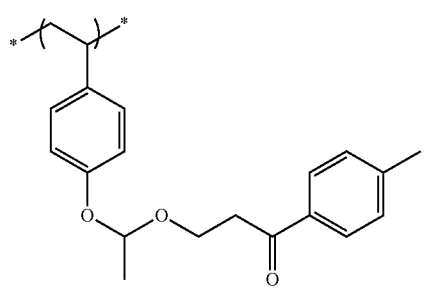 (VI-51)
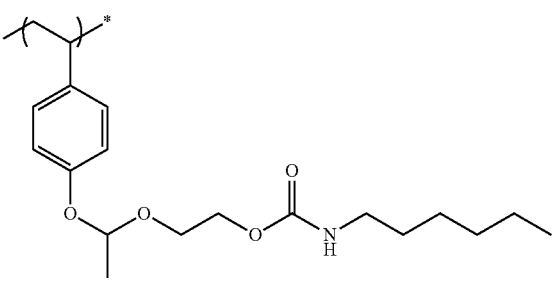 (VI-52)
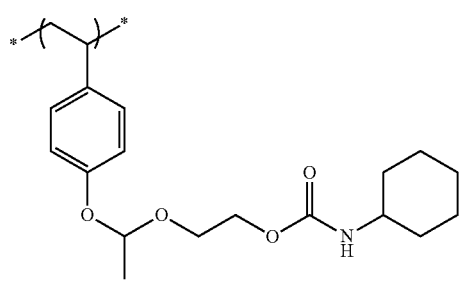 (VI-53)
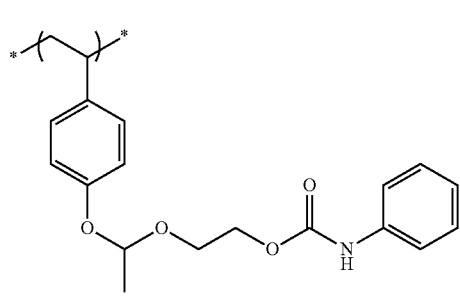 (VI-54)
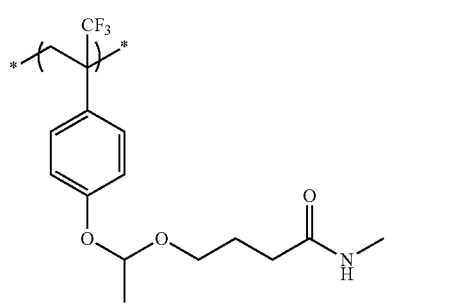 (VI-55)
(VI-50)

(VI-56)
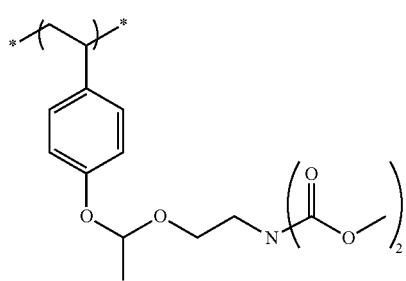
(VI-57)
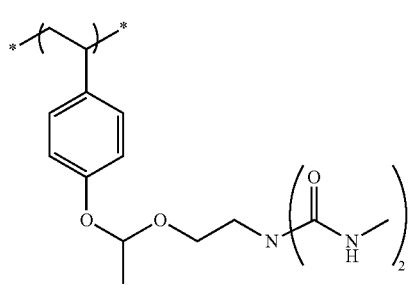
(VI-58)
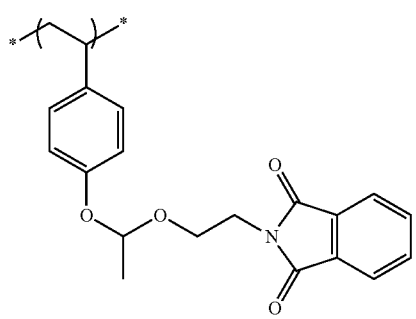
(VI-59)
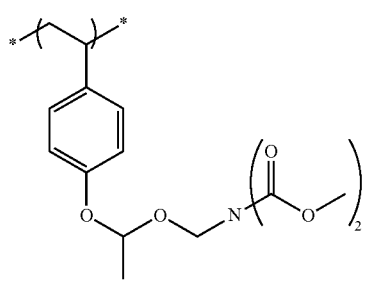
(VI-60)
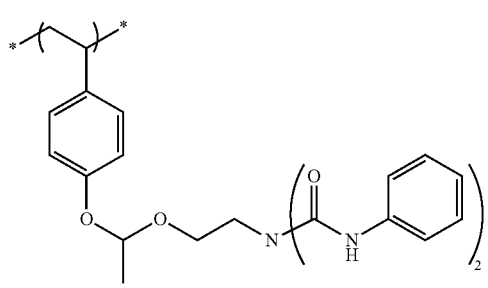
(VI-61)
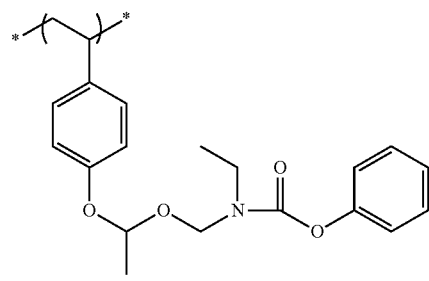
(VI-62)
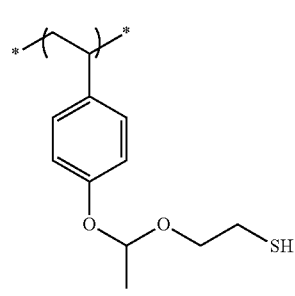
(VI-63)
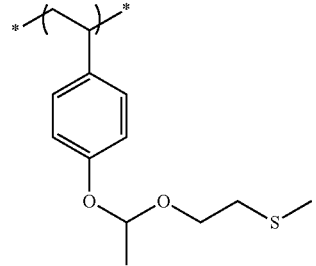
(VI-64)
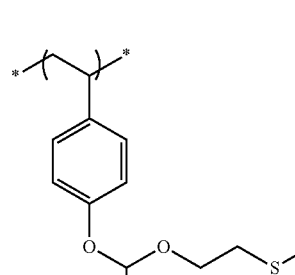
(VI-65)
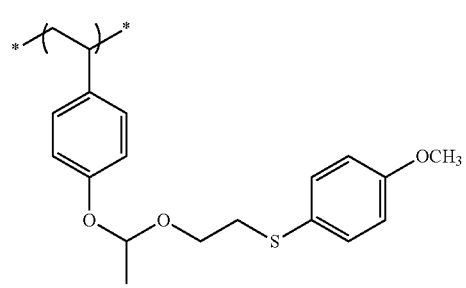

(VI-66)
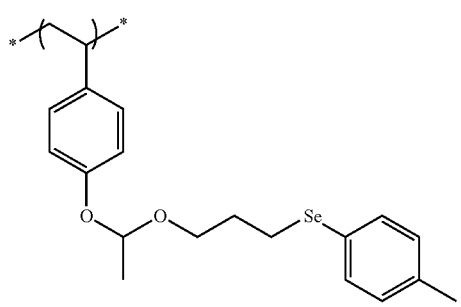
(VI-67)
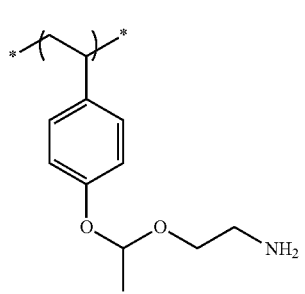
(VI-68)
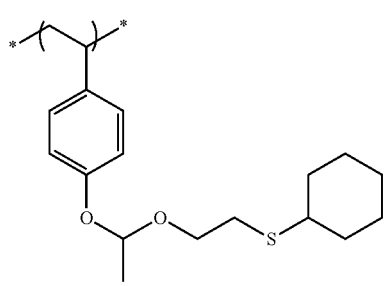
(VI-69)
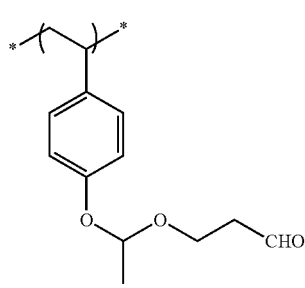
(VI-70)
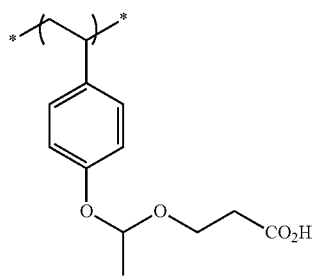
(VI-71)
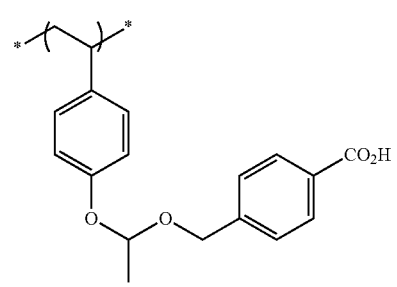
(VI-72)
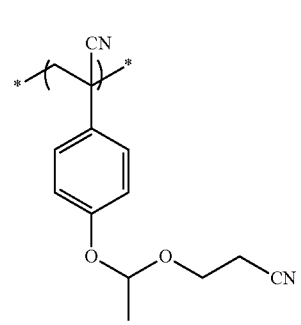
(VI-73)
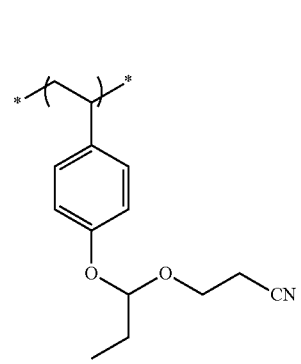
(VI-74)
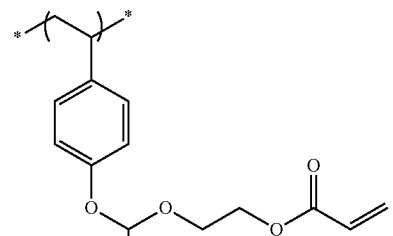
(VI-75)
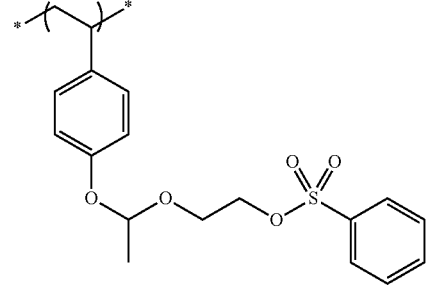

(VI-76)
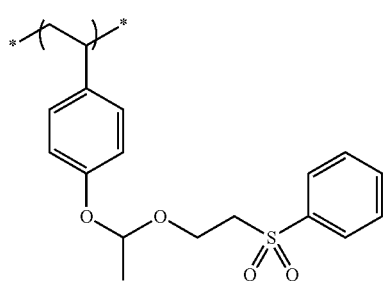
(VI-77)
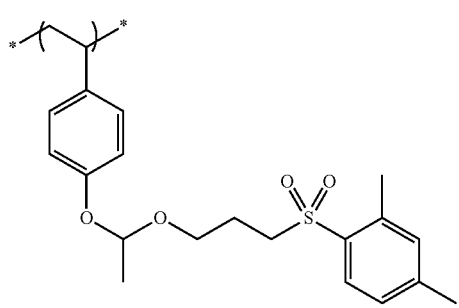
(VI-78)
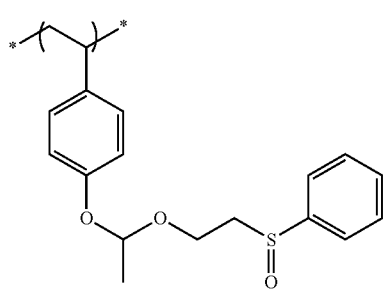
(VI-79)
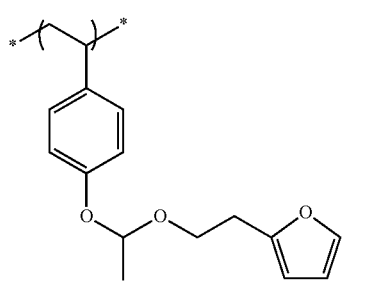
(VI-80)
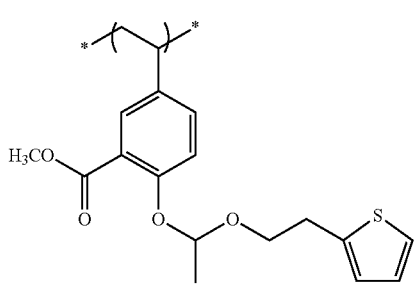
(VI-81)
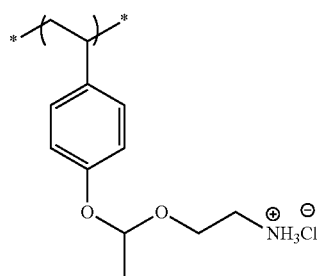
(VI-82)
(VI-83)
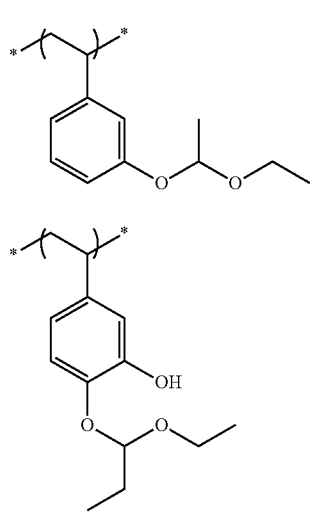
(VI-84)
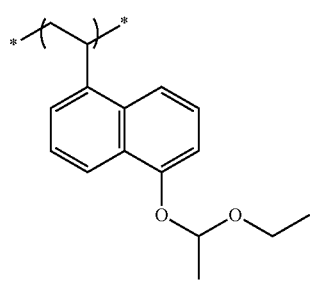
(VI-85)
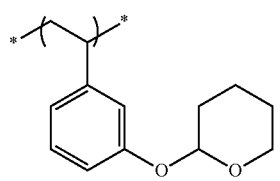
(VI-86)
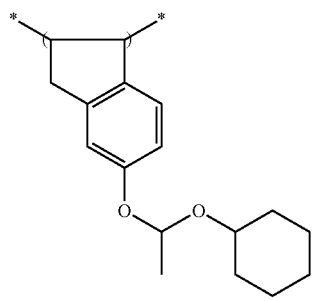

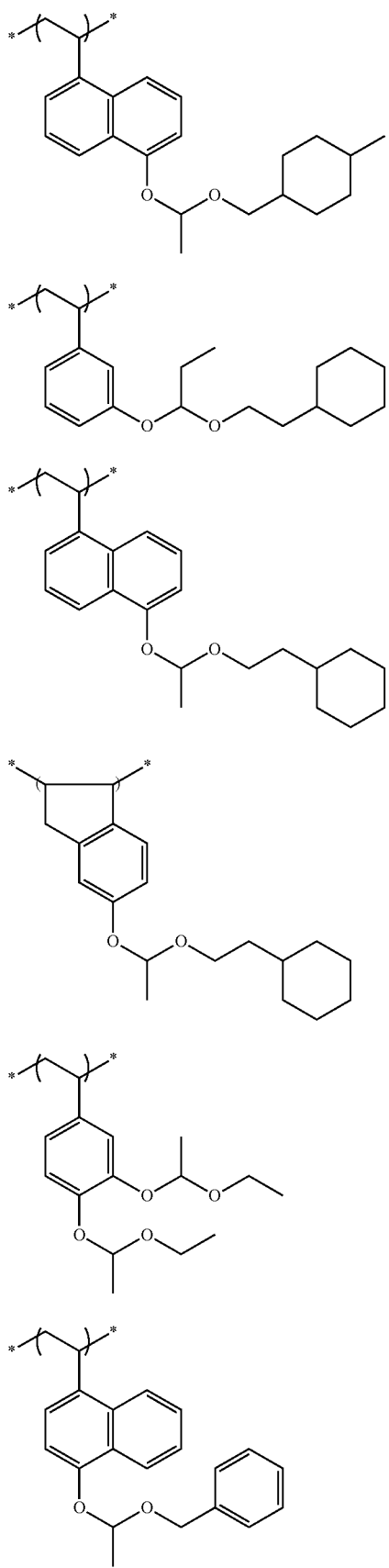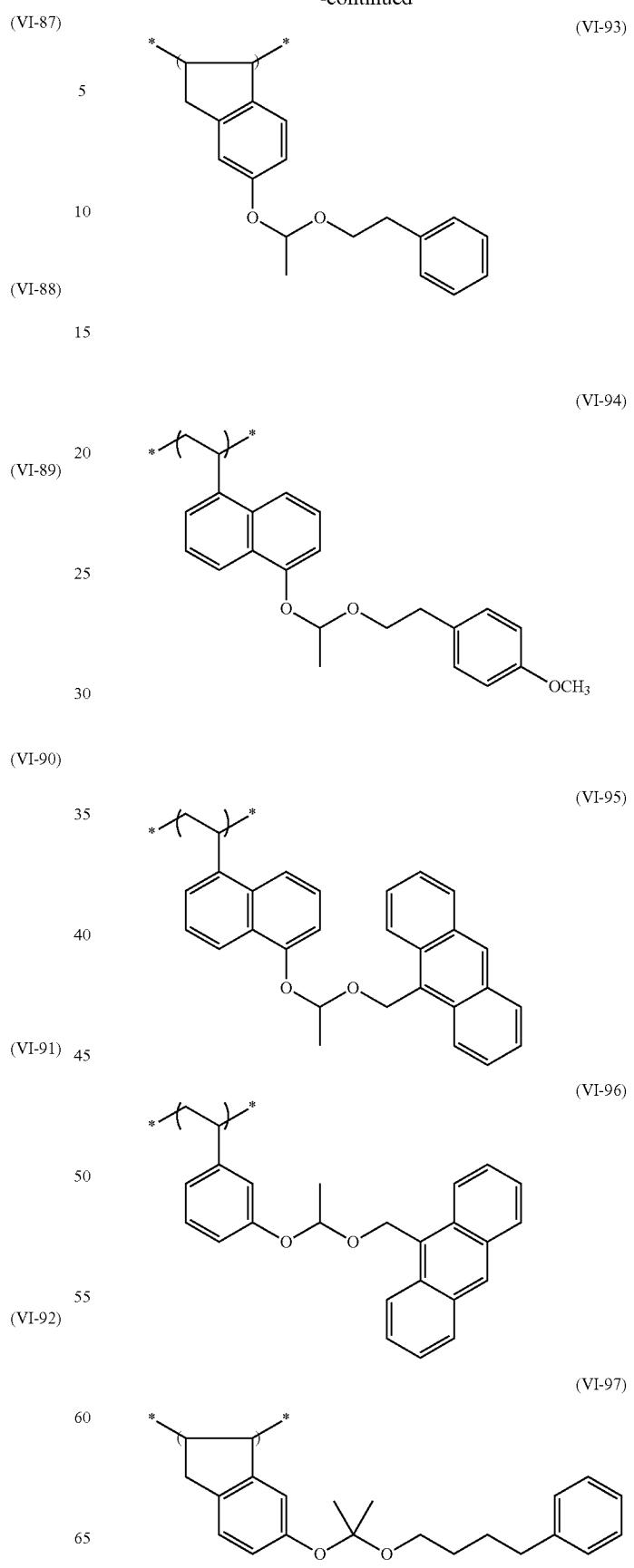

(VI-98)
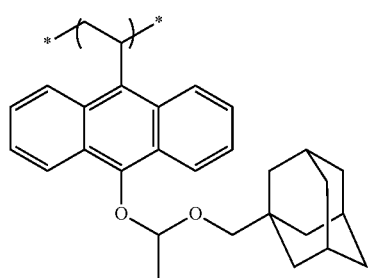
(VI-99)
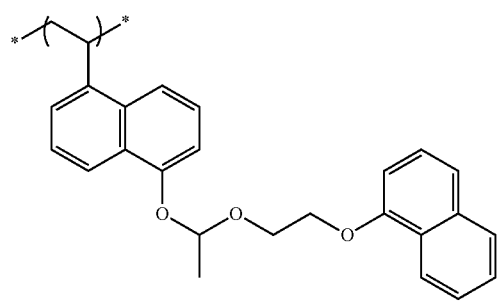
(VI-100)
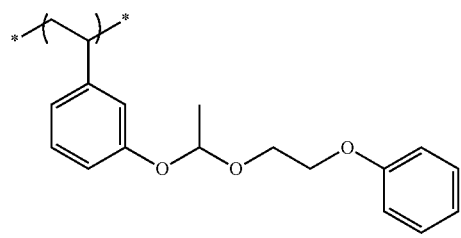
(VI-101)
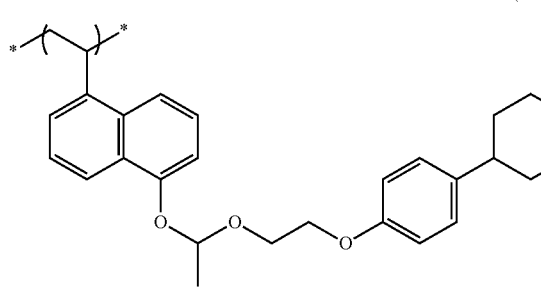
(VI-102)
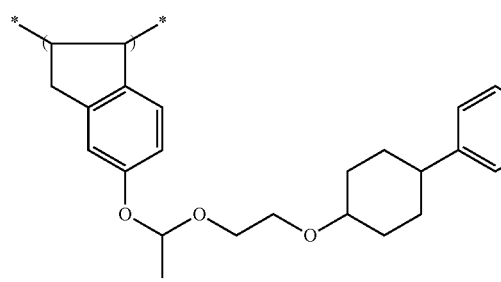
(VI-103)
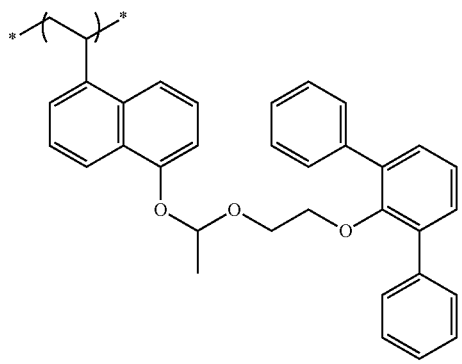
(VI-104)
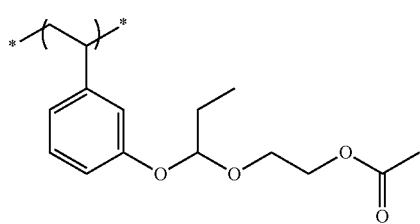
(VI-105)
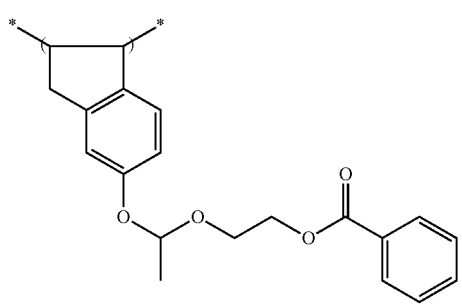
(VI-106)
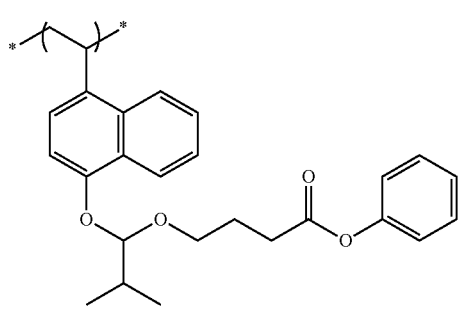
(VI-107)
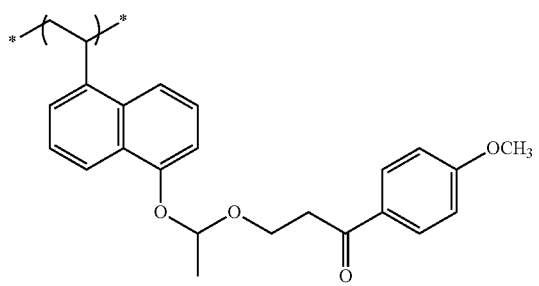

(VI-108)
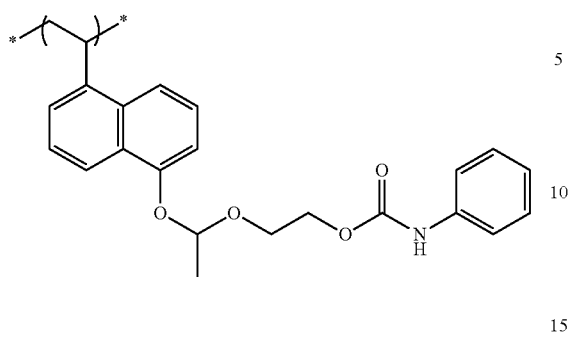
(VI-109)
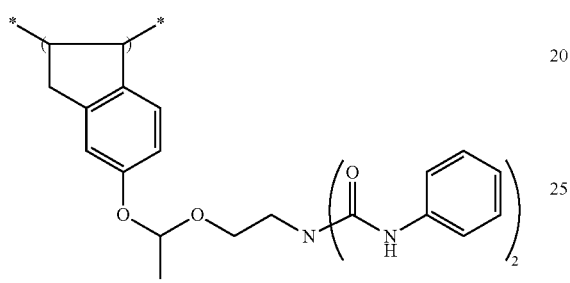
(VI-110)
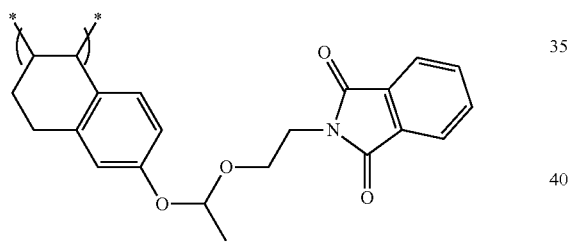
(VI-111)
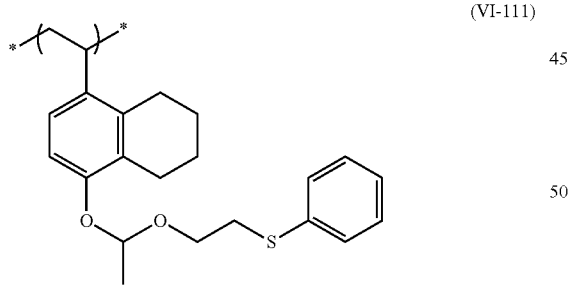
(VI-112)
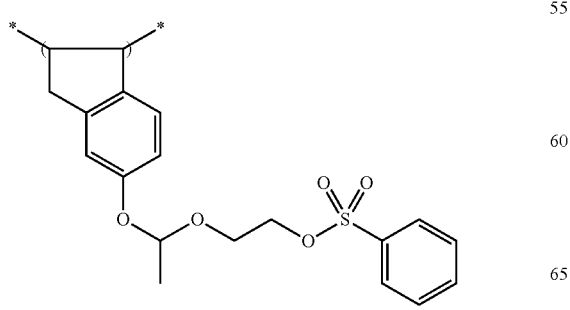
(VI-113)
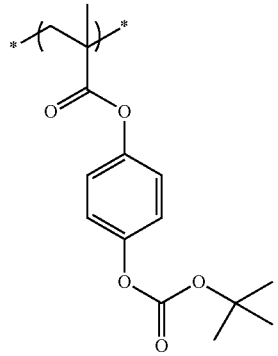
(VI-114)
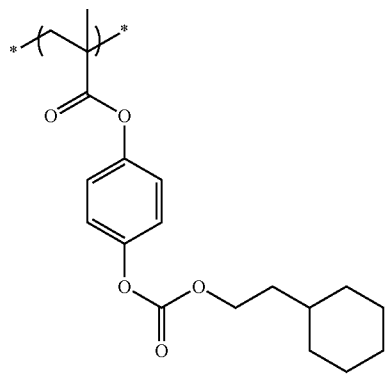
(VI-115)
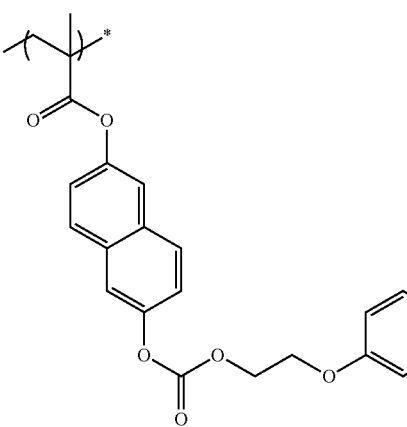
(VI-116)
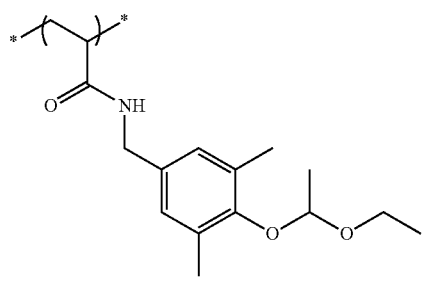

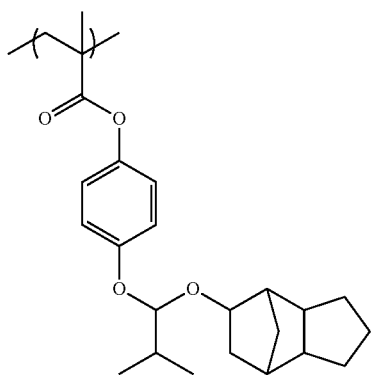 (VI-117)
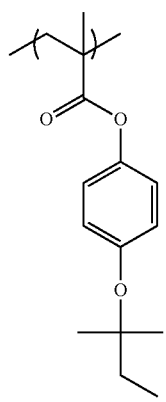 (VI-121)
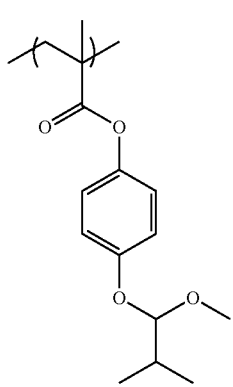 (VI-118)
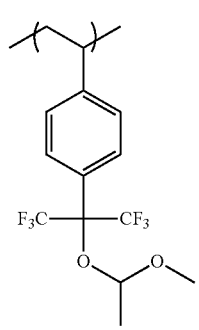 (VI-122)
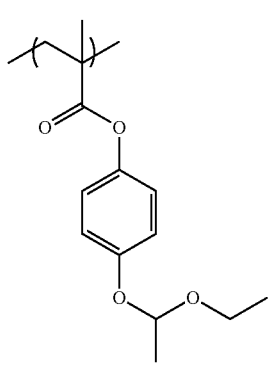 (VI-119)
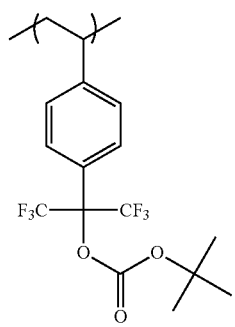 (VI-123)
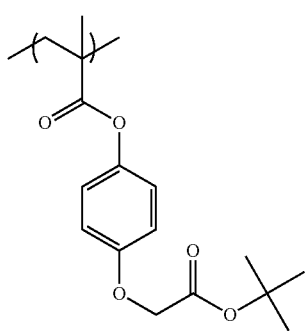 (VI-120)
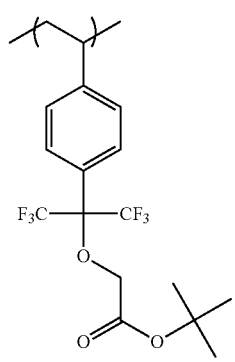 (VI-124)

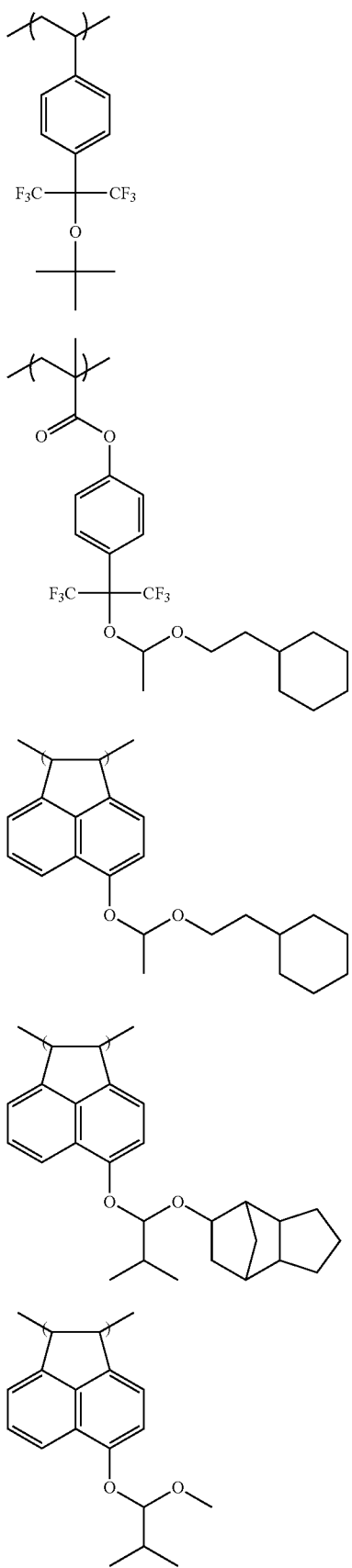

(VI-135) 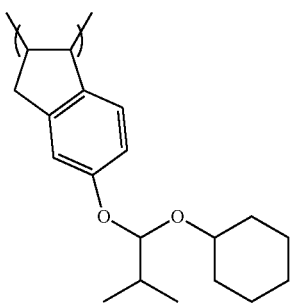

(VI-136) 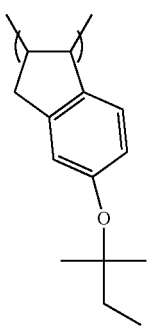

(VI-137) 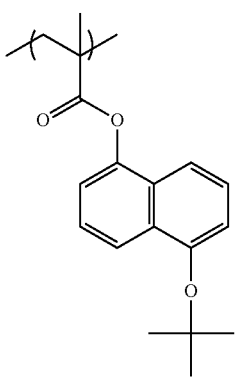

(VI-138) 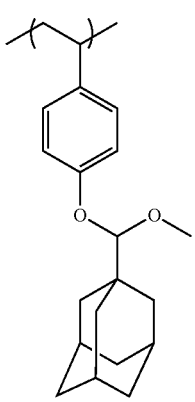

(VI-139) 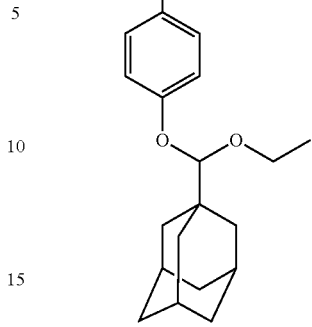

(VI-140) 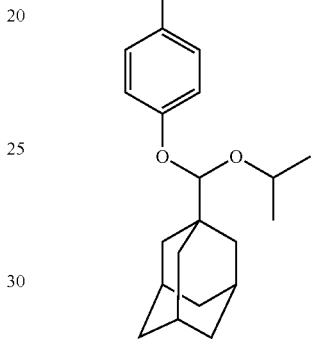

(VI-141) 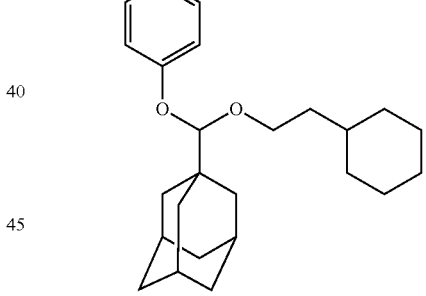

The repeating unit represented by formula (VI) is a repeating unit capable of generating a phenolic hydroxyl group by decomposition of an acid-decomposable group. In this case, the solubility in an organic solvent of the resin at the exposed part shows a tendency to be difficult to become sufficiently low, and so there are cases where the repeating unit is preferably not added in a large amount in the point of resolution. This tendency reveals more strongly in repeating units deriving from hydroxystyrenes (that is, the case where both $X_6$ and $L_6$ represent a single bond in formula (VI)), and the cause is not clear but it is presumed for the reason that the phenolic hydroxyl group is present in the vicinity of the main chain. Thus, in the invention, the content of the repeating unit generating a phenolic hydroxyl group by decomposition of an acid-decomposable group (for example, the repeating unit represented by formula (VI), preferably the repeating unit represented by formula (VI) in which both $X_6$ and $L_6$ represent a single bond) is preferably 4 mol % or less on the basis of all the repeating units of resin (A), more preferably 2 mol % or less, and most preferably 0 mol % (that is, the repeating unit is not contained).

Resin (A) may also contain a repeating unit represented by the following formula (BZ) as repeating unit (a).

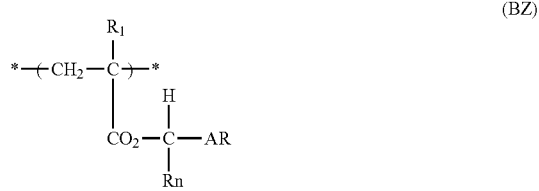

In formula (BZ), AR represents an aryl group. Rn represents an alkyl group, a cycloalkyl group or an aryl group. Rn and AR may be bonded to each other to form a non-aromatic ring.

$R_1$ represents a hydrogen atom, an alkyl group, a cycloalkyl group, a halogen atom, a cyano group or an alkyloxycarbonyl group.

As the aryl group of AR, an aryl group having 6 to 20 carbon atoms such as a phenyl group, a naphthyl group, an anthryl group or a fluorene group is preferred, and an aryl group having 6 to 15 carbon atoms is more preferred.

When AR represents a naphthyl group, an anthryl group or a fluorene group, the bonding position of AR and the carbon atom to which Rn is bonded is not especially restricted. For example, when AR is a naphthyl group, the carbon atom may be bonded to the α-position of the naphthyl group, or may be bonded to the β-position. Alternatively, when AR is an anthryl group, the carbon atom may be bonded to the 1-position of the anthryl group, or may be bonded to the 2-position, or may be bonded to the 9-position.

The aryl group as AR may have one or more substituents. As the specific examples of such substituents, straight chain or branched chain alkyl groups having 1 to 20 carbon atoms, e.g., a methyl group, an ethyl group, a propyl group, an isopropyl group, an n-butyl group, an isobutyl group, a t-butyl group, a pentyl group, a hexyl group, an octyl group, and a dodecyl group, alkoxy groups containing these alkyl group moieties, cycloalkyl groups, e.g., a cyclopentyl group and a cyclohexyl group, cycloalkoxy groups containing these cycloalkyl group moieties, a hydroxyl group, a halogen atom, an aryl group, a cyano group, a nitro group, an acyl group, an acyloxy group, an acylamino group, a sulfonylamino group, an alkylthio group, an arylthio group, an aralkylthio group, a thiophenecarbonyloxy group, a thiophenemethyl-carbonyloxy group, and heterocyclic residues, e.g., a pyrrolidone residue are exemplified. As these substituents, straight chain or branched chain alkyl groups having 1 to 5 carbon atoms and alkoxy groups containing these alkyl group moieties are preferred, and para-methyl groups and para-methoxy groups are more preferred.

When the aryl group as AR has two or more substituents, at least two of the plurality of substituents may be bonded to each other to form a ring. The ring is preferably any of 5- to 8-membered rings, and more preferably a 5- or 6-membered ring. The ring may be a heterocyclic ring containing a hetero atom such as an oxygen atom, a nitrogen atom or a sulfur atom in the ring member.

Further, the ring may have a substituent. As the examples of substituents, the same substituents as described later concerning further substituents that Rn may have are exemplified.

From the aspect of roughness performance, it is preferred for repeating unit (a) represented by formula (BZ) to contain 2 or more aromatic rings. The number of the aromatic rings that the repeating unit has is generally preferably 5 or less, and more preferably 3 or less.

Further, in repeating unit (a) represented by formula (BZ), from the viewpoint of roughness performance, it is more preferred for AR to have 2 or more aromatic rings, and it is still more preferred that AR is a naphthyl group or a biphenyl group. The number of the aromatic rings that AR has is generally preferably 5 or less, and more preferably 3 or less.

As described above, Rn represents an alkyl group, a cycloalkyl group or an aryl group.

The alkyl group represented by Rn may be a straight chain alkyl group or may be a branched chain alkyl group. As the alkyl group, preferably an alkyl group having 1 to 20 carbon atoms, e.g., a methyl group, an ethyl group, a propyl group, an isopropyl group, an n-butyl group, an isobutyl group, a t-butyl group, a pentyl group, a hexyl group, a cyclohexyl group, an octyl group, and a dodecyl group are exemplified. The alkyl group of Rn is preferably an alkyl group having 1 to 5 carbon atoms, and more preferably 1 to 3 carbon atoms.

As the cycloalkyl group of Rn, those having 3 to 15 carbon atoms, e.g., a cyclopentyl group and a cyclohexyl group are exemplified.

As the aryl group of Rn, aryl groups having 6 to 14 carbon atoms, e.g., a phenyl group, a xylyl group, a toluoyl group, a cumenyl group, a naphthyl group and an anthryl group are preferred.

Each of the alkyl group, cycloalkyl group and aryl group as Rn may further have a substituent. As the substituents, an alkoxy group, a hydroxyl group, a halogen atom, a nitro group, an acyl group, an acyloxy group, an acylamino group, a sulfonylamino group, a dialkylamino group, an alkylthio group, an arylthio group, an aralkylthio group, a thiophenecarbonyloxy group, a thiophenemethylcarbonyloxy group, and heterocyclic residues, e.g., a pyrrolidone residue are exemplified. Of these groups, an alkoxy group, a hydroxyl group, a halogen atom, a nitro group, an acyl group, an acyloxy group, an acylamino group, and a sulfonylamino group are especially preferred.

$R_1$ represents a hydrogen atom, an alkyl group, a cycloalkyl group, a halogen atom, a cyano group, or an alkyloxycarbonyl group as described above.

As the alkyl group and cycloalkyl group of $R_1$, the same groups as described above concerning Rn are exemplified. Each of these alkyl group and cycloalkyl group may have a substituent. As the substituents, the same groups as described above in Rn are exemplified.

When $R_1$ represents an alkyl group or a cycloalkyl group having a substituent, a trifluoromethyl group, an alkyloxycarbonylmethyl group, an alkylcarbonyloxymethyl group, a hydroxymethyl group, and an alkoxymethyl group are exemplified as especially preferred $R_1$.

As the halogen atom of $R_1$, a fluorine atom, a chlorine atom, a bromine atom and an iodine atom are exemplified, and a fluorine atom is especially preferred.

As the alkyl group moieties contained in the alkyloxycarbonyl group of $R_1$, structures described above as the alkyl groups of $R_1$ can be adopted.

It is preferred that Rn and AR are bonded to each other to form a ring, by which roughness performance can be improved furthermore.

The non-aromatic ring formed by bonding of Rn and AR is preferably any of 5- to 8-membered rings, and more preferably a 5- or 6-membered ring.

The non-aromatic ring may be an aliphatic ring or may be a heterocyclic ring containing a hetero atom such as an oxygen atom, a nitrogen atom or a sulfur atom as the ring member.

The non-aromatic ring may have a substituent. As the substituents, the same groups as described above in Rn as further substituents that Rn may have are exemplified.

The specific examples of repeating units (a) represented by formula (BZ) are shown below, but the invention is not restricted thereto.

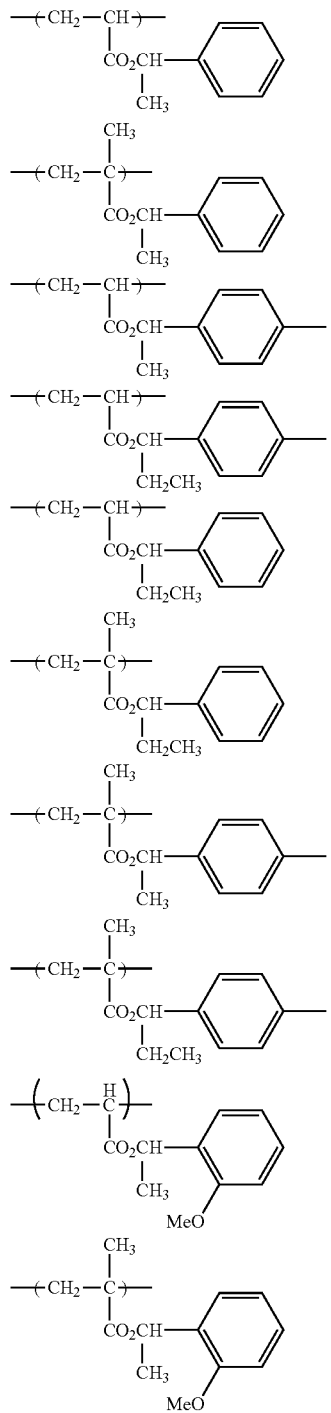
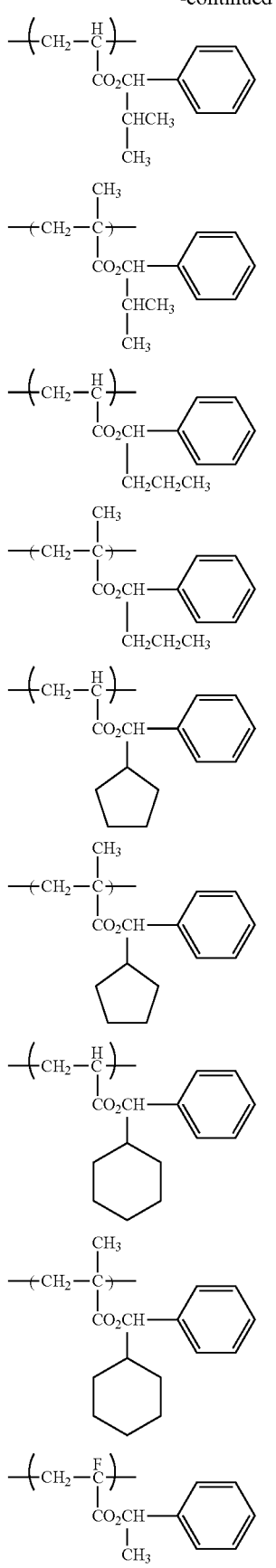

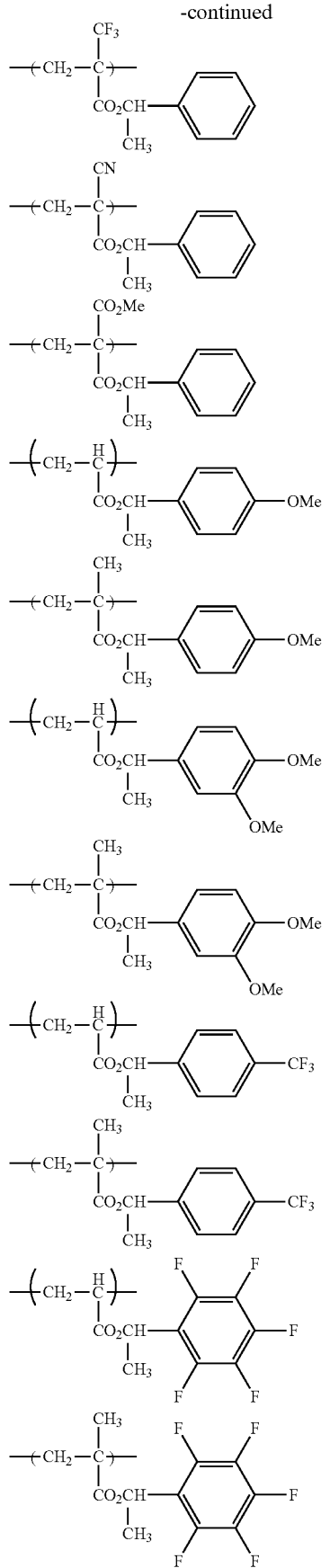
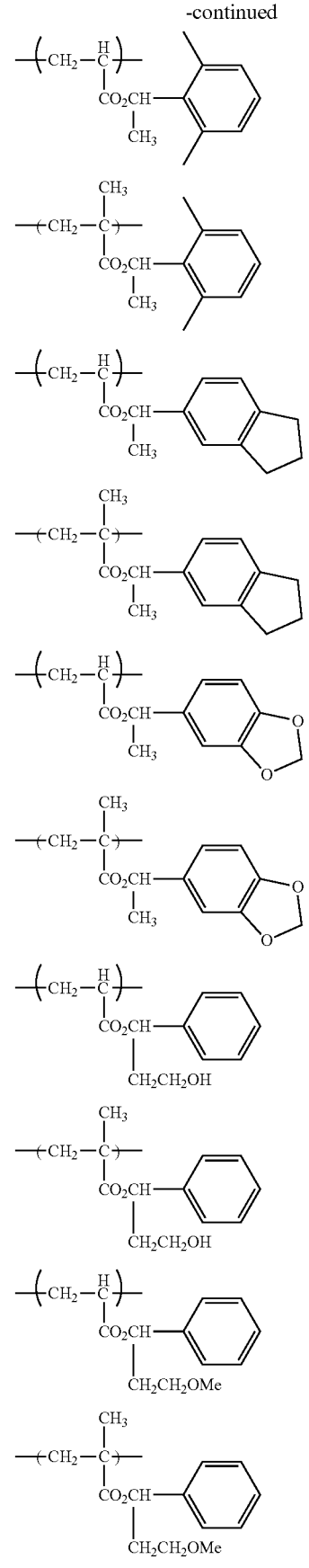

-continued
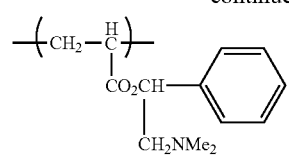
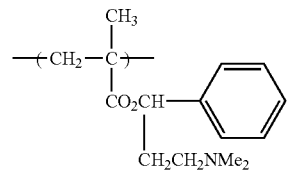
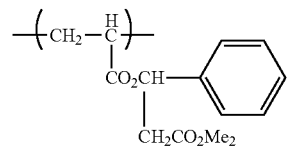
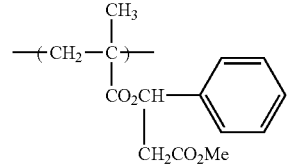
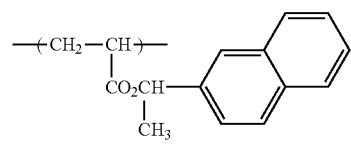
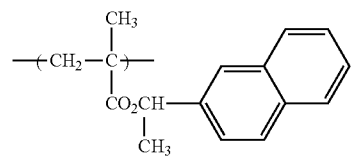
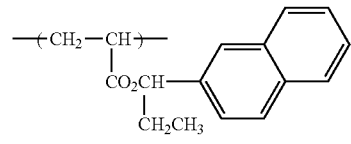
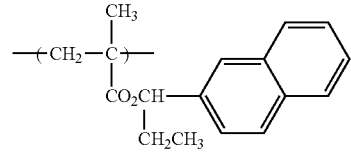
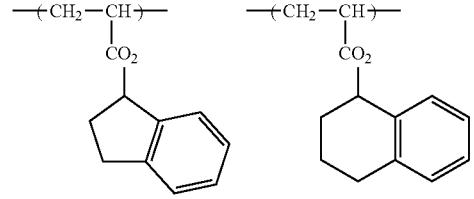
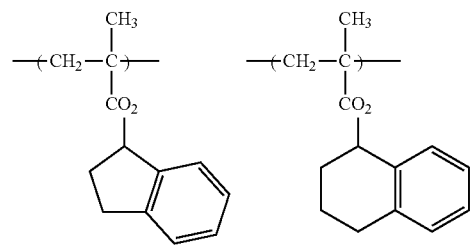
-continued
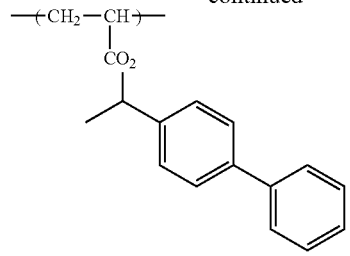
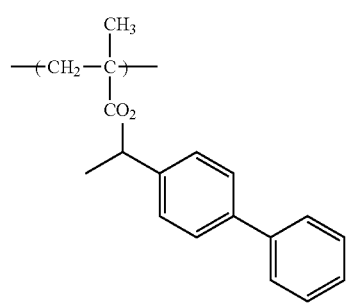
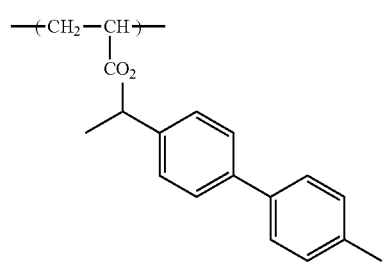
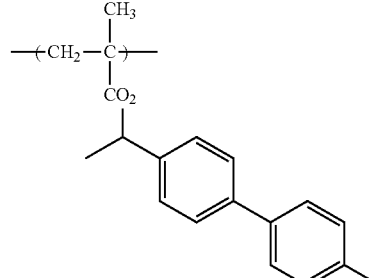
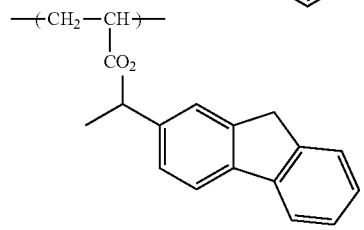
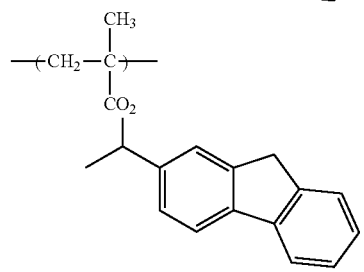

81
-continued
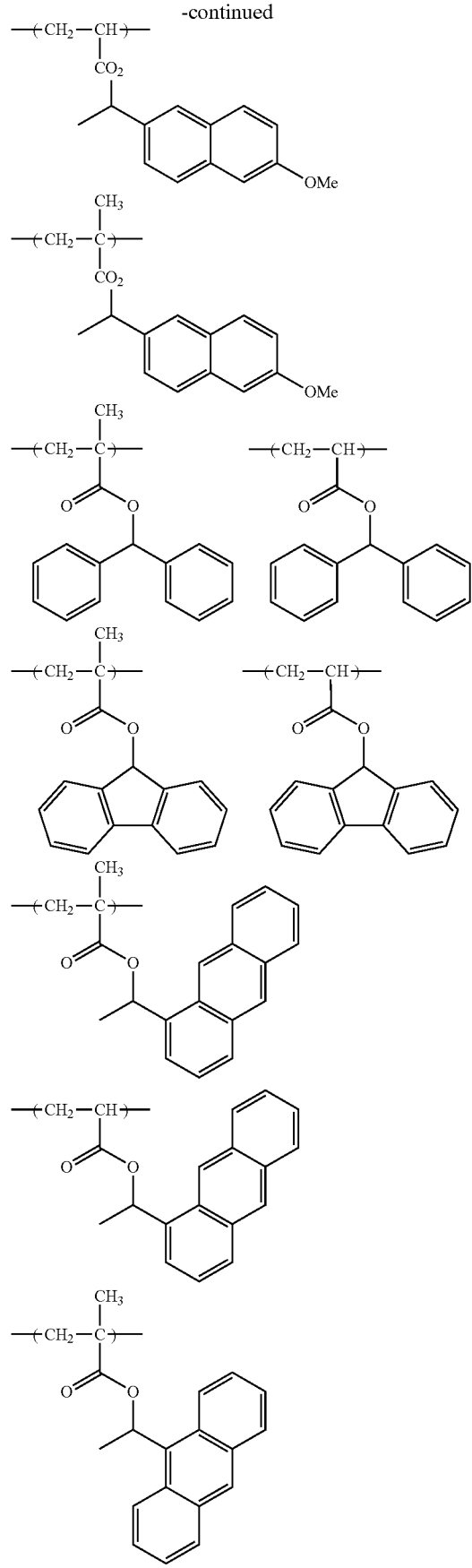
82
-continued
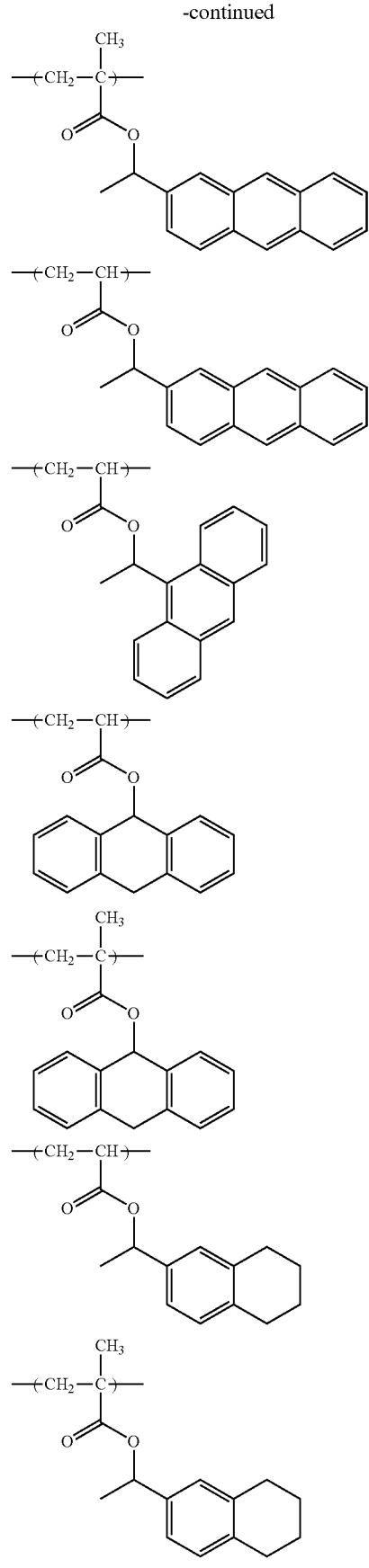

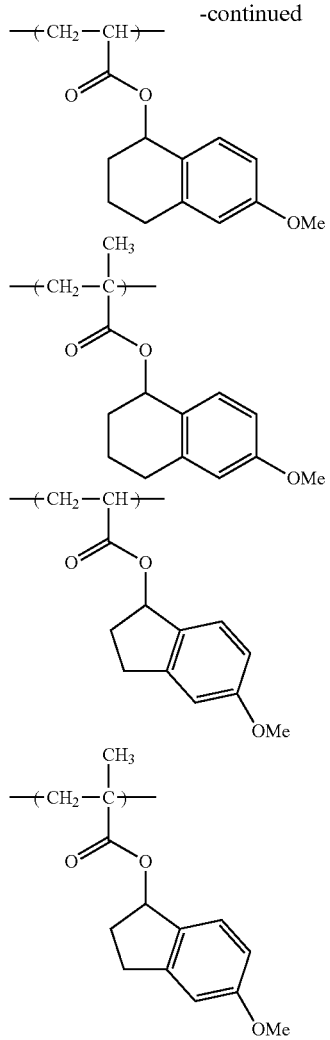

As the exemplary embodiment of a repeating unit having an acid-decomposable group other than the repeating units described above, the embodiment may be a repeating unit capable of generating an alcoholic hydroxyl group. In this case, the repeating unit is preferably represented by any of the following formulae (I-1) to (I-10), the repeating unit is more preferably represented by any of formulae (I-1) to (I-3), and still more preferably represented by formula (I-1).

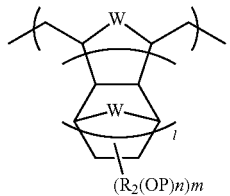

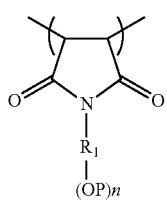

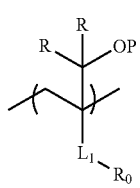

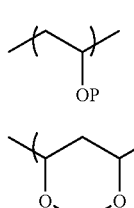

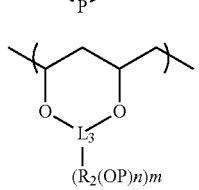

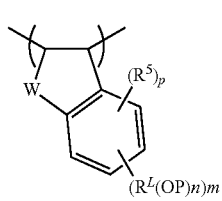

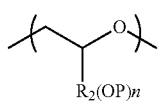

In the above formulae, each of Ra independently represents a hydrogen atom, an alkyl group, or a group represented by —$CH_2$—O—$Ra_2$, wherein $Ra_2$ represents a hydrogen atom, an alkyl group or an acyl group.

$R_1$ represents an (n+1)-valent organic group.

In the case where m is equal to or greater than 2, each $R_2$ independently represents a single bond or an (n+1)-valent organic group.

Each OP independently represents the above-described group of decomposing by the action of an acid to generate an alcoholic hydroxyl group. In the case of n being equal to or greater than 2 and/or m being equal to or greater than 2, two or more OP's may be bonded to each other and form a ring.

W represents a methylene group, an oxygen atom or a sulfur atom.

Each of n and m represents an integer of 1 or more. When $R_2$ represents a single bond in formula (I-2), (I-3) or (I-8), n is 1.

l represents an integer of 0 or more.

$L_1$ represents a linking group represented by —COO—, —OCO—, —CONH—, —O—, —Ar—, —SO$_3$—, or —SO$_2$NH—, wherein Ar represents a divalent aromatic ring group.

Each R independently represents a hydrogen atom or an alkyl group.

$R_0$ represents a hydrogen atom or an organic group.

$L_3$ represents an (m+2)-valent linking group.

Each $R^L$ represents an (n+1)-valent linking group in the case where m is equal to or greater than 2.

Each $R^S$ independently represents a substituent in the case where p is equal to or greater than 2. In the case where p is equal to or greater than 2, a plurality of $R^S$'s may be bonded to each other to form a ring.

p represents an integer of 0 to 3.

Ra represents a hydrogen atom, an alkyl group, or a group represented by —CH$_2$—O—Ra$_2$. Ra$_2$ preferably represents a hydrogen atom or an alkyl group having 1 to 10 carbon atoms, and more preferably a hydrogen atom or a methyl group.

W represents a methylene group, an oxygen atom or a sulfur atom, and preferably a methylene group or an oxygen atom.

$R_1$ represents an (n+1)-valent organic group, and preferably a non-aromatic hydrocarbon group. In this case, $R_1$ may be a chain-like hydrocarbon group or may be an alicyclic hydrocarbon group, and more preferably represents an alicyclic hydrocarbon group.

$R_2$ represents a single bond or an (n+1)-valent organic group. $R_2$ preferably represents a single bond or a non-aromatic hydrocarbon group. In this case, $R_2$ may be a chain-like hydrocarbon group or may be an alicyclic hydrocarbon group.

When $R_1$ and/or $R_2$ are a chain-like hydrocarbon group, the chain-like hydrocarbon group may be a straight chain or a branched chain. The carbon atom number of the chain-like hydrocarbon group is preferably 1 to 8. For example, when $R_1$ and/or $R_2$ represent an alkylene group, $R_1$ and/or $R_2$ are preferably a methylene group, an ethylene group, an n-propylene group, an isopropylene group, an n-butylene group, an isobutylene group or a sec-butylene group.

When $R_1$ and/or $R_2$ are an alicyclic hydrocarbon group, the alicyclic hydrocarbon group may be monocyclic or polycyclic. The alicyclic hydrocarbon group takes a monocyclic, bicyclic, tricyclic or tetracyclic structure. The carbon atom number of the alicyclic hydrocarbon group is generally 5 or more, preferably 6 to 30, and more preferably 7 to 25.

As the alicyclic hydrocarbon group, for example, those having the following partial structures are exemplified. Each of these partial structures may have a substituent. Further, in each of the partial structures, the methylene group (—CH$_2$—) may be substituted with an oxygen atom (—O—), a sulfur atom (—S—), a carbonyl group [—C(=O)—], a sulfonyl group [—S(=O)$_2$—], a sulfinyl group [—S(=O)—] or an imino group [—N(R)—] (wherein R represents a hydrogen atom or an alkyl group).

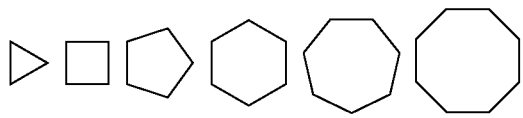

-continued

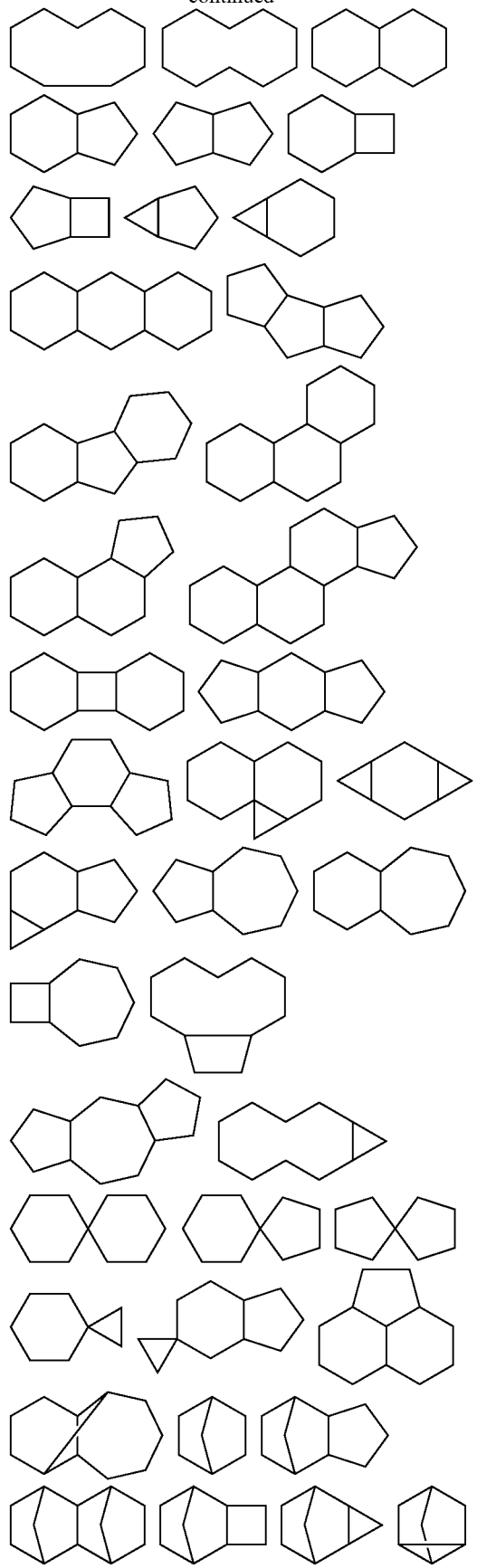

-continued

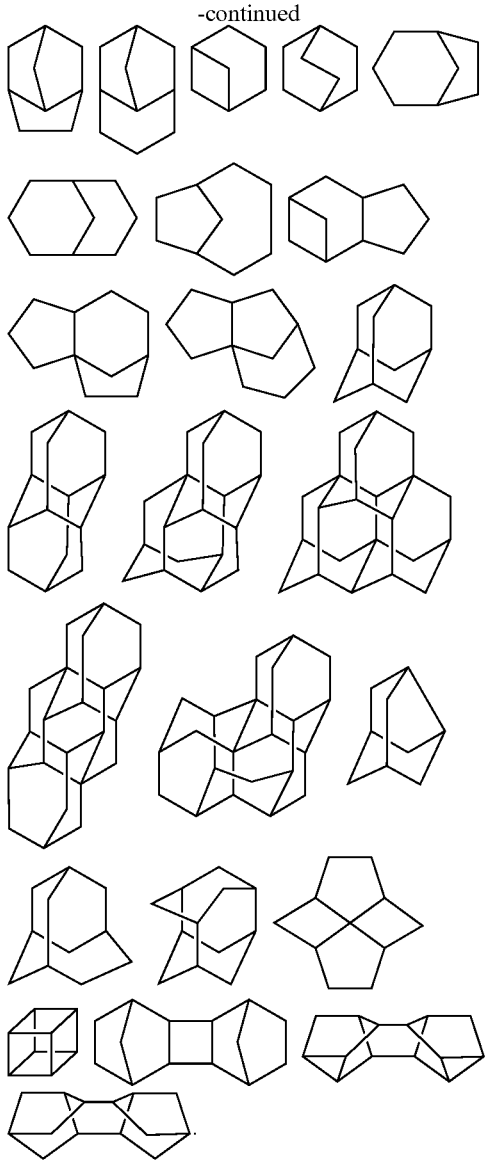

For example, in the case where $R_1$ and/or $R_2$ are a cycloalkylene group, $R_1$ and/or $R_2$ are preferably an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group, or a cyclododecanylene group, and more preferably an adamantylene group, a norbornylene group, a cyclohexylene group, a cyclopentylene group, a tetracyclododecanylene group or a tricyclodecanylene group.

The non-aromatic hydrocarbon group represented by $R_1$ and/or $R_2$ may have a substituent. As the substituent, an alkyl group having 1 to 4 carbon atoms, a halogen atom, a hydroxyl group, an alkoxy group having 1 to 4 carbon atoms, a carboxyl group and an alkoxycarbonyl group having 2 to 6 carbon atoms are exemplified. Each of these alkyl group, alkoxy group and alkoxycarbonyl group may further have a substituent. As such further substituent, e.g., a hydroxyl group, a halogen atom and an alkoxy group are exemplified.

$L_1$ represents a linking group represented by formula —COO—, —OCO—, —CONH—, —O—, —Ar—, —SO$_3$—, or —SO$_2$NH—, wherein Ar represents a divalent aromatic ring group. $L_1$ preferably represents a linking group represented by —COO—, —CONH— or —Ar—, and more preferably a linking group represented by —COO— or —CONH—.

R represents a hydrogen atom or an alkyl group. The alkyl group may be a straight chain or a branched chain. The carbon atom number of the alkyl group is preferably 1 to 6, and more preferably 1 to 3. R preferably represents a hydrogen atom or a methyl group, and more preferably a hydrogen atom.

$R_0$ represents a hydrogen atom or an organic group. As the organic group, e.g., an alkyl group, a cycloalkyl group, an aryl group, an alkynyl group and an alkenyl group are exemplified. $R_0$ preferably represents a hydrogen atom or an alkyl group, and more preferably a hydrogen atom or a methyl group.

$L_3$ represents an (m+2)-valent linking group. That is, $L_3$ represents a trivalent or higher linking group. As such linking groups, for example, corresponding groups in the later-described specific examples are exemplified.

$R^L$ represents an (n+1)-valent linking group. That is, $R^L$ represents a divalent or higher linking group. As such linking groups, for example, an alkylene group, a cycloalkylene group, and corresponding groups in the later-described specific examples are exemplified. $R^L$ may be bonded to each other or bonded to $R^S$ to form a cyclic structure.

$R^S$ represents a substituent. As the substituents, e.g., an alkyl group, an alkenyl group, an alkynyl group, an aryl group, an alkoxy group, an acyloxy group, an alkoxycarbonyl group and a halogen atom are exemplified.

n represents an integer of 1 or more, preferably an integer of 1 to 3, and more preferably 1 or 2. When n is 2 or higher, it becomes possible to further improve contrast of dissolution in a developer containing an organic solvent. Accordingly, limiting resolution and roughness characteristics can further be improved by the above constitution.

m represents an integer of 1 or more, preferably 1 to 3, and more preferably 1 or 2.

l represents an integer of 0 or more, and preferably 0 or 1.

p represents an integer of 0 to 3.

The specific examples of the repeating units having a group capable of decomposing by the action of an acid to generate an alcoholic hydroxyl group are shown below. In the specific examples, Ra and OP are respectively the same with those in formulae (I-1) to (I-3). When two or more OP's are bonded to each other to form a ring, the corresponding cyclic structure is inscribed as "O—P—O" for conveniences' sake.

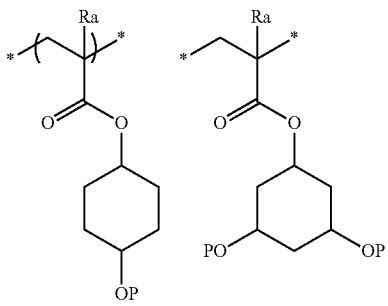

-continued
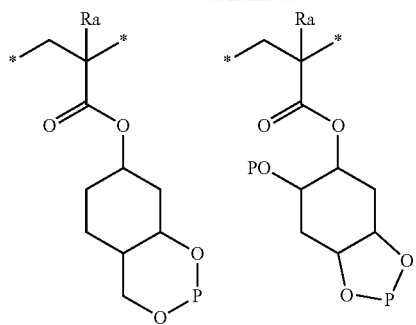
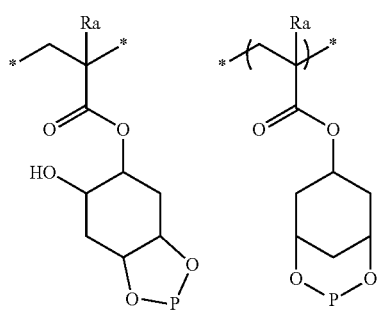
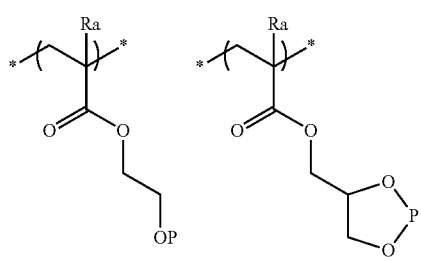
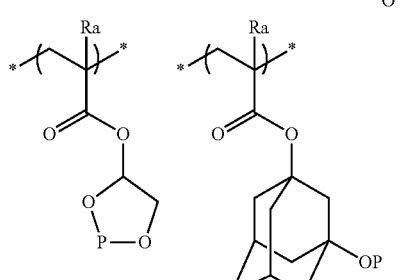
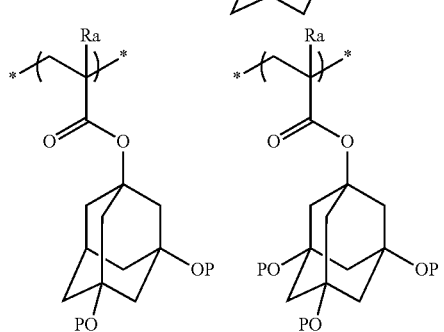
-continued
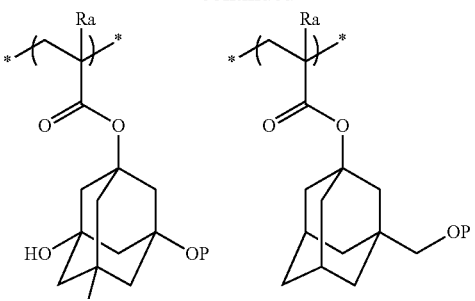
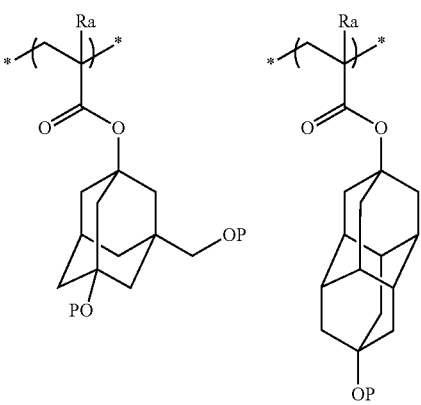
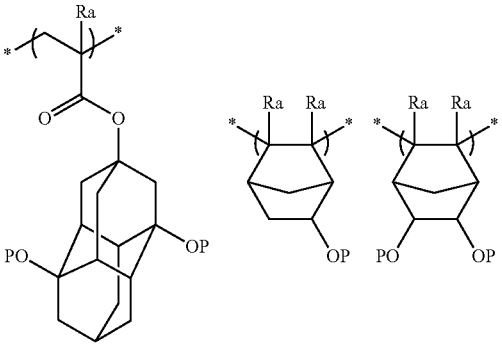
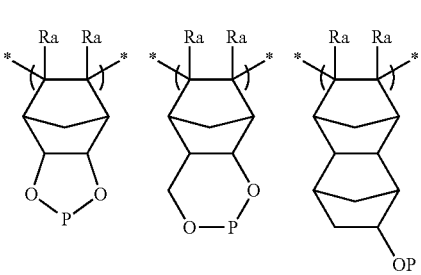

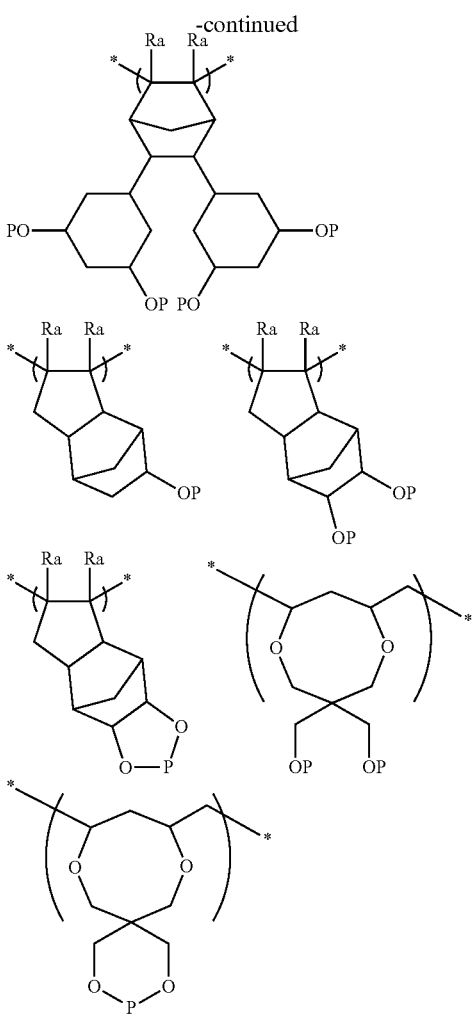

The group capable of decomposing by the action of an acid to generate an alcoholic hydroxyl group is preferably represented by at least one formula selected from the group consisting of the following formulae (II-1) to (II-4).

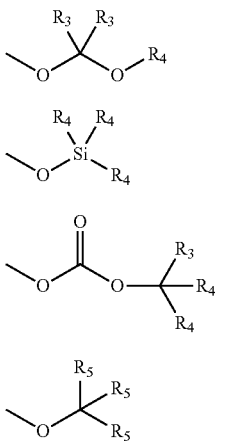

In the above formulae, each of $R_3$'s independently represents a hydrogen atom or a monovalent organic group. $R_3$'s may be bonded to each other to form a ring.

Each of $R_4$'s independently represents a monovalent organic group. $R_4$'s may be bonded to each other to form a ring. $R_3$ and $R_4$ may be bonded to each other to form a ring.

Each of $R_5$'s independently represents a hydrogen atom, an alkyl group, a cycloalkyl group, an aryl group, an alkenyl group or an alkynyl group. At least two $R_5$'s may be bonded to each other to form a ring, provided that when at least one or two of three $R_5$'s represent a hydrogen atom, at least one of the remaining $R_5$'s represents an aryl group, an alkenyl group or an alkynyl group.

The group capable of decomposing by the action of an acid to generate an alcoholic hydroxyl group is also preferably represented by at least one formula selected from the group consisting of the following formulae (II-5) to (II-9).

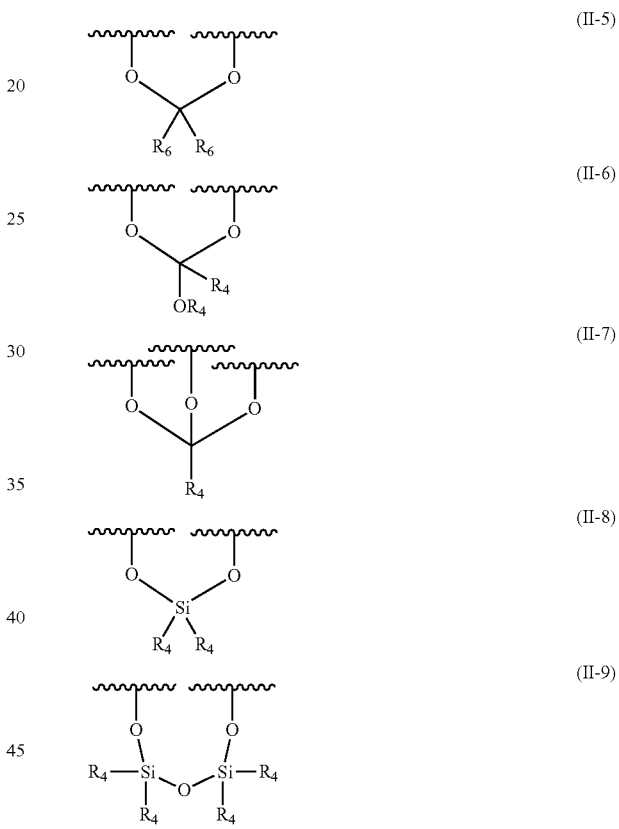

In the formulae, $R_4$ has the same meaning with those as described in formulae (II-1) to (II-3).

Each of $R_6$ independently represents a hydrogen atom or a monovalent organic group. $R_6$ may be bonded to each other to form a ring.

The group capable of decomposing by the action of an acid to generate an alcoholic hydroxyl group is preferably represented by any of the following formulae (II-1) to (II-3), more preferably represented by formula (II-1) or (II-3), and especially preferably represented by formula (II-1).

$R_3$ represents a hydrogen atom or a monovalent organic group as described above. $R_3$ preferably represents a hydrogen atom, an alkyl group, or a cycloalkyl group, and more preferably a hydrogen atom or an alkyl group.

The alkyl group represented by $R_3$ may be a straight chain or a branched chain. The number of carbon atoms of the alkyl group of $R_3$ is preferably 1 to 10, and more preferably 1 to 3. As the alkyl group of $R_3$, e.g., a methyl group, an ethyl group, an n-propyl group, an isopropyl group, and an n-butyl group are exemplified.

The cycloalkyl group represented by $R_3$ may be monocyclic or polycyclic. The number of carbon atoms of the cycloalkyl group of $R_3$ is preferably 3 to 10, and more preferably 4 to 8. As the cycloalkyl group of $R_3$, e.g., a cyclopropyl group, a cyclobutyl group, a cyclopentyl group, a cyclohexyl group, a norbornyl group and an adamantyl group are exemplified.

In formula (II-1), at least one of $R_3$'s preferably represents a monovalent organic group. Especially high sensitivity can be attained by taking such constitution.

$R_4$ represents a monovalent organic group. $R_4$ preferably represents an alkyl group or a cycloalkyl group, and more preferably an alkyl group. These alkyl group and cycloalkyl group may have a substituent.

It is preferred that the alkyl group represented by $R_4$ does not have a substituent, or $R_4$ has one or more aryl groups and/or one or more silyl groups as the substituents. The number of carbon atoms of the unsubstituted alkyl group is preferably 1 to 20. The number of carbon atoms of the alkyl group moieties in the alkyl group substituted with one or more aryl groups is preferably 1 to 25. The number of carbon atoms of the alkyl group moieties in the alkyl group substituted with one or more silyl groups is preferably 1 to 30. In the case where the cycloalkyl group of $R_4$ does not have a substituent, the number of carbon atoms is preferably 3 to 20.

$R_5$ represents a hydrogen atom, an alkyl group, a cycloalkyl group, an aryl group, an alkenyl group or an alkynyl group, provided that when at least one or two of three $R_5$'s represent a hydrogen atom, at least one of the remaining $R_5$'s represents an aryl group, an alkenyl group or an alkynyl group. $R_5$ preferably represents a hydrogen atom or an alkyl group. The alkyl group may have a substituent or may not have a substituent. When the alkyl group does have a substituent, the number of carbon atoms is preferably 1 to 6, and more preferably 1 to 3.

As described above, $R_6$ represents a hydrogen atom or a monovalent organic group. $R_6$ preferably represents a hydrogen atom, an alkyl group or a cycloalkyl group, more preferably a hydrogen atom or an alkyl group, and still more preferably a hydrogen atom or an alkyl group not having a substituent. $R_6$ preferably represents a hydrogen atom or an alkyl group having 1 to 10 carbon atoms, and more preferably a hydrogen atom or an alkyl group having 1 to 10 carbon atoms and not having a substituent.

As the alkyl group and cycloalkyl group of $R_4$, $R_5$ and $R_6$, the same groups as described above in $R_3$ are exemplified.

The specific examples of the groups capable of decomposing by the action of an acid to generate an alcoholic hydroxyl group are shown below.

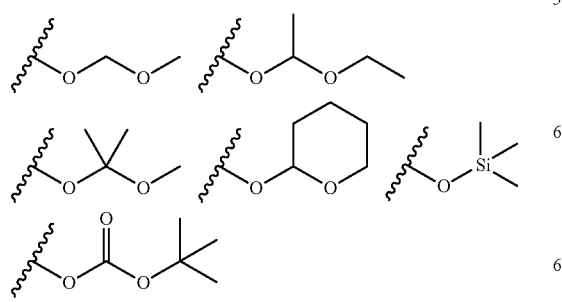

-continued

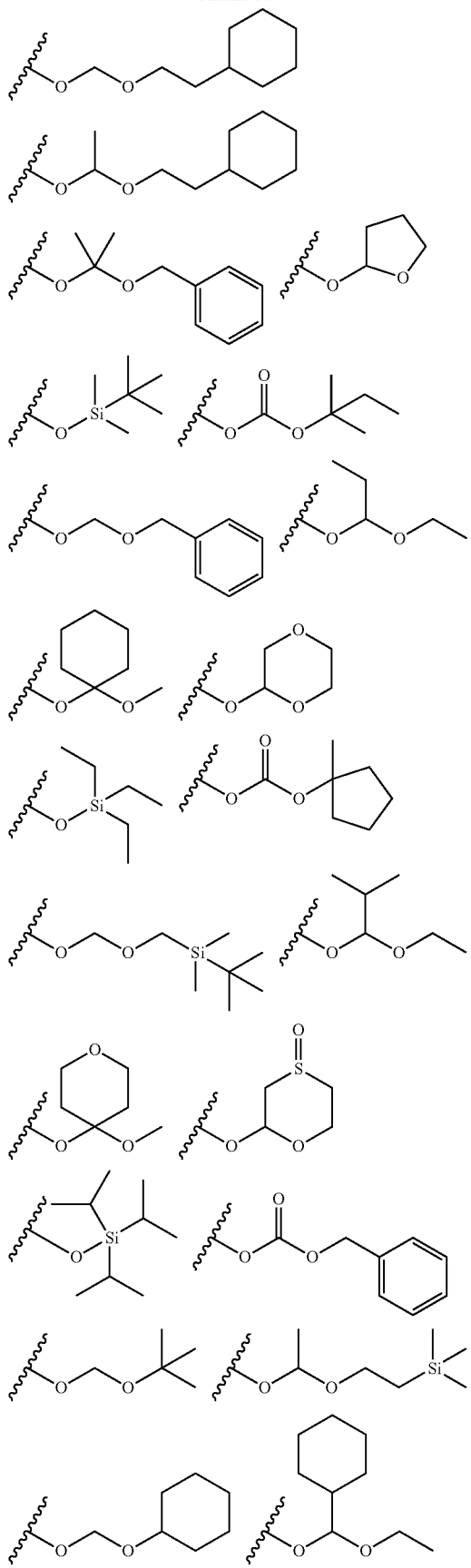

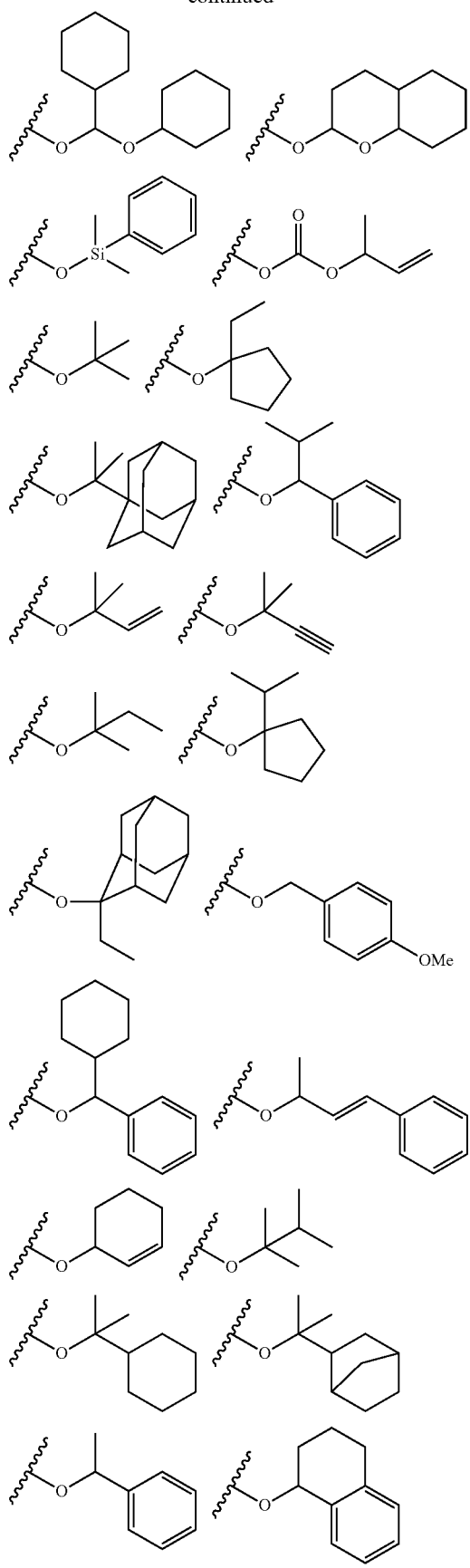
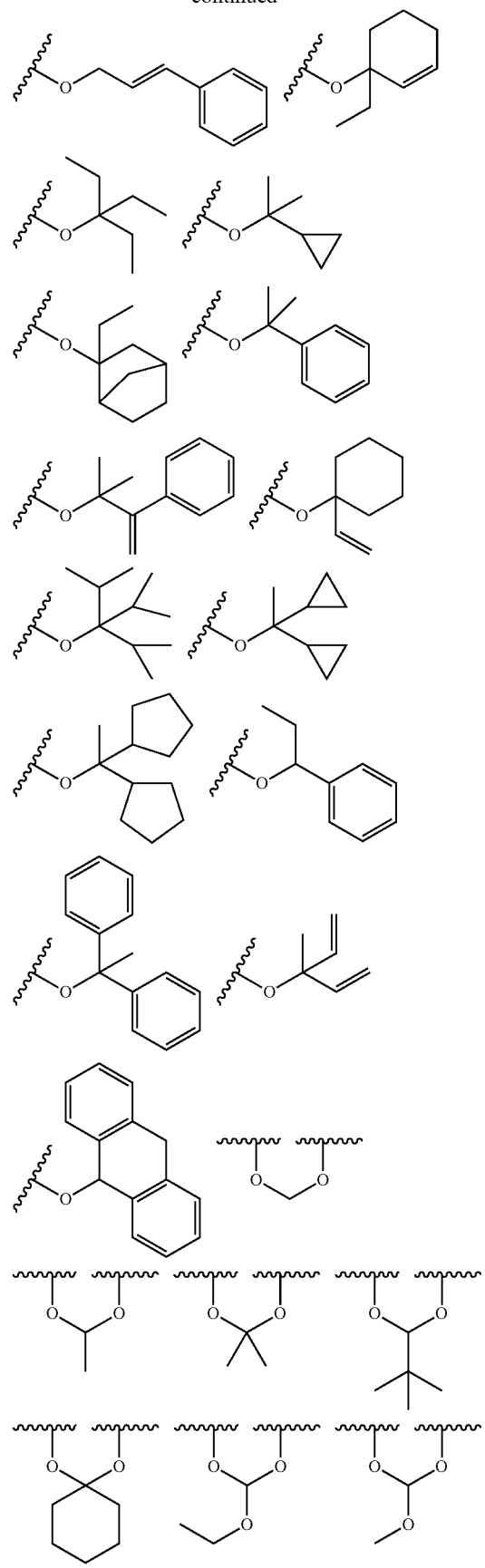

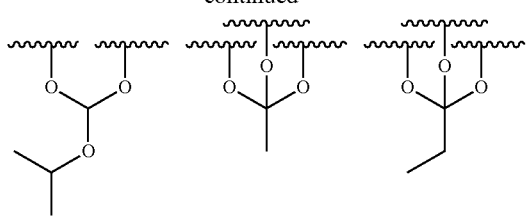
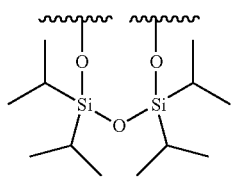
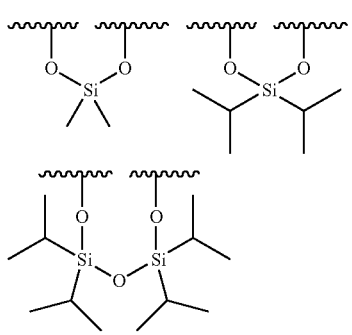
The specific examples of the repeating units having a group capable of decomposing by the action of an acid to generate an alcoholic hydroxyl group are shown below. In the formulae, $Xa_1$ represents a hydrogen atom, $CH_3$, $CF_3$ or $CH_2OH$.
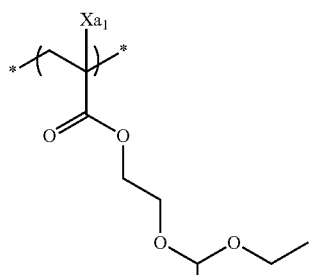
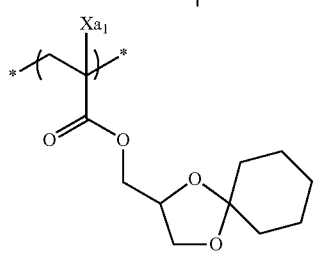
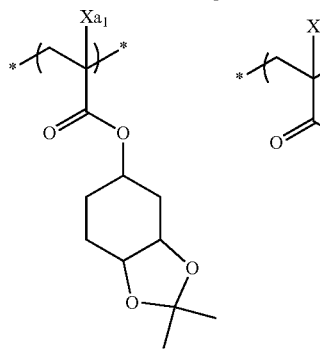
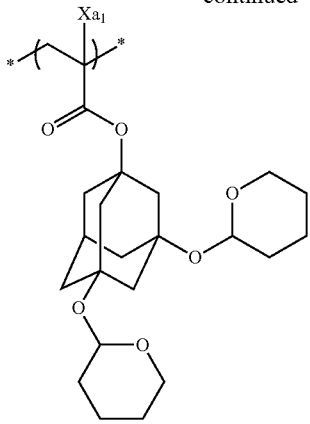
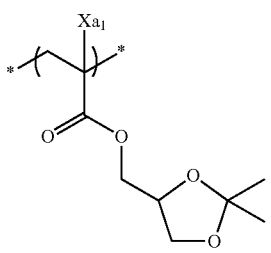
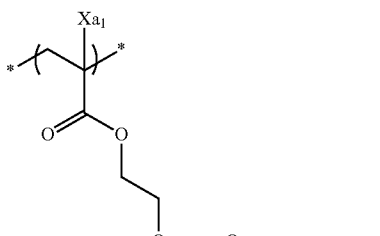
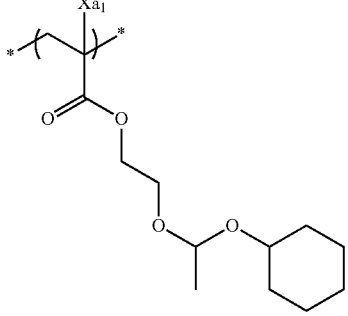
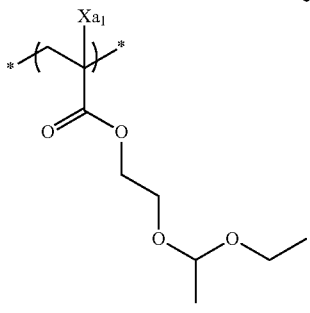

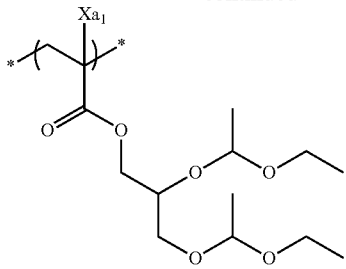

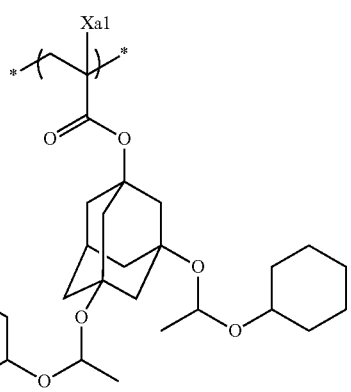

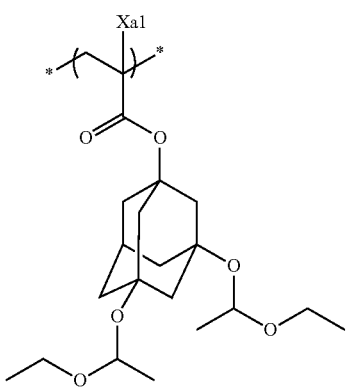

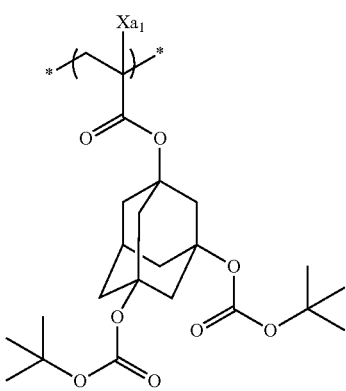

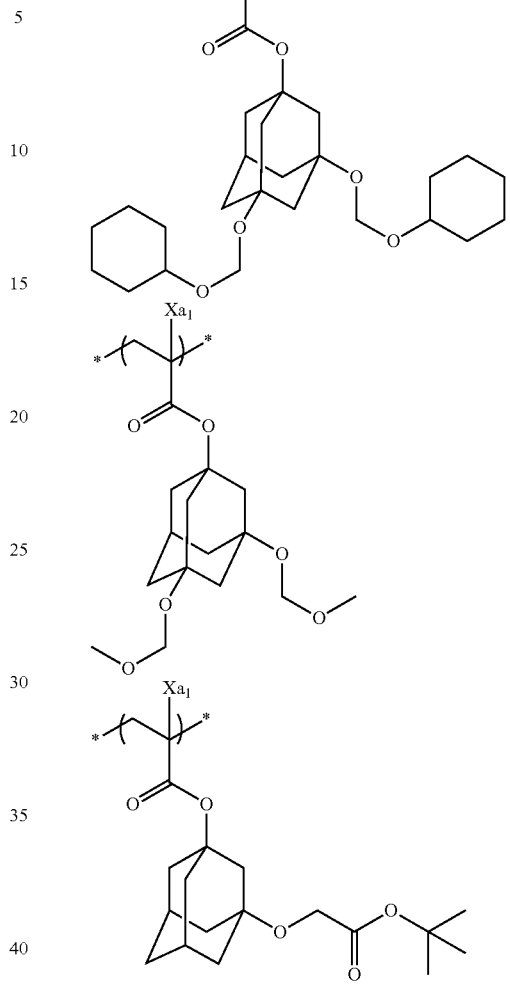

As for the repeating unit having an acid-decomposable group, one kind may be used, or two or more kinds may be used in combination.

The content of the acid-decomposable group-containing repeating unit (in the case of containing a plurality of kinds of repeating units, the total thereof) in the resin (A) is preferably from 5 to 80 mol %, more preferably from 5 to 75 mol %, still more preferably from 10 to 65 mol %, based on all repeating units in the resin (A).

(b) Repeating Units Having a Polar Group

It is preferred for resin (A) to contain repeating unit (b) having a polar group. By containing repeating unit (b), sensitivity of the composition containing the resin can be increased. Repeating unit (b) is preferably a non-acid-decomposable repeating unit (that is, the repeating unit does not have an acid-decomposable group).

As "polar groups" which can be contained in repeating unit (b), for example, the following (1) to (4) can be exemplified. Incidentally, in the following, "electronegativity" means the value by Pauling.

(1) A Functional Group Containing the Structure in which an Oxygen Atom and an Atom Having the Difference in Electronegativity Between the Oxygen Atom being 1.1 or More are Bonded by a Single Bond As such a polar group, a group containing the structure represented, for example, by O—H such as a hydroxyl group is exemplified.

(2) A Functional Group Containing the Structure in which a Nitrogen Atom and an Atom Having the Difference in Electronegativity Between the Nitrogen Atom being 0.6 or More are Bonded by a Single Bond As such a polar group, a group containing the structure represented, for example, by N—H such as an amino group is exemplified.

(3) A Functional Group Containing the Structure in which Two Atoms Different in Electronegativity by 0.5 or More are Bonded by a Double Bond or a Triple Bond As such a polar group, a group containing the structure represented, for example, by C≡N, C═O, N═O, S═O or C═N is exemplified.

(4) A Functional Group Having an Ionic Site

As such a polar group, a group having the site represented, for example, by $N^+$ or $S^+$ is exemplified.

The specific examples of partial structures that "polar group" can contain are shown below. In the following specific examples, $X^-$ represents a counter anion.

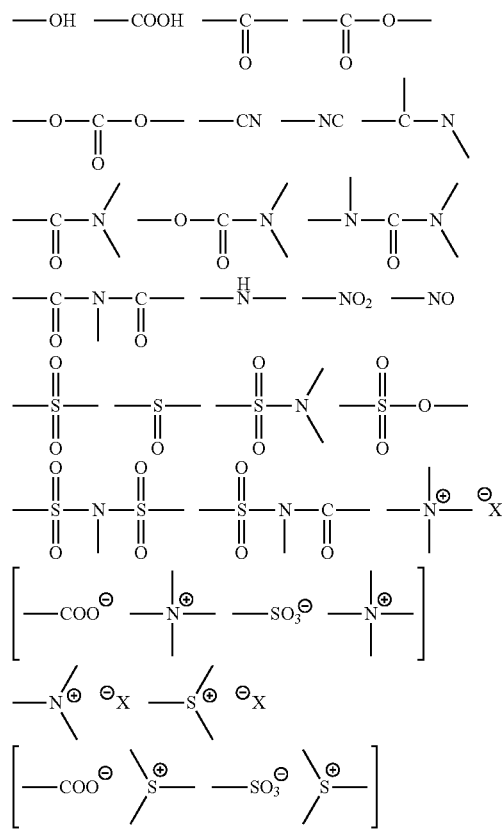

"Polar group" that repeating unit (b) can contain is preferably at least one selected from the group consisting of (I) a hydroxyl group, (II) a cyano group, (III) a lactone group, (IV) a carboxylic acid group or a sulfonic acid group, (V) an amido group, a sulfonamide group, or a group corresponding to the derivative thereof, (VI) an ammonium group or a sulfonium group, and a group obtained by combining two or more of these groups.

The polar group is preferably selected from a hydroxyl group, a cyano group, a lactone group, a carboxylic acid group, a sulfonic acid group, an amido group, a sulfonamide group, an ammonium group, a sulfonium group, and a group obtained by combining two or more of these groups, and especially preferably an alcoholic hydroxyl group, a cyano group, a lactone group, or a group containing a cyanolactone structure.

When a repeating unit having an alcoholic hydroxyl group is further added to the resin, the exposure latitude (EL) of a composition containing the resin can be further improved.

When a repeating unit having a cyano group is further added to the resin, the sensitivity of a composition containing the resin can be further improved.

When a repeating unit having a lactone group is further added to the resin, dissolution contrast in a developer containing an organic solvent can be further improved, by which it also becomes possible to further improve the dry etching resistance, coating stability and adhering property to substrate of the composition containing the resin.

When a repeating unit having a group containing a lactone structure having a cyano group is further added to the resin, dissolution contrast in a developer containing an organic solvent can be further improved, by which it also becomes possible to further improve the sensitivity, dry etching resistance, coating stability and adhering property to substrate of the composition containing the resin. In addition to the above, it is possible for a single repeating unit to bear functions resulting from each of the cyano group and the lactone group, thus the degree of freedom of design of the resin can further be increased.

When the polar group that repeating unit (b) has is an alcoholic hydroxyl group, repeating unit (b) is preferably represented by any one of the following formulae (I-1H) to (I-10H), more preferably represented by any one of formulae (I-1H) to (I-3H), and still more preferably represented by formulae (I-1H).

(I-1H)

(I-2H)

(I-3H)

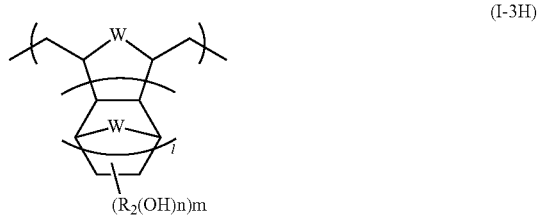

-continued

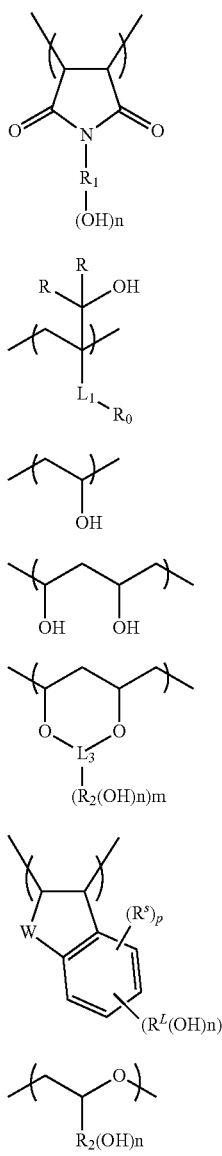

(I-4H)

(I-5H)

(I-6H)

(I-7H)

(I-8H)

(I-9H)

(I-10H)

In the above formulae, Ra, $R_1$, $R_2$, W, n, m, l, $L_1$, R, $R_0$, $L_3$, $R^L$, $R^S$ and p are respectively the same as in formulae (I-1) to (I-10).

When a repeating unit having a group capable of decomposing by the action of an acid to generate an alcoholic hydroxyl group is used in combination with a repeating unit represented by any one of the following formulae (I-1H) to (I-10H), it becomes possible to improve exposure latitude (EL) by control of distribution of acid by the alcoholic hydroxyl group and increase of sensitivity by the group capable of decomposing by the action of an acid to generate an alcoholic hydroxyl group without deteriorating other performances.

The content of the repeating unit having the alcoholic hydroxyl group is preferably 1 mol % to 60 mol % to all the repeating units in resin (A), more preferably 3 mol % to 50 mol %, and still more preferably 5 mol % to 40 mol %.

The specific examples of the repeating units represented by any of formulae (I-1H) to (I-10H) are shown below. In the formulae, Ra is the same meaning with those in formulae (I-1H) to (I-10H).

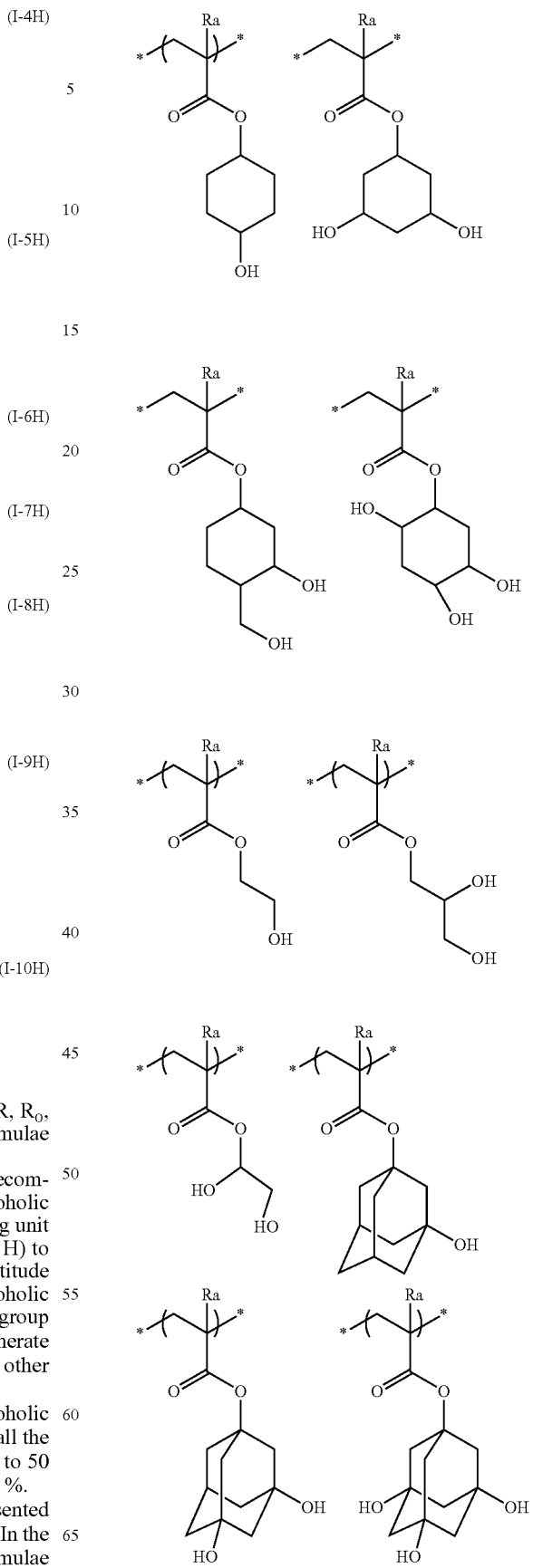

-continued

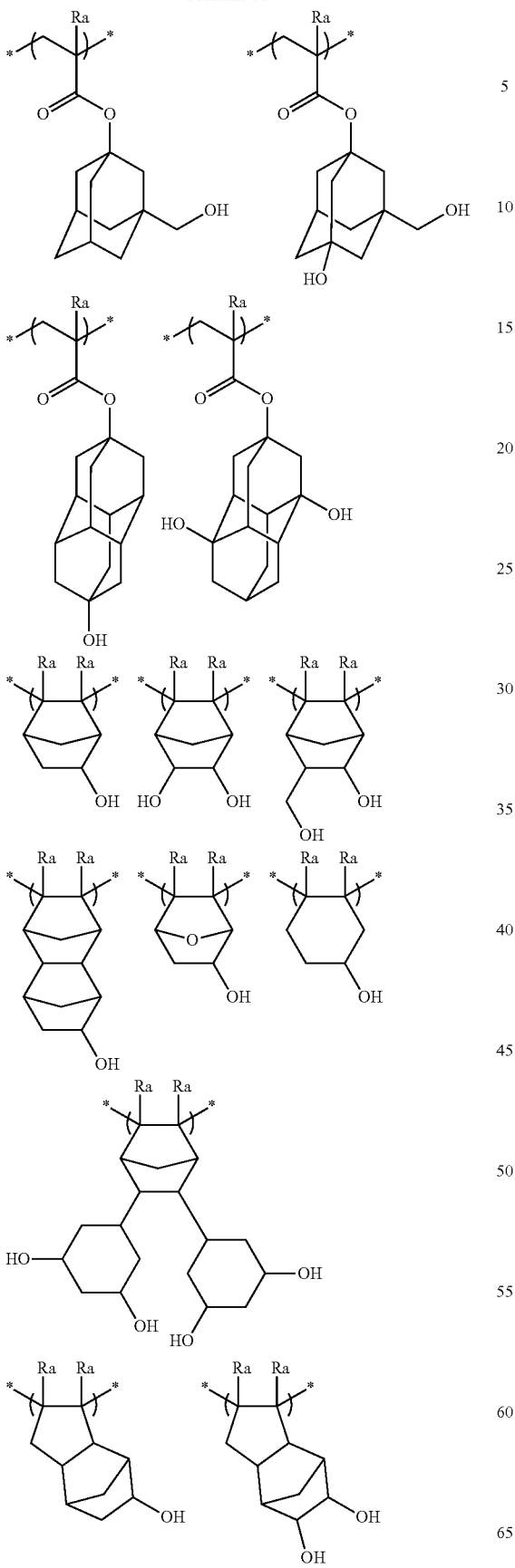

-continued

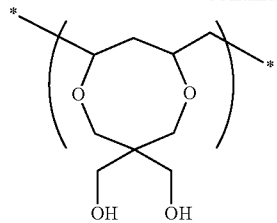

When the polar group that repeating unit (b) has is an alcoholic hydroxyl group or a cyano group, as one embodiment of preferred repeating unit, a repeating unit having an alicyclic hydrocarbon structure substituted with a hydroxyl group or a cyano group is exemplified. At this time, it is preferred not to have an acid-decomposable group. As the alicyclic hydrocarbon structure in the alicyclic hydrocarbon structure substituted with a hydroxyl group or a cyano group, an adamantyl group, a diamantyl group and a norbornane group are preferred. As preferred alicyclic hydrocarbon structure substituted with a hydroxyl group or a cyano group, a partial structure represented by any of the following formulae (VIIa) to (VIIc) is preferred. Adhering property to substrate and affinity with developer are improved by this constitution.

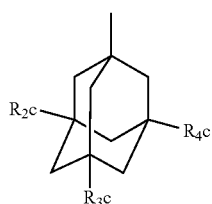
(VIIa)

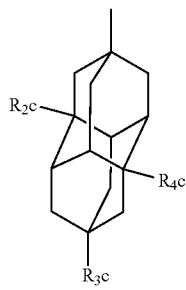
(VIIb)

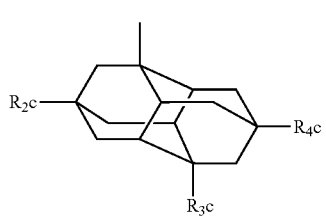
(VIIc)

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group, preferably one or two of $R_2c$ to $R_4c$ are a hydroxyl group and the remaining is a hydrogen atom. In formula (VIIa), more preferably two of $R_2c$ to $R_4c$ represent a hydroxyl group and the remaining is a hydrogen atom.

As the repeating unit having the partial structure represented by formula (VIIa), (VIIb) or (VIIc), a repeating unit represented by the following formula (AIIa), (AIIb) or (AIIc) can be exemplified.

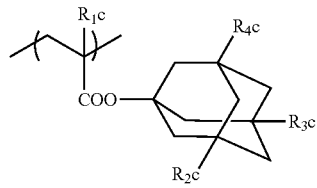
(AIIa)

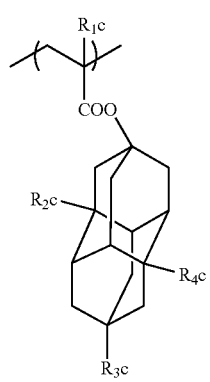
(AIIb)

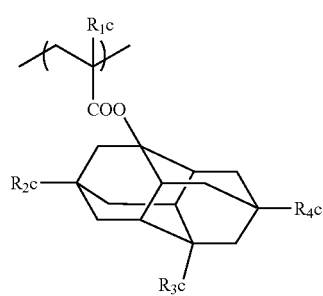
(AIIc)

In formulae (AIIa) to (AIIc), $R_1c$ represents a hydrogen atom, a methyl group, a trifluoromethyl group or a hydroxymethyl group.

$R_2c$, $R_3c$ and $R_4c$ respectively have the same meaning with $R_2c$, $R_3c$ and $R_4c$ in formulae (VIIa) to (VIIc).

Resin (A) may contain or may not contain a repeating unit having a hydroxyl group or a cyano group, but when resin (A) contain the repeating unit, the content of the repeating unit having a hydroxyl group or a cyano group is preferably 1 mol % to 60 mol % to all the repeating units in resin (A), more preferably 3 mol % to 50 mol %, and still preferably 5 mol % to 40 mol %.

The specific examples of repeating units having a hydroxyl group or a cyano group are shown below but the invention is not restricted thereto.

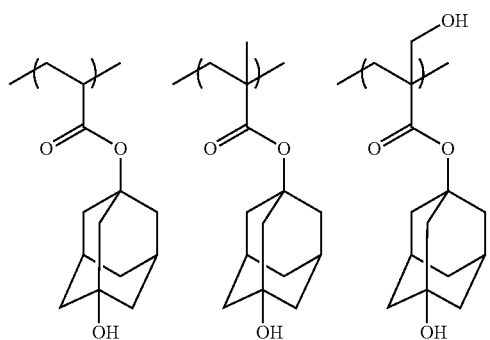

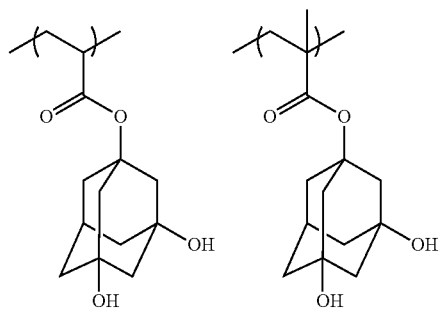

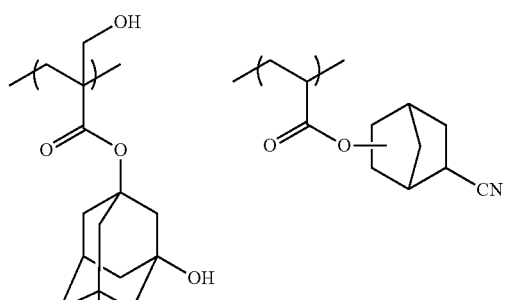

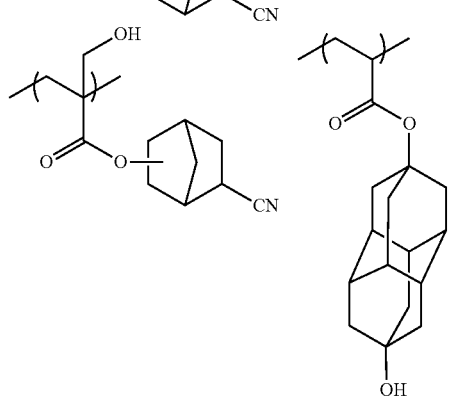

-continued

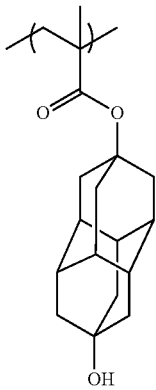

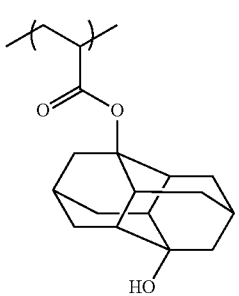

Repeating unit (b) may be a repeating unit having a lactone structure as the polar group.

As the repeating unit having a lactone structure, a repeating unit represented by the following formula (AII) is more preferred.

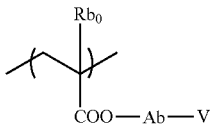

(AII)

In formula (AII), $Rb_0$ represents a hydrogen atom, a halogen atom or an alkyl group (preferably having a carbon number of 1 to 4) which may have a substituent.

Preferred examples of the substituent which may be substituted on the alkyl group of $Rb_0$ include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by combining these members. Ab is preferably a single bond or a divalent linking group represented by -$Ab_1$-$CO_2$—.

$Ab_1$ is a linear or branched alkylene group or a monocyclic or polycyclic cycloalkylene group and is preferably a methylene group, an ethylene group, a cyclohexylene group, an adamantylene group or a norbornylene group.

V represents a group having a lactone structure.

As the group having a lactone structure, any group may be used as long as it has a lactone structure, but a 5- to 7-membered ring lactone structure is preferred, and a 5- to 7-membered ring lactone structure to which another ring structure is fused to form a bicyclo or spiro structure is preferred. It is more preferred to contain a repeating unit having a lactone structure represented by any one of the following formulae (LC1-1) to (LC1-17). The lactone structure may be bonded directly to the main chain. Preferred lactone structures are (LC1-1), (LC1-4), (LC1-5), (LC1-6), (LC1-8), (LC1-13) and (LC1-14).

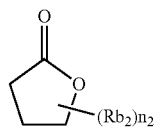

LC1-1

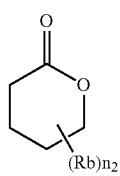

LC1-2

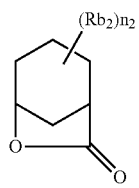

LC1-3

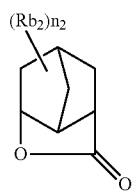

LC1-4

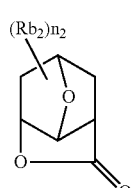

LC1-5

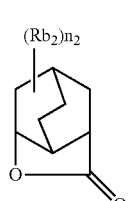

LC1-6

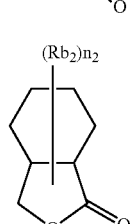

LC1-7

LC1-8 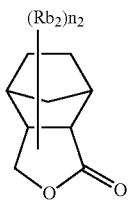

LC1-9 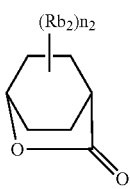

LC1-10 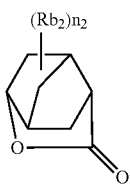

LC1-11 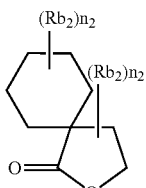

LC1-12 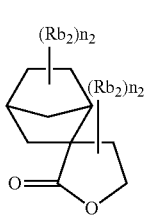

LC1-13 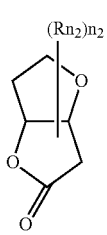

LC1-14 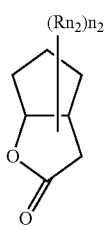

LC1-15 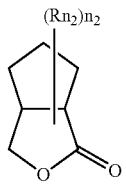

LC1-16 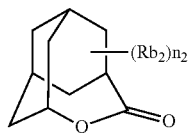

LC1-17 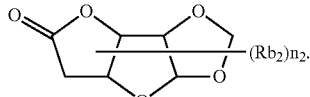

The lactone structure moiety may or may not have a substituent ($Rb_2$). Preferred examples of the substituent ($Rb_2$) include an alkyl group having a carbon number of 1 to 8, a monovalent cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is 2 or more, each substituent ($Rb_2$) may be the same as or different from every other substituents ($Rb_2$) and also, the plurality of substituents ($Rb_2$) may combine together to form a ring.

The repeating unit having a lactone group usually has an optical isomer, but any optical isomer may be used. One optical isomer may be used alone or a mixture of a plurality of optical isomers may be used. In the case of mainly using one optical isomer, the optical purity (ee) thereof is preferably 90% or more, more preferably 95% or more.

The resin (A) may or may not contain the repeating unit having a lactone structure, but in the case of containing the repeating unit having a lactone structure, the content of the repeating unit in the resin (A) is preferably from 1 to 70 mol %, more preferably from 3 to 65 mol %, still more preferably from 5 to 60 mol %, based on all repeating units.

Specific examples of the lactone structure-containing repeating unit in the resin (A) are illustrated below, but the present invention is not limited thereto. In the formulae, Rx represents H, $CH_3$, $CH_2OH$ or $CF_3$.

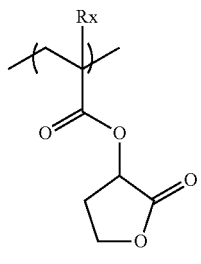 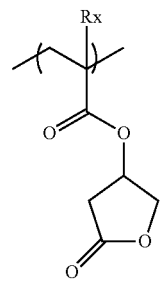

-continued

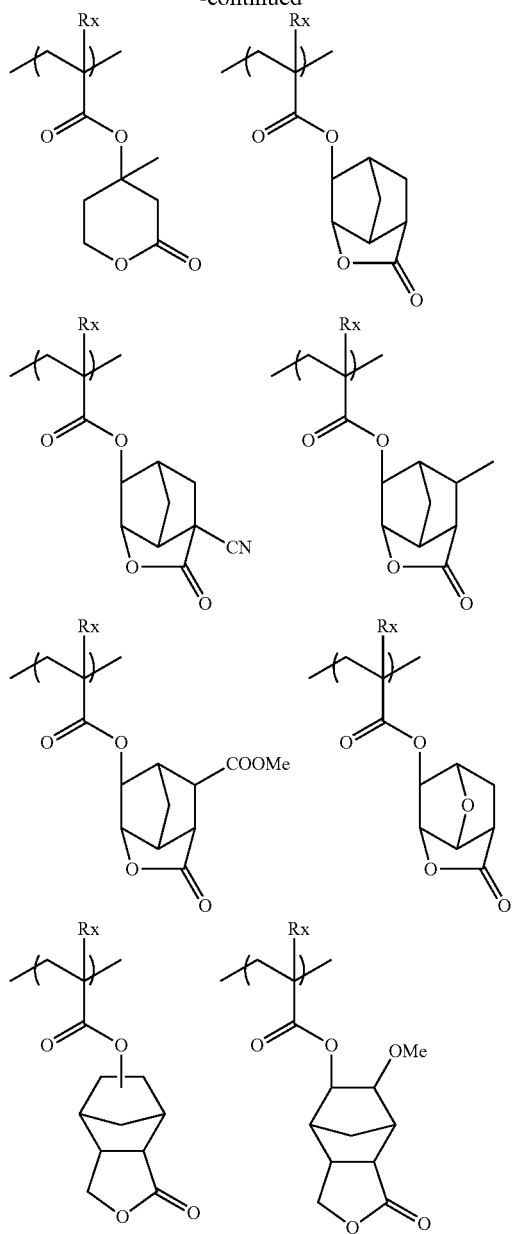

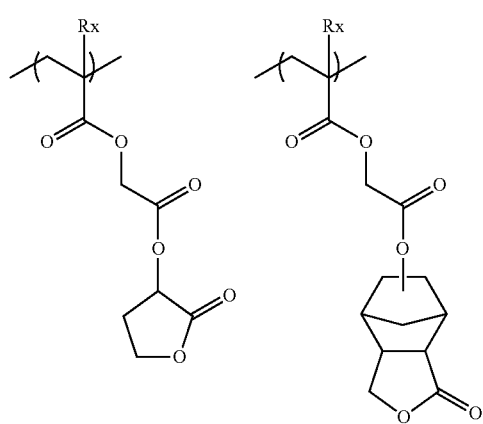

-continued

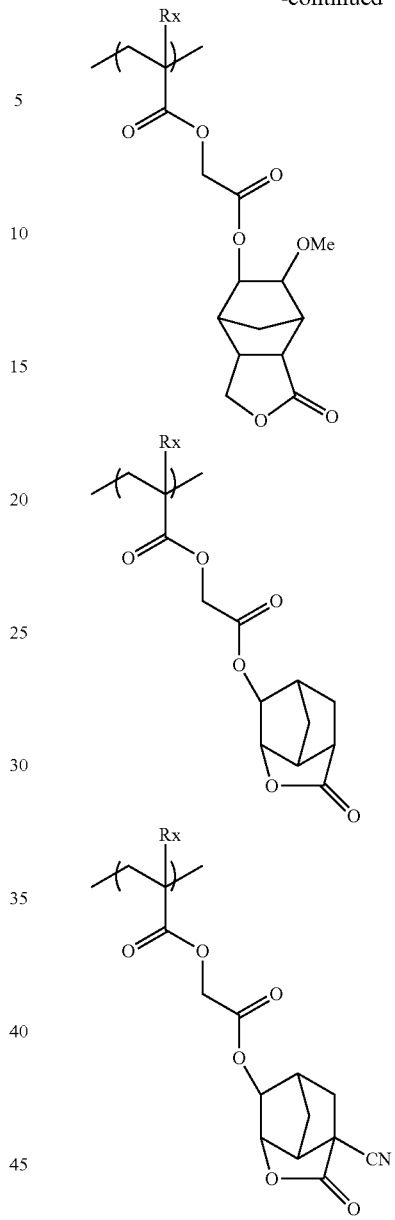

The polar group that repeating unit (b) may have is an acid group is also one especially preferred embodiment. As preferred acid groups, a phenolic hydroxyl group, a carboxylic acid group, a sulfonic acid group, a fluorinated alcohol group (e.g., a hexafluoroisopropanol group), a sulfonamide group, a sulfonylimido group, an (alkylsulfonyl)(alkylcarbonyl)methylene group, an (alkylsulfonyl)(alkylcarbonyl)imido group, a bis(alkylcarbonyl)methylene group, a bis (alkylcarbonyl)imido group, a bis(alkylsulfonyl)methylene group, a bis(alkylsulfonyl)imido group, a tris-(alkylcarbonyl)methylene group, and a tris(alkylsulfonyl)methylene group are exemplified. It is more preferred that repeating unit (b) is a repeating unit having a carboxyl group. By containing a repeating unit having an acid group, resolution in a use for contact hole increases. As repeating units having an acid group, a repeating having an acid group directly bonded to the main chain of the resin such as a repeating unit by an acrylic acid or a methacrylic acid, a repeating unit having an acid group bonded to the main chain of the resin via a linking group, and a repeating unit having an acid group introduced to the terminal of the polymer chain by using a polymerization initiator or a chain transfer agent at the time of polymerization are known and all of them are preferred. Especially preferred is a repeating unit by an acrylic acid or a methacrylic acid.

An acid group that repeating unit (b) can have may contain or may not contain an aromatic ring, but when an aromatic ring is contained, the aromatic ring is preferably selected from acid groups other than a phenolic hydroxyl group. When repeating unit (b) has an acid group, the content of the repeating unit having an acid group is preferably 30 mol % or less to all the repeating units in resin (A), and more preferably 20 mol % or less. When resin (A) contains a repeating unit having an acid group, the content of the repeating unit having an acid group in resin (A) is generally 1 mol % or more.

The specific examples of repeating units having an acid group are shown below but the invention is not restricted thereto.

In the specific examples, Rx represents H, $CH_3$, $CH_2OH$ or $CF_3$.

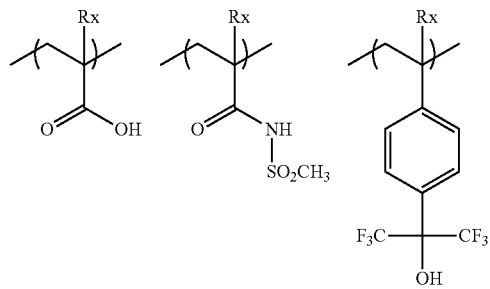

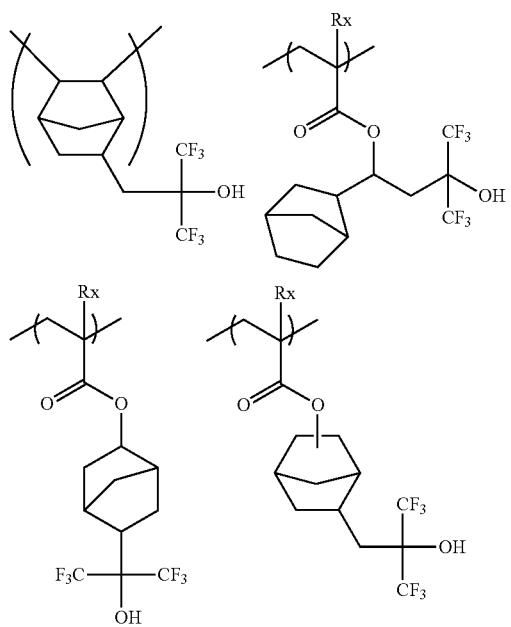

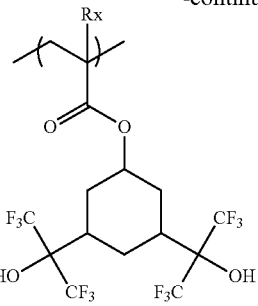

Resin (A) according to the invention can contain non-acid-decomposable repeating unit (b) having a phenolic hydroxyl group. As repeating unit (b) in this case, a structure represented by the following formula (I) is more preferred.

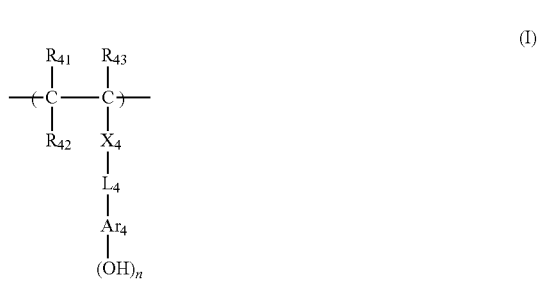

In formula (I), each of $R_{41}$, $R_{42}$ and $R_{43}$ independently represents a hydrogen atom, an alkyl group, a halogen atom, a cyano group or an alkoxycarbonyl group, provided that $R_{42}$ may be bonded to $Ar_4$ to form a ring, and $R_{42}$ represents a single bond or an alkylene group in that case.

$X_4$ represents a single bond, —COO— or —CONR$_{64}$—, and $R_{64}$ represents a hydrogen atom or an alkyl group.

$L_4$ represents a single bond or an alkylene group.

$Ar_4$ represents an (n+1)-valent aromatic ring group, and when $Ar_4$ is bonded to $R_{42}$ to form a ring, $Ar_4$ represents an (n+2)-valent aromatic ring group.

n represents an integer of 1 to 4.

The specific examples of the alkyl group, cycloalkyl group, halogen atom, alkoxycarbonyl group of $R_{41}$, $R_{42}$ and $R_{43}$ in formula (I) and the substituents that these groups can have are the same with the specific examples as described in each group of $R_{51}$, $R_{52}$ and $R_{53}$ in formula (V).

$Ar_4$ represents an (n+1)-valent aromatic ring group. The divalent aromatic ring group in the case where n is 1 may have a substituent. For example, an arylene group having 6 to 18 carbon atoms, e.g., a phenylene group, a tolylene group, a naphthylene group, and an anthracenylene, and an aromatic ring group containing a heterocyclic ring such as thiophene, furan, pyrrole, benzothiophene, benzofuran, benzopyrrole, triazine, imidazole, benzimidazole, triazole, thiadiazole or thiazole are preferably exemplified.

As the specific example of the (n+1)-valent aromatic ring group in the case where n represents an integer of 2 or more, a group obtained by removing arbitrary (n−1)-number of hydrogen atom(s) from any of the above-described specific examples of the divalent aromatic ring groups can be preferably exemplified.

The (n+1)-valent aromatic ring group may further have a substituent.

As the substituents that the above alkyl group, cycloalkyl group, alkoxycarbonyl group, alkylene group, and (n+1)- valent aromatic ring group may have, the alkyl group, methoxy group, ethoxy group, hydroxyethoxy group, propoxy group, hydroxypropoxy group, alkoxy group such as a butoxy, and aryl group such as a phenyl group enumerated in $R_{51}$, $R_{52}$ or $R_{53}$ in formula (V) are exemplified.

As the alkyl group of $R_{64}$ in —$CONR_{64}$— (wherein $R_{64}$ represents a hydrogen atom or an alkyl group) represented by $X_4$, the same alkyl groups as in the alkyls group represented by each of $R_{61}$ to $R_{63}$ are exemplified.

$X_4$ preferably represents a single bond, —OCO— or —CONH—, and more preferably a single bond or —COO—.

As the alkylene group represented by $L_4$, preferably an alkylene group having 1 to 8 carbon atoms, e.g., a methylene group, an ethylene group, a propylene group, a butylenes group, a hexylene group, and an octylene group are exemplified, each of which group may have a substituent.

As $Ar_4$, an aromatic ring group having 6 to 18 carbon atoms which may have a substituent is more preferred, and a benzene ring group, a naphthalene ring group and a biphenylene ring group are especially preferred.

It is preferred for repeating unit (b) to have a hydroxystyrene structure. That is, $Ar_4$ is preferably a benzene ring group.

The specific examples of repeating unit (b) represented by formula (I) are shown below, but the invention is not restricted thereto. In the following formulae, a represents an integer of 1 or 2.

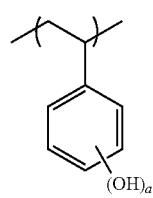
(B-1)

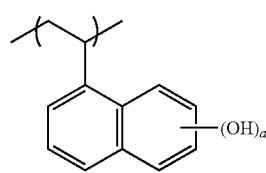
(B-2)

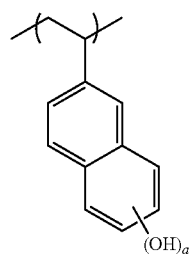
(B-3)

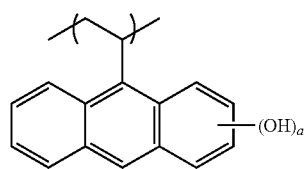
(B-4)

-continued

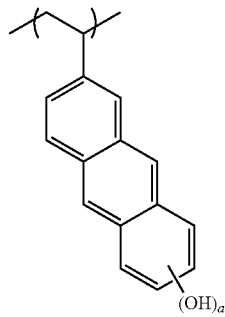
(B-5)

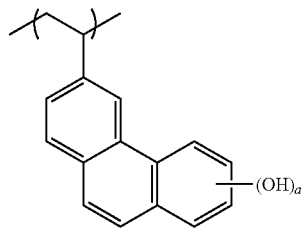
(B-6)

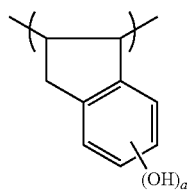
(B-7)

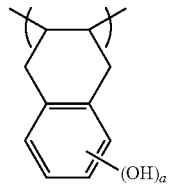
(B-8)

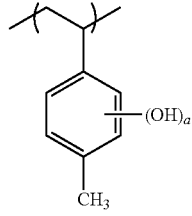
(B-9)

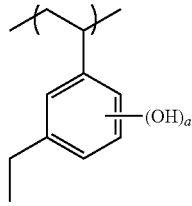
(B-10)

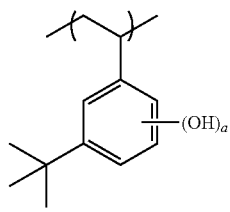
(B-11)

(B-12) 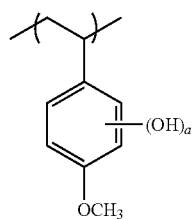
(B-13) 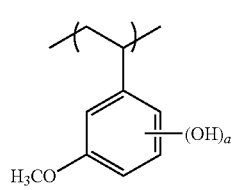
(B-14) 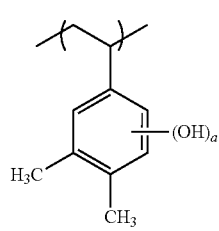
(B-15) 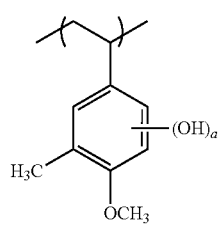
(B-16) 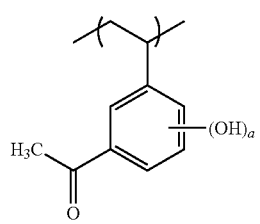
(B-17) 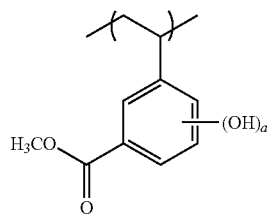
(B-18) 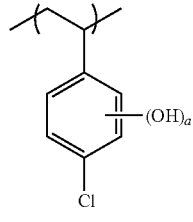
(B-19) 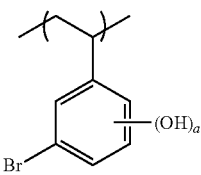
(B-20) 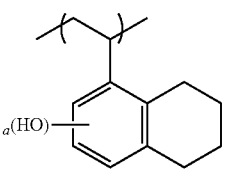
(B-21) 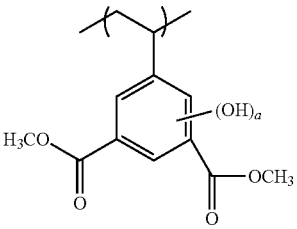
(B-22) 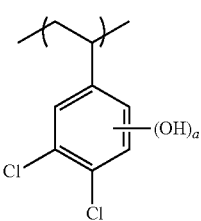
(B-23) 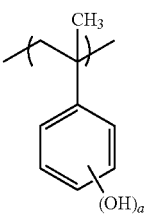
(B-24) 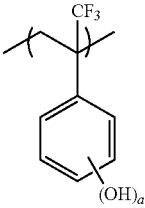
(B-25) 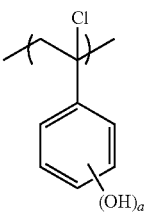

(B-26)
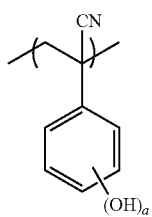

(B-27)
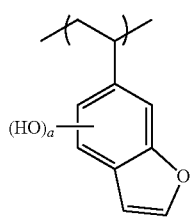

(B-28)
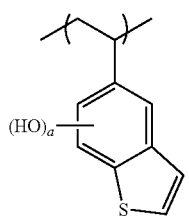

(B-29)
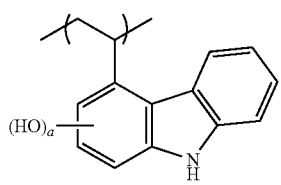

(B-30)
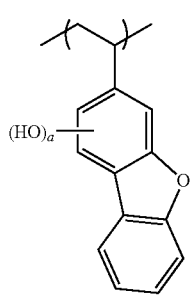

(B-31)
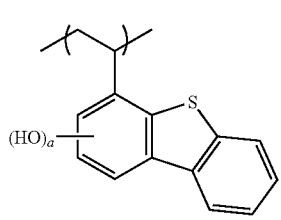

(B-32)
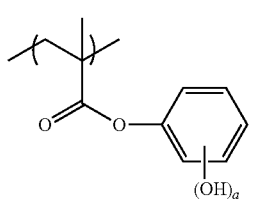

(B-33)
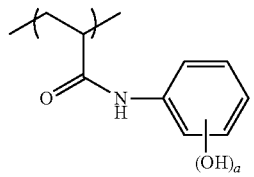

(B-34)
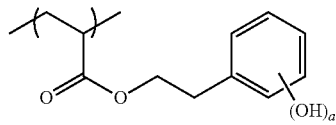

(B-35)
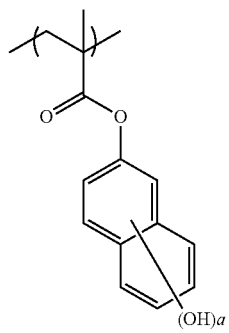

(B-36)
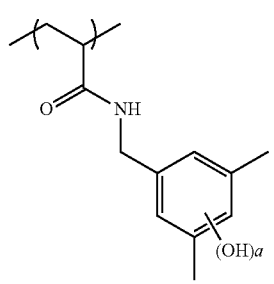

(B-37)
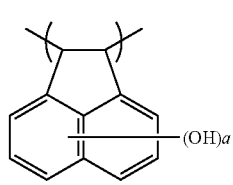

(B-38)
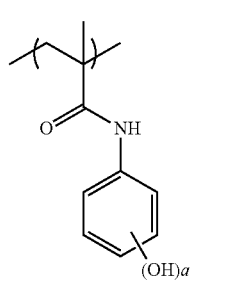

Resin (A) may contain two or more kinds of repeating units represented by formula (I).

A repeating unit having a phenolic hydroxyl group such as repeating unit (b) represented by formula (I) has a tendency to heighten the solubility of resin (A) in an organic solvent, and so there are cases where the repeating unit is preferably not added in a large amount in the point of resolution. This tendency reveals more strongly in repeating units deriving from hydroxystyrenes (that is, the case where both $X_4$ and $L_4$ represent a single bond in formula (I)), and the cause is not clear but it is presumed for the reason that the phenolic hydroxyl group is present in the vicinity of the main chain. Thus, in the invention, the content of the repeating unit represented by formula (I) (for example, the repeating unit represented by formula (I), in which both $X_4$ and $L_4$ represent a single bond) is preferably 4 mol % or less, more preferably 2 mol % or less, and most preferably 0 mol % (that is, the repeating unit is not contained) on the basis of all the repeating units of resin (A).

(c) Repeating Unit Having a Plurality of Aromatic Rings

Resin (A) may have repeating unit (c) having a plurality of aromatic rings represented by the following formula (c1).

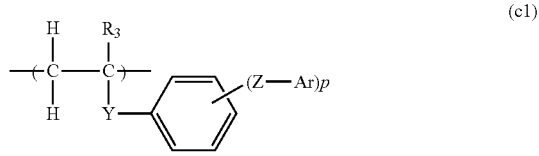

In formula (c1), $R_3$ represents a hydrogen atom, an alkyl group, a halogen atom, a cyano group or a nitro group; Y represents a single bond or a divalent linking group; Z represents a single bond or a divalent linking group; Ar represents an aromatic ring group; and p represents an integer of 1 or more.

The alkyl group represented by $R_3$ may be straight chain or branched, and, for example, a methyl group, an ethyl group, an n-propyl group, an i-propyl group, an n-butyl group, a sec-butyl group, a t-butyl group, an n-pentyl group, an n-hexyl group, an n-heptyl group, an n-octyl group, an n-nonyl group, an n-decanyl group, and an i-butyl group are exemplified. Each of these groups may further have a substituent, and as preferred substituents, an alkoxy group, a hydroxyl group, a halogen atom and a nitro group are exemplified. As the alkyl group having a substituent, a $CF_3$ group, an alkyloxycarbonylmethyl group, an alkylcarbonyloxymethyl group, a hydroxymethyl group, and an alkoxymethyl group are preferred.

As the halogen atom represented by $R_3$, a fluorine atom, a chlorine atom, a bromine atom and an iodine atom are exemplified, and a fluorine atom is especially preferred.

Y represents a single bond or a divalent linking group. The examples of the divalent linking groups include, e.g., an ether group (an oxygen atom), a thioether group (a sulfur atom), an alkylene group, an arylene group, a carbonyl group, a sulfide group, a sulfone group, —COO—, —CONH—, —$SO_2$NH—, —$CF_2$—, —$CF_2CF_2$—, —$OCF_2$O—, —$CF_2OCF_2$—, —SS—, —$CH_2SO_2CH_2$—, —$CH_2COCH_2$—, —$COCF_2$CO—, —COCO—, —OCOO—, —$OSO_2$O—, an amino group (a nitrogen atom), an acyl group, an alkylsulfonyl group, —CH=CH—, —C≡C—, an aminocarbonylamino group, an aminosulfonylamino group, and a group obtained by combining these groups. The number of carbon atoms of Y is preferably 15 or less, and more preferably 10 or less.

Y preferably represents a single, a —COO— group, a —COS— group, or a —CONH— group, more preferably a —COO— group or a —CONH— group, and especially preferably a —COO— group.

Z represents a single bond or a divalent linking group. The examples of the divalent linking groups include, e.g., an ether group (an oxygen atom), a thioether group (a sulfur atom), an alkylene group, an arylene group, a carbonyl group, a sulfide group, a sulfone group, —COO—, —CONH—, —$SO_2$NH—, an amino group (a nitrogen atom), an acyl group, an alkylsulfonyl group, —CH=CH—, an aminocarbonylamino group, an aminosulfonylamino group, and a group obtained by combining these groups.

Z preferably represents a single bond, an ether group, a carbonyl group or —COO—, more preferably a single bond or an ether group, and especially preferably a single bond.

Ar represents an aromatic ring group, specifically a phenyl group, a naphthyl group, an anthracenyl group, a phenanthrenyl group, a quinolinyl group, a furanyl group, a thiophenyl group, a fluorenyl-9-on-yl group, an anthraquinonyl group, a phenanthraquinonyl group, and a pyrrole group are exemplified, and a phenyl group is preferred. These aromatic ring groups may further have a substituent. As preferred substituents, an alkyl group, an alkoxy group, a hydroxyl group, a halogen atom, a nitro group, an acyl group, an acyloxy group, an acylamino group, a sulfonylamino group, aryl group, e.g., a phenyl group, an aryloxy group, an arylcarbonyl group, and a heterocyclic residue are exemplified. Of these groups, a phenyl group is preferred from the viewpoint of capable of controlling deterioration of exposure latitude attributable to out-of-band light and deterioration of the pattern shape.

p is an integer of 1 or more, and preferably an integer of 1 to 3.

Repeating unit (c) is more preferably a repeating unit represented by the following formula (c2).

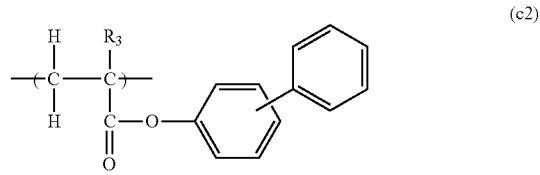

In formula (c2), $R_3$ represents a hydrogen atom or an alkyl group. The preferred alkyl groups represented by $R_3$ are the same with those in formula (c1).

Concerning extreme ultraviolet radiation (EUV ray) exposure, leaking light (out-of-band light) occurring in ultraviolet region of wavelength of 100 nm to 400 nm deteriorates, surface roughness, and as a result resolution and LWR performance are liable to lower due to bridge between patterns and breakage of the pattern.

However, the aromatic ring in repeating unit (c) functions as the inside filter capable of absorbing the above-described out-of-band light. Accordingly, from the aspects of high resolution and low LWR, it is preferred for resin (A) to contain repeating unit (c).

Here, for obtaining high resolution, it is preferred that repeating unit (c) does not contain a phenolic hydroxyl group (a hydroxyl group directly bonded onto the aromatic ring).

The specific examples of repeating unit (c) are shown below, but the invention is not restricted thereto.

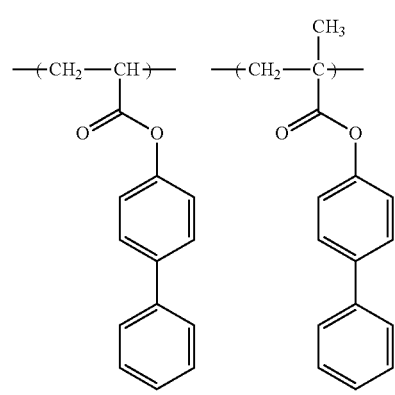
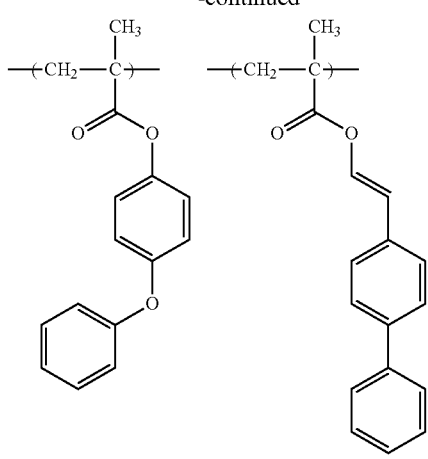
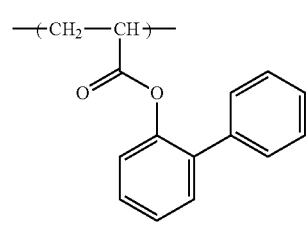
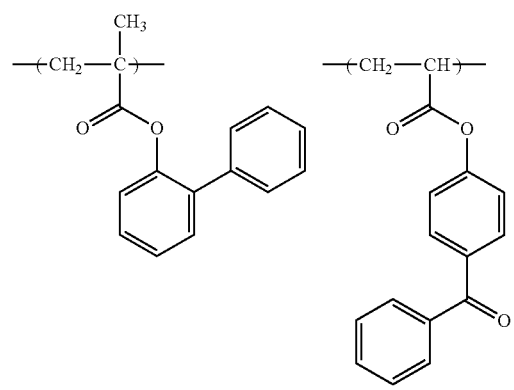
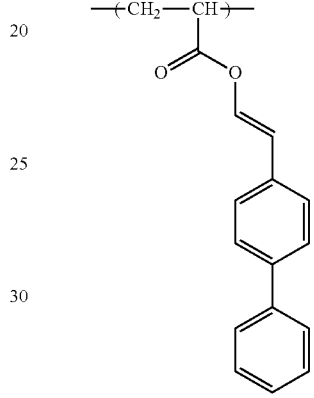
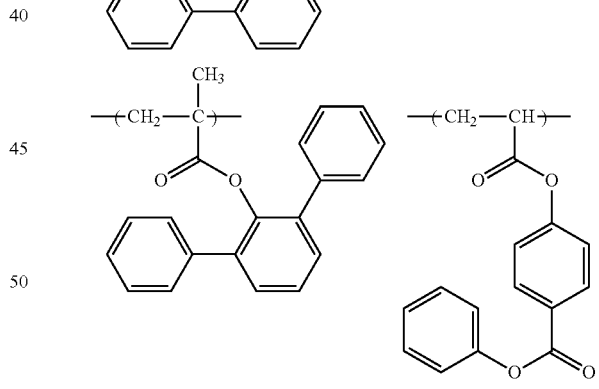
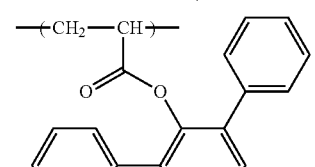
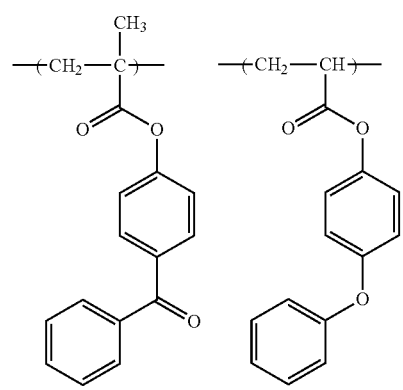
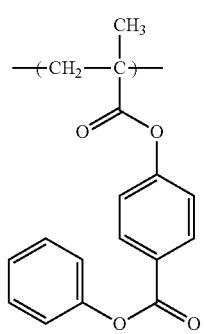

127
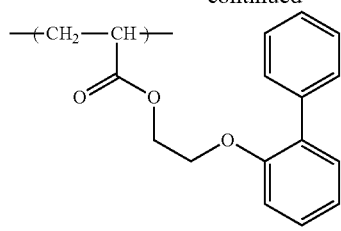
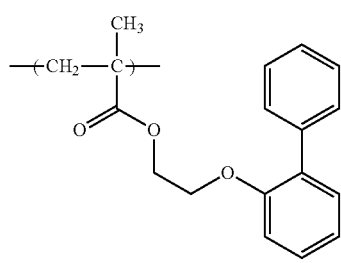
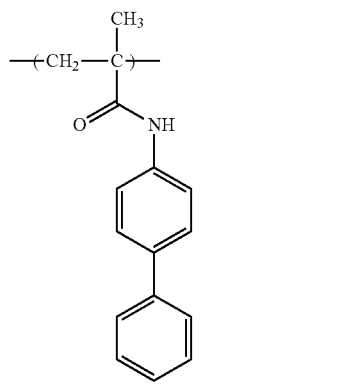
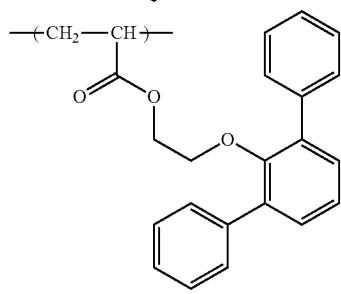
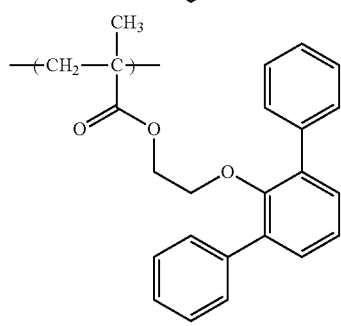
128
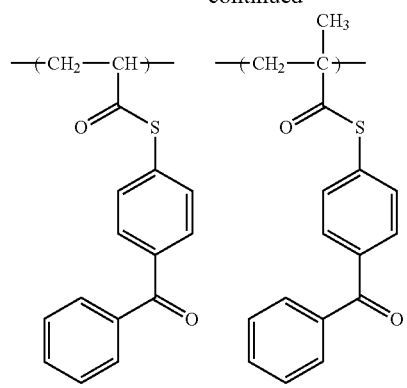
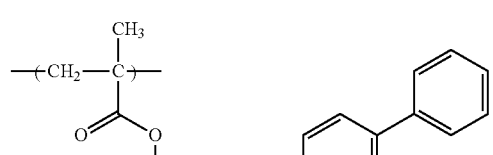
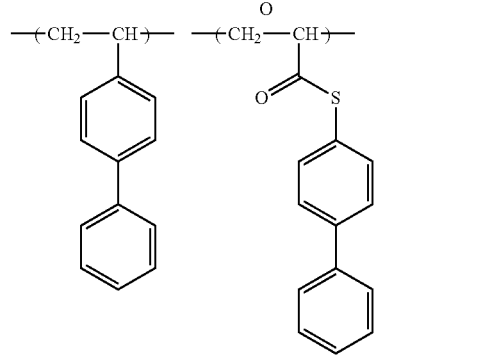
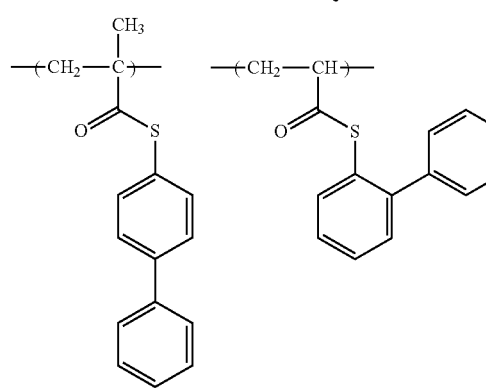

129
-continued
130
-continued
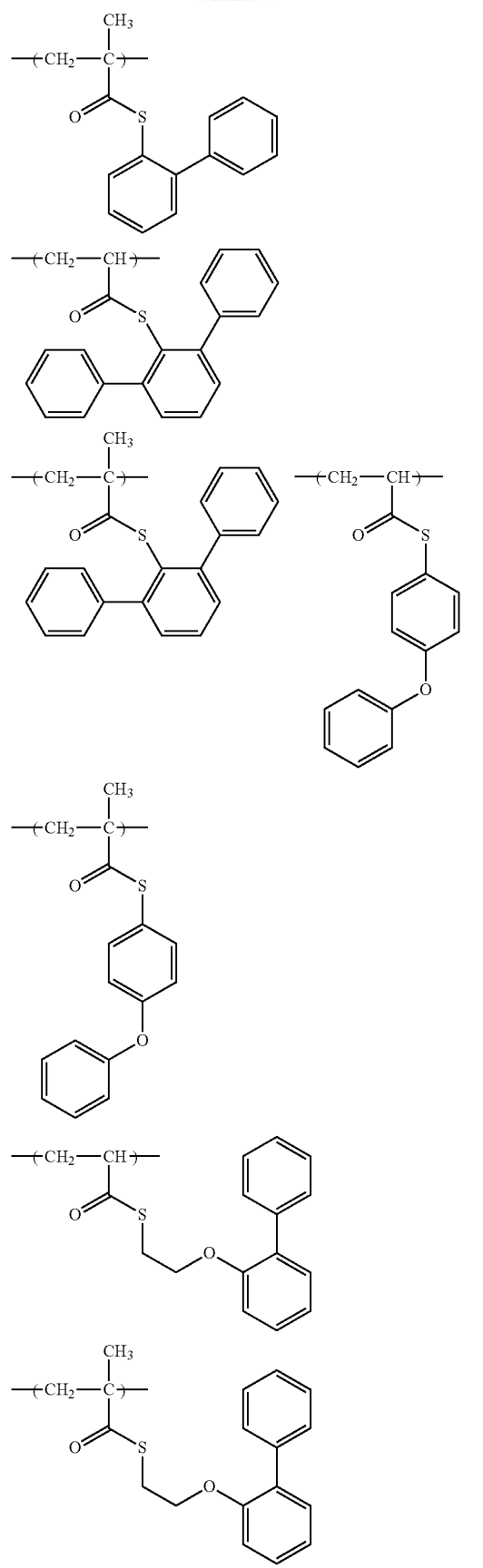
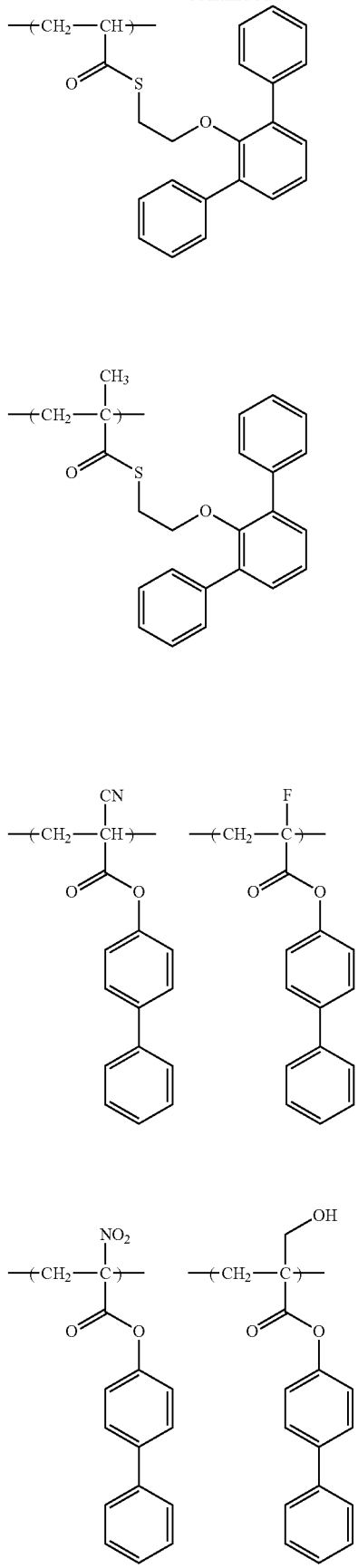

-continued

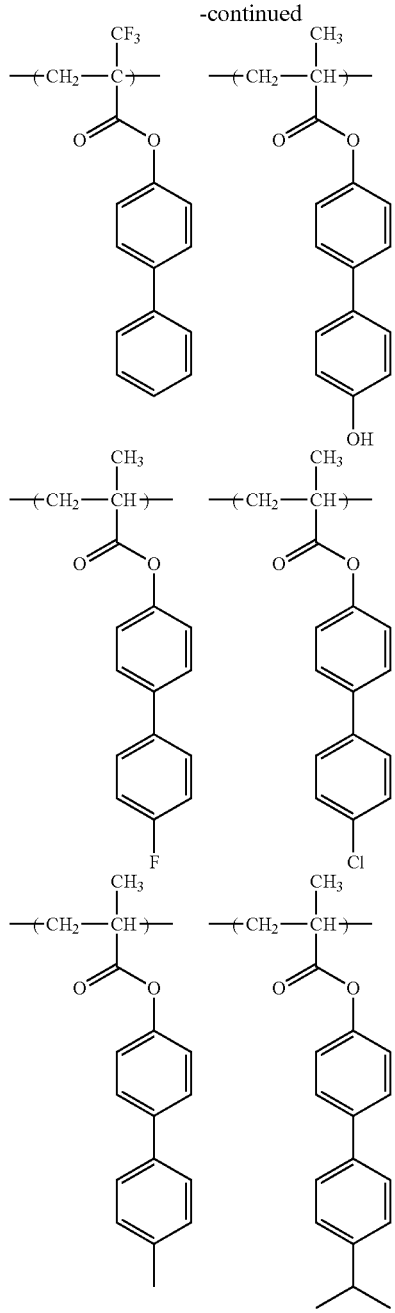

Resin (A) may contain or may not contain repeating unit (c), but when resin (A) contains repeating unit (c), the content of repeating unit (c) is preferably in the range of 1 mol % to 30 mol % to all the repeating units in resin (A), more preferably in the range of 1 mol % to 20 mol %, and still preferably in the range of 1 mol % to 15 mol %. Resin (A) may contain two or more kinds of repeating units (c) in combination.

Resin (A) in the invention may arbitrarily contain repeating units other than repeating units (a) to (c). As an example of such other repeating unit, resin (A) can contain a repeating unit having an alicyclic hydrocarbon structure not having further polar groups (for example, the above shown acid group, hydroxyl group and cyano group) and not showing acid decomposition property, by which the solubility of the resin can be properly adjusted at the time of development using a developer containing an organic solvent. As such a repeating unit, a repeating unit represented by the following formula (IV) can be exemplified.

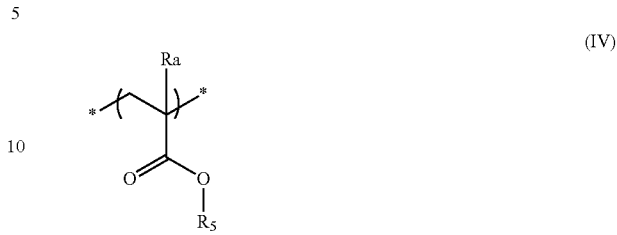

In formula (IV), $R_5$ represents a hydrocarbon group having at least one cyclic structure and having no polar group.

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.0$^{2,6}$]decane ring and tricyclo[4.3.1.1$^{2,5}$]undecane ring, and a tetracyclic hydrocarbon ring such as tetracyclo[4.4.0.1$^{2,5}$.1$^{7,10}$] dodecane ring and perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricycle[5,2,1,0$^{2,6}$]decanyl group. Of these crosslinked cyclic hydrocarbon rings, a norbornyl group and an adamantyl group are more preferred.

These alicyclic hydrocarbon groups may have a substituent, and preferred examples of the substituent include a halogen atom, an alkyl group, a hydroxyl group with a hydrogen atom being substituted for, and an amino group with a hydrogen atom being substituted for. The halogen atom is preferably bromine atom, chlorine atom or fluorine atom, and the alkyl group is preferably methyl group, ethyl group, butyl group or tert-butyl group. This alkyl group may further have a substituent, and the substituent which may be further substituted on the alkyl group includes a halogen atom, an alkyl group, a hydroxyl group with a hydrogen atom being substituted for, and an amino group with a hydrogen atom being substituted for.

Examples of the substituent for hydrogen atom include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

The resin (A) may or may not contain a repeating unit having a polar group-free alicyclic hydrocarbon structure and not exhibiting acid decomposability, but in the case of containing the repeating unit, the content thereof is preferably from 1 to 20 mol %, more preferably from 5 to 15 mol %, based on all repeating units in the resin (A).

Specific examples of the repeating unit having a polar group-free alicyclic hydrocarbon structure and not, exhibiting acid decomposability are illustrated below, but the present invention is not limited thereto. In the formulae, Ra represents H, $CH_3$, $CH_2OH$ or $CF_3$.

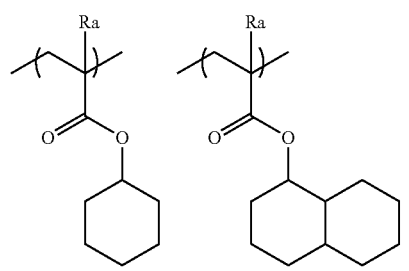

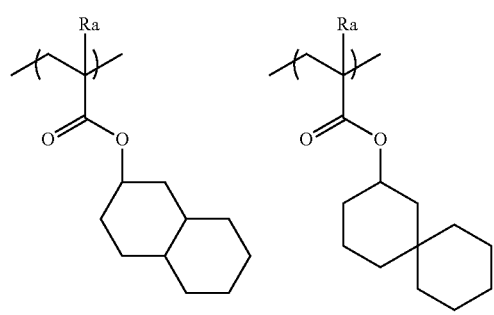

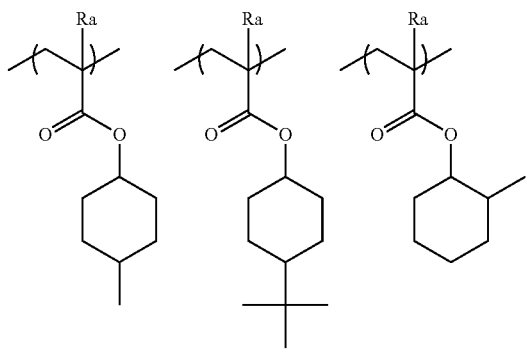

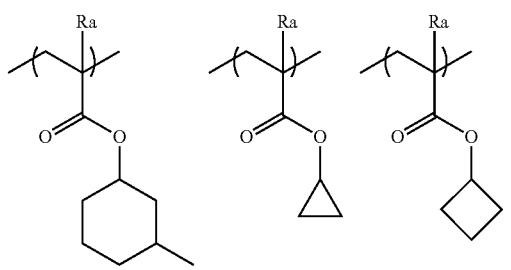

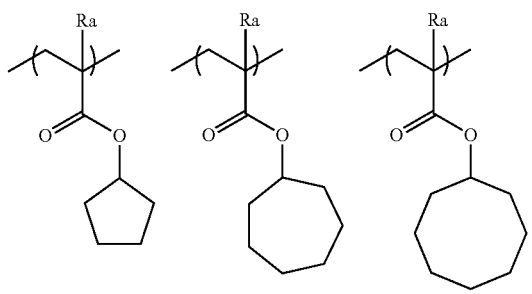

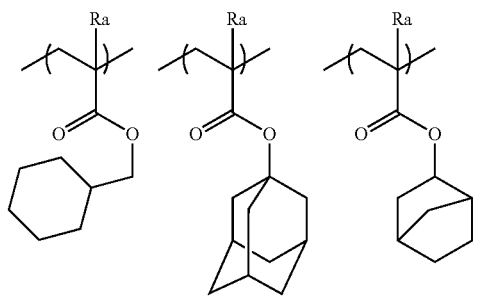

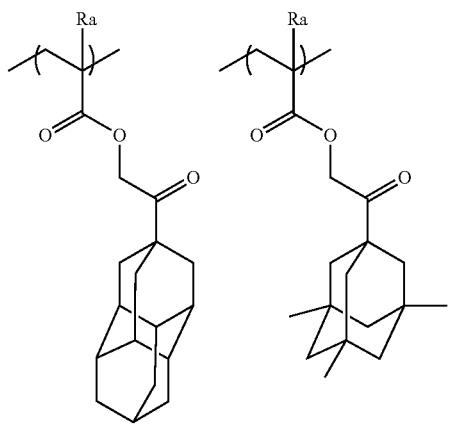

-continued

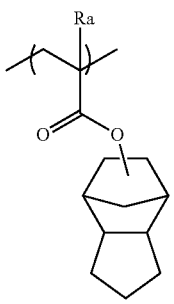

Resin (A) may also contain the following monomer components in view of the improvements of Tg and dry etching resistance, and effect of inside filter for out-of-band light.

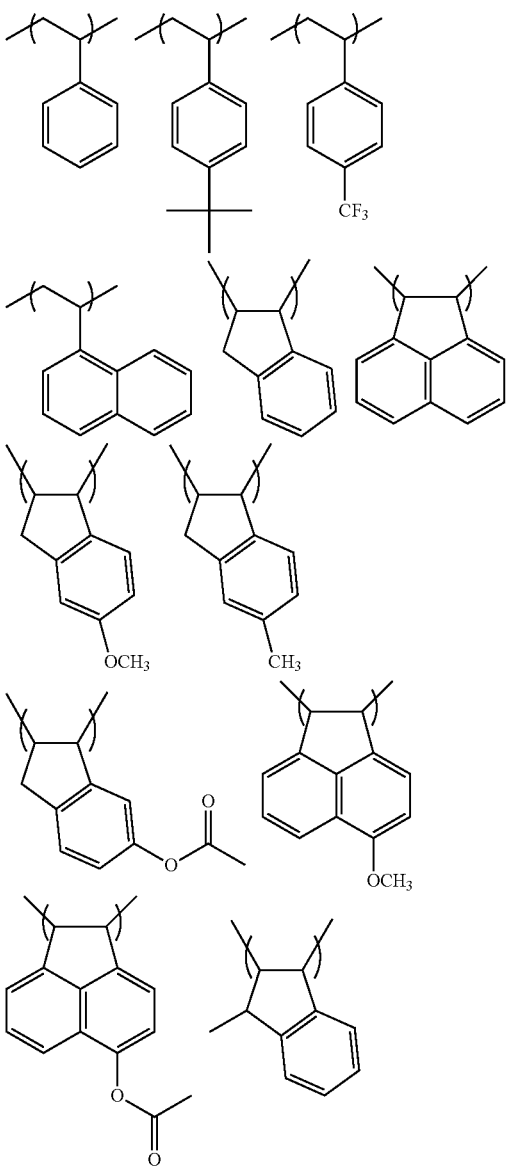

In resin (A) for use in the composition of the invention, the content molar ratio of each repeating structural unit is properly set for regulating the dry etching resistance, standard developer aptitude, adhesion to the substrate, resist profile, and generally required performances of the resist such as resolution, heat resistance and sensitivity.

The form of resin (A) may be any of random, block, comb and star types.

Resin (A) can be synthesized by, for example, radical polymerization, cationic polymerization, or anionic polymerization of unsaturated monomer corresponding to each structure. It is also possible to obtain an objective resin by polymerization with an unsaturated monomer corresponding to the precursor of each structure, and then by performing polymeric reaction.

For example, as general synthesizing methods, batch polymerization of performing polymerization by dissolving an unsaturated monomer and a polymerization initiator in a solvent and heating, and drop polymerization of adding a solution of an unsaturated monomer and a polymerization initiator to a heated solvent by dropping over 1 to 10 hours are given, and drop polymerization is preferred.

As the solvents for use in polymerization, for example, solvents which can be used in manufacturing the later-described electron beam-sensitive or extreme ultraviolet radiation-sensitive resin composition can be exemplified, and more preferably it is preferred to perform polymerization by using the same solvents with the solvents used in the composition of the invention. By using the same solvents, generation of particles during preservation can be inhibited.

Polymerization reaction is preferably carried out in the atmosphere of inert gases such as nitrogen and argon gas. Polymerization is initiated with commercially available radical initiators as polymerization initiators (azo initiators, peroxides and the like). Azo initiators are preferred as radical initiators and, for example, azo initiators having an ester group, a cyano group, or a carboxyl group are preferably used. As preferred initiators, azobisisobutyronitrile, azobisdimethylvaleronitrile, and dimethyl-2,2'-azobis(2-methylpropionate) are exemplified. If necessary, polymerization may be performed in the presence of a chain transfer agent (e.g., alkyl mercaptan and the like).

The reaction concentration is 5% by mass to 70% by mass, and preferably 10% by mass to 50% by mass. The reaction temperature is generally 10° C. to 150° C., preferably 30° C. to 120° C., and more preferably 40° C. to 100° C.

The reaction temperature is generally 1 hour to 48 hours, preferably 1 hour to 24 hours, and more preferably 1 hour to 12 hours.

After termination of the reaction, the temperature is allowed to be cooled to room temperature, and followed by purification. Various ordinary methods can be applied to the purification. For example, purification methods in the state of a solution such as washing, liquid-liquid extraction of combining proper solvents to remove residual monomer and oligomer components, and ultrafiltration of extractive removal of only the monomer components of a molecular weight lower than the prescribed molecular weight, and purification in a solid state such as reprecipitation of removing residual monomers and the like by dropping a resin solution into a poor solvent to coagulate the resin in the poor solvent, and washing the filtered resin slurry with a poor solvent can be used. For example, the resin is precipitated as a solid by bringing the solvent in which the resin is hardly soluble or insoluble (poor solvent) into contact with the reaction solution in a volume amount of the solvent of 10 times or less of the reaction solution, and preferably in a volume amount of 10 to 5 times.

Poor solvents are sufficient as the solvents for use in the process of precipitation or reprecipitation from the polymer solution (precipitation or reprecipitation solvents), and such solvents can be arbitrarily selected from among hydrocarbon, hydrocarbon halide, a nitro compound, ether, ketone, ester, carbonate, alcohol, carboxylic acid, water, and mixed solvents containing these solvents according to the kinds of polymers. Of these solvents, solvents containing at least alcohol (in particular, methanol) or water are preferred as precipitation or reprecipitation solvents.

The use amount of the precipitation or reprecipitation solvent can be arbitrarily selected by considering efficiency and yield, but is generally 100 parts by mass to 10,000 parts by mass to 100 parts by mass of the polymer solution, preferably 200 parts by mass to 2,000 parts by mass, and more preferably 300 parts by mass to 1,000 parts by mass.

The temperature at the time of precipitation or reprecipitation can be arbitrarily selected by considering efficiency and operating conditions, but is generally 0° C. to 50° C. or so, and preferably around room temperature (e.g., about 20° C. to 35° C.). Precipitation or reprecipitation can be performed by known methods such as a batch system or continuous system with conventional mixers such as a stirring tank.

A precipitated or reprecipitated polymer is generally subjected to filtration, conventional solid-liquid separation such as centrifugation, drying, and then used. Filtration is preferably performed under pressure with a solvent-resisting filter material. Drying is carried out under normal pressure or reduced pressure (preferably under reduced pressure) at temperature of about 30° C. to 100° C., and preferably 30° C. to 50° C. or so.

Once precipitated and separated resin may be again dissolved in a solvent and brought into contact with the solvent in which the resin is hardly soluble or insoluble. That is, after termination of the above radical polymerization reaction, the reaction solution may be purified by a purification method containing steps of bringing the reaction solution into contact with the solvent in which the resin is hardly soluble or insoluble to precipitate the resin (step a), separating the resin from the solution (step b), dissolving the resin again in a solvent to prepare resin solution A (step c), bringing the solvent in which the resin is hardly soluble or insoluble into contact with resin solution A in a volume amount of the solvent less than 10 times of the resin solution A (preferably in a volume amount of 5 times or less) to precipitate the solid of the resin (step d), and separating the precipitated (step e).

Polymerization reaction is preferably carried out in the atmosphere of inert gases such as nitrogen and argon gas. Polymerization is initiated with commercially available radical initiators as polymerization initiators (azo initiators, peroxides and the like). Azo initiators are preferred as radical initiators and, for example, azo initiators having an ester group, a cyano group, or a carboxyl group are preferably used. As preferred initiators, azobisisobutyronitrile, azobisdimethylvaleronitrile, and dimethyl-2,2'-azobis(2-methylpropionate) are exemplified. The initiator is added according to necessity or added in parts, and after the reaction, the reaction solution is put into a solvent and a desired polymer is recovered by a method of powder recovery or solid recovery. The reaction concentration is 5% by mass to 50% by mass, and preferably 10% by mass to 30% by mass. The reaction temperature is generally 10° C. to 150° C., preferably 30° C. to 120° C., and more preferably 60° C. to 100° C.

The molecular weight of resin (A) in the invention is not especially restricted, but the weight average molecular weight is preferably in the range of 1,000 to 100,000, more preferably in the range of 1,500 to 60,000, and especially preferably in the range of 2,000 to 30,000. By bringing the weight average molecular weight into the range of 1,000 to 100,000, deterioration of heat resistance and dry etching resistance can be prevented, and degradation of developing property and film-forming property due to high viscosity can also be prevented. The weight average molecular weight of the resin here shows the polystyrene equivalent molecular weight measured by GPC (carrier: THF or N-methyl-2-pyrrolidone (NMP)).

Polydispersity (Mw/Mn) is preferably 1.00 to 5.00, more preferably 1.03 to 3.50, and still more preferably 1.05 to 2.50. The smaller the molecular weight, the more excellent are resolution and resist form. Further, the side wall of the resist pattern is smooth and excellent in roughness performance.

Resin (A) of the invention may be used by one kind alone, or two or more in combination. The content of resin (A) is preferably 20% by mass to 99% by mass based on all the solid contents in the electron beam-sensitive or extreme ultraviolet radiation-sensitive resin composition in the invention, more preferably 30% by mass to 89% by mass, and especially preferably 40% by mass to 79% by mass.

[2] Compound Capable of Generating Acid Upon Irradiation with Actinic Ray or Radiation (B)

The composition of the invention contains a compound capable of generating an acid upon irradiation with actinic ray or radiation (hereinafter also referred to as "an acid generator").

Known acid generators can be used with no particular limitation, but compounds capable of generating organic acids, e.g., at least any of a sulfonic acid, bis(alkylsulfonyl) imide and tris(askylsulfonyl)methide by irradiation with actinic ray or radiation are preferably used.

More preferably, the compound represented by the following formula (ZI), (ZII) or (ZIII) can be exemplified.

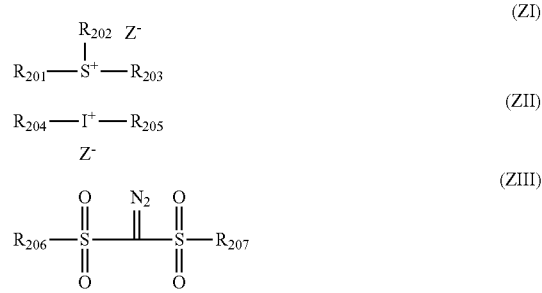

In formula (ZI), each of $R_{201}$, $R_{202}$ and $R_{203}$ independently represents an organic group.

The number of carbon atoms of the organic groups of $R_{201}$, $R_{202}$ and $R_{203}$ is generally 1 to 30, and preferably 1 to 20.

Two of $R_{201}$, $R_{202}$ and $R_{203}$ may be bonded to form a cyclic structure, and an oxygen atom, a sulfur atom, an ester bond, an amido bond, or a carbonyl group may be contained in the ring. As the group to be formed by bonding of two of $R_{201}$, $R_{202}$ and $R_{203}$, an alkylene group (e.g., a butyrene group and a pentylene group) can be given.

$Z^-$ represents a non-nucleophilic anion (an anion which is extremely low in capability of causing nucleophilic reaction).

The examples of the non-nucleophilic anions include, e.g., a sulfonic acid anion (an aliphatic sulfonic acid anion, an aromatic sulfonic acid anion, a camphor sulfonic acid anion), a carboxylic acid anion (an aliphatic carboxylic acid anion, an aromatic carboxylic acid anion, an aralkylcarboxylic acid anion), a sulfonylimide anion, a bis(alkylsulfonyl)imide anion, and a tris(alkylsulfonyl)methide anion.

The aliphatic sites in the aliphatic sulfonic acid anion and the aliphatic carboxylic acid anion may be an alkyl group or a cycloalkyl group, and preferably a straight chain or branched alkyl group having 1 to 30 carbon atoms and cycloalkyl group having 3 to 30 carbon atoms are exemplified.

The aromatic group in the aromatic sulfonic acid anion and the aromatic carboxylic acid anion is preferably an aryl group having 6 to 14 carbon atoms, e.g., a phenyl group, a tolyl group, and a naphthyl group are exemplified.

The alkyl group, cycloalkyl group and aryl group described above may have a substituent. As the specific examples of the substituents, a nitro group, a halogen atom, e.g., a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms) are exemplified. In connection with the aryl group and the cyclic structure of each group, an alkyl group (preferably having 1 to 15 carbon atoms) can further be exemplified as the substituent.

As the aralkyl group in the aralkylcarboxylic acid anion, preferably an aralkyl group having 6 to 12 carbon atoms, e.g., a benzyl group, a phenethyl group, a naphthylmethyl group, a naphthylethyl group, and a naphthylbuthyl group can be exemplified.

As the sulfonylimide anion, e.g., a saccharin anion can be exemplified.

The alkyl group in the bis(alkylsulfonyl)imide anion and tris(alkylsulfonyl)-methide anion is preferably an alkyl group having 1 to 5 carbon atoms. As the substituents of these alkyl groups, a halogen atom, an alkyl group substituted with a halogen atom, an alkoxy group, an alkylthio group, an alkyloxysulfonyl group, an aryloxysulfonyl group, and a cycloalkylaryloxysulfonyl group can be exemplified, and a fluorine atom and an alkyl group substituted with a fluorine atom are preferred.

The alkyl groups in the bis(alkylsulfonyl)imide anion may be bonded to each other to form a cyclic structure, by which acid strength is heightened.

As other non-nucleophilic anions, e.g., fluorinated phosphorus (e.g., $PF_6^-$), fluorinated boron (e.g., $BF_4^-$) and fluorinated antimony (e.g., $SbF_6^-$) can be exemplified.

As the non-nucleophilic anions, an aliphatic sulfonic acid anion in which at least the α-position of the sulfonic acid is substituted with a fluorine atom, an aromatic sulfonic acid anion substituted with a fluorine atom or a group having a fluorine atom, a bis(alkylsulfonyl)imide anion in which the alkyl group is substituted with a fluorine atom, and a tris(alkylsulfonyl)methide anion in which the alkyl group is substituted with a fluorine atom are preferred. More preferred non-nucleophilic anions are an aliphatic perfluorosulfonic acid anion (still more preferably having 4 to 8 carbon atoms), and a benzenesulfonic acid anion having a fluorine atom, and still more preferred non-nucleophilic anions are a nonafluorobutanesulfonic acid anion, a perfluorooctanesulfonic acid anion, a pentafluorobenzenesulfonic acid anion, and a 3,5-bis(trifluoromethyl)benzenesulfonic acid anion.

From the viewpoint of acid strength, pKa of a generated acid is preferably −1 or less in view of the improvement of sensitivity.

As non-nucleophilic anion, an anion represented by the following formula (AN1) is also exemplified as preferred embodiment.

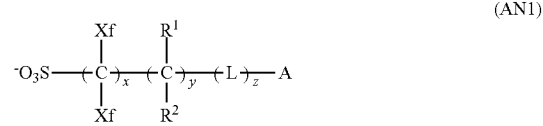

(AN1)

In formula (AN1), each of Xf independently represents a fluorine atom, or an alkyl group substituted with at least one fluorine atom.

Each of $R^1$ and $R^2$ independently represents a hydrogen atom, a fluorine atom or an alkyl group, and each $R^1$ and $R^2$, when a plurality of $R^1$ and $R^2$ are present, may be the same with or different from every other $R^1$ and $R^2$.

L represents a divalent linking group, and each L, when a plurality of L are present, may be the same with or different from every other L.

A represents a cyclic organic group.

x represents an integer of 1 to 20, y represents an integer of 0 to 10, and z represents an integer of 0 to 10.

Formula (AN1) will be described in further detail.

The alkyl group in the alkyl group substituted with a fluorine atom represented by Xf is preferably an alkyl group having 1 to 10 carbon atoms, and more preferably 1 to 4 carbon atoms. The alkyl group substituted with a fluorine atom represented by Xf is preferably a perfluoroalkyl group.

Xf preferably represents, a fluorine atom or a perfluoroalkyl group having 1 to 4 carbon atoms. Specifically, a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$ are exemplified, and a fluorine atom and $CF_3$ are preferred of all. It is especially preferred that both Xf represent a fluorine atom.

The alkyl group represented by $R^1$ and $R^2$ may have a substituent (preferably a fluorine atom), preferably a substituent having 1 to 4 carbon atoms, and more preferably a perfluoroalkyl group having 1 to 4 carbon atoms. As the specific examples of the alkyl group of $R^1$ and $R^2$ having a substituent, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$ are exemplified, and $CF_3$ is especially preferred.

Each of $R^1$ and $R^2$ preferably represents a fluorine atom or $CF_3$.

x is preferably 1 to 10, and more preferably 1 to 5.

y is preferably 0 to 4, and more preferably 0.

z is preferably 0 to 5, and more preferably 0 to 3.

The divalent linking group represented by L is not especially restricted, and —COO—, —OCO—, —CO—, —O—, —S—, —SO—, —SO$_2$—, an alkylene group, a cycloalkylene group, an alkenylene group, and a linking group obtained by linking two or more of these groups are exemplified, and linking groups having total carbon atoms of 12 or less are preferred. Of these, —COO—, —OCO—, —CO— and —O— are preferred, and —COO— and —OCO— are more preferred.

The cyclic organic group represented by A is not especially limited so long as it has a cyclic structure, and an alicyclic group, an aryl group, and a heterocyclic group (including not only those having an aromatic property but also those not having an aromatic property) are exemplified.

The alicyclic group may be monocyclic or polycyclic, and monocyclic cycloalkyl groups, e.g., a cyclopentyl group, a cyclohexyl group, and a cyclooctyl group, and polycyclic cycloalkyl groups, e.g., a norbornyl group, a tricyclodecanyl group, a tetracyclodecanyl group, a tetracyclododecanyl group, and an adamantyl group are preferably exemplified. Of these groups, alicyclic groups having 7 or more carbon atoms and a bulky structure such as a norbornyl group, a tricyclodecanyl group, a tetracyclodecanyl group, a tetracyclododecanyl group, and an adamantyl group are preferred for capable of controlling diffusibility in a film in the heating step after exposure and from the viewpoint of the improvement of MEEF.

As the aryl group, a benzene ring, a naphthalene ring, a phenanthrene ring, and an anthracene ring are exemplified.

As the heterocyclic group, groups deriving from a furan ring, a thiophene ring, a benzofuran ring, a benzothiophene ring, a dibenzofuran ring, a dibenzothiophene ring, or a pyridine ring are exemplified, and groups deriving from a furan ring, a thiophene ring, or a pyridine ring are preferred of all.

As the cyclic organic group, lactone structures can also be exemplified, and as the specific examples, the lactone structures represented by any of the above formulae (LC1-1) to (LC1-17) that resin (A) may have can be given.

The above cyclic organic groups may have a substituent. As the substituents, an alkyl group (which may be straight chain, branched or cyclic, and preferably having 1 to 12 carbon atoms), a cycloalkyl group (which may be monocyclic, polycyclic or spirocyclic, and preferably having 3 to 20 carbon atoms), an aryl group (preferably having 6 to 14 carbon atoms), a hydroxyl group, an alkoxy group, an ester group, an amido group, a urethane group, a ureido group, a thioether group, a sulfonamide group, and a sulfonic ester group are exemplified. Carbon atoms for constituting the cyclic organic group (carbon atoms contributing to ring formation) may be carbonyl carbon atoms.

As the organic groups represented by $R_{201}$, $R_{202}$ and $R_{203}$, an aryl group, an alkyl group and a cycloalkyl group are exemplified.

It is preferred that at least one of $R_{201}$, $R_{202}$ and $R_{203}$ represents an aryl group, and more preferably all of three represent an aryl group. As the aryl group, besides a phenyl group and a naphthyl group, hetero aryl group such as an indole residue and a pyrrole residue are also included. As the alkyl group and cycloalkyl group represented by $R_{201}$, $R_{202}$ and $R_{203}$, a straight chain or branched alkyl group having 1 to 10 carbon atoms, and a cycloalkyl group having 3 to 10 carbon atoms are preferably exemplified. As the alkyl group, more preferably a methyl group, an ethyl group, an n-propyl group, an i-propyl group, and an n-butyl group can be exemplified. As the cycloalkyl group, more preferably a cyclopropyl group, a cyclobutyl group, a cyclopentyl group, a cyclohexyl group, and a cycloheptyl group can be exemplified. These groups may further have a substituent. As the substituents, a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms) are exemplified, but the substituents are not restricted thereto.

When two of $R_{201}$, $R_{202}$ and $R_{203}$ are bonded to each other to form a cyclic structure, the structure is preferably the structure represented by the following formula (A1).

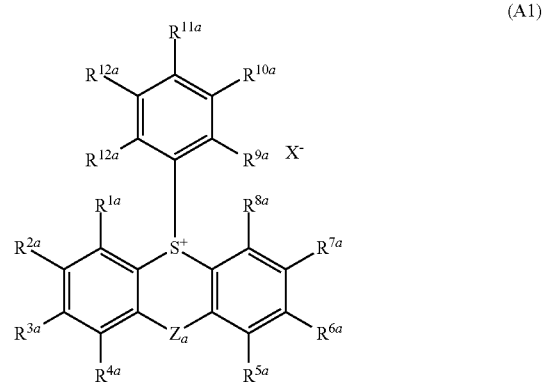

(A1)

In formula (A1), each of $R^{1a}$ to $R^{13a}$ independently represents a hydrogen atom or a substituent.

Preferably one to three of $R^{1a}$ to $R^{13a}$ do not represent a hydrogen atom, and more preferably any one of $R^{9a}$ to $R^{13a}$ does not represent a hydrogen atom.

Za represents a single bond or a divalent linking group.

X$^-$ is the same with Z$^-$ in formula (ZI).

When each of $R^{1a}$ to $R^{13a}$ does not represent a hydrogen atom, the specific examples include a halogen atom, a straight chain, branched or cyclic alkyl group, an alkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyl-oxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H), and other known substituents.

When each of $R^{1a}$ to $R^{13a}$ does not represent a hydrogen atom, a straight chain, branched or cyclic alkyl group substituted with a hydroxyl group is preferably exemplified.

As the divalent linking group represented by Za, an alkylene group, an arylene group, a carbonyl group, a sulfonyl group, a carbonyloxy group, a carbonylamino group, a sulfonylamido group, an ether bond, a thioether bond, an amino group, a disulfide group, —($CH_2$)$_n$—CO—, —($CH_2$)$_n$—$SO_2$—, —CH=CH—, an aminocarbonylamino group, and an aminosulfonylamino group are exemplified (n is an integer of 1 to 3).

Preferred structures in the case where at least one of $R_{201}$, $R_{202}$ and $R_{203}$ is not an aryl group may take cationic structures, such as the compounds disclosed in JP-A-2004-233661, paragraphs 0047 and 0048, JP-A-2003-35948, paragraphs 0040 to 0046, U.S. Patent Application 2003/0224288A1, compounds (I-1) to (I-70), and U.S. Patent Application 2003/0077540A1, compounds (IA-1) to (IA-54), (IB-1) to (IB-24).

In formulae (ZII) and (ZIII), each of $R_{204}$ to $R_{207}$ independently represents an aryl group, an alkyl group or a cycloalkyl group.

The aryl group, alkyl group and cycloalkyl group represented by each of $R_{204}$ to $R_{207}$ are the same with the aryl group, alkyl group and cycloalkyl group represented by each of $R_{201}$ to $R_{203}$ in formula (ZI).

The aryl group, alkyl group and cycloalkyl group represented by each of $R_{204}$ to $R_{207}$ may have a substituent. As the examples of the substituents, the same substituents with those that the aryl group, alkyl group and cycloalkyl group represented by each of $R_{201}$ to $R_{203}$ in formula (ZI) may have are exemplified.

$Z^-$ represents a non-nucleophilic anion, and the same non-nucleophilic anions as represented by $Z^-$ in formula (ZI) can be exemplified.

As acid generators, the compounds represented by the following formula (ZIV), (ZV) or (ZVI) are also exemplified.

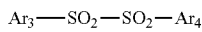

(ZIV)

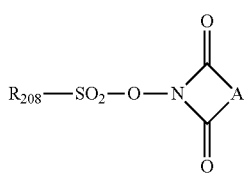

(ZV)

(ZVI)

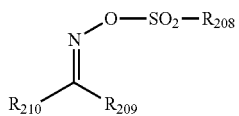

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group as $R_{201}$, $R_{202}$ and $R_{203}$ in formula (ZI).

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI).

The alkylene group of A includes an alkylene group having a carbon number of 1 to 12 (e.g., methylene group, ethylene group, propylene group, isopropylene group, butylene group, isobutylene group); the alkenylene group of A includes an alkenylene group having a carbon number of 2 to 12 (e.g., ethynylene group, propenylene group, butenylene group); and the arylene group of A includes an arylene group having a carbon number of 6 to 10 (e.g., phenylene group, tolylene group, naphthylene group).

As the acid generator for use in the invention, a compound having a group capable of decomposing by the action of an acid to decrease the solubility in a developer containing an organic solvent as a substituent can also be preferably used. The specific examples of the groups capable of decomposing by the action of an acid to decrease the solubility in a developer containing an organic solvent are the same with those described in the acid-decomposable group in resin (A). The examples of such acid generators include the compounds described in JP-A-2005-97254 and JP-A-2007-199692.

Especially preferred examples of acid generators are shown below.

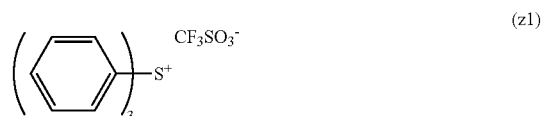

(z1)

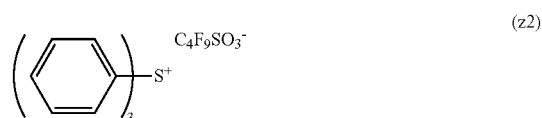

(z2)

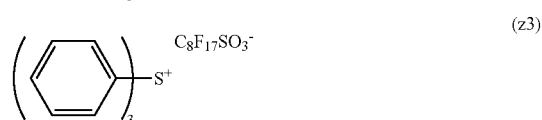

(z3)

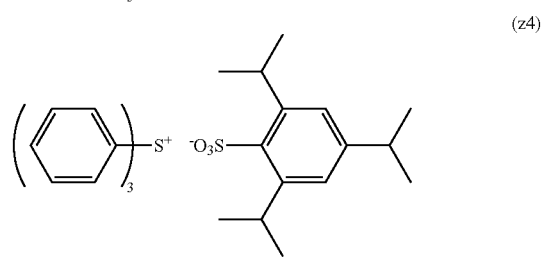

(z4)

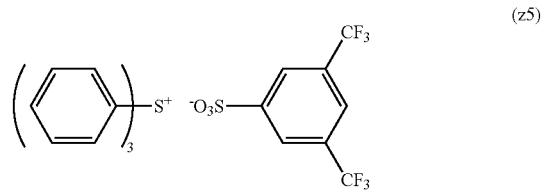

(z5)

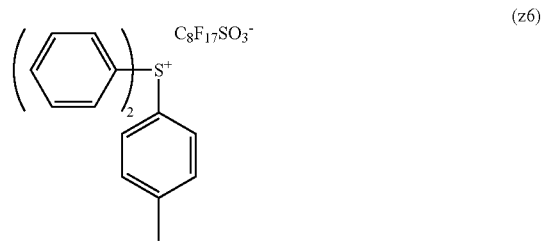

(z6)

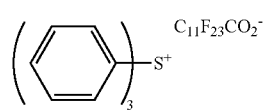 (z7)
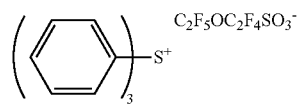 (z8)
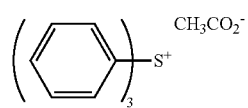 (z9)
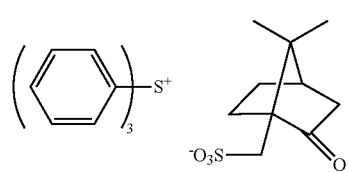 (z10)
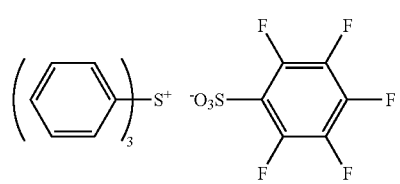 (z11)
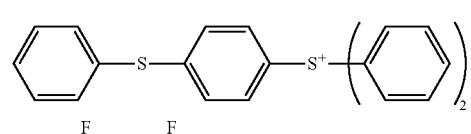 (Z12)
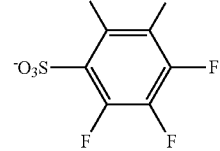 (z13)
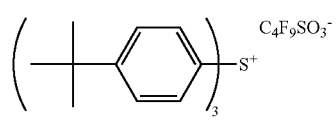 (z14)
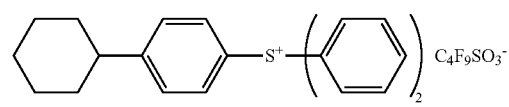 (z15)
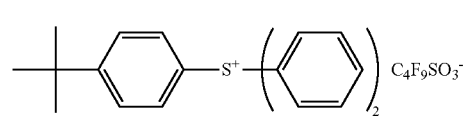 (z16)
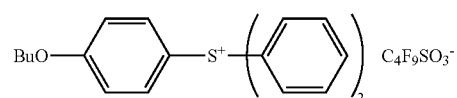 (z17)
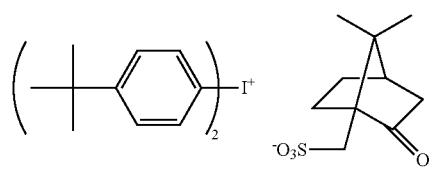
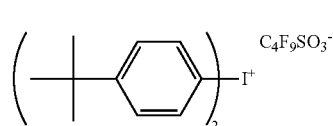 (z18)
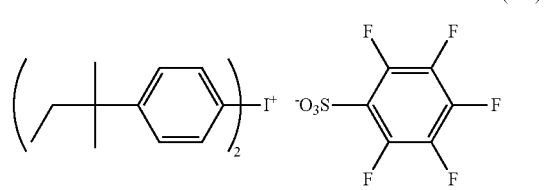 (z19)
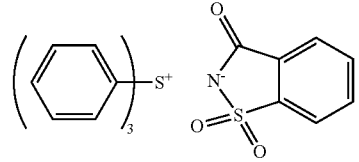 (z20)
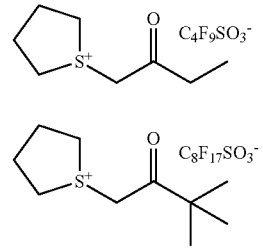 (z21)
(z22)
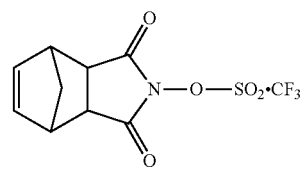 (z23)
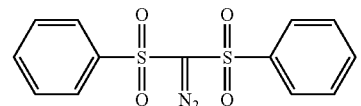 (z24)
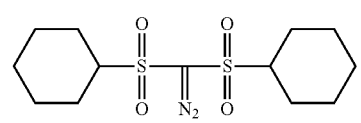 (z25)
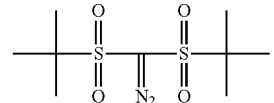 (z26)
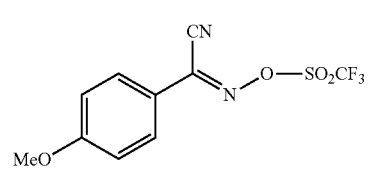 (z27)

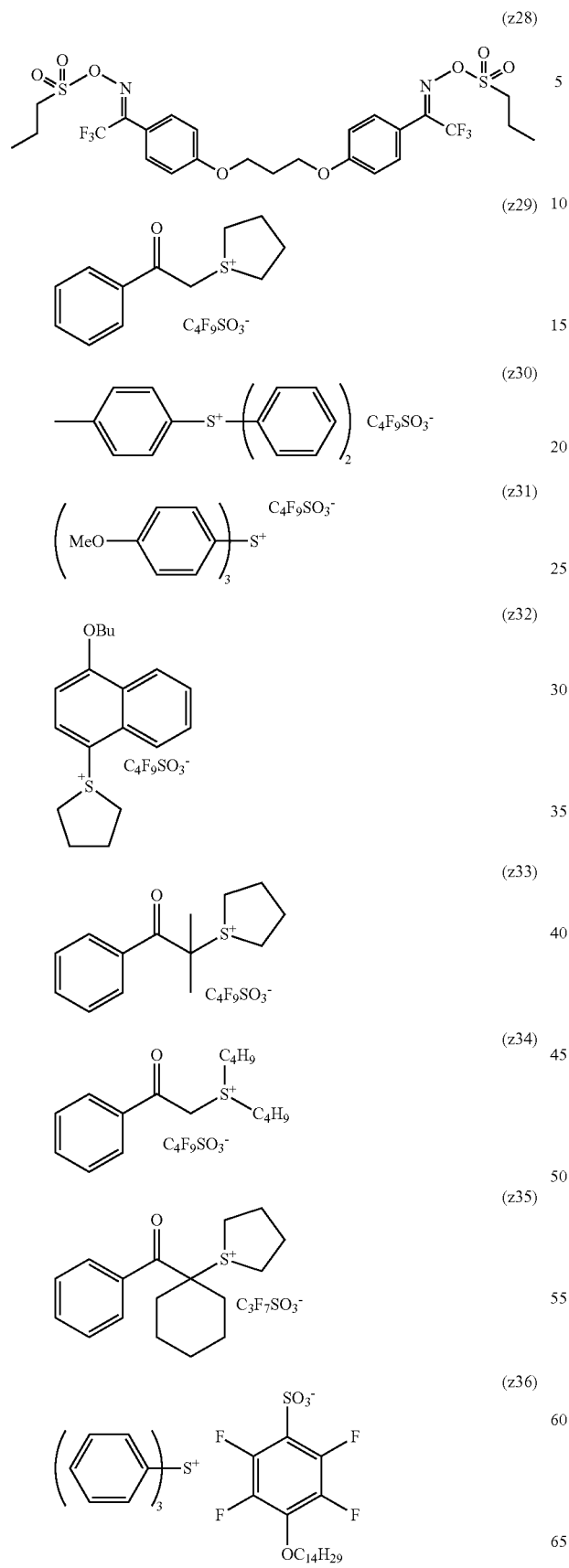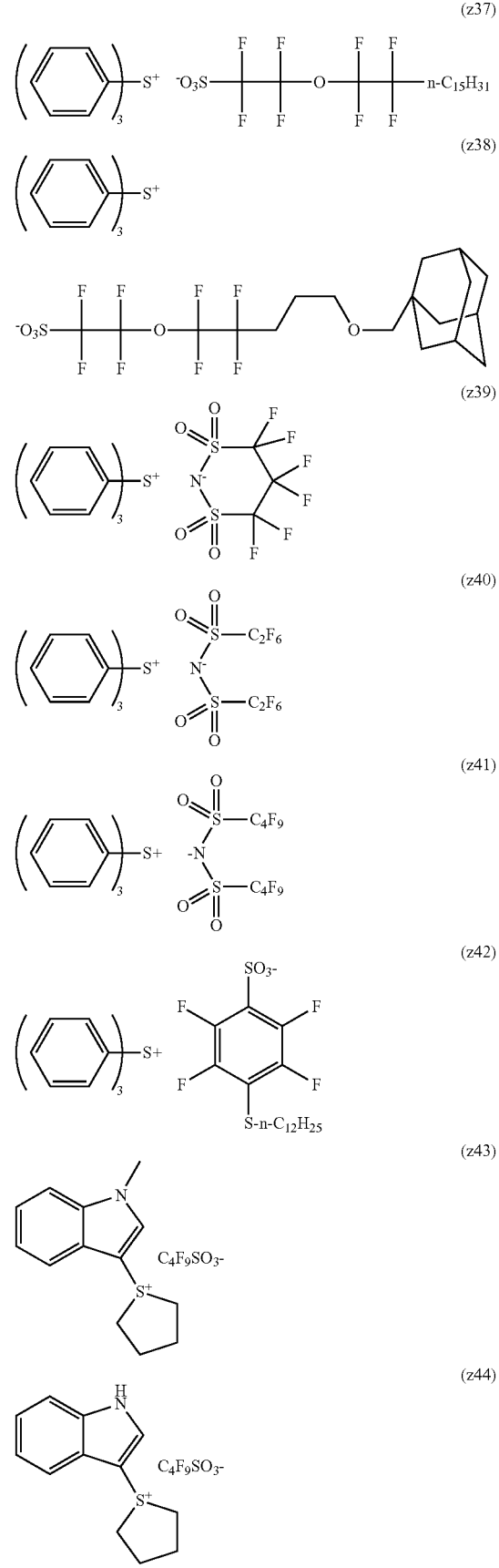

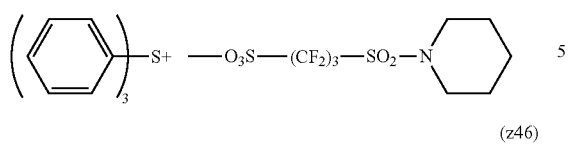
(z45)
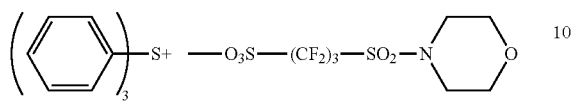
(z46)
(z47)
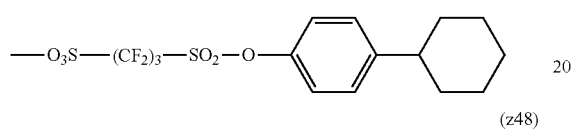
(z48)
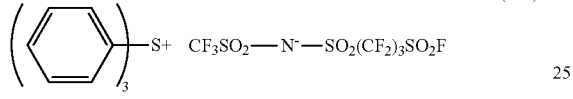
(z49)
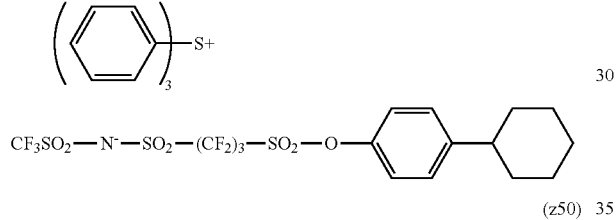
(z50)
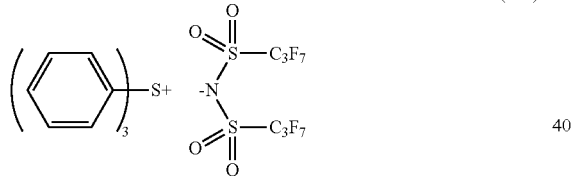
(z51)
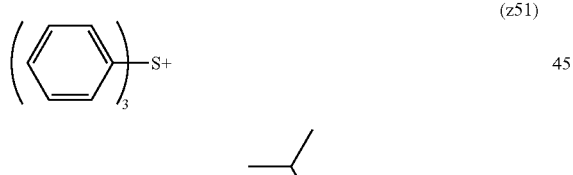
(z52)
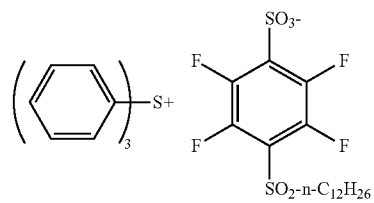
(z53)
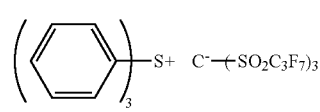
(z54)
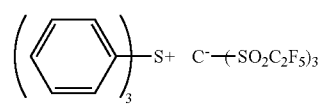
(z55)
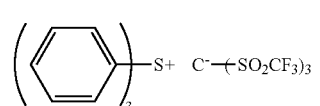
(z56)
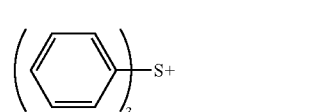
(z57)
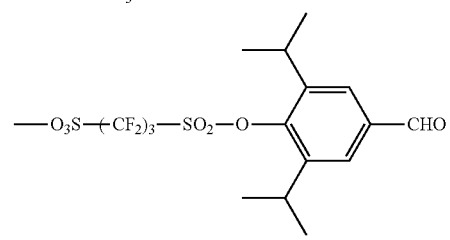
(z57)
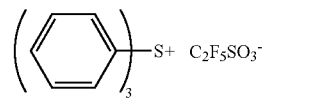
(z58)
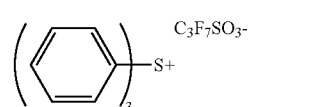
(z59)
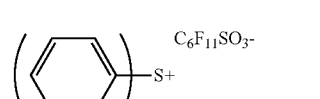
(z60)
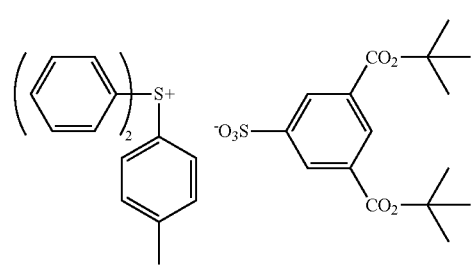
(z61)

-continued
(z62)
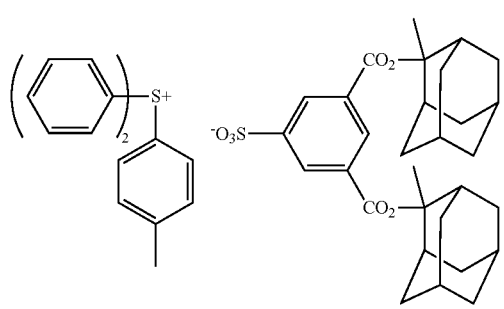
(z63)
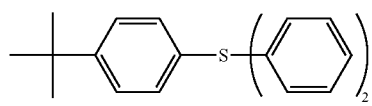
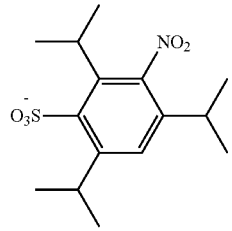
(z64)
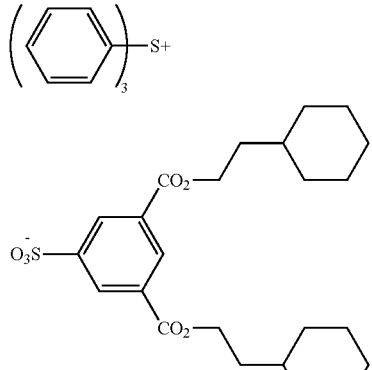
(z65)
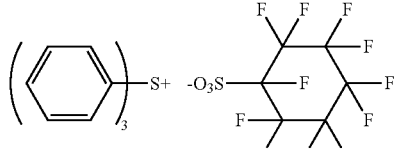
(z66)
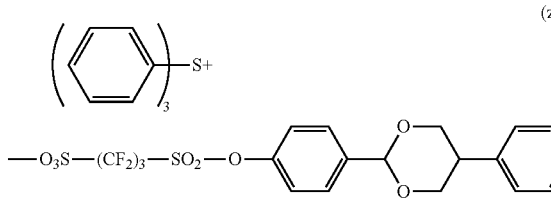
(z67)
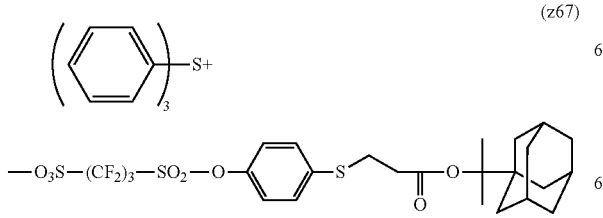
-continued
(z68)
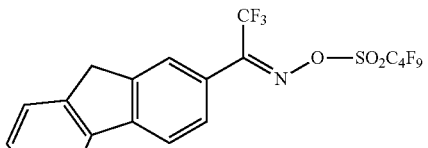
(z69)
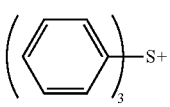
$CF_3SO_2-N^--SO_2-(CF_2)_3-SO_2-N\bigcirc$
(z70)
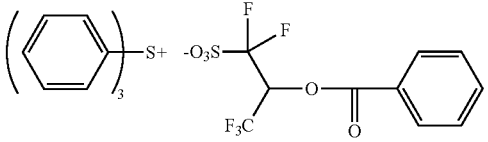
(z71)
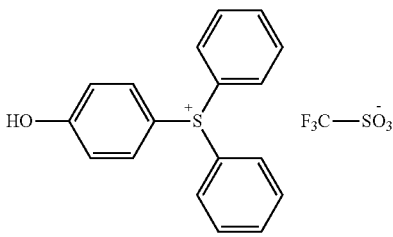
(z72)
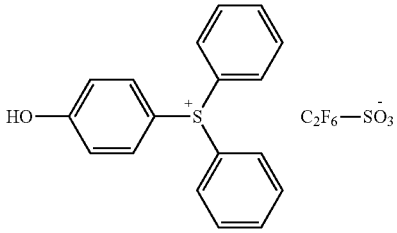
(z73)
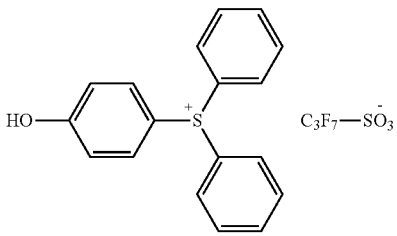
(z74)

-continued
(z75) 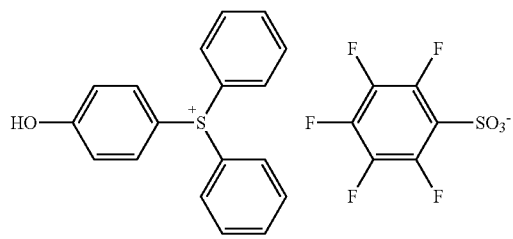
(z76) 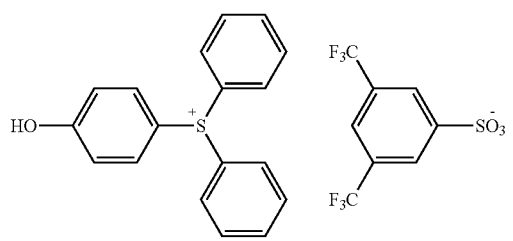
(z77) 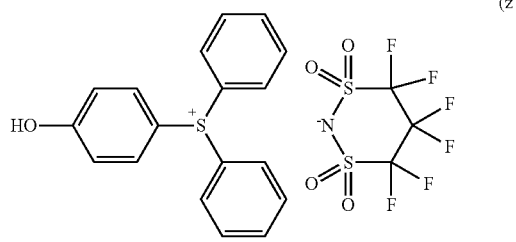
(z78) 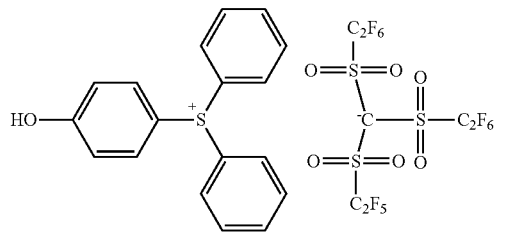
(z79) 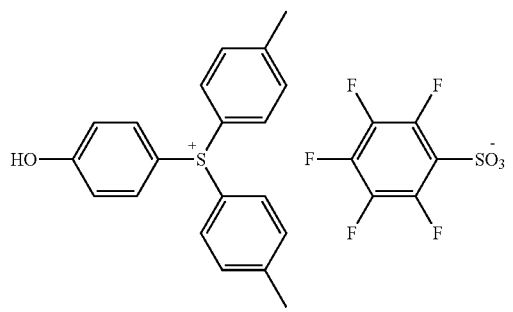
-continued
(z80) 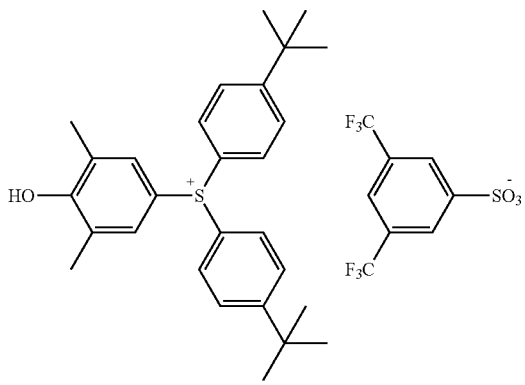
(z81) 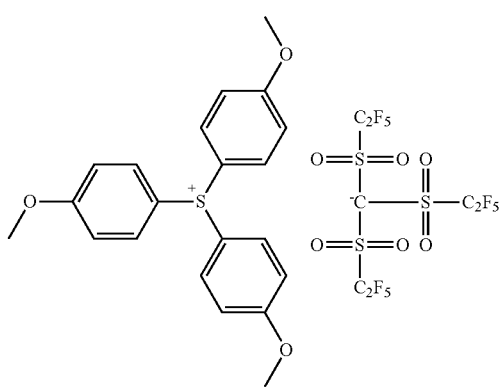
(z82) 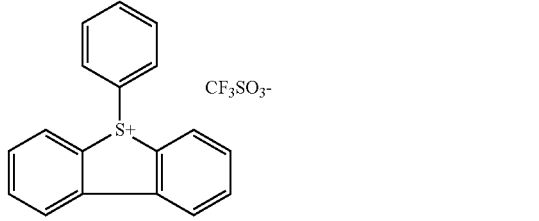
(z83) 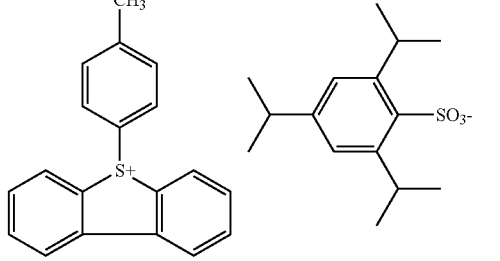
(z84) 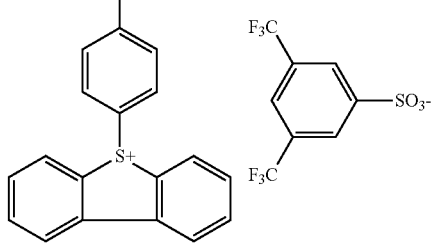

(z85)
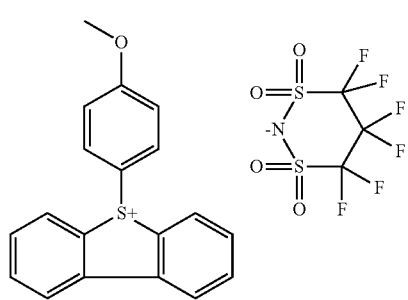
(z90)
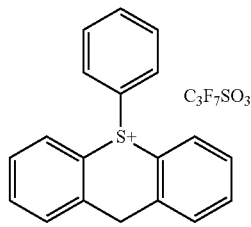
(z86)
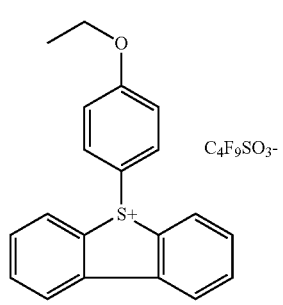
(z91)
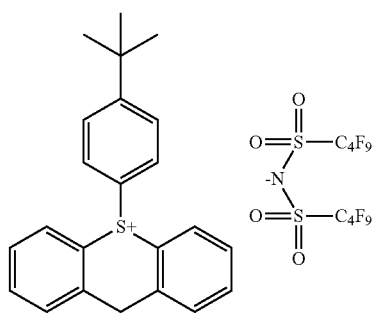
(z87)
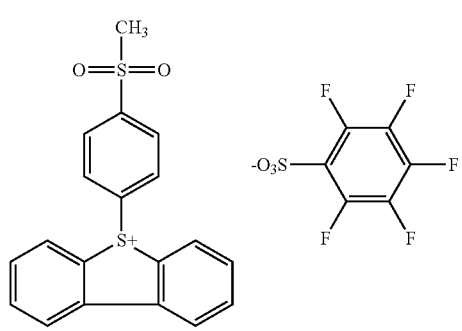
(z92)
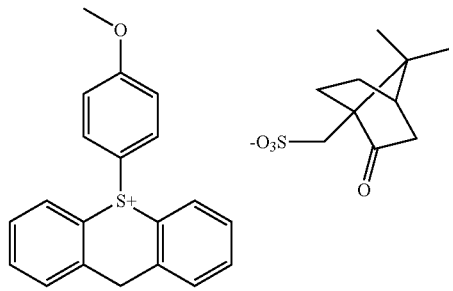
(z88)
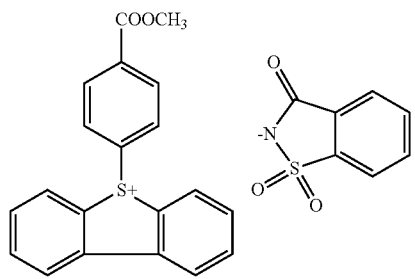
(z93)
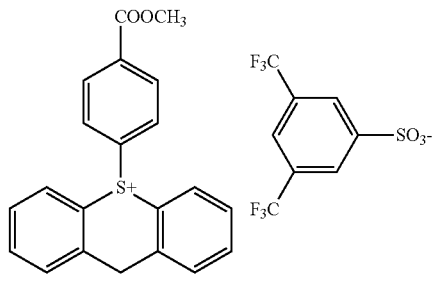
(z89)
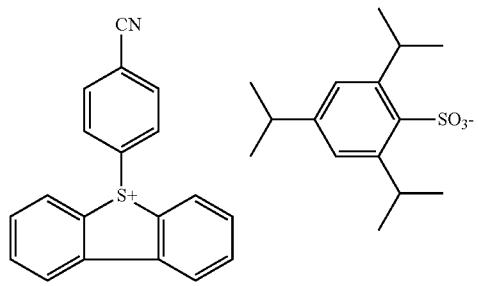
(z94)
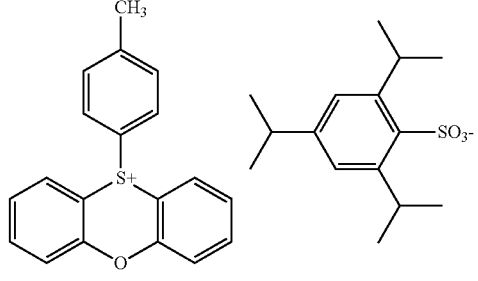

(z95)
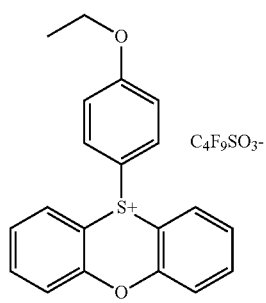
(z96)
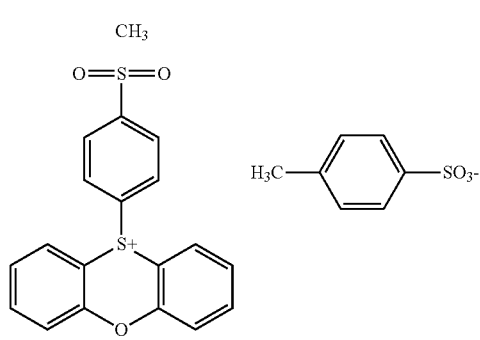
(z97)
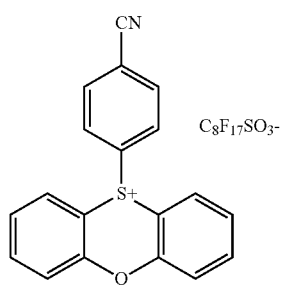
(z98)
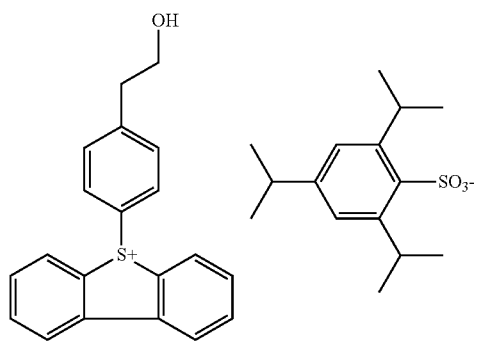
(z99)
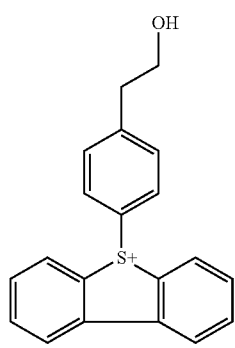
(z100)
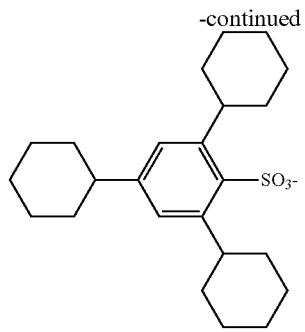
(z101)
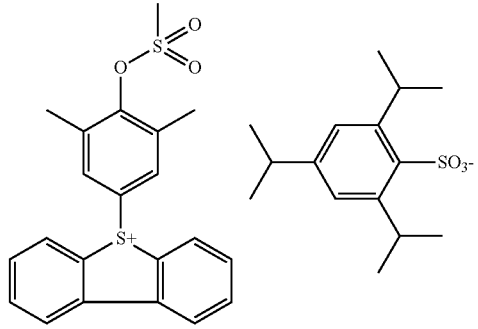
(z102)
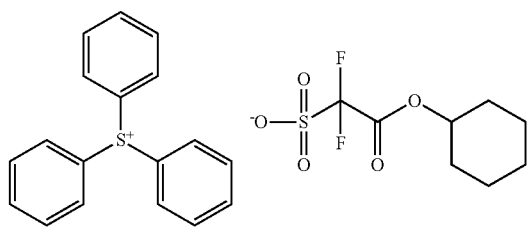
(z103)
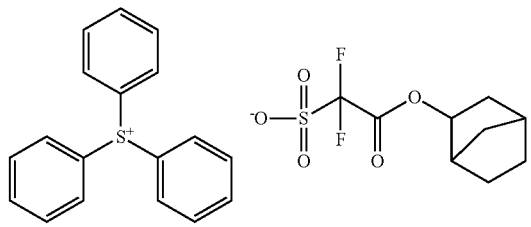
(z104)
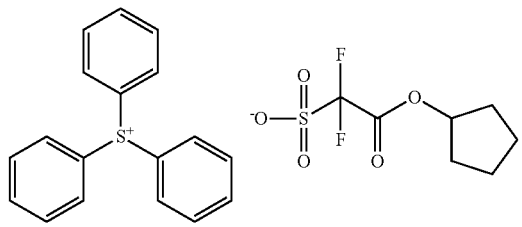
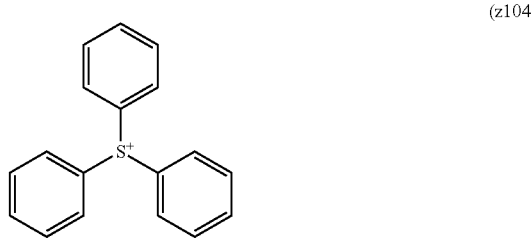

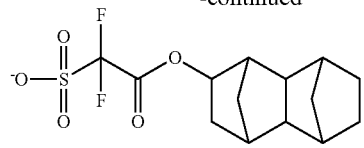
(z105)
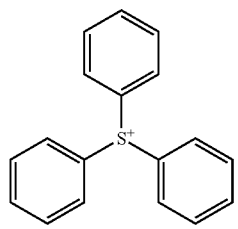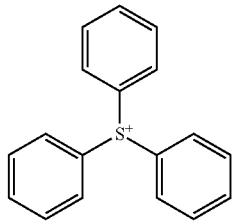
(z106)
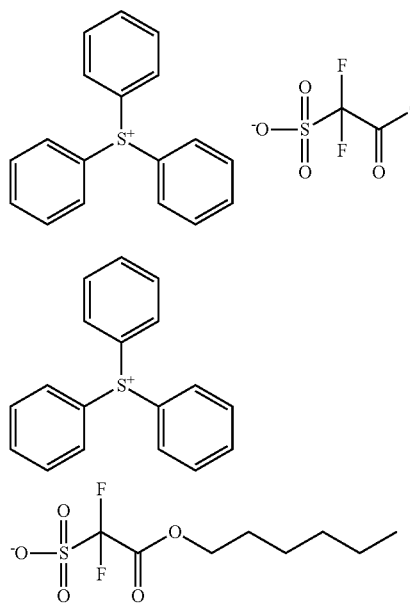
(z107)
(z108)
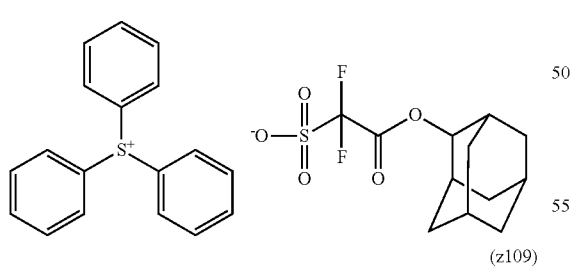
(z109)
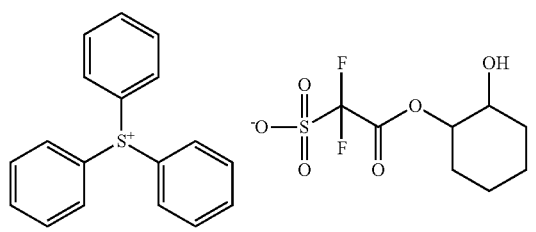
(z110)
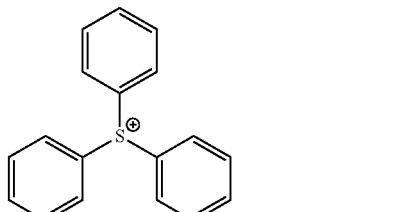
(z111)
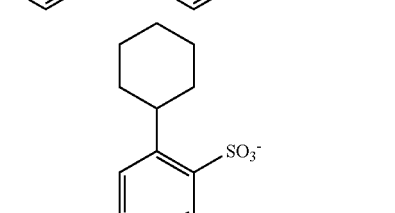
(z112)
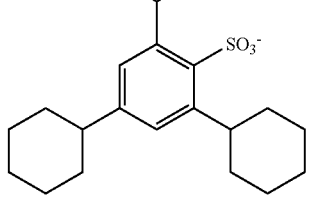
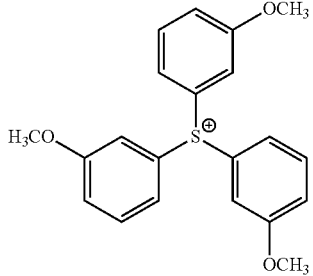
(z113)

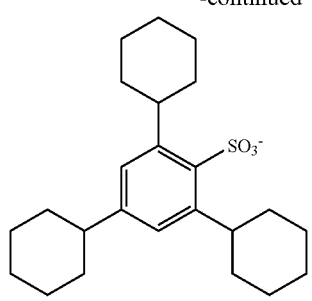
(z114)
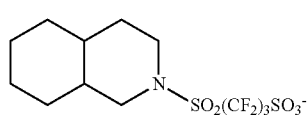
(z115)
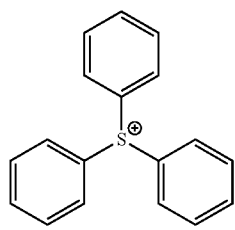
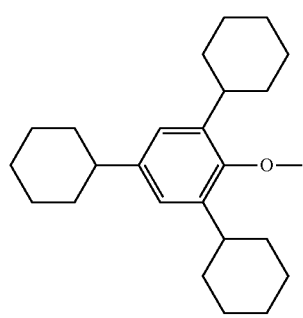
(z116)
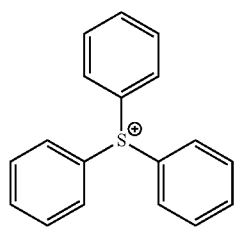
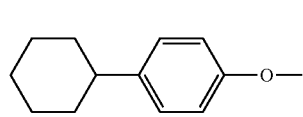
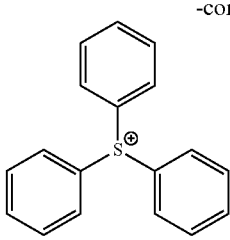
(z117)
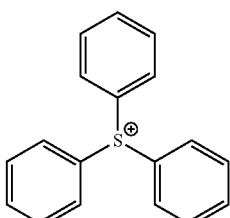
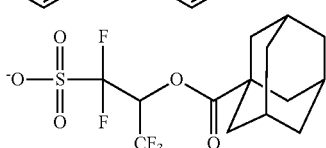
(z118)
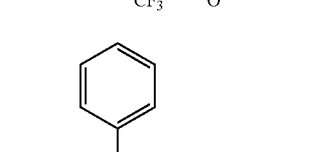
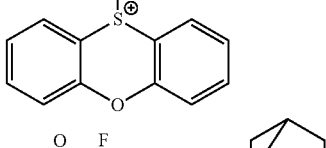
(z119)
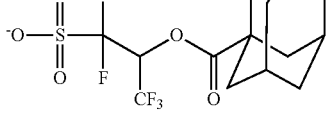
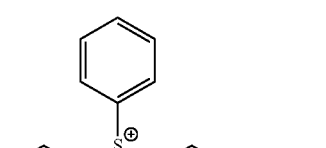
(z120)
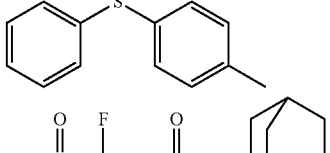
Acid generators can be used one kind alone, or two or more kinds may be used in combination.

The content of the acid generator in the composition is preferably 0.1% by mass to 70% by mass on the basis of all the solids content of the composition, more preferably 10% by mass to 70% by mass, and still more preferably 21% by mass to 70% by mass. When the content of the acid generator in the composition is 21% by mass or more on the basis of all the solids content of the composition, LWR performance can be bettered furthermore.

[3] Resin (C)

The electron beam-sensitive or extreme ultraviolet radiation-sensitive resin composition for use in the pattern-forming method of the invention contains resin (C).

Resin (C) of the invention is a resin having one or more groups selected from the group consisting of a fluorine atom, a group having a fluorine atom, a group having a silicon atom, an alkyl group having 6 or more carbon atoms, a cycloalkyl group having 6 or more carbon atoms, an aryl group having 9 or more carbon atoms, an aralkyl group having 10 or more carbon atoms, an aromatic ring group substituted with at least one alkyl group having 3 or more carbon atoms and an aromatic ring group substituted with at least one cycloalkyl group having 5 or more carbon atoms.

Here, resin (C) is a resin different from resin (A).

Since the atoms or groups contained in resin (C) have high hydrophobicity, resin (C) can localize on the surface of the resist film and accelerates dissolution of the resist film in an organic developer regardless of exposed part or unexposed part of the resist film. As a result, even in the case of forming an extremely fine pattern, it is thought that resin (C) exhibits functions to restrain roughness on the pattern surface (especially in the case of EUV exposure) and the occurrence of a T-top shape, a reverse taper shape and a bridged part.

It is preferred that resin (C) has repeating unit (C) having one or more groups selected from the group consisting of a fluorine atom, a group having a fluorine atom, a group having a silicon atom, an alkyl group having 6 or more carbon atoms, a cycloalkyl group having 6 or more carbon atoms an aryl group having 9 or more carbon atoms, an aralkyl group having 10 or more carbon atoms, an aromatic ring group substituted with at least one alkyl group having 3 or more carbon atoms and an aromatic ring group substituted with at least one cycloalkyl group having 5 or more carbon atoms.

However, although a fluorine atom is excellent in the function of localizing resin (C) on the surface of the resist film, highly sensitive to extreme ultraviolet radiation (EUV ray) on the other hand, thus the unexposed part is also liable to be sensitive to EUV ray. Accordingly, when the exposure light source is extreme ultraviolet radiation (EUV ray), it is preferred that resin (C) has one or more groups selected from the group consisting of a group having a silicon atom, an alkyl group having 6 or more carbon atoms, a cycloalkyl group having 6 or more carbon atoms, an aryl group having 9 or more carbon atoms, an aralkyl group having 10 or more carbon atoms, an aromatic ring group substituted with at least one alkyl group having 3 or more carbon atoms and an aromatic ring group substituted with at least one cycloalkyl group having 5 or more carbon atoms.

As the groups having a fluorine atom, an alkyl group having a fluorine atom, a cycloalkyl group having a fluorine atom and an aryl group having a fluorine atom are enumerated.

As the alkyl group having a fluorine atom, an alkyl group having a fluorine atom and preferably having 1 to 10 carbon atoms, and more preferably having 1 to 4 carbon atoms is exemplified. The alkyl group is a straight chain or branched alkyl group in which at least one hydrogen atom is replaced by a fluorine atom, and the alkyl group may further have a substituent other than a fluorine atom.

The cycloalkyl group having a fluorine atom is a monocyclic or polycyclic cycloalkyl group in which at least one hydrogen atom is replaced by a fluorine atom, and the cycloalkyl group may further have a substituent other than a fluorine atom.

As the aryl group having a fluorine atom, an aryl group, e.g., a phenyl group or a naphthyl group, in which at least one hydrogen atom is replaced by a fluorine atom is exemplified, and the aryl group may further have a substituent other than a fluorine atom.

As the alkyl group having a fluorine atom, as the cycloalkyl group having a fluorine atom, and as the aryl group having a fluorine atom, the groups represented by the following formula (F2), (F3) or (F4) can be enumerated, but the invention is not restricted thereto.

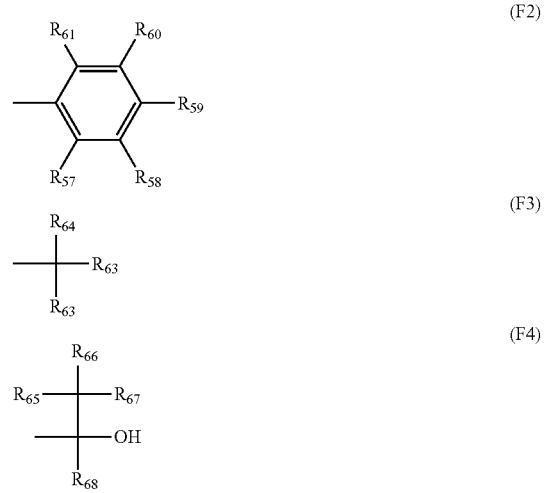

In formulae (F2) to (F4), each of $R_{57}$ to $R_{68}$ independently represents a hydrogen atom, a fluorine atom or an alkyl group (straight chain or branched), provided that each of at least one of $R_{57}$ to $R_{61}$, at least one of $R_{62}$ to $R_{64}$, and at least one of $R_{65}$ to $R_{68}$ independently represents a fluorine atom or an alkyl group (preferably having 1 to 4 carbon atoms) in which at least one hydrogen atom is replaced by a fluorine atom.

It is preferred that all of $R_{57}$ to $R_{61}$ and $R_{65}$ to $R_{67}$ represent a fluorine atom. Each of $R_{62}$, $R_{63}$ and $R_{68}$ preferably represents an alkyl group (preferably having 1 to 4 carbon atoms) in which at least one hydrogen atom is replaced by a fluorine atom, and more preferably a perfluoroalkyl group having 1 to 4 carbon atoms. $R_{62}$ and $R_{63}$ may be linked to each other to form a ring.

The specific examples of the groups represented by formula (F2) include a p-fluorophenyl group, a pentafluorophenyl group, and a 3,5-di(trifluoromethyl)phenyl group.

The specific examples of the groups represented by formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a perfluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group, preferably a hexafluoroisopropyl group, a heptafluoroisopropyl group, a hexafluoro(2-methyl)-isopropyl group, an octafluoroisobutyl group, a nonafluoro-t-butyl group, and a perfluoroisopentyl group, and more preferably a hexafluoroisopropyl group and a heptafluoroisopropyl group.

The specific examples of the groups represented by formula (F4) include —C(CF$_3$)$_2$OH, —C(C$_2$F$_5$)$_2$OH, —C(CF$_3$)(CH$_3$)OH, and —CH(CF$_3$)OH, and preferably —C(CF$_3$)$_2$OH is exemplified.

As the group having a silicon atom, an alkylsilyl structure (preferably a trialkylsilyl group), and a cyclic siloxane structure are exemplified.

As the alkylsilyl structure and cyclic siloxane structure represented by W$_3$ to W$_6$, specifically the groups represented by any of the following formulae (CS-1) to (CS-3) are exemplified.

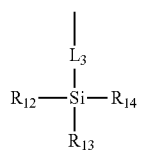

(CS-1)

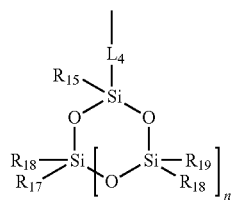

(CS-2)

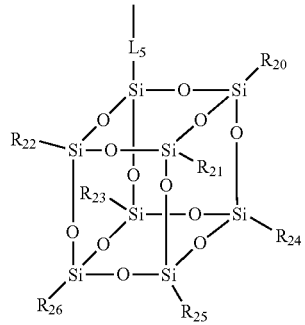

(CS-3)

In formulae (CS-1) to (CS-3), each of R$_{12}$ to R$_{26}$ independently represents a straight chain or branched alkyl group (preferably having 1 to 20 carbon atoms) or a cycloalkyl group (preferably having 3 to 20 carbon atoms).

Each of L$_3$ to L$_5$ represents a single bond or a divalent linking group. As the divalent linking group, one group or a combination of two or more groups (preferably total carbon atoms of 12 or less) selected from the group consisting of an alkylene group, a phenylene group, an ether bond, a thioether bond, a carbonyl group, an ester bond, an amido bond, a urethane bond and a urea bond.

n represents an integer of 1 to 5, and preferably an integer of 2 to 4.

The alkyl group having 6 or more carbon atoms is a straight chain or branched alkyl group preferably having 6 to 20 carbon atoms, and more preferably 6 to 15 carbon atoms, and the alkyl group may further have a substituent (but not applicable to a fluorine atom, a group having a fluorine atom, and a group having a silicon atom).

The cycloalkyl group having 6 or more carbon atoms is a cycloalkyl group preferably having 6 to 20 carbon atoms, and more preferably 6 to 15 carbon atoms, and the cycloalkyl group may further have a substituent (but not applicable to a fluorine atom, a group having a fluorine atom and a group having a silicon atom).

The aryl group having 9 or more carbon atoms is an aryl group preferably having 9 to 20 carbon atoms, and more preferably 9 to 15 carbon atoms, and the aryl group may further have a substituent (but not applicable to a fluorine atom, a group having a fluorine atom, and a group having a silicon atom).

The aralkyl group having 10 or more carbon atoms is an aralkyl group preferably having 10 to 20 carbon atoms, and more preferably 6 to 20 carbon atoms, and the aralkyl may further have a substituent (but not applicable to a fluorine atom, a group having a fluorine atom and a group having a silicon atom).

As the aromatic rings in the aromatic ring group substituted with at least one alkyl group having 3 or more carbon atoms and the aromatic ring group substituted with at least one cycloalkyl group having 5 or more carbon atoms, aromatic rings preferably having 6 to 20 carbon atoms, and more preferably having 6 to 15 carbon atoms are exemplified, and the aromatic rings may have a substituent other than an alkyl group having 3 or more carbon atoms (but not applicable to a fluorine atom, a group having a fluorine atom and a group having a silicon atom).

As the alkyl group having 3 or more carbon atoms, a straight chain or branched alkyl group preferably having 3 to 15 carbon atoms, and more preferably 3 to 10 carbon atoms is exemplified. In the aromatic ring group substituted with at least one alkyl group having 3 or more carbon atoms, the aromatic ring is preferably substituted with 1 to 9 alkyl groups having 3 or more carbon atoms, more preferably substituted with 1 to 7 alkyl groups having 3 or more carbon atoms, and still more preferably substituted with 1 to 5 alkyl groups having 3 or more carbon atoms.

As the cycloalkyl group having 5 or more carbon atoms, a cycloalkyl group preferably having 5 to 20 carbon atoms, and more preferably having 5 to 15 carbon atoms is exemplified. In the aromatic ring group substituted with at least one cycloalkyl group having 5 or more carbon atoms, the aromatic ring is preferably substituted with 1 to 5 cycloalkyl groups having 5 or more carbon atoms, more preferably substituted with 1 to 4 cycloalkyl groups having 5 or more carbon atoms, and still more preferably substituted with 1 to 3 cycloalkyl groups having 5 or more carbon atoms.

It is preferred for resin (C) to have, as the repeating unit (C), at least one repeating unit represented by any one of the following formulae (C-Ia) to (C-Id).

(C-Ia)

(C-Ib)

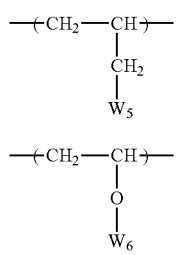

In the formulae, each of $R_{10}$ and $R_{11}$ independently represents a hydrogen atom, a fluorine atom or an alkyl group. The alkyl group is preferably a straight chain or branched alkyl group having 1 to 4 carbon atoms and may have a substituent. As the alkyl group having a substituent, in particular a fluorinated alkyl group can be exemplified. Each of $R_{10}$ and $R_{11}$ independently preferably represents a hydrogen atom or a methyl group.

Each of $W_3$, $W_5$ and $W_6$ independently represents an organic group having one or more groups selected from the group consisting of a group having a fluorine atom, a group having a silicon atom, an alkyl group having 6 or more carbon atoms, a cycloalkyl group having 6 or more carbon atoms, an aryl group having 9 or more carbon atoms and an aralkyl group having 10 or more carbon atoms.

$W_4$ represents an organic group having one or more groups selected from the group, consisting of a group having a fluorine atom, a group having a silicon atom, an alkyl group having 3 or more carbon atoms and a cycloalkyl group having 5 or more carbon atoms.

$Ar_{11}$ represents an (r+1)-valent aromatic ring group.

r represents an integer of 1 to 10.

As the (r+1)-valent aromatic ring group $Ar_{11}$, the divalent aromatic ring group in the case where r represents 1 may have a substituent, e.g., an arylene group having 6 to 18 carbon atoms such as a phenylene group, a tolylene group, a naphthylene group and an anthracenylene group are exemplified.

As the specific examples of the (r+1)-valent aromatic ring group in the case where r represents an integer of 2 or more, a group obtained by removing arbitrary (r−1) hydrogen atom(s) from the above specific examples of the divalent aromatic ring group can be preferably exemplified.

The group having a fluorine atom of $W_3$ to $W_6$ is the same with the group described above in the group having a fluorine atom.

The group having a fluorine atom represented by each of $W_3$ to $W_6$ may be directly bonded to the repeating unit represented by any of formulae (C-Ia) to (C-Id), or may be bonded to the repeating unit represented by any of formulae (C-Ia) to (C-Id) via one group selected from the group consisting of an alkylene group, a phenylene group, an ether bond, a thioether bond, a carbonyl group, an ester bond, an amido bond, a urethane bond and a ureylene bond, or a group obtained by combining two or more these groups.

The group having a silicon atom of $W_3$ to $W_6$ is the same with the group described above in the group having a silicon atom.

The alkyl group having 6 or more carbon atoms, the cycloalkyl group having 6 or more carbon atoms, the aryl group having 9 or more carbon atoms and the aralkyl group having 10 or more carbon atoms with respect to $W_3$, $W_5$ and $W_6$ are respectively the same with those described above.

The alkyl group having 3 or more carbon atoms and the cycloalkyl group having 5 or more carbon atoms of $W_4$ are respectively the same with those described concerning "the alkyl group having 3 or more carbon atoms" in the aromatic ring group substituted with at least one alkyl group having 3 or more carbon atoms, and "the cycloalkyl group having 5 or more carbon atoms" in the aromatic ring group substituted with at least one cycloalkyl group having 5 or more carbon atoms.

In the case where the exposure light source is extreme ultraviolet radiation (EUV ray), for the above-described reason, it is also preferred that each of $W_3$, $W_5$ and $W_6$ independently represents an organic group having one or more groups selected from the group consisting of a group having a silicon atom, an alkyl group having 6 or more carbon atoms, a cycloalkyl group having 6 or more carbon atoms, an aryl group having 9 or more carbon atoms and an aralkyl group having 10 or more carbon atoms. $W_4$ also preferably represents an organic group having one or more groups selected from the group consisting of a group having a silicon atom, an alkyl group having 3 or more carbon atoms and a cycloalkyl group having 5 or more carbon atoms.

Each of $W_3$, $W_5$ and $W_6$ independently preferably represents an organic group having a fluorine atom, an organic group having a silicon atom, an alkyl group having 6 or more carbon atoms, a cycloalkyl group having 6 or more carbon atoms, an aryl group having 9 or more carbon atoms or an aralkyl group having 10 or more carbon atoms. In the case where the exposure light source is extreme ultraviolet radiation (EUV ray), for the above-described reason, it is also preferred for each of $W_3$, $W_5$ and $W_6$ to represent an organic group having a silicon atom, an alkyl group having 6 or more carbon atoms, a cycloalkyl group having 6 or more carbon atoms, an aryl group having 9 or more carbon atoms or an aralkyl group having 10 or more carbon atoms.

$W_4$ preferably represents an organic group having a fluorine atom, an organic group having a silicon atom, an alkyl group having 3 or more carbon atoms or a cycloalkyl group having 5 or more carbon atoms. In the case where the exposure light source is extreme ultraviolet radiation (EUV ray), for the above-described reason, it is also preferred for $W_4$ to represent an organic group having a silicon atom, an alkyl group having 3 or more carbon atoms or a cycloalkyl group having 5 or more carbon atoms.

The specific examples of the repeating units represented by any of formulae (C-Ia) to (C-Id) are shown below, but the invention is not restricted thereto.

In the specific examples, $X_1$ represents a hydrogen atom, —$CH_3$, —F or —$CF_3$.

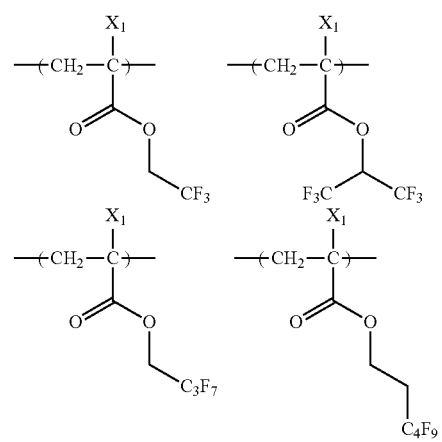

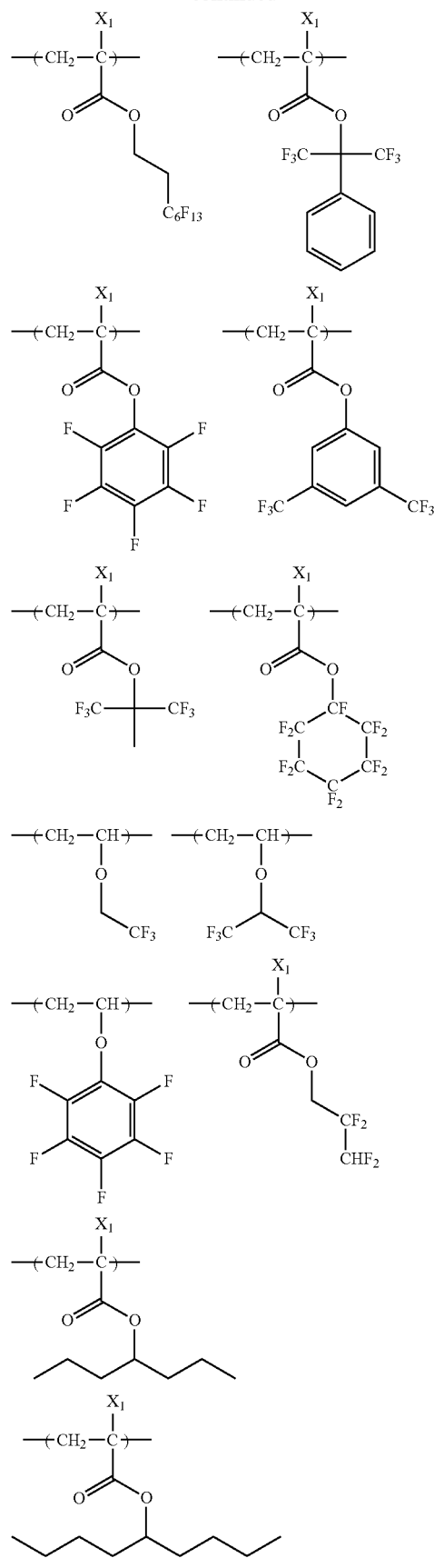
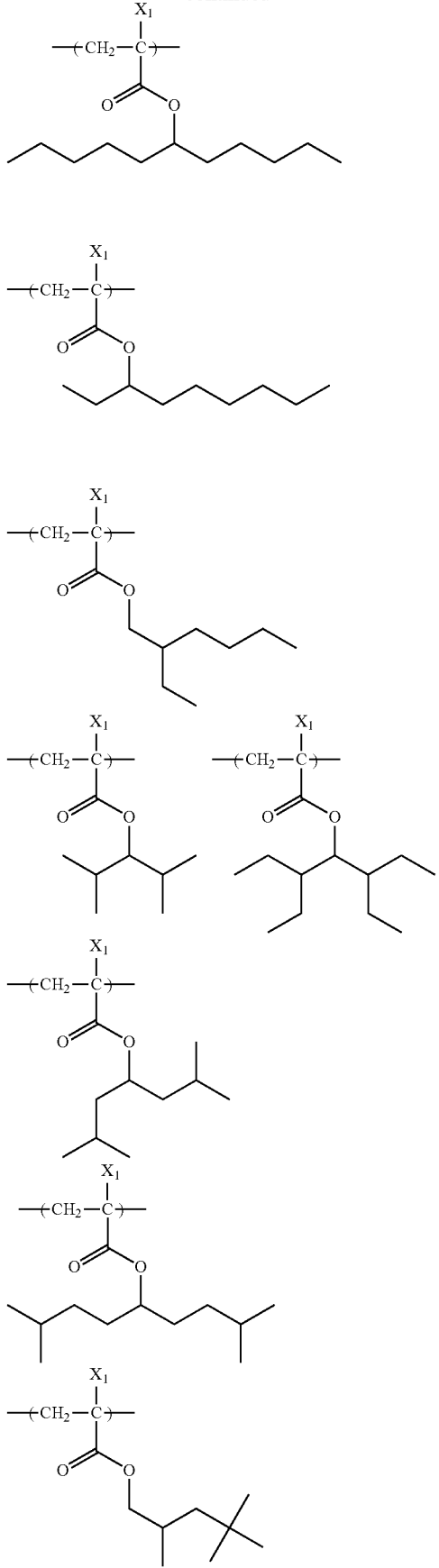

-continued
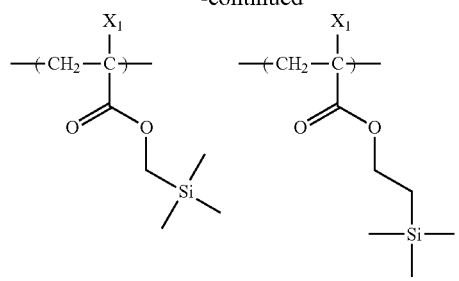
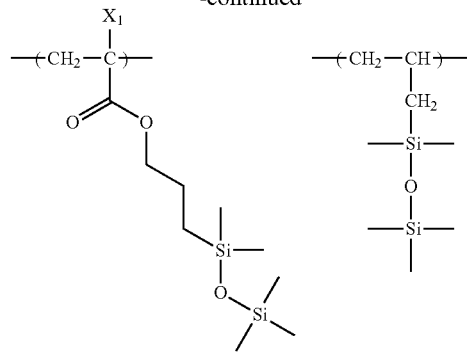
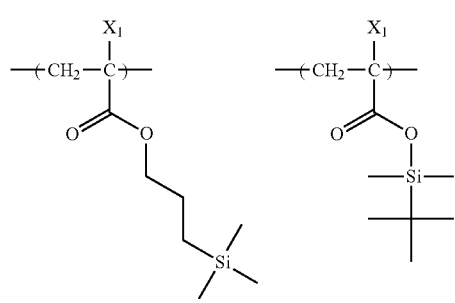
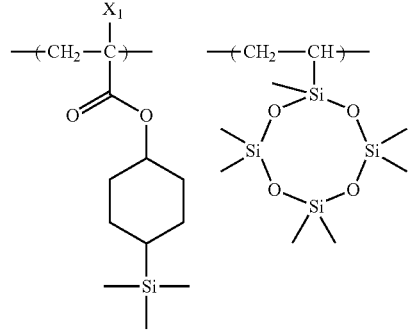
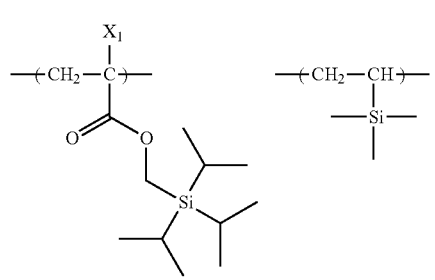
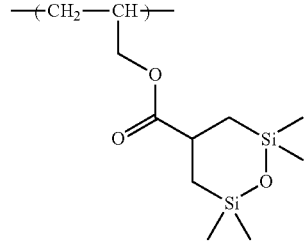
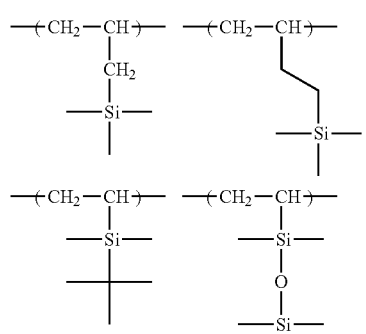
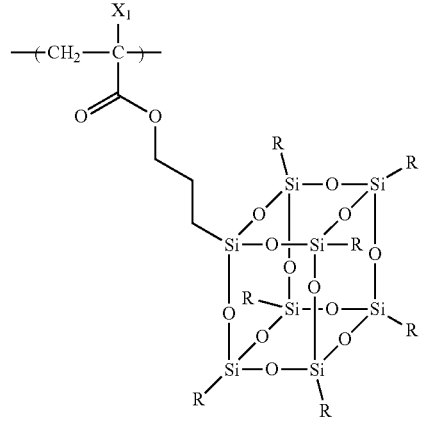
R = CH$_3$, C$_2$H$_5$, C$_3$H$_7$, C$_4$H$_9$
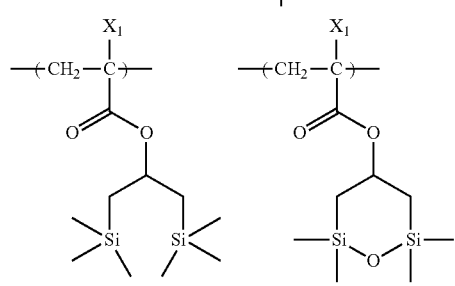
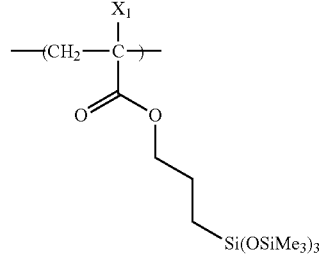
It is preferred for resin (C) to have an aromatic ring group, and more preferably have a repeating unit having an aromatic ring group. The aromatic ring group contained in resin (C) absorbs out of band light of EUV ray, and malfunctions such that only the surface of the exposed part is sensitized by out of band light (in particular in the case of EUV exposure), the sectional shape of the pattern becomes a T-top shape or a reverse taper shape, and the surfaces of parts which should be separated do not separate from each other and a bridged part is generated can be further restrained.

In this case, repeating unit (C) may have an aromatic ring group, alternatively resin (C) may further have a repeating unit other than repeating unit (C) and that repeating unit other than repeating unit (C) may have an aromatic ring group.

Repeating unit (C) in the case where repeating unit (C) has an aromatic ring group is preferably a repeating unit represented by the following formula (C-II).

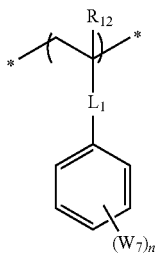

(C-II)

In formula (C-II), $R_{12}$ represents a hydrogen atom, a methyl group, a trifluoromethyl group or a fluorine atom.

$W_7$ represents an organic group having one or more groups selected from the group consisting of a group having a fluorine atom, a group having a silicon atom, an alkyl group having 3 or more carbon atoms and a cycloalkyl group having 5 or more carbon atoms.

$L_1$ represents a single bond or a —COOL$_2$- group. $L_2$ represents a single bond or an alkylene group.

n represents an integer of 1 to 5.

The group having a fluorine atom and the group having a silicon atom represented by $W_7$ are respectively the same with the group having a fluorine atom and the group having a silicon atom as exemplified above. The alkyl group having 3 or more carbon atoms and the cycloalkyl group having 5 or more carbon atoms of $W_7$ are respectively the same with the groups as described concerning "the alkyl group having 3 or more carbon atoms" in the aromatic ring group substituted with at least one alkyl group having 3 or more carbon atoms, and "the cycloalkyl group having 5 or more carbon atoms" in the aromatic ring group substituted with at least one cycloalkyl group having 5 or more carbon atoms.

$W_7$ preferably represents a trialkylsilyl group, a trialkoxysilyl group, an alkyl group having a trialkylsilyl group, an alkyl group having a trialkoxysilyl group, an alkyl group having 3 or more carbon atoms, or a cycloalkyl group having 5 or more carbon atoms.

In the trialkylsilyl group, the trialkoxysilyl group, the alkyl group having a trialkylsilyl group and the alkyl group having a trialkoxysilyl group of $W_7$, the number of carbon atoms of the alkyl group or alkoxy group bonding to silicon atoms is preferably 1 to 5 and more preferably 1 to 3.

Further, in the alkyl group having a trialkylsilyl group and the alkyl group having a trialkoxysilyl group of $W_7$, the number of carbon atoms of the alkyl group bonding to the trialkylsilyl group or the trialkoxysilyl group is preferably 1 to 5 and more preferably 1 to 3.

$R_{12}$ preferably represents a hydrogen atom or a methyl group.

The alkylene group represented by $L_2$ is preferably an alkylene group having 1 to 5 carbon atoms, and more preferably 1 to 3 carbon atoms. $L_2$ is preferably a single bond.

$W_7$ preferably represents an organic group having a fluorine atom, an organic group having a silicon atom, an alkyl group having 3 or more carbon atoms or a cycloalkyl group having 5 or more carbon atoms.

The specific examples of the repeating units represented by formula (C-II) are shown below, but the invention is not restricted thereto.

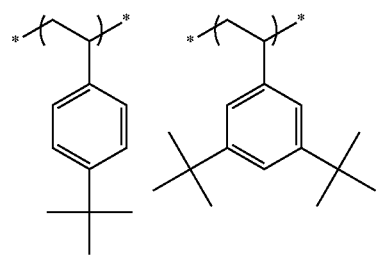

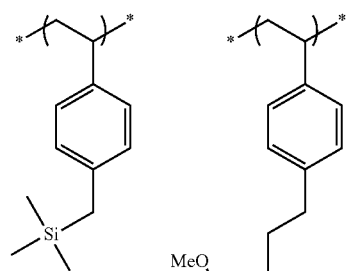

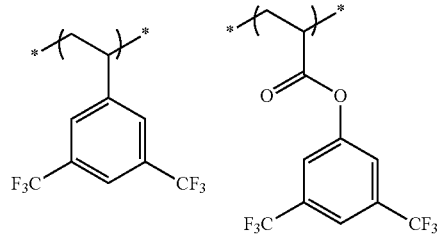

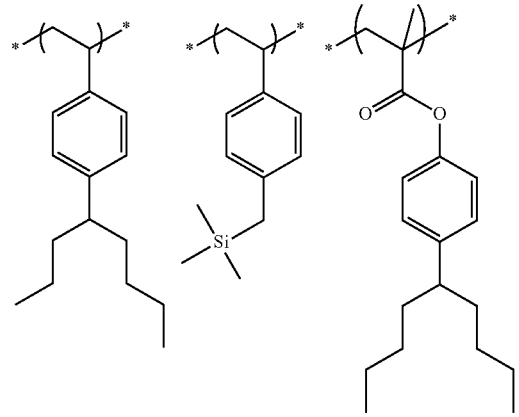

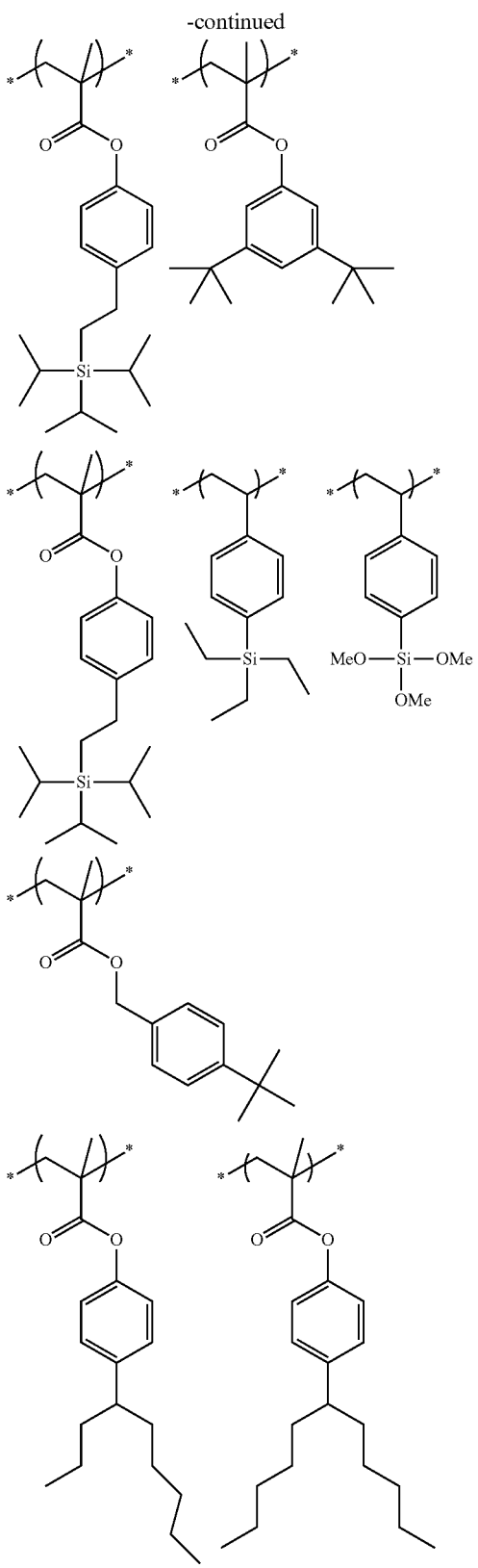

The content of repeating unit (C) is preferably 40 mol % to 100 mol % based on all the repeating units in resin (C), more preferably 50 mol % to 100 mol %, and still more preferably 60 mol % to 100 mol %.

In the case where resin (C) further has a repeating unit other than repeating unit (C) and the repeating unit other than repeating unit (C) has an aromatic ring group, a copolymer having a repeating unit represented by any of formulae (C-Ia) to (C-Id) and a repeating unit having an aromatic ring group is exemplified as resin (C).

The repeating unit having an aromatic ring group is preferably a repeating unit represented by the following formula (II).

$$\begin{array}{c} R_{51}\ R_{53} \\ |\ \ \ | \\ -(C-C)- \\ |\ \ \ | \\ R_{52}\ X_5 \\ \ \ \ \ \ | \\ \ \ \ \ \ L_5 \\ \ \ \ \ \ | \\ \ \ \ \ \ Ar_5 \end{array} \quad (II)$$

In formula (II), each of $R_{51}$, $R_{52}$ and $R_{53}$ independently represents a hydrogen atom, an alkyl group, a halogen atom, a cyano group or an alkoxycarbonyl group. However, $R_{52}$ may be bonded to $Ar_5$ to form a ring, and $R_{52}$ in that case represents a single bond or an alkylene group.

$X_5$ represents a single bond, —COO— or —CONR$_{64}$—, and $R_{64}$ represents a hydrogen atom or an alkyl group.

$L_5$ represents a single bond or an alkylene group.

$Ar_5$ represents a monovalent aromatic ring group, and represents a divalent aromatic ring group when bonded to $R_{52}$ to form a ring.

The specific examples of the alkyl group, cycloalkyl group, halogen atom, alkoxycarbonyl group represented by $R_{51}$, $R_{52}$ and $R_{53}$ in formula (I), and substituents that these groups may have are the same with the specific examples described in each group represented by $R_{51}$, $R_{52}$ and $R_{53}$ in formula (V).

The monovalent aromatic ring group $Ar_5$ may have a substituent, e.g., an arylene group having 6 to 18 carbon atoms such as a phenyl group, a tolyl group, a naphthyl group, and an anthracenyl group, and aromatic ring groups containing a heterocyclic ring such as thiophene, furan, pyrrole, benzothiophene, benzofuran, benzopyrrole, triazine, imidazole, benzimidazole, triazole, thiadiazole and thiazole can be given as preferred examples.

As the specific examples of the divalent aromatic ring groups, groups obtained by removing one arbitrary hydrogen atom from the above described specific examples of the monovalent aromatic ring groups can be properly exemplified.

As the examples of the substituents that the above alkyl group, cycloalkyl group, alkoxycarbonyl group, alkylene group and monovalent aromatic ring group may have, the alkyl group, alkoxy groups, e.g., a methoxy group, an ethoxy group, a hydroxyethoxy group, a propoxy group, a hydroxypropoxy group and a butoxy group, and the ary group, e.g., a phenyl group exemplified in $R_{51}$ to $R_{53}$ in formula (V) can be enumerated.

The alkyl group of $R_{64}$ in —CONR$_{64}$— (wherein $R_{64}$ represents a hydrogen atom or an alkyl group) represented by $X_5$ is the same with the alkyl group represented by $R_{51}$ to $R_{53}$.

$X_5$ preferably represents a single bond, —COO— or —CONH—, and more preferably a single bond or —COO—.

As the alkylene group represented by $L_5$, preferably an alkylene group having 1 to 8 carbon atoms, such as a methylene group, an ethylene group, a propylene group, a butylenes group, a hexylene group and an octylene group are exemplified, each of which groups may have a substituent.

$Ar_5$ more preferably represents an aromatic ring group having 6 to 18 carbon atoms which may have a substituent, and especially preferably represents a phenyl group, a naphthyl group or a biphenyl group.

The specific examples of the repeating units represented by formula (II) are shown below, but the invention is not restricted thereto.

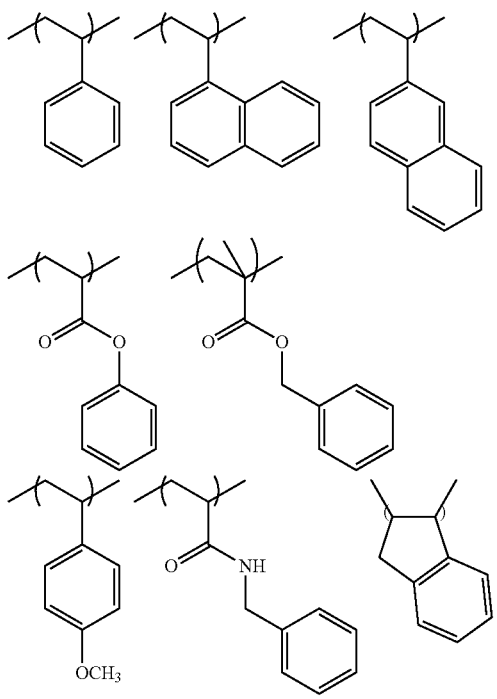

Resin (C) may contain or may not contain the repeating unit represented by formula (II), but when contains, the content of the repeating unit represented by formula (II) to all the repeating units of resin (C) is preferably 1 mol % to 40 mol %, more preferably 1 mol % to 35 mol %, and still more preferably 1 mol % to 30 mol %.

As the repeating unit having an aromatic ring group, repeating unit (c) having two or more aromatic rings represented by formula (c1) described in resin (A) can be exemplified, and preferred examples in repeating unit (c) are the same as described above.

Resin (C) may contain or may not contain repeating unit (c) having two or more aromatic rings represented by formula (c1), but when contains, the content of repeating unit (c) having two or more aromatic rings is preferably in the range of 1 mol % to 30 mol % to all the repeating units in resin (C), more preferably 1 mol % to 25 mol %, and still more preferably 1 mol % to 20 mol %. Repeating unit (c) having two or more aromatic rings contained in resin (C) may be used in combination of two or more kinds.

Resin (C) may further have at least one group selected from the following group (x) an acid group, (y) a group having a lactone structure, an acid anhydride group or an acid imide group and (z) a group capable of decomposing by the action of an acid.

As an acid group (x), a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkyl-carbonyl)imido group, a bis(alkylcarbonyl)methylene group, a bis(alkylcarbonyl)-imido group, a bis(alkylsulfonyl)methylene group, a bis(alkylsulfonyl) imido group, a tris(alkylcarbonyl)methylene group and a tris(alkylsulfonyl)methylene group are exemplified.

As preferred acid groups, a fluorinated alcohol group (preferably hexafluoroisopropanol), a sulfonamido group and a bis(alkylcarbonyl)methylene group are exemplified.

The repeating unit having an acid group (x) includes a repeating unit having an acid group directly bonded to the main chain of the resin such as a repeating unit by an acrylic acid or a methacrylic acid, or a repeating unit having an acid group bonded to the main chain of the resin via a linking group. Further, an acid group can be introduced into the terminal of the polymer chain by using a polymerization initiator or a chain transfer agent having an acid group at the time of polymerization, and both cases are preferred. The repeating unit having an acid group (x) may have at least either a fluorine atom or a silicon atom.

The content of the repeating unit having an acid group (x) is preferably 10 mol % or less based on all the repeating units in resin (C), and more preferably 5 mol % or less. It is preferred that resin (C) does not substantially have the repeating unit having an acid group (x) (ideally, the content of the repeating unit having an acid group (x) is 0 mol % based on all the repeating units in resin (C), that is, resin (C) does not have the repeating unit having an acid group (x)).

The specific examples of the repeating units having an acid group (x) are shown below, but the invention is not restricted thereto. In the formulae, Rx represents a hydrogen atom, $CH_3$, $CF_3$ or $CH_2OH$.

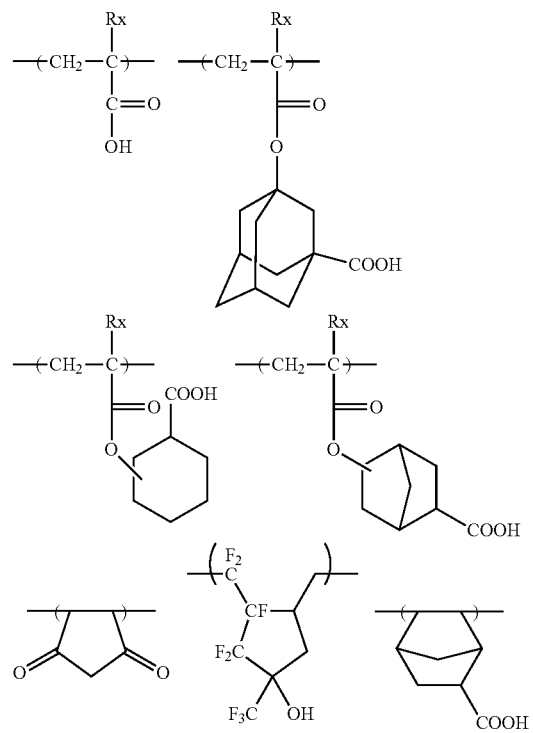

179
-continued
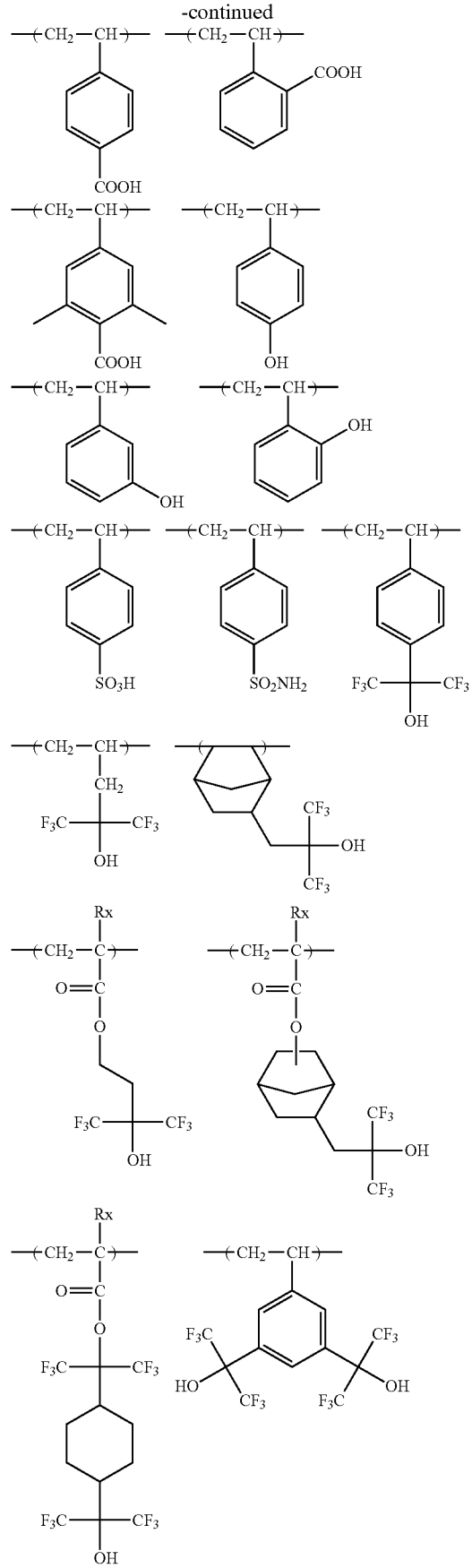
180
-continued
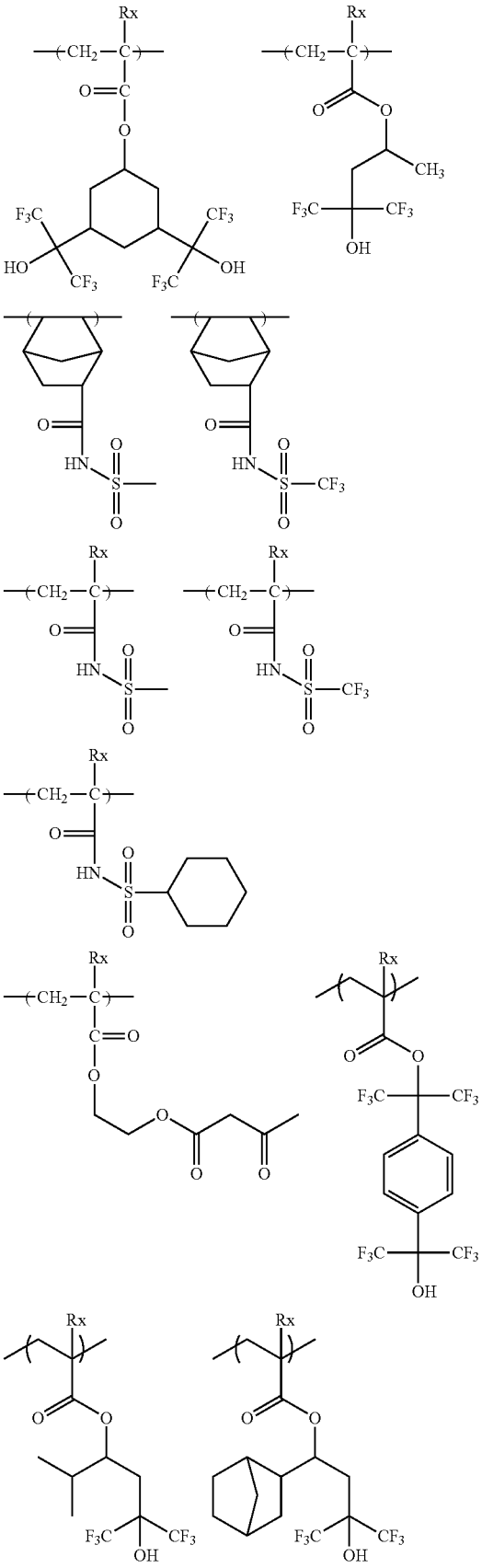

As a group having a lactone structure, an acid anhydride group or an acid imide group (y), a group having a lactone structure is especially preferred.

The repeating unit containing any of these groups is, for example, a repeating unit having the group directly bonded to the main chain of the resin such as a repeating unit by acrylic ester or methacrylic ester, or the repeating unit may be a repeating unit having any of these groups bonded to the main chain of the resin via a linking group. Alternatively, any of these groups may be introduced into the terminal of the resin of the repeating unit by using a polymerization initiator or a chain transfer agent having the group at the time of polymerization.

As the repeating unit having a group having a lactone structure, for example, the same repeating unit with the repeating unit having a lactone structure described in acid-decomposable resin (A) can be exemplified.

The content of the repeating unit having a group having a lactone structure, an acid anhydride group or an acid imide group is preferably 10 mol % or less on the basis of all the repeating units in the hydrophobic resin, and more preferably 5 mol % or less. It is preferred that resin (C) does not substantially have the repeating unit having a group having a lactone structure, an acid anhydride group or an acid imide group (ideally, the content of the repeating unit having a group having a lactone structure, an acid anhydride group or an acid imide group is 0 mol % based on all the repeating units in resin (C), that is, resin (C) does not have the repeating unit having a group having a lactone structure, an acid anhydride group or an acid imide group).

As the repeating unit having a group capable of decomposing by the action of an acid (z) (an acid-decomposable repeating unit) in resin (C), the same repeating unit with the repeating unit having an acid-decomposable group as described in resin (A) can be exemplified. The repeating unit having a group capable of decomposing by the action of an acid (z) may have at least either a fluorine atom or a silicon atom. The content of the repeating unit having a group capable of decomposing by the action of an acid (z) in resin (C) is preferably 5 mol % or less on the basis of all the repeating units in resin (C), and more preferably 3 mol % or less. Ideally, it is particularly preferred for resin (C) not to have the repeating unit having a group capable of decomposing by the action of an acid (z). This is for the reason that for restraining roughness on the pattern surface (especially in the case of EUV exposure) and the occurrences of a T-top shape, a reverse taper shape and a bridged part, it is preferred for resin (C) to accelerate dissolution of the resist film in an organic developer regardless of exposed part or unexposed part of the resist film, but with the increase of the repeating units having a group capable of decomposing by the action of an acid (z) contained in resin (C), difference is generated in the above-described function of dissolution acceleration between the exposed part and the unexposed part.

Resin (C) may further contain a repeating unit represented by the following formula (CIII).

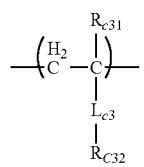

(CIII)

In formula (CIII), $R_{c31}$ represents a hydrogen atom, an alkyl group (which may be substituted with a fluorine atom), a cyano group or a —$CH_2$—O—$Rac_2$ group, wherein $Rac_2$ represents a hydrogen atom, an alkyl group or an acyl group. $R_{c31}$ preferably represents a hydrogen atom, a methyl group, a hydroxymethyl group or a trifluoromethyl group, and especially preferably represents a hydrogen atom or a methyl group.

$R_{c32}$ represents a group having an alkyl group, a cycloalkyl group, an alkenyl group, a cycloalkenyl group or an aryl group. These groups may be substituted with a group containing a fluorine atom or a silicon atom.

$L_{c3}$ represents a single bond or a divalent linking group.

The alkyl group of $R_{c32}$ in formula (CIII) is preferably a straight chain or branched alkyl group having 3 to 20 carbon atoms.

The cycloalkyl group of $R_{c32}$ is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms, and more preferably a phenyl group and a naphthyl group, and these groups may have a substituent.

$R_{c32}$ is preferably an unsubstituted alkyl group or an alkyl group substituted with a fluorine atom.

The divalent linking group represented by $L_{c3}$ is preferably an alkylene group (preferably having 1 to 5 carbon atoms), an ether bond, a phenylene group or an ester bond (a group represented by —COO—).

The content of the repeating unit represented by formula (CIII) is preferably 1 mol % to 100 mol % on the basis of all the repeating units in the hydrophobic resin, more preferably 10 mol % to 90 mol %, and still more preferably 30 mol % to 70 mol %.

It is also preferred for resin (C) to have a repeating unit represented by the following formula (CII-AB).

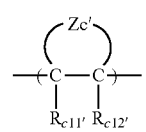

(CII-AB)

In formula (CII-AB), each of $R_{c11}'$ and $R_{c12}'$ independently represents a hydrogen atom, a cyano group, a halogen atom or an alkyl group.

$Zc'$ contains bonded two carbon atoms (C—C) and represents an atomic group to form an alicyclic structure.

The content of the repeating unit represented by formula (CII-AB) is preferably 1 mol % to 100 mol % on the basis of all the repeating units in the hydrophobic resin, more preferably 10 mol % to 90 mol %, and still more preferably 30 mol % to 70 mol %.

The specific examples of the repeating units represented by formula (III) or (CII-AB) are shown below, but the invention is not restricted thereto. In the formulae, Ra represents H, $CH_3$, $CH_2OH$, $CF_3$ or CN.

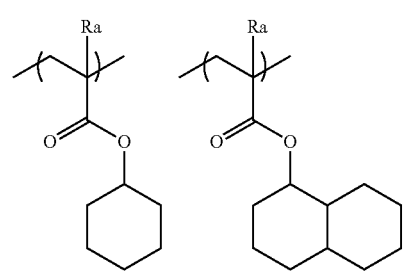
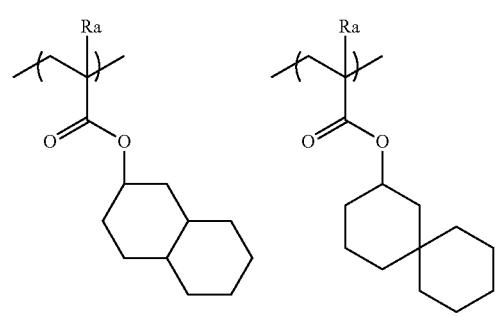
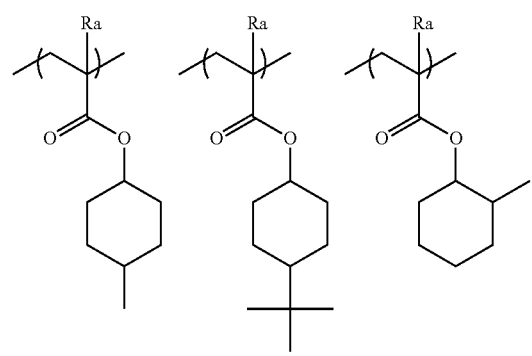
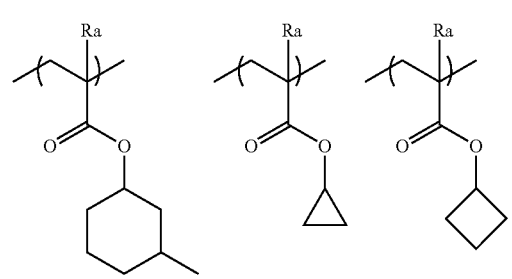
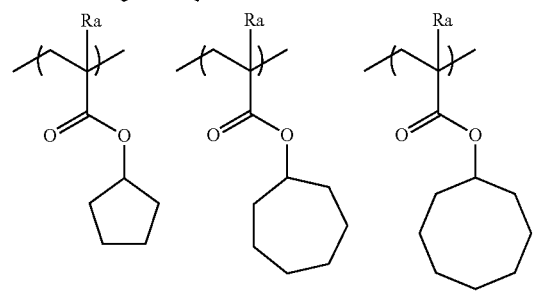
-continued
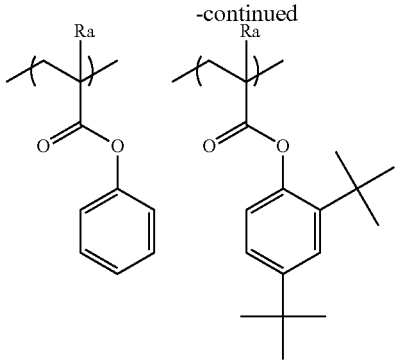
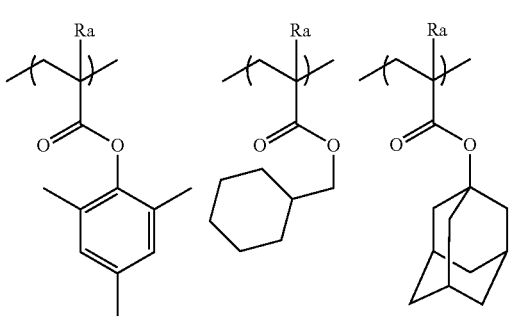
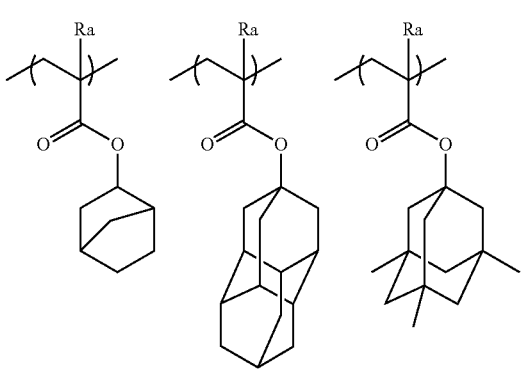
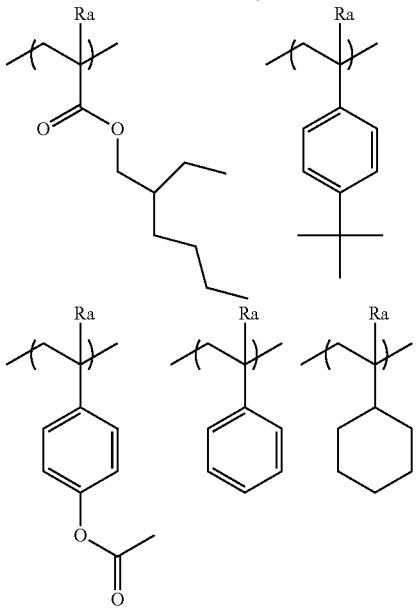

-continued

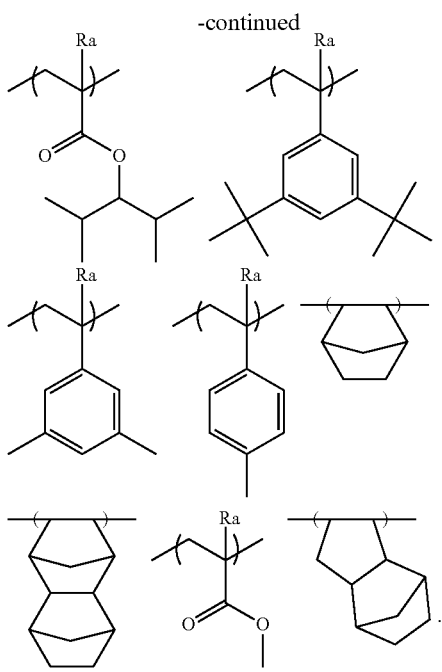

The standard polystyrene equivalent weight average molecular weight of resin (C) is preferably 1,000 to 100,000, more preferably 1,000 to 50,000, and still more preferably 2,000 to 15,000.

In the case where resin (C) contains a fluorine atom or a group having a fluorine atom, the content of the repeating unit having a fluorine atom is preferably 5 mol % to 100 mol % on the basis of all the repeating units in resin (C), and more preferably 10 mol % to 100 mol %. However, in the case where the exposure light source is EUV ray, for the above-described reason, the content of the repeating unit having a fluorine atom is also preferably 50 mol % or less on the basis of all the repeating units in resin (C), also more preferably 30 mol % or less, also still more preferably 10 mol % or less, and it is also preferred not to have a fluorine atom.

Further, especially when the exposure light source is EUV ray, since an aromatic ring group can absorb out of band light of EUV ray as described above, it is preferred that resin (C) has a repeating unit having an aromatic ring group.

In the case where resin (C) has a repeating unit having an aromatic ring group, the content of the repeating unit having an aromatic ring group is preferably 50 mol % to 100 mol % on the basis of all the repeating units in resin (C), and more preferably 70 mol % to 100 mol %.

Resin (C) can be used one kind alone or two or more kinds may be used in combination. When two or more kinds of resin (C) are used in combination, it is preferred that at least one kind of a plurality of resin (C) has an aromatic ring group.

The content of resin (C) in the composition is preferably 0.01% by mass to 10% by mass on the basis of all the solids content in the composition of the invention, more preferably 0.05% by mass to 8% by mass, and still more preferably 0.1% by mass to 5% by mass.

Similarly to resin (A), also in resin (C), as a matter of course impurities such as metals are the less, the better, and the residual monomer and oligomer components are preferably 0.01% by mass to 5% by mass, more preferably 0.01% by mass to 3% by mass, and still more preferably 0.05% by mass to 1% by mass. In the above range of impurities, an electron beam-sensitive or extreme ultraviolet radiation-sensitive resin composition free from foreign matters in liquid and aging transformation of sensitivity can be obtained. Also from the points of resolution, a resist form, the side wall of the resist pattern and roughness, molecular weight distribution (Mw/Mn, also referred to as polydispersity) is preferably in the range of 1 to 5, more preferably 1 to 3, and still more preferably in the range of 1 to 2.

Each of resin (C) and resin (A) may have a repeating unit having a polar group selected from a hydroxyl group, a cyano group, a lactone group, a carboxylic acid group, a sulfonic acid group, an amido group, a sulfonamido group, an ammonium group, a sulfonium group and a group obtained by combining two or more of these groups, but the content (mol %) of the repeating unit having a polar group to all the repeating units of resin (C) is preferably less than the content (mol %) of the repeating unit having a polar group to all the repeating units of resin (A) by 10 mol % or more, more preferably less than that by 20 mol % or more, and especially preferably less than that by 30 mol % or more. As described above, resin (C) is a resin having a group of high hydrophobicity, but by satisfying the above relationship concerning the contents of the repeating units having a polar group, resin (C) is relatively sufficiently hydrophobic to resin (A), and effectively localize on the surface of the resist film with ease.

Commercially available products can be used as resin (C), or resin (C) can be synthesized according ordinary methods (for example, radical polymerization). As ordinary synthesizing methods, for example, batch polymerization of performing polymerization by dissolving a monomer seed and a polymerization initiator in a solvent and heating, and drop polymerization of adding a solution of a monomer seed and a polymerization initiator to a heated solvent by dropping over 1 to 10 hours are given, and drop polymerization is preferred.

Reaction solvents, polymerization initiators, reaction conditions (temperature, concentration, and the like), and purification methods after reaction are the same with the contents as described in resin (A), but in the synthesis of hydrophobic resin (E), the reaction concentration is preferably 30% by mass to 50% by mass.

The specific examples of resin (C) are shown below. Further, in Tables 1 and 2 below, the molar ratio of the repeating units in each resin (corresponding to each repeating unit from the left side in order), the weight average molecular weight and polydispersity are shown.

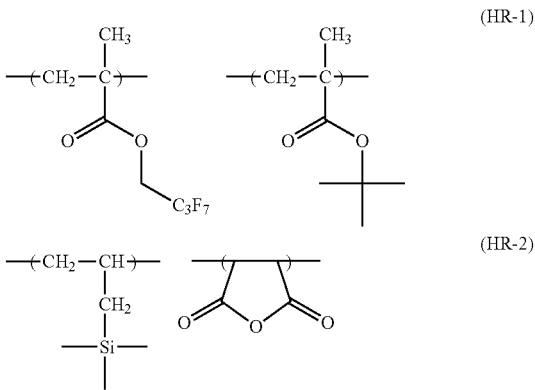

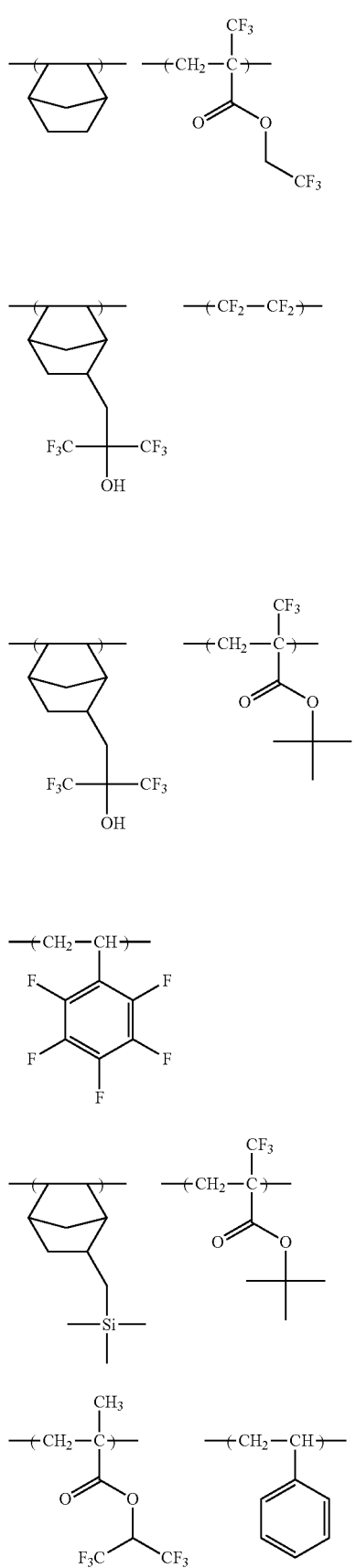
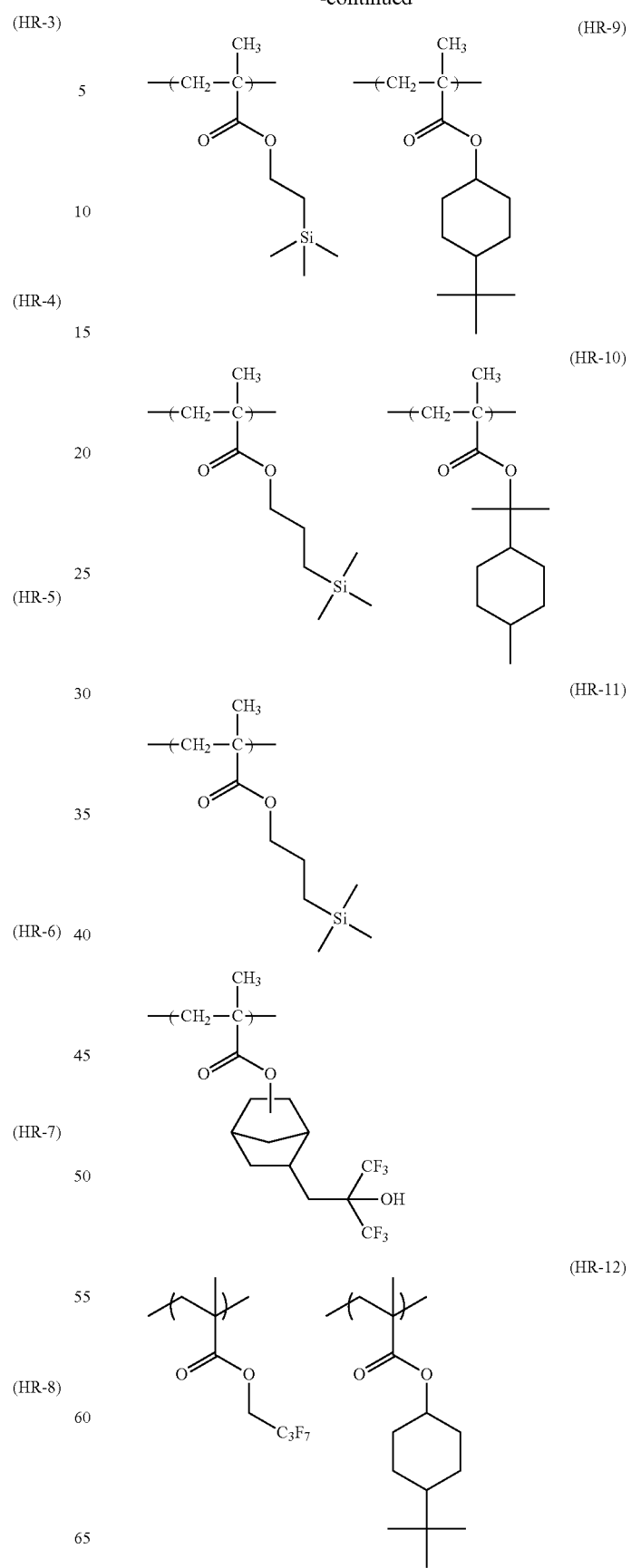

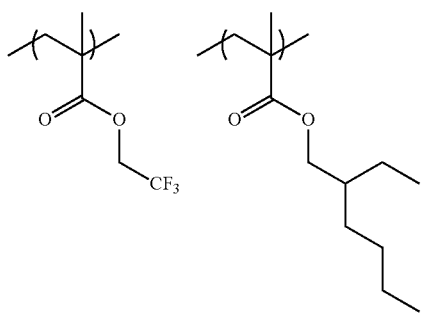
(HR-13)
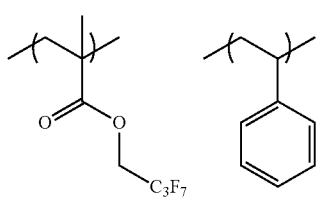
(HR-14)
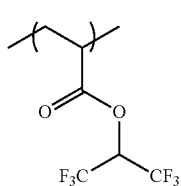
(HR-15)
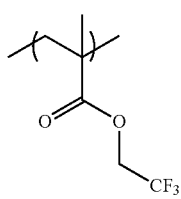
(HR-16)
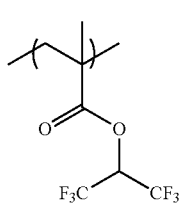
(HR-17)
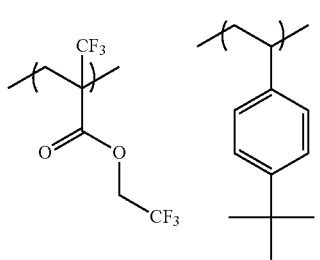
(HR-18)
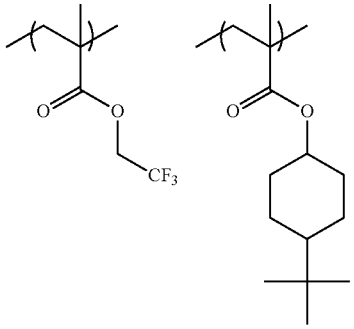
(HR-19)
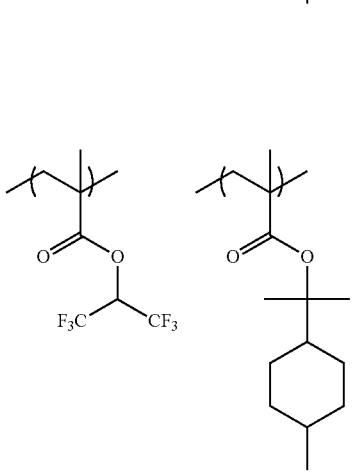
(HR-20)
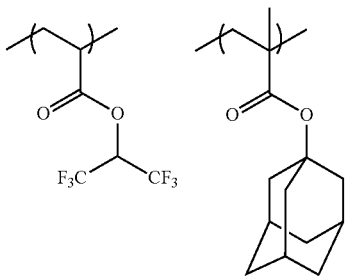
(HR-21)
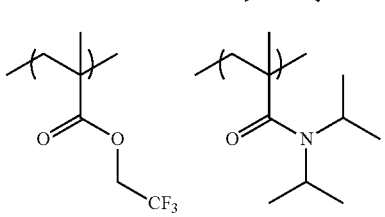
(HR-22)
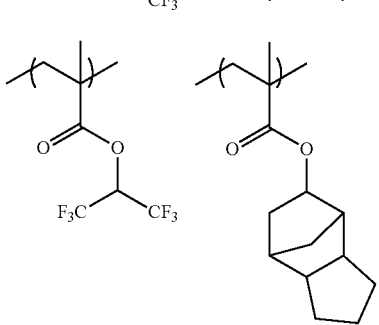
(HR-23)

(HR-24) 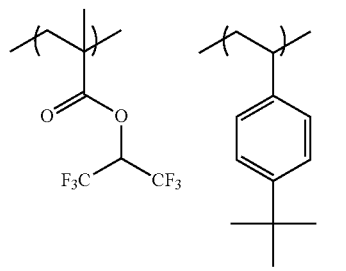
(HR-25) 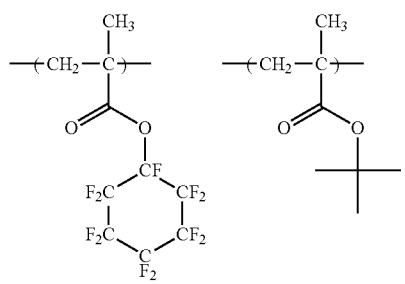
(HR-26) 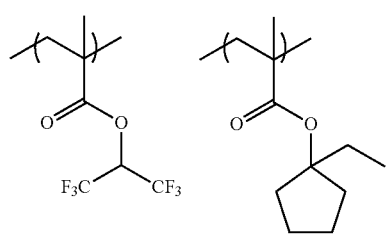
(HR-27) 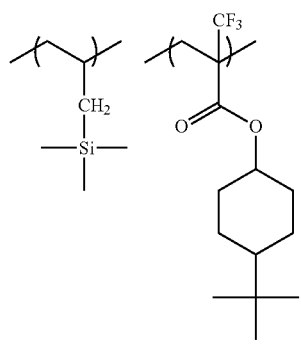
(HR-28) 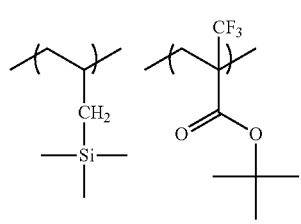
(HR-29) 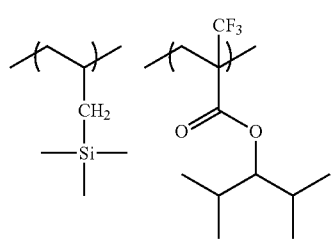
(HR-30) 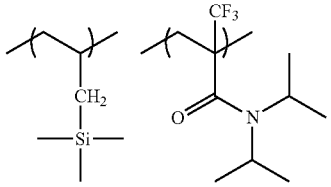
(HR-31) 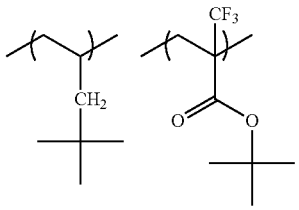
(HR-32) 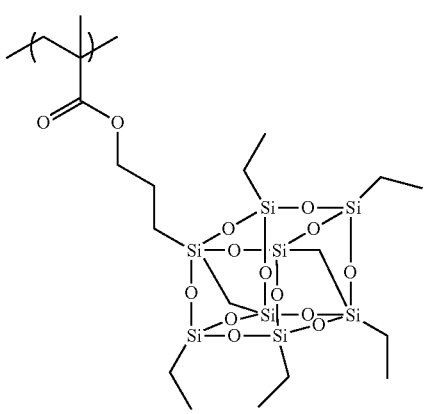
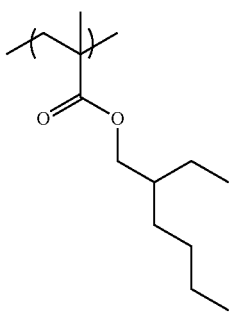
(HR-33) 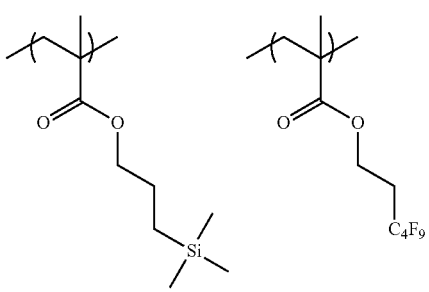

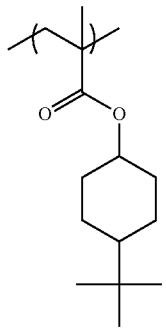
(HR-34)
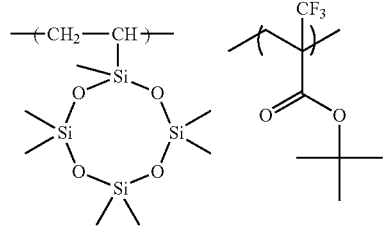
(HR-35)
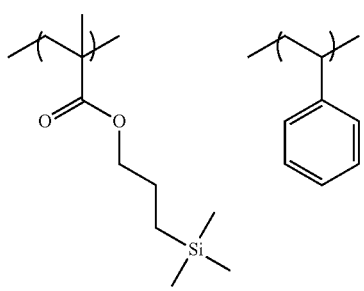
(HR-36)
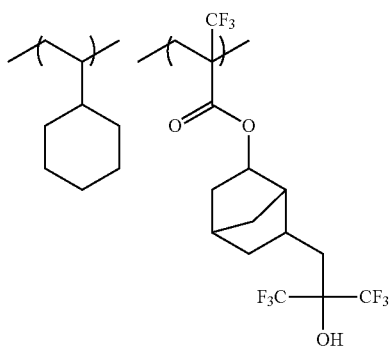
(HR-37)
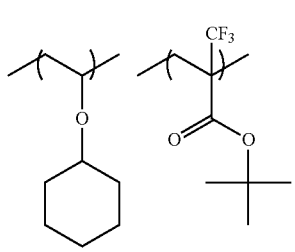
(HR-38)
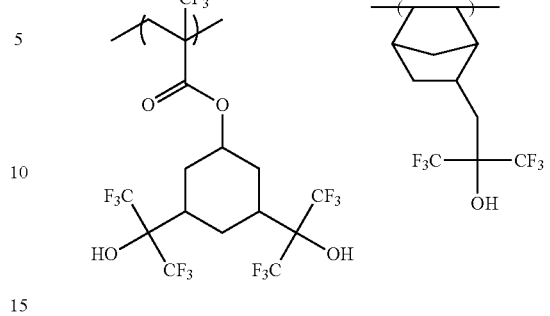
(HR-39)
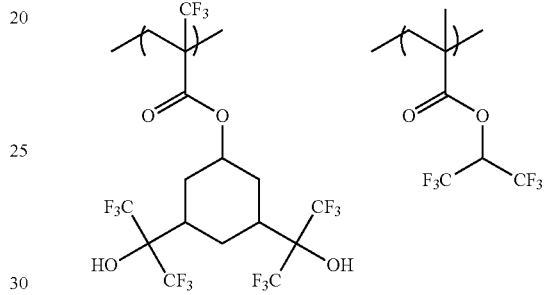
(HR-40)
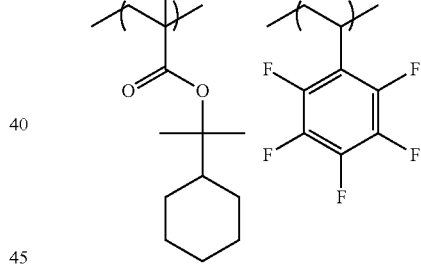
(HR-41)
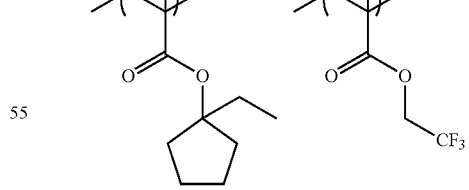
(HR-42)
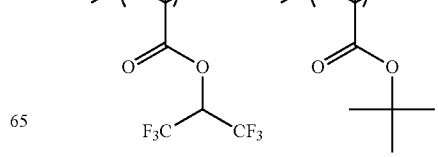

(HR-43) 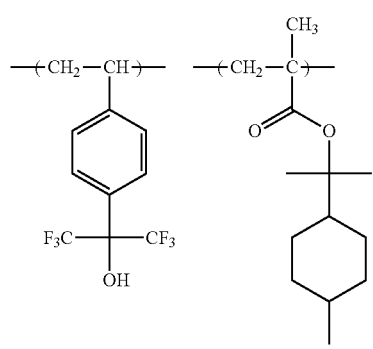
(HR-44) 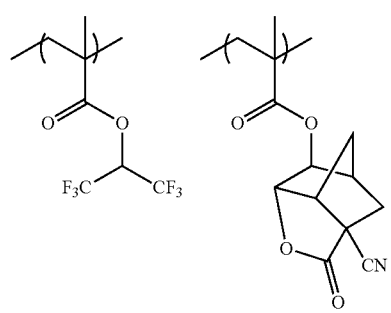
(HR-45) 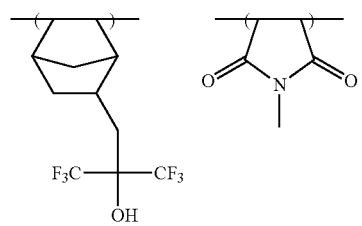 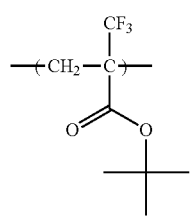
(HR-46) 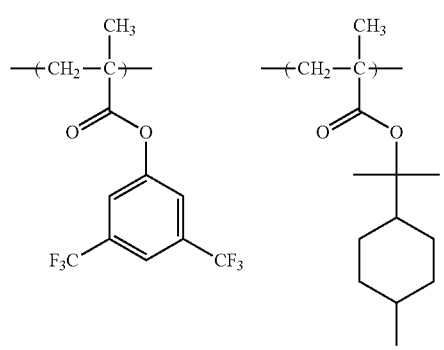
(HR-47) 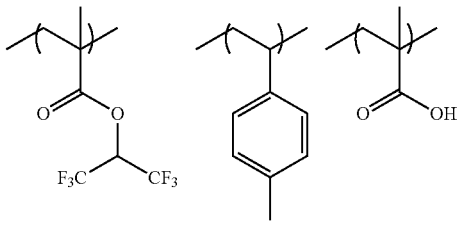
(HR-48) 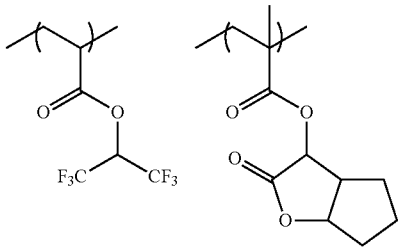
A-1 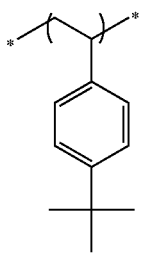
A-2 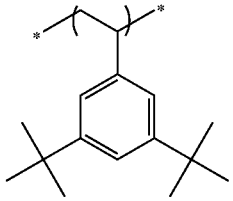
A-3 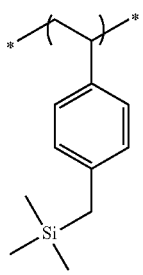
A-4 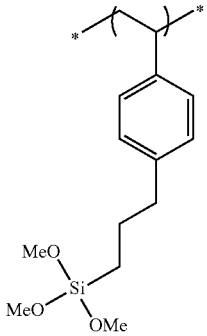

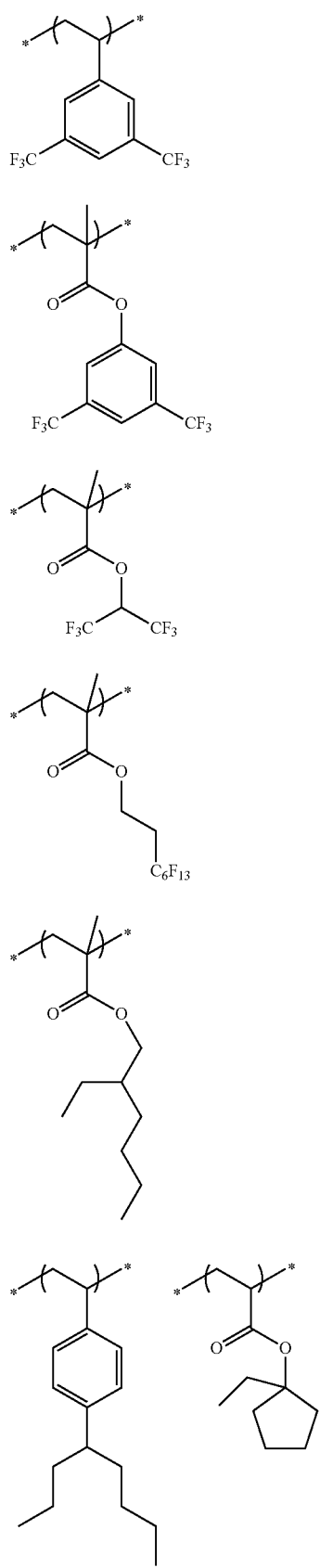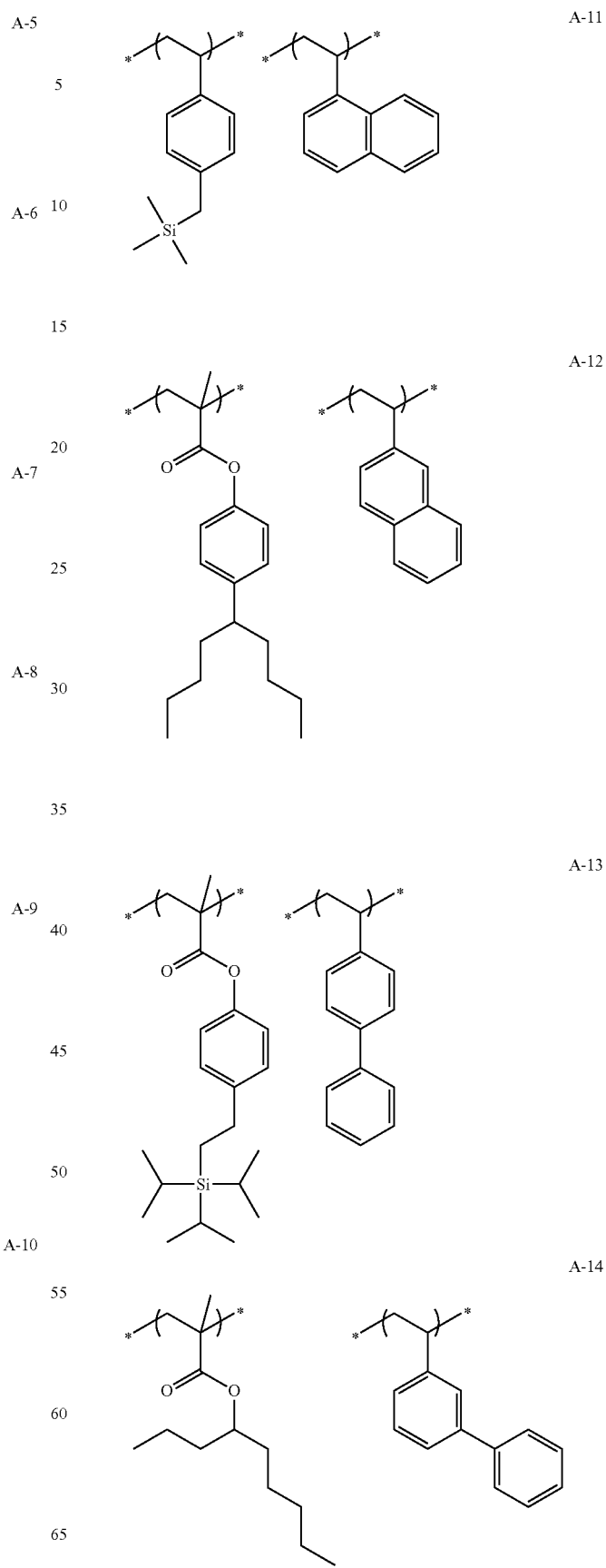

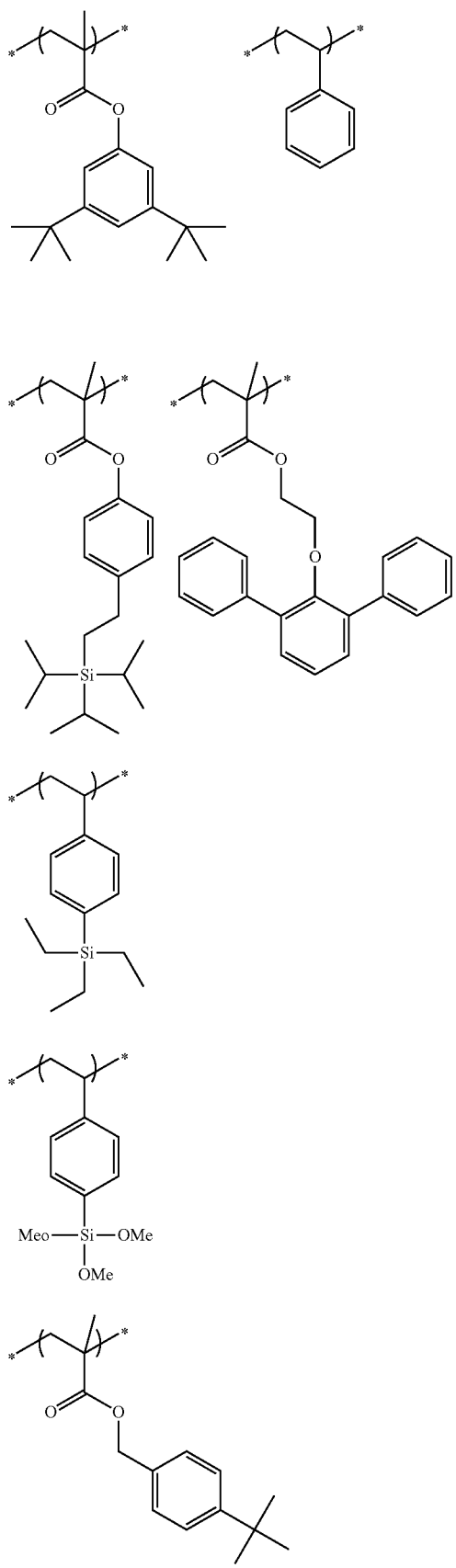
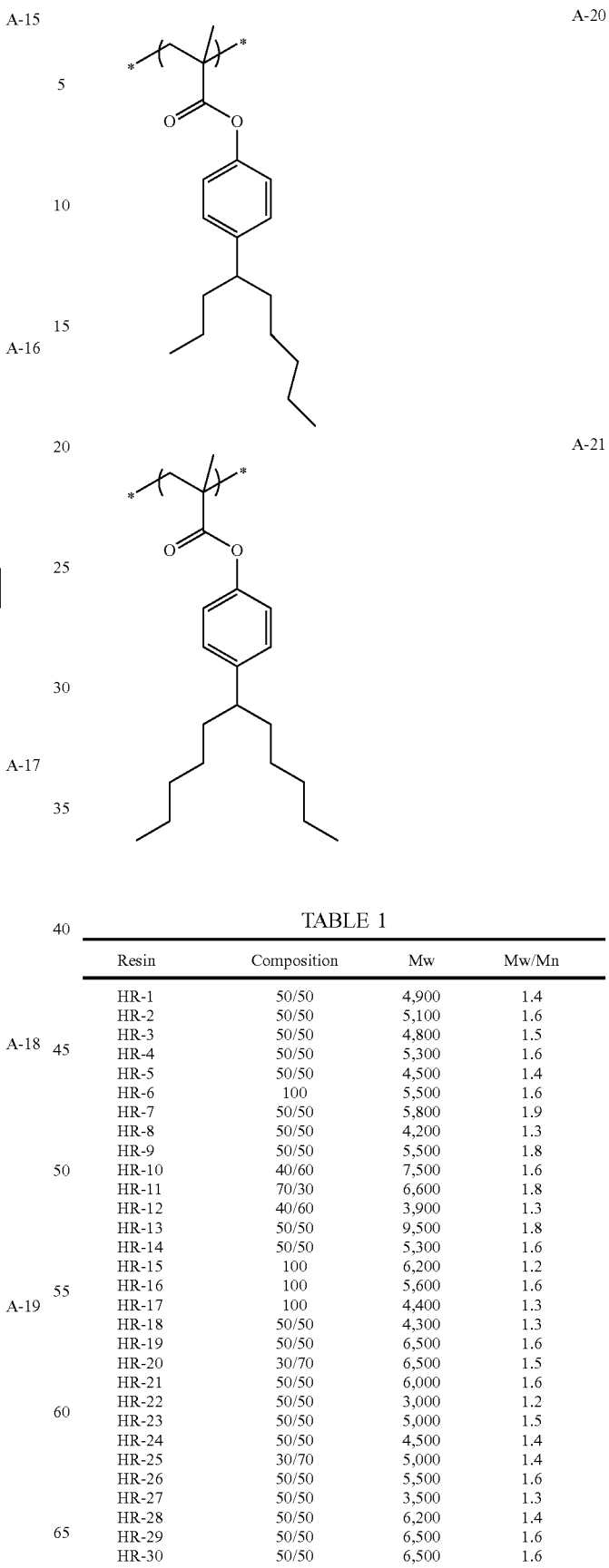
| Resin | Composition | Mw | Mw/Mn |
|---|---|---|---|
| HR-1 | 50/50 | 4,900 | 1.4 |
| HR-2 | 50/50 | 5,100 | 1.6 |
| HR-3 | 50/50 | 4,800 | 1.5 |
| HR-4 | 50/50 | 5,300 | 1.6 |
| HR-5 | 50/50 | 4,500 | 1.4 |
| HR-6 | 100 | 5,500 | 1.6 |
| HR-7 | 50/50 | 5,800 | 1.9 |
| HR-8 | 50/50 | 4,200 | 1.3 |
| HR-9 | 50/50 | 5,500 | 1.8 |
| HR-10 | 40/60 | 7,500 | 1.6 |
| HR-11 | 70/30 | 6,600 | 1.8 |
| HR-12 | 40/60 | 3,900 | 1.3 |
| HR-13 | 50/50 | 9,500 | 1.8 |
| HR-14 | 50/50 | 5,300 | 1.6 |
| HR-15 | 100 | 6,200 | 1.2 |
| HR-16 | 100 | 5,600 | 1.6 |
| HR-17 | 100 | 4,400 | 1.3 |
| HR-18 | 50/50 | 4,300 | 1.3 |
| HR-19 | 50/50 | 6,500 | 1.6 |
| HR-20 | 30/70 | 6,500 | 1.5 |
| HR-21 | 50/50 | 6,000 | 1.6 |
| HR-22 | 50/50 | 3,000 | 1.2 |
| HR-23 | 50/50 | 5,000 | 1.5 |
| HR-24 | 50/50 | 4,500 | 1.4 |
| HR-25 | 30/70 | 5,000 | 1.4 |
| HR-26 | 50/50 | 5,500 | 1.6 |
| HR-27 | 50/50 | 3,500 | 1.3 |
| HR-28 | 50/50 | 6,200 | 1.4 |
| HR-29 | 50/50 | 6,500 | 1.6 |
| HR-30 | 50/50 | 6,500 | 1.6 |

TABLE 1-continued

| Resin | Composition | Mw | Mw/Mn |
|---|---|---|---|
| HR-31 | 50/50 | 4,506 | 1.4 |
| HR-32 | 30/70 | 5,000 | 1.6 |
| HR-33 | 30/30/40 | 6,500 | 1.8 |
| HR-34 | 50/50 | 4,000 | 1.3 |
| HR-35 | 50/50 | 6,500 | 1.7 |
| HR-36 | 50/50 | 6,000 | 1.5 |
| HR-37 | 50/50 | 5,000 | 1.6 |
| HR-38 | 50/50 | 4,000 | 1.4 |
| HR-39 | 20/80 | 6,000 | 1.4 |
| HR-40 | 50/50 | 7,000 | 1.4 |
| HR-41 | 50/50 | 6,500 | 1.6 |
| HR-42 | 50/50 | 5,200 | 1.6 |
| HR-43 | 50/50 | 6,000 | 1.4 |
| HR-44 | 70/30 | 5,500 | 1.6 |
| HR-45 | 50/20/30 | 4,200 | 1.4 |
| HR-46 | 30/70 | 7,500 | 1.6 |
| HR-47 | 40/58/2 | 4,300 | 1.4 |
| HR-48 | 50/50 | 6,800 | 1.6 |

TABLE 2

| Resin | Ratio of Composition | Mass Average Molecular Weight (Mw) | Polydispersity (Mw/Mn) |
|---|---|---|---|
| A-1 | 100 | 11,000 | 1.40 |
| A-2 | 100 | 12,000 | 1.45 |
| A-3 | 100 | 11,500 | 1.43 |
| A-4 | 100 | 11,800 | 1.42 |
| A-5 | 100 | 11,700 | 1.46 |
| A-6 | 100 | 11,600 | 1.51 |
| A-7 | 100 | 11,800 | 1.48 |
| A-8 | 100 | 11,000 | 1.52 |
| A-9 | 100 | 11,200 | 1.41 |
| A-10 (1) | 97/3 | 11,500 | 1.50 |
| A-10 (2) | 95.5/4.5 | 11,600 | 1.48 |
| A-10 (3) | 94.5/5.5 | 11,400 | 1.51 |
| A-10 (4) | 93/7 | 11,500 | 1.48 |
| A-11 | 70/30 | 11,000 | 1.48 |
| A-12 | 70/30 | 11,300 | 1.43 |
| A-13 | 80/20 | 11,300 | 1.45 |
| A-14 | 80/20 | 11,500 | 1.44 |
| A-15 | 80/20 | 11,400 | 1.50 |
| A-16 | 80/20 | 11,600 | 1.51 |
| A-17 | 100 | 11,800 | 1.52 |
| A-18 | 100 | 11,000 | 1.48 |
| A-19 | 100 | 11,200 | 1.51 |
| A-20 | 100 | 11,500 | 1.43 |
| A-21 | 100 | 11,600 | 1.42 |

[4] Resist Solvent (D) (Coating Solvent)

The solvents usable in preparing the composition are not especially restricted so long as they are capable of dissolving each component, for example, alkylene glycol monoalkyl ether carboxylate (propylene glycol monomethyl ether acetate (also known as PGMEA, 1-methoxy-2-acetoxypropane), alkylene glycol monoalkyl ether (propylene glycol monomethyl ether (PGME, 1-methoxy-2-propanol), etc.), alkyl lactate (ethyl lactate, methyl lactate, etc.), cyclic lactone (γ-butyrolactone, etc., preferably having 4 to 10 carbon atoms), chain or cyclic ketone (2-heptanone, cyclohexanone, etc., preferably having 4 to 10 carbon atoms), alkylene carbonate (ethylene carbonate, propylene carbonate, etc.), alkyl carboxylate (alkyl acetate such as butyl acetate is preferred), and alkyl alkoxyacetate (ethyl ethoxypropionate) are exemplified. As other usable solvents, the solvents disclosed in U.S. Patent Application 2008/0248425A1, paragraphs from [0244] downward are exemplified.

Of the above solvents, alkylene glycol monoalkyl ether carboxylate and alkylene glycol monoalkyl ether are preferred.

One kind of these solvents may be used alone, or two or more kinds may be mixed. When two or more kinds are mixed, it is preferred to mix a solvent having a hydroxyl group and a solvent not having a hydroxyl group. The mass ratio of the solvent having a hydroxyl group and the solvent not having a hydroxyl group is 1/99 to 99/1, preferably 10/90 to 90/10, and more preferably 20/80 to 60/40.

As the solvent having a hydroxyl group, alkylene glycol monoalkyl ether is preferred, and as the solvent not having a hydroxyl group, alkylene glycol monoalkyl ether carboxylate is preferred.

[5] Basic Compounds

It is preferred that the electron beam sensitive or extreme ultraviolet radiation-sensitive resin composition in the invention contains a basic compound.

The basic compound is preferably a nitrogen-containing organic basic compound.

Usable compounds are not especially limited and, for example, compounds classified into the following (1) to (4) are preferably used.

(1) Compound Represented by the Following Formula (BS-1)

(BS-1)

In formula (BS-1), each of $R_{bs1}$ independently represents any of a hydrogen atom, an alkyl group (straight chain or branched), a cycloalkyl group (monocyclic or polycyclic), an aryl group and an aralkyl group. However, not all $R_{bs1}$ represent a hydrogen atom.

The carbon atom number of the alkyl group represented by $R_{bs1}$ is not especially restricted and is generally 1 to 20, and preferably 1 to 12.

The carbon atom number of the cycloalkyl group represented by $R_{bs1}$ is not especially restricted and is generally 3 to 20, and preferably 5 to 15.

The carbon atom number of the aryl group represented by $R_{bs1}$ is not especially restricted and is generally 6 to 20, and preferably 6 to 10. Specifically a phenyl group and a naphthyl group are exemplified.

The carbon atom number of the aralkyl group represented by $R_{bs1}$ is not especially restricted and is generally 7 to 20, and preferably 7 to 11. Specifically a benzyl group is exemplified.

The hydrogen atom of each of the alkyl group, cycloalkyl group, aryl group or aralkyl group represented by $R_{bs1}$ may be substituted with a substituent. As the substituents, an alkyl group, a cycloalkyl group, an aryl group, an aralkyl group, a hydroxyl group, a carboxyl group, an alkoxy group, an aryloxy group, an alkylcarbonyloxy group and an alkyloxycarbonyl group are exemplified.

It is preferred that, in the compound represented by formula (BS-1), one alone of three $R_{bs1}$ represents a hydrogen atom, or not all $R_{bs1}$ represent a hydrogen atom.

As the specific examples of the compound represented by formula (BS-1), tri-n-butylamine, tri-n-pentylamine, tri-n-octylamine, tri-n-decylamine, triisodecyl-amine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, and N,N-dihexylaniline are exemplified.

Further, in formula (BS-1), a compound in which at least one $R_{bs1}$ is an alkyl group substituted with a hydroxyl group is exemplified as a preferred embodiment. As the specific compounds, triethanolamine and N,N-dihydroxyethylaniline are exemplified.

Further, the alkyl group represented by $R_{bs1}$ may have an oxygen atom in the alkyl chain to form an oxyalkylene chain. As the oxyalkylene chain, —CH$_2$CH$_2$O— is preferred. As the specific examples, tris(methoxyethoxyethyl)amine and the compounds disclosed in U.S. Pat. No. 6,040,112, column 3, line 60 and after, are exemplified.

(2) Compound Having a Nitrogen-Containing Heterocyclic Structure

As the heterocyclic structure, the compound may not have an aromatic property. Further, a plurality of nitrogen atoms may be contained, and hetero atoms other than a nitrogen atom may be contained. Specifically, a compound having an imidazole structure, (2-phenylbenzimidazole, 2,4,5-triphenylimidazole), a compound having a piperidine structure (N-hydroxyethylpiperidine, bis(1,2,2,6,6-pentamethyl-4-piperidyl)sebacate), a compound having a pyridine structure (4-dimethylamino- pyridine), and a compound having an antipyrine structure (antipyrine, hydroxyl- antipyrine) are exemplified.

A compound having two or more cyclic structures is also preferably used. Specifically, 1,5-diazabicyclo[4.3.0]non-5-ene, 1,8-diazabicyclo[5.4.0]undeca-7-ene are exemplified.

(3) Amine Compound Having a Phenoxy Group

An amine compound having a phenoxy group is a compound having a phenoxy group at the terminal on the opposite side to the nitrogen atom of the alkyl group of an amine compound. The phenoxy group may have a substituent, e.g., an alkyl group, an alkoxy group, a halogen atom, a cyano group, a nitro group, a carboxyl group, a carboxylic acid ester group, a sulfonic acid ester group, an aryl group, an aralkyl group, an acyloxy group or an aryloxy group.

More preferably, the compound is a compound having at least one oxyalkylene chain between the phenoxy group and the nitrogen atom. The number of oxyalkylene chains in one molecule is preferably 3 to 9, and more preferably 4 to 6. Of oxyalkylene chains, —CH$_2$CH$_2$O— is preferred.

As the specific examples, 2-[2-{2-(2,2-dimethoxyphenoxyethoxy)ethyl}-bis-(2-methoxyethyl)]amine, and Compounds (C1-1) to (C3-3) disclosed in U.S. Patent Application 2007/0224539A1, paragraph [0066] are exemplified.

(4) Ammonium Salt

Ammonium salts are also arbitrarily used. Preferred compound is hydroxide or carboxylate. More specifically, tetraalkylammonium hydroxide represented by tetrabutylammonium hydroxide is preferred. Besides the above, ammonium salts deriving from the amines in the above (1) to (3) can be used.

As other basic compounds, the compounds disclosed in JP-A-2011-85926, the compounds synthesized in JP-A-2002-363146, and the compounds disclosed in JP-A-2007-298569, paragraph [0108] can also be used.

The composition according to the invention may contain, as a basic compound, a low molecular weight compound having a nitrogen atom and a group capable of leaving by the action of an acid (hereinafter also referred to as "low molecular weight compound (D)" or "compound (D)").

The group capable of leaving by the action of an acid is not especially limited, but an acetal group, a carbonate group, a carbamate group, a tertiary ester group, a tertiary hydroxyl group and a hemiaminal ether group are preferred, and a carbamate group and a hemiaminal ether group are especially preferred.

The molecular weight of compound (D) is preferably 100 to 1,000, more preferably 100 to 700, and especially preferably 100 to 500.

As compound (D), amine derivatives having a group capable of leaving by the action of an acid on a nitrogen atom are preferred.

Compound (D) may have a carbamate group having a protective group on a nitrogen atom. The protective group constituting the carbamate group can be, for example, represented by the following formula (d-1).

(d-1)

In formula (d-1), each R' independently represents a hydrogen atom, a straight chain or branched alkyl group, a cycloalkyl group, an aryl group, an aralkyl group or an alkoxyalkyl group. R' may be bonded to each other to form a ring.

R' preferably represents a straight chain or branched alkyl group, a cycloalkyl group or an aryl group, and more preferably a straight chain or branched alkyl group or a cycloalkyl group.

The specific examples of such groups are shown below.

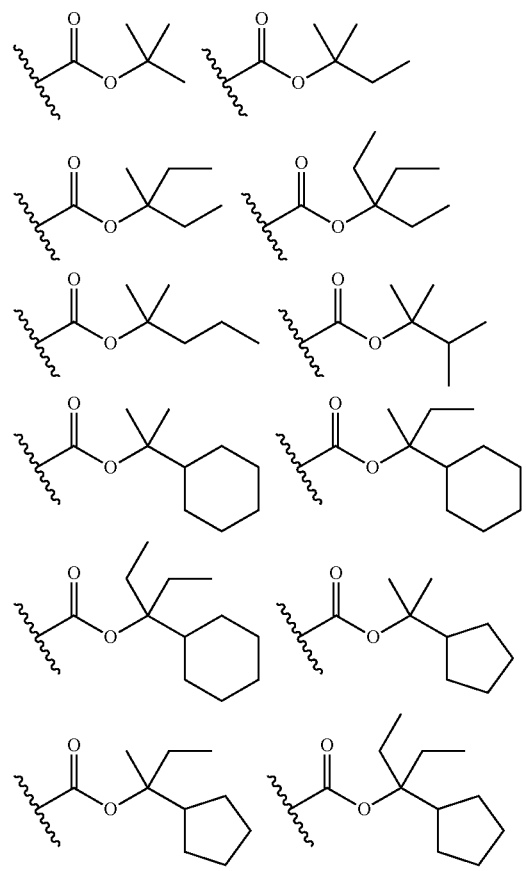

205
-continued
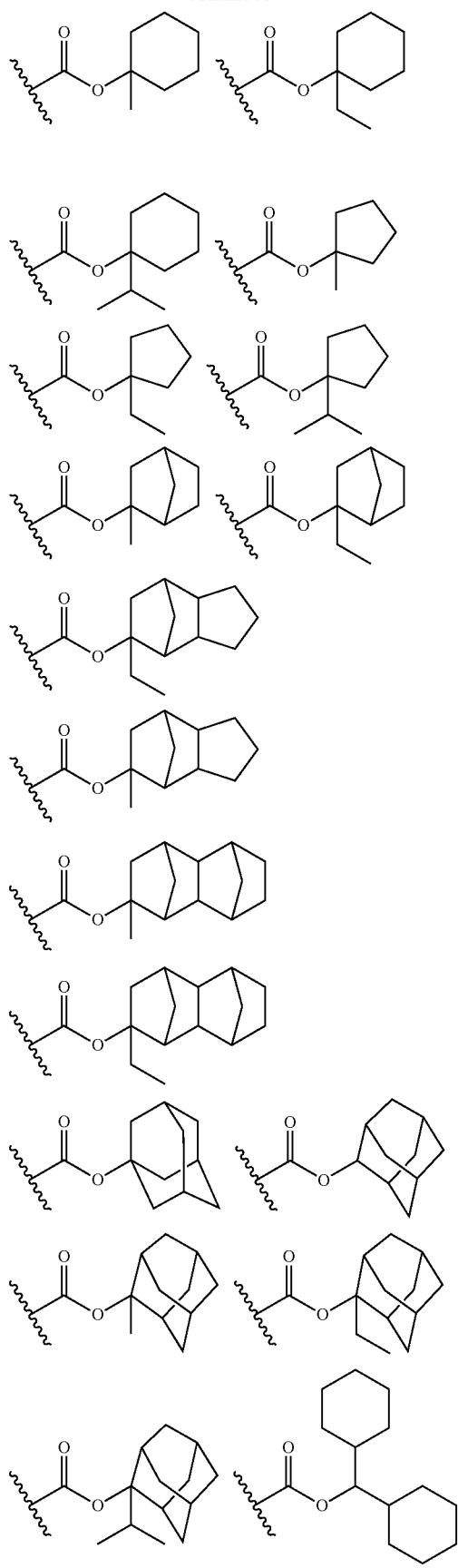
206
-continued
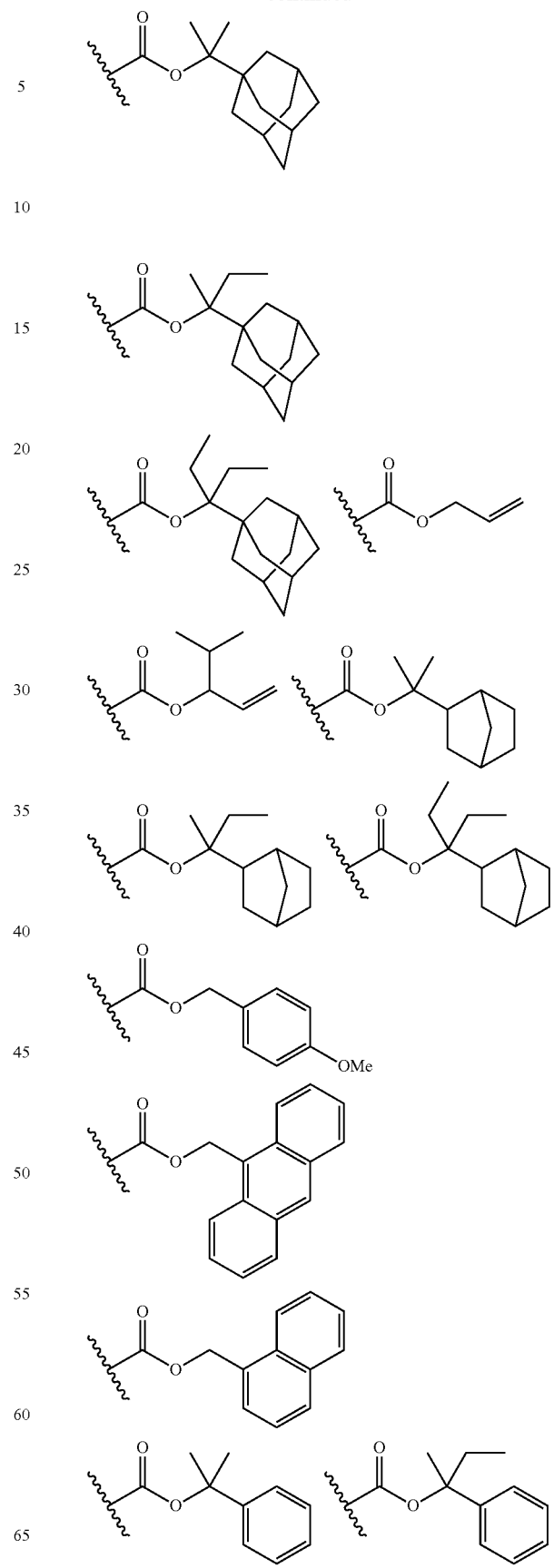

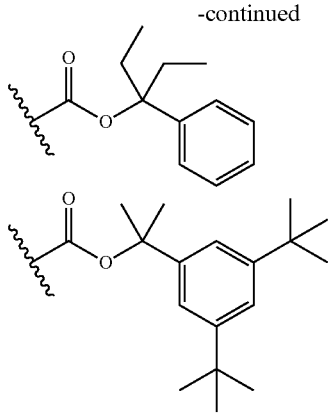

Compound (D) can also be constituted by arbitrarily combining the above described various basic compounds with the structure represented by formula (d-1).

Compound (D) is especially preferably a compound having the structure represented by the following formula (F).

So long as compound (D) is a low molecular weight compound having a group capable of leaving by the action of an acid, compound (D) may be a compound corresponding to the above various basic compounds.

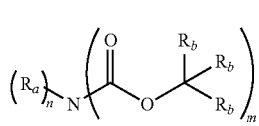
(F)

In formula (F), Ra represents a hydrogen atom, an alkyl group, a cycloalkyl group, an aryl group, or an aralkyl group. When n is 2, two Ra's may be the same with or different from each other, and two Ra's may be bonded to each other to form a divalent heterocyclic hydrocarbon group (preferably having 20 or less carbon atoms) or derivatives thereof.

Each Rb independently represents a hydrogen atom, an alkyl group, a cycloalkyl group, an aryl group, an aralkyl group or an alkoxyalkyl group, provided that when one or more Rb in —C(Rb)(Rb)(Rb) are hydrogen atoms, at least one of the remaining Rb is a cyclopropyl group, a 1-alkoxyalkyl group or an aryl group.

At least two Rb's may be bonded to form an alicyclic hydrocarbon group, an aromatic hydrocarbon group, a heterocyclic hydrocarbon group or derivatives thereof.

n represents an integer of 0 to 2, m represents an integer of 1 to 3, and n+m=3.

In formula (F), each of the alkyl group, cycloalkyl group, aryl group and aralkyl group represented by Ra and Rb may be substituted with a functional group such as hydroxyl group, cyano group, amino group, pyrrolidino group, piperidino group, morpholino group and oxo group, an alkoxy group, or a halogen atom. The alkoxyalkyl group represented by Rb may be substituted in the same manner.

As the alkyl group, cycloalkyl group, aryl group, and aralkyl group (these alkyl group, cycloalkyl group, aryl group, and aralkyl group may be substituted with the above functional group, alkoxy group, or halogen atom) represented by Ra and/or Rb, there are exemplified, for example:

groups deriving from straight chain or branched alkane such as methane, ethane, propane, butane, pentane, hexane, heptanes, octane, nonane, decane, undecane, dodecane, etc., groups obtained by substituting these groups deriving from alkane with, for example, one kind or more or one group or more of a cycloalkyl group such as a cyclobutyl group, a cyclopentyl group, or a cyclohexyl group, groups deriving from cycloalkane such as cyclobutane, cyclopentane, cyclohexane, cycloheptane, cyclooctane, norbornane, adamantane, noradamantane, etc., groups obtained by substituting these groups deriving from cycloalkane with, for example, one kind or more or one group or more of a straight chain or branched alkyl group such as a methyl group, an ethyl group, an n-propyl group, an i-propyl group, an n-butyl group, a 2-methylpropyl group, a 1-methylpropyl group, or a t-butyl group, groups deriving from an aromatic compound such as benzene, naphthalene, anthracene, etc., groups obtained by substituting these groups deriving from aromatic compound with, for example, one kind or more or one group or more of a straight chain or branched alkyl group such as a methyl group, an ethyl group, an n-propyl group, an i-propyl group, an n-butyl group, a 2-methylpropyl group, a 1-methylpropyl group, or a t-butyl group, groups deriving from a heterocyclic compound such as pyrrolidine, piperidine, morpholine, tetrahydrofuran, tetrahydropyran, indole, indoline, quinoline, perhydroquinoline, indazole, benzimidazole, etc., groups obtained by substituting these groups deriving from heterocyclic compound with one kind or more or one group or more of a straight chain or branched alkyl group or a group deriving from an aromatic compound, groups obtained by substituting a group deriving from straight chain or branched alkane and a group deriving from cycloalkane with one kind or more or one group or more of a group deriving from an aromatic compound such as a phenyl group, a naphthyl group, anthracenyl, etc., or groups obtained by substituting the above substituents with a functional group such as a hydroxyl group, a cyano group, an amino group, a pyrrolidino group, a piperidino group, a morpholino group, or an oxiso group.

Examples of the divalent heterocyclic hydrocarbon group (preferably having a carbon number of 1 to 20) formed by combining Ra with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group where the group derived from such a heterocyclic compound is substituted with one or more kinds of or one or more groups of linear or branched alkane-derived groups, cycloalkane-derived groups, aromatic compound-derived groups, heterocyclic compound-derived groups and functional groups such as hydroxyl group, cyano group, amino group, pyrrolidino group, piperidino group, morpholino group and oxo group.

The specific examples of especially preferred compound (D) in the invention are shown below, but the invention is not restricted thereto.

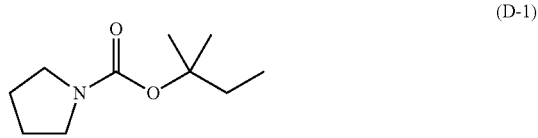
(D-1)

-continued
(D-2) 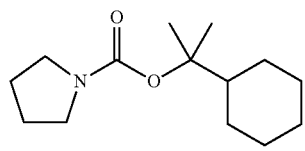
(D-3) 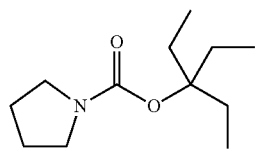
(D-4) 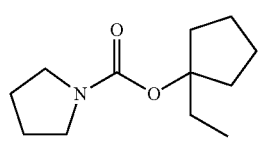
(D-5) 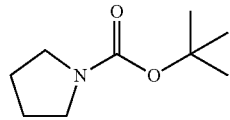
(D-6) 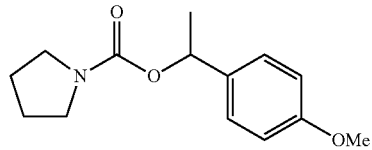
(D-7) 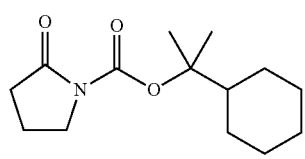
(D-8) 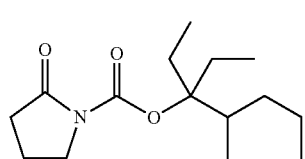
(D-9) 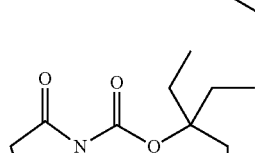
(D-10) 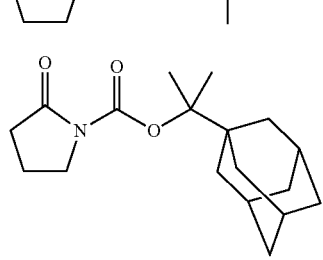
(D-11) 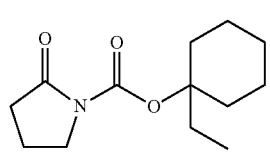
-continued
(D-12) 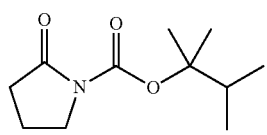
(D-13) 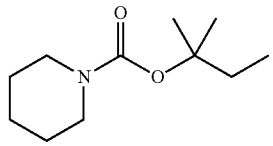
(D-14) 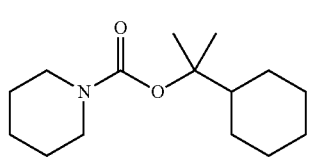
(D-15) 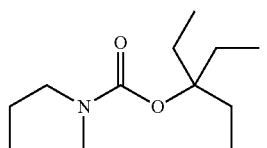
(D-16) 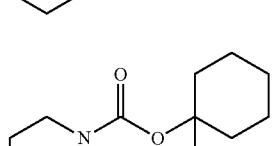
(D-17) 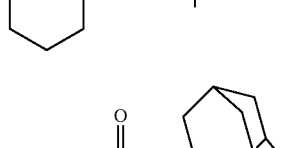
(D-18) 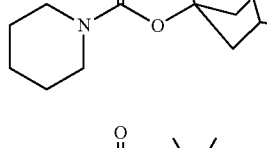
(D-19) 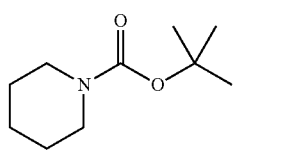
(D-20) 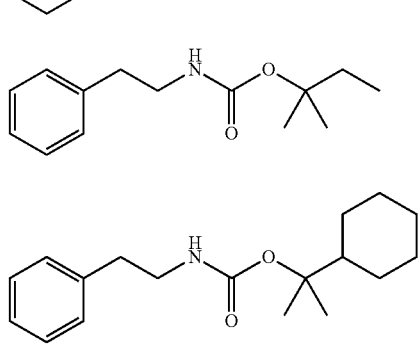
(D-21)

(D-22) 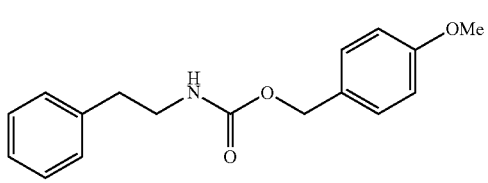
(D-23) 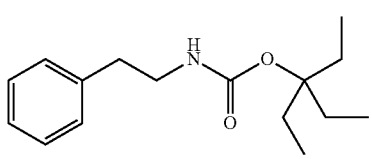
(D-24) 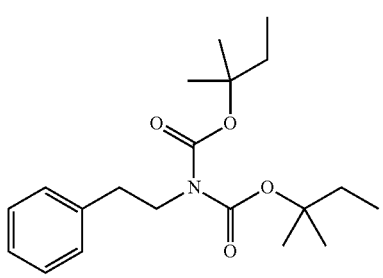
(D-25) 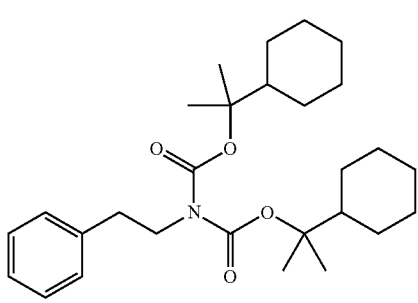
(D-26) 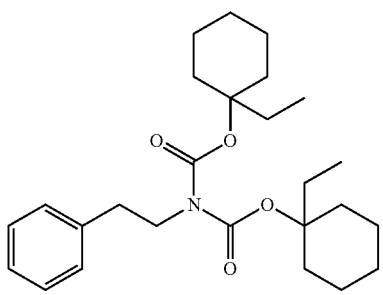
(D-27) 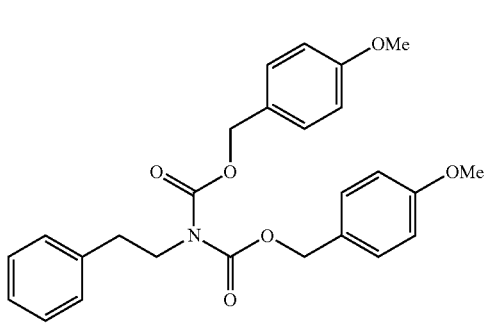
(D-28) 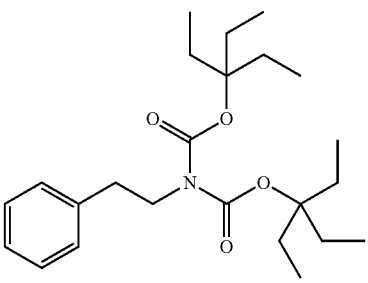
(D-29) 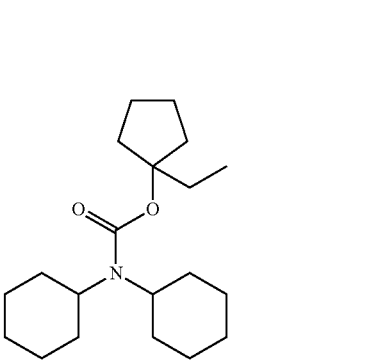
(D-30) 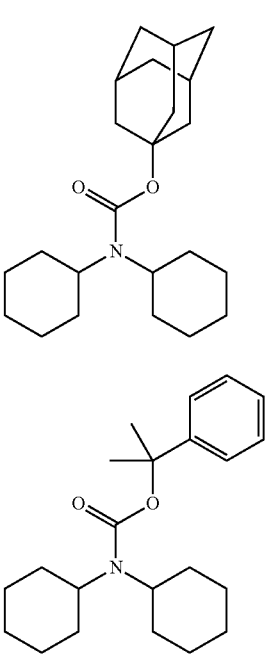
(D-31) 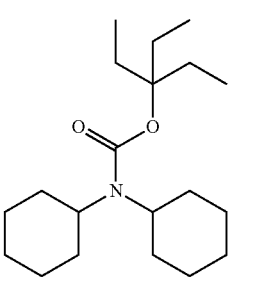
(D-32) 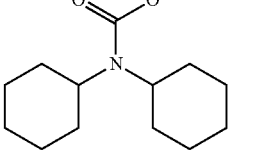

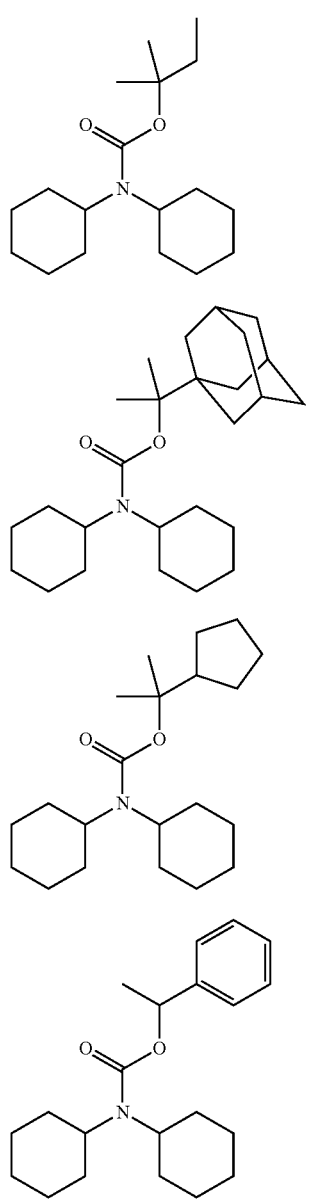
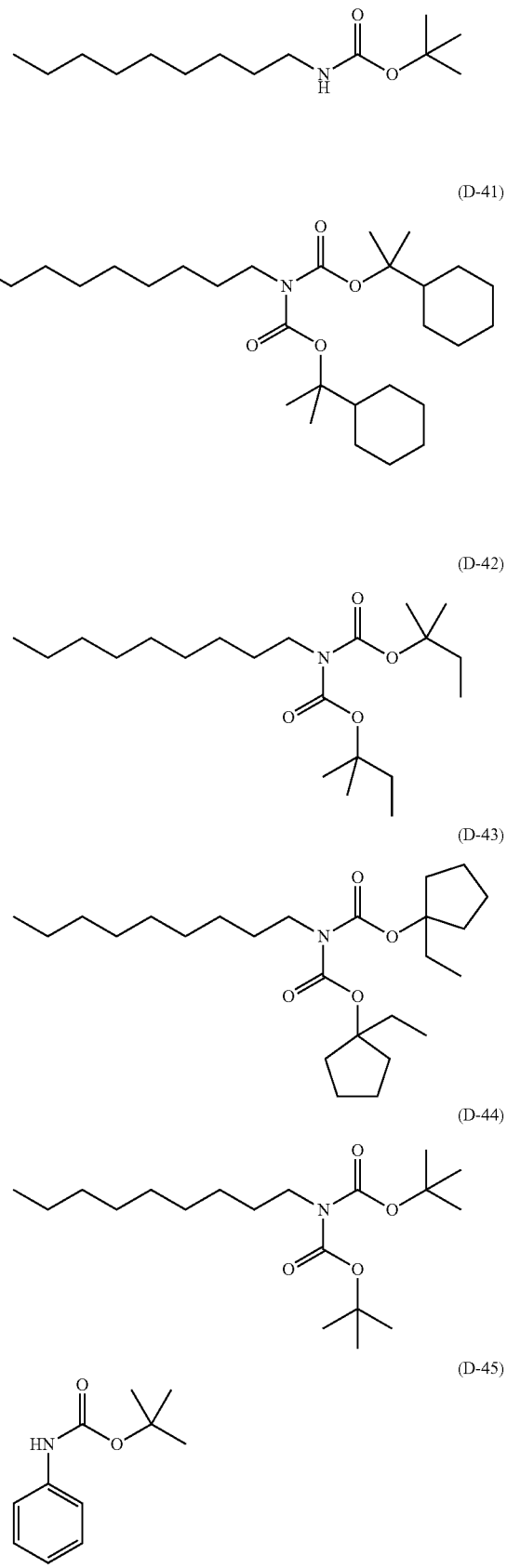

-continued (D-46) 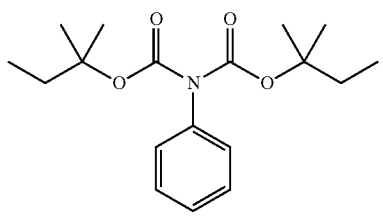

(D-47) 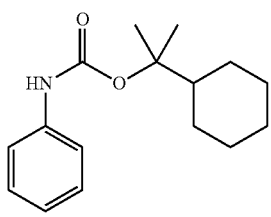

(D-48) 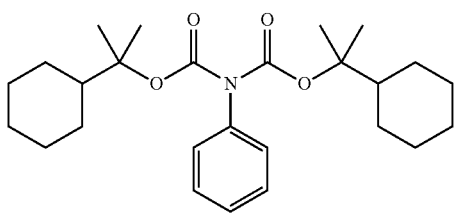

(D-49) 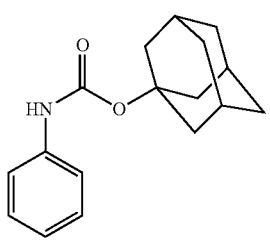

(D-50) 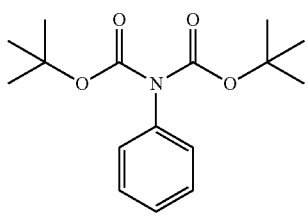

(D-51) 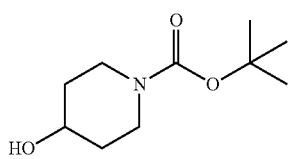

(D-52) 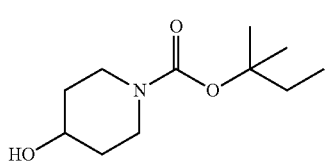

(D-53) 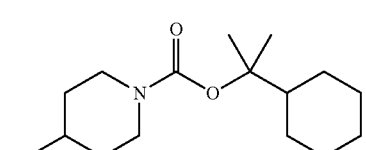

-continued (D-54) 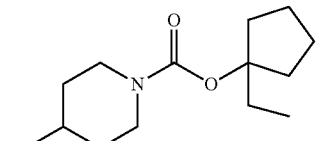

(D-55) 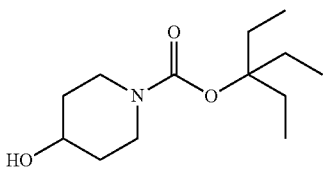

The compound represented by formula (A) can be easily synthesized from commercially available amine according to the method described in Protective Groups in Organic Synthesis, Fourth Edition. As the most ordinary method, there is a method of obtaining the compound by acting dicarbonate ester or haloformate ester to commercially available amine. In the formula, X represents a halogen atom. The definition and specific examples of Ra and Rb are the same with those described in the above formula (F).

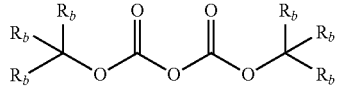

or

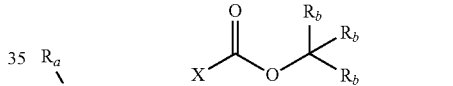

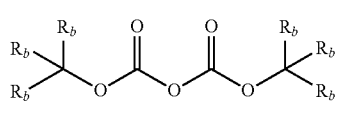

or

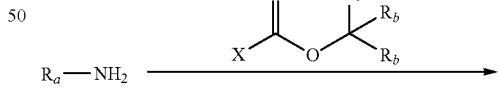

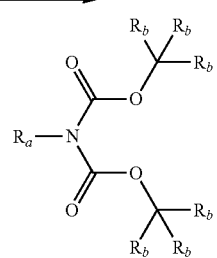

Photo-decomposable basic compounds (compounds which show basic properties by the work of basic nitrogen atoms as a base at the beginning, but decomposed upon irradiation with actinic ray or radiation and generate amphoteric ion compounds having basic nitrogen atoms and organic acid sites, and basic properties diminish or vanish by the neutralization of them in the molecule, for example, onium salts disclosed in Japanese Patent No. 3577743, JP-A-2001-215689, JP-A-2001-166476, and JP-A-2008-102383), and photo-base generating agents (for example, compounds disclosed in JP-A-2010-243773) are also arbitrarily used.

One kind of basic compound (containing compound (D)) is used alone, or two or more kinds are used in combination.

The use amount of basic compound is generally 0.001% by mass to 10% by mass on the basis of the solids content of the composition, and preferably 0.01% by mass to 5% by mass.

The molar ratio of acid generator/basic compound is preferably 2.5 to 300. That is, the molar ratio is preferably 2.5 or more from the point of sensitivity and resolution, and preferably 300 or less from the point of inhibition of lowering of resolution due to thickening of the pattern during the time after exposure to heating treatment. The molar ratio is more preferably 5.0 to 200, and still more preferably 7.0 to 150.

[6] Surfactant

The composition according to the invention may further contain surfactants. By containing surfactants, it becomes possible to form a pattern showing high sensitivity, good resolution and little in defects of adhesion and development when an exposure light source of the wavelength of 250 nm or less, particularly 220 nm or less, is used.

It is especially preferred to use fluorine and/or silicon surfactants.

As fluorine and/or silicon surfactants, the surfactants disclosed in U.S. Patent Application No. 2008/0248425, paragraph [0276] are exemplified. Further, Eftop EF301 and EF303 (manufactured by Shin-Akita Kasei Co., Ltd.), Fluorad FC 430, 431 and 4430 (manufactured by Sumitomo 3M Limited), Megafac F171, F173, F176, F189, F113, F110, F177, F120, and R08 (manufactured by DIC Corporation), Sarfron S-382, SC 101, 102, 103, 104, 105 and 106 (manufactured by ASAHI GLASS CO., LTD.), Troy Sol S-366 (manufactured by Troy Chemical Co., Ltd.), GF-300 and GF-150 (manufactured by TOAGOSEI CO., LTD.), Sarfron S-393 (manufactured by SEIMI CHEMICAL CO., LTD.), Eftop EF121, EF122A, EF122B, RF122C, EF125M, EF135M, EF351, EF352, EF801, EF802, and EF601 (manufactured by JEMCO INC.), PF636, PF656, PF6320 and PF6520 (manufactured by OMNOVA), and FTX-204G; 208G, 218G, 230G, 204D, 208D, 212D, 218D, and 222D (manufactured by NEOS) may be used. Further, polysiloxane polymer KP-341 (manufactured by Shin-Etsu Chemical Co., Ltd.) can also be used as a silicon surfactant.

In addition to these known surfactants as exemplified above, surfactants may also be synthesized with fluoro-aliphatic compounds manufactured by a telomerization method (also called a telomer method) or an oligomerization method (also called an oligomer method). Specifically, polymers having fluoro-aliphatic groups derived from the fluoro-aliphatic compounds may be used as surfactants. The fluoro-aliphatic compound can be synthesized by the method disclosed in JP-A-2002-90991.

As polymers having fluoro-aliphatic groups, copolymers of monomers having fluoro-aliphatic groups and (poly(oxyalkylene)) acrylate or methacrylate and/or (poly(oxyalkylene)) methacrylate are preferred, and they may be distributed at random or may be block copolymerized.

As the poly(oxyalkylene) groups, a poly(oxyethylene) group, a poly(oxypropylene) group, and a poly(oxybutylene) group are exemplified. Further, the polymers may be units having alkylenes different in chain length in the same chain length, such as a block combination of poly(oxyethylene and oxypropylene and oxyethylene), and a block combination of poly(oxyethylene and oxypropylene).

In addition, copolymers of monomers having fluoro-aliphatic groups and poly(oxyalkylene) acrylate or methacrylate may be terpolymers or higher polymers obtained by copolymerization of monomers having different two or more kinds of fluoro-aliphatic groups or different two or more kinds of poly(oxyalkylene) acrylates or methacrylates at the same time.

For example, as commercially available surfactants, Megafac F178, F470, F473, F475, F476 and F472 (manufactured by DIC Corporation) can be exemplified. Further, copolymers of acrylate or methacrylate having a $C_6F_{13}$ group and poly(oxyalkylene) acrylate or methacrylate, copolymers of acrylate or methacrylate having a $C_6F_{13}$ group, poly(oxyethylene) acrylate or methacrylate, and poly(oxypropylene) acrylate or methacrylate, copolymers of acrylate or methacrylate having a $C_8F_{17}$ group and poly(oxyalkylene)acrylate or methacrylate, and copolymers of acrylate or methacrylate having a $C_8F_{17}$ group, poly(oxyethylene) acrylate or methacrylate, and poly(oxypropylene) acrylate or methacrylate are exemplified.

Fluorine and/or silicon surfactants other than those disclosed in U.S. Patent Application 2008/0248425, paragraph [0280] may be used.

These surfactants may be used by one kind alone, or two or more kinds of surfactants may be used in combination.

When the composition according to the invention contains surfactants, the content is preferably 0% by mass to 2% by mass, more preferably 0.0001% by mass to 2% by mass, and still more preferably 0.0005% by mass to 1% by mass based on all the solid contents in the composition.

[7] Other Additives

Other than the above-described components, the composition of the invention can arbitrarily contain a carboxylic acid, a carboxylic acid onium salt, dissolution inhibiting compounds having a molecular weight of 3,000 or less as described in Proceeding of SPIE, 2724, 355 (1996), etc., a dye, a plasticizer, a photo-sensitizer, a photo-absorber, and an antioxidant.

In particular, a carboxylic acid is preferably used for the improvement of performances. As the carboxylic acid, aromatic carboxylic acids such as a benzoic acid and naphthoic acid are preferred.

The content of the carboxylic acid is preferably 0.01% by mass to 10% by mass in all the solid content concentration of the composition, more preferably 0.01% by mass to 5% by mass, and still more preferably 0.01% by mass to 3% by mass.

From the standpoint of enhancing the resolution, the electron beam-sensitive or extreme ultraviolet radiation-sensitive resin composition for use in the present invention is preferably used in a film thickness of 10 to 250 nm, more preferably from 20 to 200 nm, even more preferably from 30 to 100 nm. Such a film thickness can be obtained by setting the solid content concentration in the composition to an appropriate range, thereby imparting an appropriate viscosity and enhancing the coatability and film-forming property.

The entire solid content concentration in the electron beam-sensitive or extreme ultraviolet radiation-sensitive resin composition for use in the present invention is usually from 1.0 to 10 mass %, preferably from 2.0 to 5.7 mass %, more preferably from 2.0 to 5.3 mass %. By setting the solid content concentration to the range above, the resist solution can be uniformly applied on a substrate and furthermore, a resist pattern with excellent performance in terms of line width roughness can be formed. The reason therefor is not clearly known, but it is considered that thanks to a solid content concentration of 10 mass % or less, preferably 5.7 mass % or less, aggregation of materials, particularly, a photoacid generator, in the resist solution is suppressed, as a result, a uniform resist film can be formed.

The solid content concentration is a weight percentage of the weight of other resist components excluding the solvent, based on the total weight of the electron beam-sensitive or extreme ultraviolet radiation-sensitive resin composition.

The electron beam-sensitive or extreme ultraviolet radiation-sensitive resin composition for use in the present invention is used by dissolving the components above in a predetermined organic solvent, preferably in the above-described mixed solvent, filtering the solution, and applying it on a predetermined support (substrate). The filter used for filtration is preferably a polytetrafluoroethylene-, polyethylene- or nylon-made filter having a pore size of 0.1 μm or less, more preferably 0.05 μm or less, still more preferably 0.03 μm or less. In the filtration through a filter, as described, for example, in JP-A-2002-62667, circulating filtration may be performed, or the filtration may be performed by connecting a plurality of kinds of filters in series or in parallel. Also, the composition may be filtered a plurality of times. Furthermore, a deaeration treatment or the like may be applied to the composition before or after filtration through a filter.

[Uses]

The pattern-forming method of the invention is preferably used in the formation of semiconductor fine circuit such as the manufacture of super LSI and high capacity microchips. At the time of forming a semiconductor fine circuit, a resist film formed with a pattern is subjected to circuit formation and etching, and then the residual resist film part is finally removed with a solvent, and so the resist film resulting from the electron beam-sensitive or extreme ultraviolet radiation-sensitive resin composition of the invention does not remain on the final product such as microchips unlike what is called a permanent resist for use in a print substrate and the like.

The invention also relates to a manufacturing method of an electronic device containing the above described pattern-forming method and also relates to an electronic device manufactured according to the manufacturing method.

The electronic device of the invention is preferably mounted on electric and electronic apparatus (domestic electric apparatus, OA and peripheral devices of broadcasting media, optical apparatus, and communication devices).

EXAMPLE

The invention will be further specifically explained with reference to examples but the invention is not restricted to these examples.

Synthesis Example 1

Synthesis of Resin (Poly-2)

Under nitrogen flow, 20 g of cyclohexanone is put in a three-necked flask and heated at 80° C. (solvent 1). M-1, M-2, M-3 and M-4 shown below are dissolved in the cyclohexanone at a molar rate of 40/10/40/10 to prepare a 22% by mass monomer solution (200 g). Further, a solution obtained by adding 6 mol % of initiator V-601 (manufactured by Wako Pure Chemical Industries) to monomer and dissolving is dripped into solvent 1 over 6 hours. After termination of dripping, the reaction solution is further reacted at 80° C. for 2 hours. The reaction solution is allowed to be cooled, and then poured into a mixed solution comprising 1,400 ml of hexane and 600 ml of ethyl acetate. The powder precipitated is collected by filtration and dried to obtain 37 g of resin (Poly-2). From GPC of the obtained resin (Poly-2), weight average molecular weight (Mw: polystyrene-equivalent) is 10,000, and polydispersity (Mw/Mn) is 1.60.

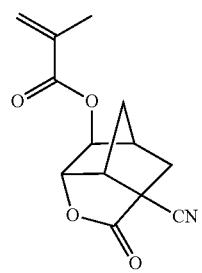

M-1

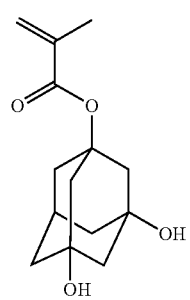

M-2

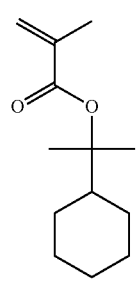

M-3

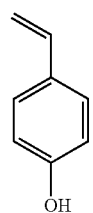

M-4

Resins (Poly-1) and (Poly-3) are synthesized in the similar method. The polymer structure, weight average molecular weight (Mw) and polydispersity (Mw/Mn) of each of the synthesized polymers are shown below. The compositional ratio of each repeating unit of the structures of the following polymers is shown in a molar ratio.

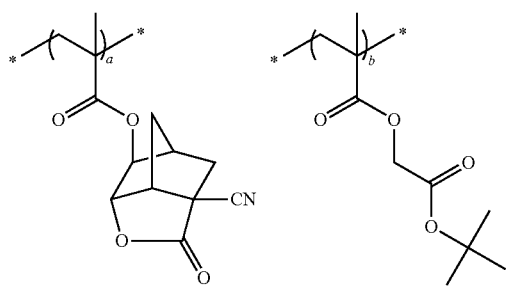

(Poly-1)
a/b = 40/60
Mw = 11000, Mw/Mn = 1.58

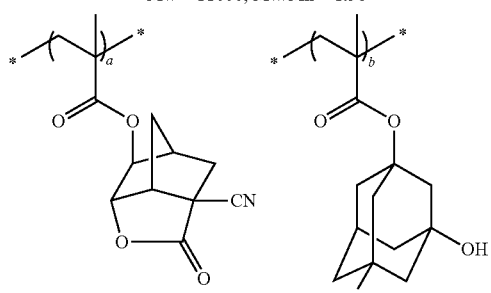

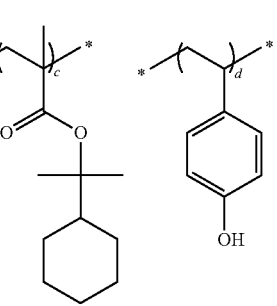

(Poly-2)
a/b/c/d = 40/10/40/10
Mw = 10000, Mw/Mn = 1.60
(Poly-3)
a/b/c/d = 40/10/46/4
Mw = 11500 Mw/Mn = 1.49

Synthesis Example 2

(Synthesis of Resin (A-1))

Compound (1) shown below (16.03 g) and 0.46 g of polymerization initiator V-601 (manufactured by Wako Pure Chemical Industries) are dissolved in 38.46 g of propylene glycol monomethyl ether acetate (PGMEA). PGMEA (9.62 g) is contained in the reaction vessel, and the prepared PGMEA solution above including Compound (1) and the polymerization initiator is dropped to the system in the reaction vessel at 80° C. over 4 hours in a nitrogen gas atmosphere. The reaction solution is stirred for 2 hours with heating, and then the temperature is allowed to be cooled to room temperature.

The reaction solution is diluted with acetone to reach the total amount of 80 g. The diluted solution is dropped to 800 g of hexane to precipitate a polymer, and the polymer is filtered. The filtered solid is roughly washed with 100 g of hexane. Subsequently, the solid after washing is dried under reduced pressure to thereby obtain 13.95 g of resin (A-1).

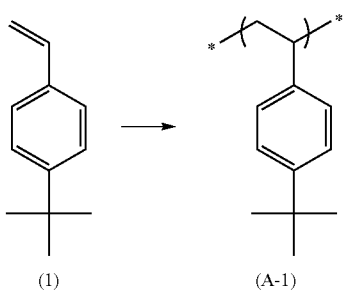

Synthesis Example 3

(Synthesis of Resin (A-11))

Compound (2) shown below (13.33 g), 4.63 g of compound (3) shown below and 0.46 g of polymerization initiator V-601 (manufactured by Wako Pure Chemical Industries) are dissolved in 43.08 g of cyclohexanone. Cyclohexanone (10.77 g) is contained in the reaction vessel, and the prepared cyclohexanone solution above including Compounds (2) and (3) and the polymerization initiator is dropped to the system in the reaction vessel at 80° C. over 4 hours in a nitrogen gas atmosphere. The reaction solution is stirred for 2 hours with heating, and then the temperature is allowed to be cooled to room temperature.

The reaction solution is diluted with acetone to reach the total amount of 90 g. The diluted solution is dropped to 900 g of hexane/ethyl acetate (9/1) to precipitate a polymer, and the polymer is filtered. The filtered solid is roughly washed with 150 g of hexane/ethyl acetate (9/1). Subsequently, the solid after washing is dried under reduced pressure to thereby obtain 14.72 g of resin (A-11).

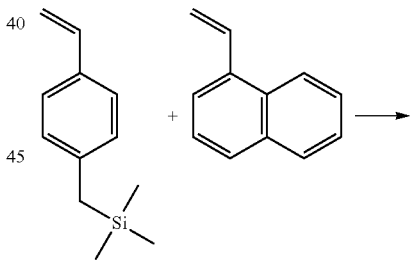

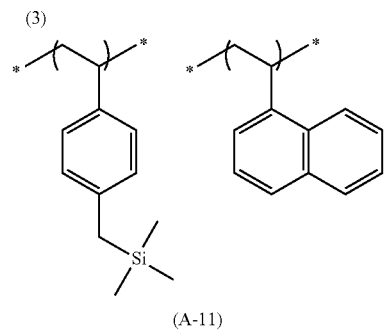

Resins (A-2) to (A-10), (A-12) to (A-21) are synthesized in the same manner. The polymer structure, weight average molecular weight (Mw) and polydispersity (Mw/Mn) of these resins are as described above.

Examples 1 to 31 and Comparative Example 1

(Extreme Ultraviolet Radiation (EUV) Exposure)
(1) Preparation of Coating Solution of Electron Beam-Sensitive or Extreme Ultraviolet Radiation-Sensitive Resin Composition and Coating The solution of the electron beam-sensitive or extreme ultraviolet radiation-sensitive resin composition (resist composition) is obtained by precisely filtering the coating solution composition having the composition shown in the table below through a membrane filter having a pore size of 0.05 µm.

The solution of the electron beam-sensitive or extreme ultraviolet radiation-sensitive resin composition is coated on an 8-inch Si wafer having been subjected to hexamethyldisilazane (HMDS) treatment in advance with a spin coater ACT-12 (manufactured by Tokyo Electron Limited), dried on a hot plate at 100° C. for 60 seconds, and a resist film having a thickness of 50 nm is obtained.

(2) EUV Exposure and Development

Pattern irradiation is performed on the wafer coated with the resist film obtained in the above (1) with an EUV exposure apparatus (Micro Exposure Tool, NA 0.3, Quadrupole, outer sigma 0.68, inner sigma 0.36, manufactured by Exitech) through an exposure mask (line/space: 1/1). After irradiation, the wafer is heated at 110° C. for 60 seconds on a hot plate. After that, the wafer is puddled with the organic developer shown in the following table and developed for 30 seconds, and then rinsed by using the rinsing solution shown in the table below. Subsequently, the wafer is revolved at 4,000 rpm for 30 seconds and then baked at 90° C. for 60 seconds, to thereby obtain a resist pattern of line and space pattern of 1/1 having a line width of 50 nm.

Comparative Example 2

(Extreme Ultraviolet Radiation (EUV) Exposure)

An electron beam-sensitive or extreme ultraviolet radiation-sensitive resin composition is prepared and a pattern is formed in the same manner as in Example 1 except that the constitution is changed as shown in the table below, and development is performed with an alkali aqueous solution (TMAH, a 2.38% by mass tetramethyammonium hydroxide aqueous solution) in place of the organic developer and water is used as the rinsing solution.

(3) Evaluation of Resist Pattern

The pattern form, resolution and LWR of the obtained resist pattern are evaluated with a scanning electron microscope (S-9380II, manufactured by Hitachi Limited) by the following methods. The results obtained are shown in the table below.

(3-1) Pattern Form

The pattern form is evaluated as follows. In the sectional shape of the line pattern, the case where the ratio expressed by [the line width at the top part (surface part) of the line pattern/the line width at the middle part (the position of half the height of the line pattern height) of the line pattern] is 1.5 or more is taken as "reverse taper", the case where the ratio is 1.2 or more and less than 1.5 is taken as "slightly reverse taper", and the case where the ratio is less than 1.2 is taken as "rectangle".

(3-2) Limiting Resolution

In the irradiation energy (Eop) at the time of resolution of a 1/1 line and space pattern having a line width of 50 nm, limiting resolution is evaluated by the smallest line width of separated line and space pattern of (1/1). The smaller the value, the better is the limiting resolution.

(3-3) Line Width Roughness (LWR)

Concerning line width roughness, in the above Eop, line width is measured at arbitrary 50 points of 0.5 µm in the longitudinal direction of a line and space pattern having a line width of 50 nm, and standard deviation is obtained, from which $3\sigma$ is computed. The smaller the value, the better is the performance.

TABLE 3

| | | | | | | | | | | | |
|---|---|---|---|---|---|---|---|---|---|---|---|
| | | | | EUV Exposure | | | | | | | |
| Example No. | Resin (A) | Acid Generator (B) | Resin (C) | Solvent (ratio by mass) (40 g) | Basic Compound | Surfactant (5 mg) | Developer | Rinsing Solution | Pattern Form | Limiting Resolution (nm) | LWR (nm) |
| Example 1 | Poly-1 (0.607 g) | z118 (0.35 g) | A-1 (0.04 g) | S-1/S-2 (60/40) | D-1 (3 mg) | W-1 | S-5 | S-10 | rectangle | 24 | 3.8 |
| Example 2 | Poly-1 (0.615 g) | z118 (0.35 g) | A-2 (0.03 g) | S-1/S-2 (60/40) | D-1 (5 mg) | W-1 | S-5 | S-10 | rectangle | 25 | 3.9 |
| Example 3 | Poly-1 (0.606 g) | z118 (0.35 g) | A-3 (0.04 g) | S-1/S-2 (70/30) | D-2 (4 mg) | W-1 | S-6 | S-11 | rectangle | 24 | 3.7 |
| Example 4 | Poly-1 (0.622 g) | z114 (0.35 g) | A-4 (0.02 g) | S-1/S-2 (60/40) | D-1 (8 mg) | W-1 | S-5 | S-10 | rectangle | 25 | 3.8 |
| Example 5 | Poly-1 (0.605 g) | z118 (0.35 g) | A-5 (0.04 g) | S-1/S-2 (60/40) | D-1 (5 mg) | W-1 | S-11 | S-12 | rectangle | 26 | 4.5 |
| Example 6 | Poly-1 (0.616 g) | z118 (0.35 g) | A-6 (0.03 g) | S-1/S-2 (60/40) | D-1 (4 mg) | W-1 | S-5 | S-13 | rectangle | 25 | 4.6 |
| Example 7 | Poly-1 (0.616 g) | z49 (0.35 g) | A-7 (0.03 g) | S-1/S-2 (80/20) | D-4 (4 mg) | W-1 | S-8 | S-10 | slightly reverse taper | 28 | 5.1 |
| Example 8 | Poly-1 (0.616 g) | z118 (0.35 g) | A-8 (0.03 g) | S-1/S-2 (60/40) | D-1 (4 mg) | W-1 | S-5 | S-10 | slightly reverse taper | 29 | 5.2 |
| Example 9 | Poly-1 (0.603 g) | z39 (0.35 g) | A-9 (0.04 g) | S-1/S-2 (60/40) | D-3 (7 mg) | W-1 | S-5 | S-10 | slightly reverse taper | 29 | 5.1 |
| Example 10 | Poly-1 (0.601 g) | z113 (0.35 g) | A-10 (1) (0.04 g) | S-1/S-2 (60/40) | D-1 (9 mg) | W-1 | S-7 | S-10 | rectangle | 27 | 3.9 |
| Example 11 | Poly-1 (0.612 g) | z118 (0.35 g) | A-10 (2) (0.03 g) | S-1/S-3 (60/40) | D-1 (8 mg) | W-2 | S-9 | S-11 | rectangle | 28 | 4.1 |
| Example 12 | Poly-1 (0.594 g) | z118 (0.35 g) | A-11 (0.05 g) | S-4 | D-1 (6 mg) | W-1 | S-5 | S-14 | rectangle | 25 | 3.9 |

TABLE 3-continued

EUV Exposure

| Example No. | Resin (A) | Acid Generator (B) | Resin (C) | Solvent (ratio by mass) (40 g) | Basic Compound | Surfactant (5 mg) | Developer | Rinsing Solution | Pattern Form | Limiting Resolution (nm) | LWR (nm) |
|---|---|---|---|---|---|---|---|---|---|---|---|
| Example 13 | Poly-1 (0.605 g) | z118 (0.35 g) | A-12 (0.04 g) | S-1/S-2 (60/40) | D-3 (5 mg) | W-1 | S-5 | S-10 | rectangle | 26 | 3.6 |
| Example 14 | Poly-1 (0.616 g) | z114 (0.35 g) | A-13 (0.03 g) | S-1/S-2 (60/40) | D-1 (4 mg) | W-1 | S-8 | S-11 | rectangle | 24 | 3.8 |
| Example 15 | Poly-1 (0.625 g) | z118 (0.35 g) | A-14 (0.02 g) | S-1/S-4 (60/40) | D-1 (5 mg) | W-1 | S-8 | S-12 | rectangle | 25 | 3.8 |
| Example 16 | Poly-1 (0.606 g) | z108 (0.35 g) | A-15 (0.04 g) | S-1/S-2 (80/20) | D-1 (4 mg) | W-1 | S-5 | S-10 | rectangle | 26 | 3.7 |
| Example 17 | Poly-1 (0.627 g) | z118 (0.35 g) | A-16 (0.02 g) | S-1/S-2 (60/40) | D-2 (3 mg) | W-1 | S-5 | S-10 | rectangle | 25 | 3.8 |
| Example 18 | Poly-1 (0.601 g) | z118 (0.35 g) | A-17 (0.04 g) | S-1 | D-1 (9 mg) | W-1 | S-5 | S-10 | rectangle | 26 | 3.9 |
| Example 19 | Poly-1 (0.615 g) | z118 (0.35 g) | A-18 (0.03 g) | S-1/S-2 (60/40) | D-1 (5 mg) | W-4 | S-12 | S-12 | rectangle | 24 | 3.7 |
| Example 20 | Poly-1 (0.635 g) | z2 (0.35 g) | A-19 (0.01 g) | S-1/S-2 (60/40) | D-2 (5 mg) | W-2 | S-5 | S-10 | rectangle | 25 | 4.3 |
| Example 21 | Poly-1 (0.593 g) | z118 (0.35 g) | A-20 (0.05 g) | S-1/S-3 (60/40) | D-1 (7 mg) | W-3 | S-8 | S-10 | rectangle | 26 | 3.6 |
| Example 22 | Poly-1 (0.594 g) | z118 (0.35 g) | A-21 (0.05 g) | S-1/S-2 (60/40) | D-1 (6 mg) | W-4 | S-5 | S-10 | rectangle | 25 | 3.7 |
| Example 23 | Poly-1 (0.601 g) | z118 (0.35 g) | A-1 (0.04 g) | S-1/S-2 (60/40) | D-1 (9 mg) | W-1 | S-5 | S-11 | rectangle | 25 | 4.0 |
| Example 24 | Poly-1 (0.615 g) | z118 (0.35 g) | A-1 (0.03 g) | S-1/S-2 (60/40) | D-1 (5 mg) | W-1 | S-5 | S-10 | rectangle | 26 | 3.9 |
| Example 25 | Poly-2 (0.625 g) | z118 (0.35 g) | A-1 (0.02 g) | S-1/S-2 (60/40) | D-1 (5 mg) | W-1 | S-5 | S-10 | rectangle | 26 | 3.9 |
| Example 26 | Poly-3 (0.614 g) | z118 (0.35 g) | A-1 (0.03 g) | S-1/S-2 (60/40) | D-1 (6 mg) | W-1 | S-5 | S-11 | rectangle | 25 | 4.1 |
| Example 27 | Poly-1 (0.607 g) | z118 (0.35 g) | A-10 (3) (0.04 g) | S-1/S-2 (60/40) | D-1 (3 mg) | W-1 | S-5 | S-12 | rectangle | 32 | 6.1 |
| Example 28 | Poly-1 (0.606 g) | z18 (0.35 g) | A-10 (4) (0.04 g) | S-1/S-2 (60/40) | D-1 (4 mg) | W-1 | S-5 | S-10 | rectangle | 33 | 7.2 |
| Example 29 | Poly-1 (0.805 g) | z118 (0.15 g) | A-1 (0.04 g) | S-1/S-2 (60/40) | D-1 (5 mg) | W-1 | S-5 | S-11 | rectangle | 26 | 5.5 |
| Example 30 | Poly-1 (0.207 g) | z118 (0.75 g) | A-1 (0.04 g) | S-1/S-2 (60/40) | D-1 (3 mg) | W-1 | S-5 | S-10 | rectangle | 32 | 5.1 |
| Example 31 | Poly-1 (0.604 g) | z118 (0.35 g) | A-1/A-9 (0.02 g/ 0.02 g) | S-1/S-2 (60/40) | D-1 (6 mg) | W-1 | S-5 | S-10 | rectangle | 24 | 3.9 |
| Comparative Example 1 | Poly-1 (0.645 g) | z118 (0.35 g) | — | S-1/S-2 (60/40) | D-1 (5 mg) | W-1 | S-5 | S-10 | reverse taper | 35 | 7.8 |
| Comparative Example 2 | Poly-1 (0.604 g) | Z118 (0.35 g) | A-1 (0.04 g) | S-1/S-2 (60/40) | D-1 (6 mg) | W-1 | TMAH (positive development) | water | reverse taper | 50 | 8.3 |

The abbreviations in the tables show the compounds of the above specific examples and the following compounds.
<Basic Compound>
D-1: Tetra-(n-butyl)ammonium hydroxide
D-2: 1,8-Diazabicyclo[5.4.0]-7-undecene
D-3: 2,4,5-Triphenylimidazole
D-4: Tridecylamine
<Surfactant>
W-1: Megafac F176 (fluorine surfactant, manufactured by DIC Corporation)
W-2: Megafac R08 (fluorine/silicon surfactant, manufactured by DIC Corporation)
W-3: Polysiloxane polymer KP-341 (silicon surfactant, manufactured by Shin-Etsu Chemical Co., Ltd.)
W-4: PF6320 (fluorine surfactant, manufactured by OMNOVA)
<Coating Solvent>
S-1: Propylene glycol monomethyl ether acetate (PGMEA)
S-2: Propylene glycol monomethyl ether (PGME)
S-3: Tetrahydrofuran
S-4: Cyclohexanone <Developer, Rinsing Solution>
S-5: Butyl acetate
S-6: Pentyl acetate
S-7: Anisole
S-8: 1-Hexanol
S-9: 4-Methyl-2-pentanol
S-10: Decane
S-11: Octane
S-12: Ethylbenzene
S-13: Propylene glycol monomethyl ether acetate (PGMEA)
S-14: Ethoxybenzene
TMAH: Tetramethylammonium hydroxide 2.38% by mass aqueous solution As can be seen from the above tables, Examples 1 to 31 can satisfy excellent pattern form, high resolution and high line width roughness (LWR) performance at the same time on an extremely high level.

In particular, as can be seen from the comparison of Example 1 and Comparative Example 2, wherein positive development is performed with the same resist composition as used in Example 1 and by the alkali developer, by using the pattern-forming method of the invention with the organic developer, patterns having an excellent pattern form, high resolution and high LWR performance can be formed. As described above, this is presumed for the reason that capillary force applied to the side wall of the pattern is reduced when the organic developer is used, as compared with the case of using an alkali developer, as a result pattern collapse can be prevented.

Further, as compared with Example 29 where the content of the acid generator to all the solids content of the composition is less than 21% by mass, Examples 1 to 26 where the content of the acid generator is 21% by mass or more show more preferred results concerning LWR performance.

Further, as can be seen from the results of evaluation in Examples 1 to 6 and 10 to 31, when the resin contains the repeating unit having an aromatic ring group, the pattern form, resolution and LWR performance are further excellent. This is presumably because the resins absorb out of band light in EUV exposure and malfunctions due to out of band light (roughness on, the surface of the pattern, a T-top shape, a reverse taper shape and generation of a bridged part) are furthermore restrained.

In addition, as compared with Examples 27 and 28 wherein the content of the acid-decomposable repeating unit to the content of all the repeating units in resin (C) exceeds 5 mol %, other Examples wherein the content is 5 mol % or less show more preferred results concerning LWR performance. This is presumably because such a phenomenon that polarity rises due to decomposition of the acid-decomposable repeating unit by exposure is difficult to occur in resin (C) localized on the surface of the resist film and the unexposed part is surely dissolved in the organic solvent in Examples other than Examples 27 and 28.

Incidentally, in the case where a rinsing step is not carried out, excellent effects similar to those in the above examples can be obtained.

Industrial Applicability

According to the invention, a pattern-forming method capable of satisfying an excellent pattern form, high resolution (high critical resolution, etc.), and high line width roughness (LWR) performance on an extremely higher order at the same time; an electron beam-sensitive or extreme ultraviolet radiation-sensitive resin composition; a resist film; a manufacturing method of an electronic device using these; and an electronic device can be provided.

This application is based on Japanese patent application No. JP 2011-218550 filed on Sep. 30, 2011, the entire content of which is hereby incorporated by reference, the same as if set forth at length.

The invention claimed is:

1. A pattern-forming method, comprising in this order:
step (1) of forming a film with an electron beam-sensitive or extreme ultraviolet radiation-sensitive resin composition that contains (A) a resin having an acid-decomposable repeating unit and capable of decreasing a solubility of the resin (A) in a developer containing an organic solvent by an action of an acid, (B) a compound capable of generating an acid upon irradiation with an electron beam or extreme ultraviolet radiation, (C) a resin having one or more groups selected from the group consisting of an alkyl group having 6 or more carbon atoms, a cycloalkyl group having 6 or more carbon atoms, an aryl group having 9 or more carbon atoms, an aralkyl group having 10 or more carbon atoms, an aromatic ring group substituted with at least one alkyl group having 3 or more carbon atoms and an aromatic ring group substituted with at least one cycloalkyl group having 5 or more carbon atoms, and wherein the resin (C) contains no fluorine or silicon atoms, and (D) a solvent;

step (2) of exposing the film with an electron beam or extreme ultraviolet radiation; and step (4) of developing the film with a developer containing an organic solvent after the exposing to form a negative pattern.

2. The pattern-forming method according to claim 1, wherein the resin (C) contains a repeating unit represented by any one of the following formulae (C-Ia) to (C-Id):

wherein each of $R_{10}$ and $R_{11}$ independently represents a hydrogen atom or an alkyl group;

each of $W_3$, $W_5$ and $W_6$ independently represents an organic group having one or more groups selected from the group consisting of a group having an alkyl group having 6 or more carbon atoms, a cycloalkyl group having 6 or more carbon atoms, an aryl group having 9 or more carbon atoms and an aralkyl group having 10 or more carbon atoms;

$W_4$ represents an organic group having one or more groups selected from the group consisting of a group having an alkyl group having 3 or more carbon atoms and a cycloalkyl group having 5 or more carbon atoms;

$Ar_{11}$ represents an (r+1)-valent aromatic ring group; and r represents an integer of 1 to 10.

3. The pattern-forming method according to claim 2, wherein the resin (C) further contains a repeating unit having an aromatic ring group other than the repeating unit represented by any one of the formulae (C-Ia) to (C-Id).

4. The pattern-forming method according to claim 1, wherein the resin (C) contains a repeating unit represented by the following formula (C-II):

(C-II)

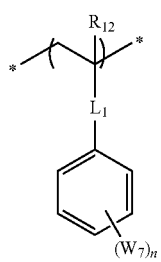

wherein $R_{12}$ represents a hydrogen atom or a methyl group;
$W_7$ represents an organic group having one or more groups selected from the group consisting of an alkyl group having 3 or more carbon atoms and a cycloalkyl group having 5 or more carbon atoms;
$L_1$ represents a single bond or a —COO$L_2$- group;
$L_2$ represents a single bond or an alkylene group; and
n represents an integer of 1 to 5.

5. The pattern-forming method according to claim 4, wherein in formula (C-II), $W_7$ represents an alkyl group having 3 or more carbon atoms or a cycloalkyl group having 5 or more carbon atoms.

6. The pattern-forming method according to claim 1, wherein a content of the acid-decomposable repeating unit in the resin (C) is 5 mol% or less to all repeating units in the resin (C).

7. The pattern-forming method according to claim 1, wherein the resin (A) has one or more groups selected from the group consisting of a hydroxyl group, a cyano group, a lactone group, a carboxylic acid group, a sulfonic acid group, an amido group, a sulfonamido group, an ammonium group, a sulfonium group and a group obtained by combining two or more of these groups.

8. The pattern-forming method according to claim 1, wherein a content of the compound (B) is 21% by mass to 70% by mass on the basis of all solids content of the composition.

9. The pattern-forming method according to claim 1, which is a method for forming a semiconductor ultrafine circuit.

10. The pattern-forming method according to claim 1, wherein a content of the resin (C) in the composition is 0.01% by mass to 10% by mass on a basis of all solid contents in the composition.

11. The pattern-forming method according to claim 1, wherein a content of the resin (C) in the composition is 0.05% by mass to 8% by mass on a basis of all solid contents in the composition.

12. The pattern-forming method according to claim 1, wherein a content of the resin (C) in the composition is 0.1% by mass to 5% by mass on a basis of all solid contents in the composition.

13. A manufacturing method of an electronic device, comprising:
the pattern-forming method according to claim 1.

14. An electronic device, which is manufactured by the manufacturing method of an electronic device according to claim 13.

15. A pattern-forming method, comprising in this order:
step (1) of forming a film with an electron beam-sensitive or extreme ultraviolet radiation-sensitive resin composition that contains (A) a resin having an acid-decomposable repeating unit and capable of decreasing a solubility of the resin (A) in a developer containing an organic solvent by an action of an acid, (B) a compound capable of generating an acid upon irradiation with an electron beam or extreme ultraviolet radiation, (C) a resin containing a repeating unit represented by the following formula (C-II):

(C-II)

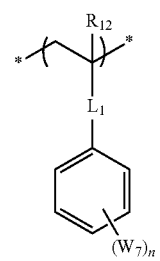

wherein $R_{12}$ represents a hydrogen atom, a methyl group, a trifluoromethyl group or a fluorine atom;
$W_7$ represents an organic group having one or more groups selected from the group consisting of a group having a fluorine atom, a group having a silicon atom, an alkyl group having 3 or more carbon atoms and a cycloalkyl group having 5 or more carbon atoms;
$L_1$ represents a single bond or a —COO$L_2$- group;
$L_2$ represents a single bond or an alkylene group; and
n represents an integer of 1 to 5,
and wherein the resin (C) contains a repeating unit, other than the repeating unit represented by formula (C-II), which contains a plurality of aromatic rings, represented by formula (II) or formula (c1):

(II)

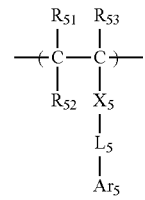

wherein each of $R_{51}$, $R_{52}$ and $R_{53}$ independently represents a hydrogen atom, an alkyl group, a halogen atom, a cyano group or an alkoxycarbonyl group, provided that $R_{52}$ may be bonded to $Ar_5$ to form a ring, and $R_{52}$ in that case represents a single bond or an alkylene group; $X_5$ represents a single bond, —COO— or —CONR$_{64}$—, and $R_{64}$ represents a hydrogen atom or an alkyl group; $L_5$ represents a single bond or an alkylene group; $Ar_5$ represents a monovalent aromatic ring group, and represents a divalent aromatic ring group when bonded to $R_{52}$ to form a ring, (c1)

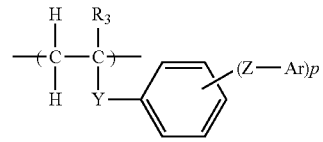

wherein $R_3$ represents a hydrogen atom, an alkyl group, a halogen atom, a cyano group or a nitro group; Y represents a single bond or a divalent linking group; Z represents a single bond or a divalent linking group; Ar represents an aromatic ring group; and p represents an integer of 1 or more, (D) a solvent; and wherein a content of the resin (C) in the composition is 0.05% by mass to 8% by mass on a basis of all solid content in the composition.

step (2) of exposing the film with an electron beam or extreme ultraviolet radiation; and step (4) of developing the film with a developer containing an organic solvent after the exposing to form a negative pattern.

16. The pattern-forming method according to claim 15, wherein a content of the resin (C) in the composition is 0.1% by mass to 5% by mass on a basis of all solid contents in the composition.

17. An electron beam-sensitive or extreme ultraviolet radiation-sensitive resin composition, which is defined in step (1) of claim 15.

18. A resist film, which is formed with the electron beam-sensitive or extreme ultraviolet radiation-sensitive resin composition according to claim 17.

* * * * *